United States Patent [19]

Aoai et al.

[11] Patent Number: 5,276,124
[45] Date of Patent: Jan. 4, 1994

[54] SILOXANE POLYMERS AND POSITIVE WORKING LIGHT-SENSITIVE COMPOSITIONS COMPRISING THE SAME

[75] Inventors: Toshiaki Aoai; Kazuyoshi Mizutani, both of Shizuoka, Japan

[73] Assignee: Fuji Photo Film Co., Ltd., Ashigara, Japan

[21] Appl. No.: 3,465

[22] Filed: Jan. 12, 1993

Related U.S. Application Data

[62] Division of Ser. No. 550,446, Jul. 10, 1990, Pat. No. 5,216,105.

[30] Foreign Application Priority Data

| Jul. 12, 1989 | [JP] | Japan | 1-179784 |
| Jul. 13, 1989 | [JP] | Japan | 1-180738 |
| Jul. 14, 1989 | [JP] | Japan | 1-181878 |
| Jul. 14, 1989 | [JP] | Japan | 1-181879 |
| Jul. 14, 1989 | [JP] | Japan | 1-181880 |
| Jan. 9, 1990  | [JP] | Japan | 2-1795 |
| Jan. 9, 1990  | [JP] | Japan | 2-1796 |

[51] Int. Cl.$^5$ .................................................. C08G 77/14
[52] U.S. Cl. ........................................... 528/28; 528/26; 528/27; 528/32
[58] Field of Search ........................ 528/26, 28, 27, 32

[56] References Cited

U.S. PATENT DOCUMENTS 5,143,816  9/1992  Mizutani et al. ........................ 528/26

*Primary Examiner*—Melvyn I. Marquis
*Attorney, Agent, or Firm*—Burns, Doane, Swecker & Mathis

[57] ABSTRACT

A novel siloxane polymer having at least 1 mol % of a structural unit derived from a cyclic heat addition product between a diene compound of formula (I) or (II) and an olefin or acetylene compound of formula (III), (IV) or (V):

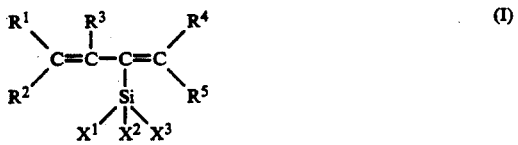

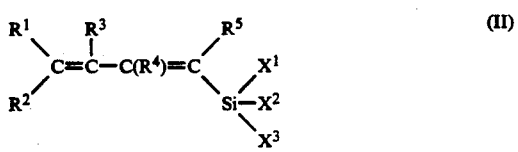

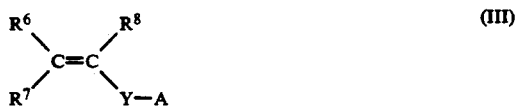

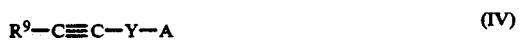

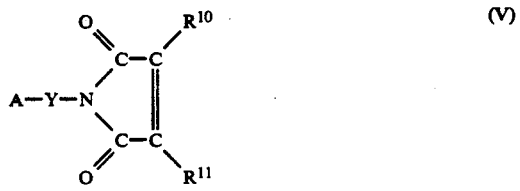

and a positive working light-sensitive composition comprising the siloxane polymer.

8 Claims, No Drawings

SILOXANE POLYMERS AND POSITIVE WORKING LIGHT-SENSITIVE COMPOSITIONS COMPRISING THE SAME

This application is a divisional of application Ser. No. 07/550,446, filed Jul. 10, 1990, now U.S. Pat. No. 5,216,105.

BACKGROUND OF THE INVENTION

The present invention relates to a positive working light-sensitive composition which makes it possible to form a presensitized plate for use in making a lithographic printing plate (hereunder referred to as "PS plate"), proof sheets for process printing, figures for overhead projectors or fine resist patterns required for making integrated circuits (IC) of semiconductor elements; components or intermediates useful for the preparation of the positive-working light-sensitive composition; and a process for the preparation of the components or intermediates.

As so-called positive working light-sensitive materials which are made soluble by irradiating with actinic rays, for instance, in making lithographic printing plates, there have been known o-quinonediazide compounds and these compounds have practically been utilized widely for preparing PS plates or the like. Such o-quinonediazide compounds are disclosed in various publications inclusive of U.S. Pat. Nos. 2,766,118; 2,767,092; 2,772,972; 2,859,112; 2,907,665; 3,046,110; 3,046,111; 3,046,115; 3,046,118; 3,046,119; 3,046,120; 3,046,121; 3,046,122; 3,046,123; 3,061,430; 3,102,809; 3,106,465; 3,635,709; and 3,647,443.

These o-quinonediazide compounds are decomposed by irradiation with actinic rays to form 5-membered carboxylic acids and they are thus made alkali-soluble. In these applications of the light-sensitive material, such properties of the compounds are utilised. However, their light-sensitivity is insufficient. This problem arises because it is difficult to optically sensitize the o-quinonediazide compounds and their quantum yield essentially never exceeds 1. Moreover, the wave length used for exposing the same is limited to a specific one and, therefore, tolerance with respect to light sources is narrow. In other words, it is difficult to impart resistance to incadescent rays to the composition. In addition, the absorption of light in Deep-UV region ranging from about 200 to 300 nm is great and thus it is not suitable for applications in which light of short wave length is used to enhance the resolution of a photoresist.

Many attempts have been made to improve the light-sensitivity of light-sensitive compositions containing o-quinonediazide compounds. However, it is very difficult to improve the light-sensitivity while maintaining the development tolerance during development. For instance, examples of such attempts are disclosed in Japanese Patent Publication for Opposition Purpose (hereunder referred to as "J.P. KOKOKU") No. Sho 48-12242, Japanese Patent Un-examined Publication (hereunder referred to as "J.P. KOKAI") No. Sho 52-40125 and U.S. Pat. No. 4,307,173.

Recently, there have been proposed some positive working light-sensitive compositions free of o-quinonediazide compounds. One example thereof comprises a polymeric compound having o-nitrocarbinol ester groups as disclosed in J.P. KOKOKU No. Sho 56-2696. However, such a composition does not provide high sensitivity for the same reasons as those discussed above in connection with o-quinonediazide compounds.

Separately, there have been proposed methods to improve light-sensitivity using a light-sensitive system which is catalytically activated, wherein a known principle is used that a photolytically generated acid causes a second reaction which makes resist in exposed areas soluble. Examples of the methods include combinations of photolytically acid producing compound and acetal or O- or N-acetal compound (J.P.KOKAI No. Sho 48-89003), orthoester or amideacetal compound (J.P.KOKAI No. Sho 51-120714), polymer having in the main chain acetal or ketal groups (J.P.KOKAI No. Sho 53-133429), enolether compound (J.P.KOKAI No Sho 55-12995), N-acylimino carbonic acid compound (J.P.KOKAI No. Sho 55-126236), polymer having in the main chain orthoester groups (J.P.KOKAI No. Sho 56-17345), silyl ester compound (J.P.KOKAI No. Sho 60-10247), and silyl ether compound (J.P.KOKAI Nos. Sho 60-37549 and 60-121446). Since quantum yield principally exceeds 1 in these combinations, high light-sensitivity is realized. However, there are such problems as storage stability over time, and change in sensitivity during the time between exposure to light and development.

There have been also proposed systems which are stable over time at room temperature but are decomposed by heat in the presence of an acid to become alkali-soluble. Examples of such systems include a combination of a compound which produces an acid upon exposure to light and secondory or tertiary carbon (e.g. t-butyl or 2-cyclohexenyl) ester or carbonic acid ester compound disclosed in J.P.KOKAI Nos. Sho 59-45439, 60-3625, 62-229242, and 63-36240, Polym. Eng. Sci., vol. 23, page 1012, (1983), ACS. Sym., vol. 242, page 11 (1984). Semiconductor World (1987), November, page 91, Macromolecules, vol. 21, page 1475 (1988) and SPIE, vol. 920, page 42 (1988). In fact, these systems are good in storage stability over time and small in sensitivity change over time after exposure to light. However, they are low in resistance to oxygen plasma when they are used as resist materials for semiconductor.

On the other hand, as pattern-forming methods used in making electronic parts such as semiconductor elements, magnetic bubble memories and integrated circuits, there have been widely employed methods in which a photoresist sensitive to ultraviolet and visible rays. The photoresists are classified into two groups, one of which is negative working type ones whose exposed portions are made insoluble in a developer by irradiating with light, and the other of which is positive working ones whose exposed portions are, on the contrary, made soluble in a developer. The negative working type ones are superior in sensitivity to the positive working ones and adhesion to a substrate and resistance to chemicals required in wet etching are also excellent. Therefore, the use of negative working resists is one of the mainstreams of photolithography. However, the line width and the distance between lines of patterns become smaller as the degree of integration of semiconductor elements and the packaging density thereof are increased. In addition, dry etching techniques have been adopted as a means for etching substrates. Thus, the photoresists should have high resolution and high resistance to dry etching. For this reason, positive working photoresists are mainly utilized recently. In particular, there have been exclusively used alkali developable positive working photoresists mainly composed of alkali-soluble novolak resins as disclosed in J. C. Strieter, Kodak Microelectronics Seminar Proceedings, 1976, p. 116, since they are excellent in sensitivity, resolution and resistance to dry etching.

However, it is required to further scale down the size of patterns to thus achieve more higher packaging density and degree of integration accompanied by the recent increase in multifunctionality and high functionality of electronic devices.

More specifically, the size of integrated circuits in their transversal direction is greatly reduced, but the size thereof in the longitudinal direction cannot be reduced so much. Therefore, the ratio of the height of the resist patterns to the width thereof is correspondingly increased. For this reason, it becomes very difficult to restrict the change in size of the resist patterns on a semiconductor wafer having a complicated stepped structure as the scale down of patterns proceeds. In addition, various methods for exposure suffer from problems as the scale down in the minimum size of patterns. For instance, the exposure by means of light causes interference effect due to light reflected by the stepped portions of the substrate which greatly affects dimensional accuracy. On the other hand, in the exposure by means of an electron beam, the ratio of the height to the width of fine resist patterns cannot be increased because of the proximity effect caused due to backscattering of electrons.

It is found that most of these problems can be eliminated by the use of a multilayered resist system. The multilayered resist system is summarized in Solid State Technology, 74 (1981) and a variety of investigations on the multilayered resist system have been reported. In general, the multilayered resist methods are classified into triple layer resist method and double layer resist method. The triple layer resist method comprises applying an organic film for leveling onto the surface of a stepped substrate, and then applying thereto an inorganic intermediate layer and a resist layer in this order; patterning the resist layer, dry etching the inorganic layer using the patterned resist layer as a mask, and finally patterning the organic leveling layer by $O_2$ RIE (reactive ion etching) technique using the inorganic layer as a mask to form a desired pattern on the stepped substrate. The investigation of this method has been started from earlier stage since it can essentially utilize techniques conventionally known, but it requires the use of very complicated processes, or since these layers, i.e., an organic film, an inorganic film and an organic film which differ in physical properties from each other are superposed, the intermediate layer is liable to cause cracks or to form pinholes. Contrary to the triple layer resist method, the double layer resist method utilizes a resist having properties of both resist and inorganic intermediate layers in the triple layer resist method, more specifically a resist resistant to oxygen plasma etching and thus the formation of cracks and pinholes can be suppressed. Further, since the number of layers are reduced from 3 to 2, the process can be simplified. However, a conventional resist can be used as the upper resist in the triple layer resist method while, in the double layer resist method, it is required to newly develop a resist excellent in resistance to oxygen plasma.

Under such circumstances, there has been required to develop a highly sensitive positive working photoresist having a high degree of resolution which is excellent in resistance to oxygen plasma and can hence be used as an upper resist in the double layer resist method or the like, in particular an alkaline developable resist which can be used without changing the processes currently employed.

As such a resist, there have been proposed light-sensitive compositions comprising a combination of a conventional o-quinonediazide light-sensitive material and a silicone polymer such as polysiloxane or polysilmethylene which is made alkali-soluble, for instance, those disclosed in J.P. KOKAI Nos. Sho 61-256347, Sho 61-144639, Sho 62-159141, Sho 62-191849, Sho 62-220949, Sho 62-229136, Sho 63-90534 and Sho 63-91654 and U.S. Pat. No. 4,722,881.

All these silicone polymers are made alkali soluble by introduction of phenolic OH group or silanol group ($\equiv$Si—OH). The introduction of phenolic groups are very difficult and silicone polymers having silanol groups are not always stable over time.

Examples of resists not having orthoquinonediazide compound include a light-sensitive composition comprising a combination of a polysiloxane/carbonate block copolymer and an effective amount of an onium salt disclosed in J.P.KOKAI No. Sho 62-136638, silicone polymer having nitrobenzylphenylether groups disclosed in J.P.KOKAI No. Sho 63-146038. However, it is very difficult to produce these polymers. Further, alkali solubility of the polymers exposed to light is not sufficient.

SUMMARY OF THE INVENTION

Accordingly, an object of the present invention is to provide novel positive working light-sensitive compositions which make it possible to solve the foregoing problems, more specifically to provide novel positive working light-sensitive compositions having high sensitivity and high tolerance with respect to light sources.

Another object of the present invention is to provide an alkali-developable positive working light-sensitive composition exhibiting excellent resistance to oxygen plasma.

A further object of the present invention is to provide a novel positive working light-sensitive composition which can easily be produced and can hence be easily available.

A still further object of the present invention is to provide novel positive working light-sensitive compositions which do not produce gas upon exposure to light and do not cause coupling reaction upon development.

A further object of the present invention is to provide a novel siloxane polymer which can be used as a component or an intermediate of the positive working light-sensitive composition mentioned above.

A still further object of the present invention is to provide a process for the preparation of the novel siloxane polymer.

The inventors of this invention have conducted various studies to achieve the foregoing objects and have completed the present invention.

The present invention provides a novel siloxane polymer having at least 1 mol % of a structural unit derived from a product of a cyclic heat addition reaction between a diene compound of formula (I) or (II) described below and an olefin or acetylene compound of formula (III), (IV) or (V) described below.

The present invention also provides a novel siloxane polymer having at least 1 mol % of a structural unit derived from a product of a cyclic heat addition reaction between a diene compound of formula (I) or (II)

and an olefin or acetylene compound of formula (V') described below.

The present invention further provides a process for the preparation of the siloxane polymer described above.

The present invention further provides a positive working light-sensitive composition comprising an alkali soluble polymer and the siloxane polymer described above.

The present invention further provides a positive working light-sensitive composition comprising a compound capable of generating an acid through irradiation with actinic rays or radiant rays and the siloxane polymer described above.

The present invention provides a positive working light-sensitive composition comprising a condensate of a naphthoquinonediazide compound and the siloxane polymer described above.

DETAILED EXPLANATION OF THE INVENTION

The present invention, and in particular Formula (I)-(V') discussed above, will now be explained in detail.

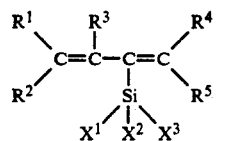  (I)

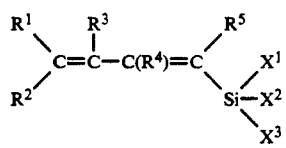  (II)

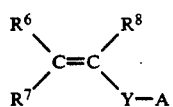  (III)

  (IV)

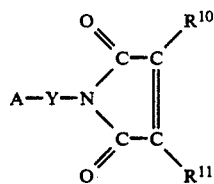  (V)

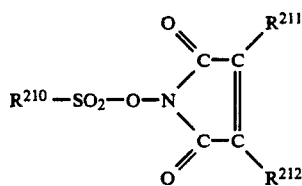  (V')

wherein $R^1$ to $R^5$ may be same or different and represent hydrogen atoms, alkyl, aryl or alkoxy groups, preferably hydrogen atoms, linear, branched or cyclic alkyl groups having 1 to 10 carbon atoms, mono- or poly-cyclic aryl groups having 6 to 15 carbon atoms and alkoxy groups having 1 to 8 carbon atoms;

$R^6$ to $R^9$ may be same or different and represent hydrogen or halogen atoms, cyano, alkyl, aryl, alkoxy, $-SO_2-R^{12}$, $-SO_3-R^{12}$, $-CO-R^{12}$, $-CO-NH-R^{12}$, $-COO-R^{12}$, or $-Y-A$, preferably hydrogen or chlorine atoms, cyano, linear, branched or cyclic alkyl groups having 1 to 6 carbon atoms, mono- or poly-cyclic aryl groups having 6 to 10 carbon atoms and alkoxy groups having 1 to 6 carbon atoms, $-SO_2-R^{12}$, $-SO_3-R^{12}$, $-CO-R^{12}$, $-CO-NH-R^{12}$, $-COO-R^{12}$, or $-Y-A$, more preferably hydrogen atoms, $-SO_2-R^{12}$, $-SO_3-R^{12}$, $-CO-R^{12}$, $-CO-NH-R^{12}$, $-COO-R^{12}$, or $-Y-A$;

$R^{12}$ represents an alkyl or aryl group, preferably a linear, branched or cyclic alkyl group having 1 to 10 carbon atoms, or a mono- or poly-cyclic aryl group having 6 to 15 carbon atoms;

$R^{10}$ and $R^{11}$ represent hydrogen atoms, alkyl or aryl groups, preferably hydrogen atoms or linear or branched alkyl groups having 1 to 4 carbon atoms; two of $R^6$ to $R^8$ and Y, or $R^{10}$ and $R^{11}$ may combine to form a ring;

Y represents a single bond, a divalent aromatic or aliphatic hydrocarbon group, preferably a single bond, a linear or branched alkylene group having 1 to 4 carbon atoms, or a mono- or poly-cyclic arylene group having 6 to 10 carbon atoms; Y may contain such a group as ketone, ether, ester, amide, urethane, ureido, etc.;

$R^{210}$ represents an alkyl or aryl group, preferably a linear, branched or cyclic alkyl groups having 1 to 10 carbon atoms or a mono- or poly-cyclic aryl group having 6 to 15 carbon atoms;

$R^{211}$ and $R^{212}$ represent hydrogen atoms, alkyl or aryl groups, preferably hydrogen atoms or linear or branched alkyl groups having 1 to 4 carbon atoms; $R^{211}$ and $R^{212}$ may combine to form a ring; and A represents a photoreactive or photoresponsible group or an acid decomposable group.

Examples of a photoreactive or photoresponsible group are as follows.

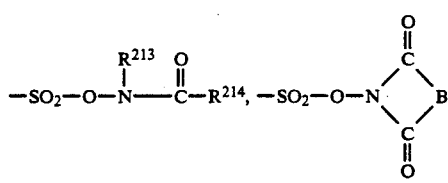  (a)

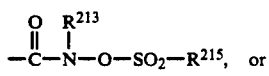

wherein $R^{213}$ to $R^{215}$ may be same or different and represent alkyl or aryl groups, preferably linear, branched or cyclic alkyl groups having 1 to 10 carbon atoms or mono- or poly-cyclic aryl groups having 6 to 15 carbon atoms, or aryl groups substituted by an alkyl group having 1 to 6 carbon atoms, an alkoxy group having 1 to 8 carbon atoms, a halogen atom, a carboxy, carboxyester, cyano, dialkylamino or nitro group; B represents a divalent alkylene or arylene group, preferably a linear, branched or cyclic alkylene group having 1 to 12 carbon atoms or a mono- or poly-cyclic arylene group having 6 to 15 carbon atoms; and Z represents a trivalent alkylene or arylene group, preferably a mono- or poly-cyclic arylene group having 6 to 10 carbon atoms.

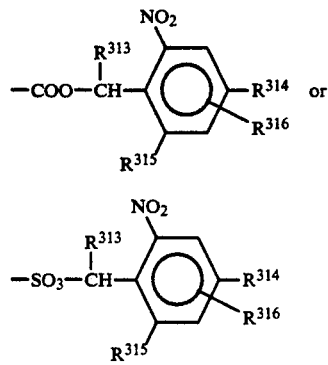

wherein
$R^{313}$ represents a hydrogen atom, an alkyl or aryl group, preferably a hydrogen atom, a linear, branched or cyclic alkyl group having 1 to 6 carbon atoms;
$R^{314}$ and $R^{315}$ may be same or different and represent hydrogen atoms, nitro, alkoxy or dialkylamino groups, preferably hydrogen atoms or nitro groups; and
$R^{316}$ represents a hydrogen or halogen atom, a nitrile, alkyl, aryl or alkoxy group, preferably a hydrogen atom, a linear or branched alkyl group having 1 to 4 carbon atoms, an alkoxy group having 1 to 6 carbon atoms or a nitrile group.

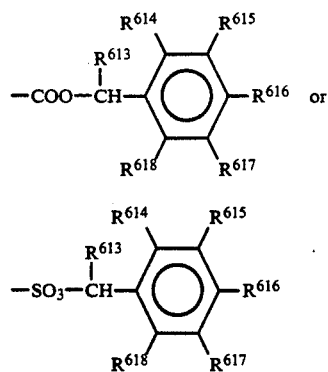

wherein
$R^{613}$ represents a hydrogen atom, an alkyl or aryl group, preferably a hydrogen atom, a linear, branched or cyclic alkyl group having 1 to 6 carbon atoms;
$R^{614}$ to $R^{618}$ may be same or different and represent hydrogen or halogen atoms, alkoxy, aryloxy, cyano or alkyl groups, preferably hydrogen or chlorine atoms, alkoxy groups having 1 to 6 carbon atoms, aryloxy groups having 6 to 15 carbon atoms or linear or branched alkyl groups having 1 to 4 carbon atoms, more preferably hydrogen atoms, alkoxy groups having 1 to 6 carbon atoms, provided that at least one of $R^{614}$ to $R^{618}$ represents an alkoxy or aryloxy group, preferably at least one of $R^{614}$ to $R^{615}$ represents an alkoxy or aryloxy group, and two of $R^{614}$ to $R^{618}$ may combine to form a ring. Specific examples of A represented by the formula (c) include esters and sulfonates groups of 2-alkoxybenzyl, 3-alkoxybenzyl, 2,3-dialkoxybenzyl, 2,4-dialkoxybenzyl, 2,5-dialkoxybenzyl, 2,6-dialkoxybenzyl, 3,4-dialkoxybenzyl, 3,5-dialkoxybenzyl, 2,3,4-trialkoxybenzyl and 3,4,5,-trialkoxybenzyl.

$$-SO_2-SO_2-Ar, \quad (d)$$

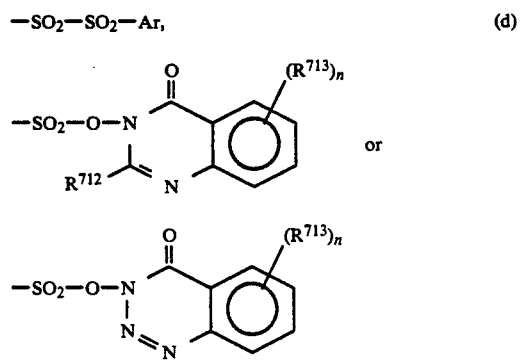

wherein
$R^{712}$ represents an alkyl, alkenyl or aryl group, more specifically a linear, branched or cyclic alkyl group having preferably 1 to 10 carbon atoms, or an alkyl group substituted by a halogen atom such as a chlorine atom, an alkoxy group having 1 to 6 carbon atoms such as a methoxy group, an aryl group such as a phenyl group or an aryloxy group such as a phenoxy group; an alkenyl group such as a vinyl group or a vinyl group substituted by an alkyl group having 1 to 6 carbon atoms such as a methyl group, or an aryl group such as a phenyl group; a mono- or di-cyclic aryl group such as a group having 1 to 6 carbon atoms, an alkoxy group having 1 to 6 carbon atoms, a halogen atom, a nitro, cyano, carboxyl or phenyl group;
$R^{713}$ represents a hydrogen or halogen atom, an alkyl, aryl or alkoxy group, preferably a chlorine or bromine atom as a halogen atom; an alkyl group having 1 to 6 carbon atoms, an alkyl group substituted by a halogen atom such as a chlorine atom or an alkoxy group having 1 to 6 carbon atoms; a monocyclic aryl group or a mono-cyclic aryl group substituted by an alkyl group having 1 to 6 carbon atoms or by a halogen atom; an alkoxy group having 1 to 6 carbon atoms; and two $R^{713}$ groups may combine to form a ring;
$R^{714}$ represents an alkyl or aryl group, preferably a linear, branched or cyclic alkyl group having 1 to 10 carbon atoms or a mono- or poly-cyclic aryl group having 6 to 15 carbon atoms or a mono- or poly-cyclic aryl group having 6 to 15 carbon atoms substituted by an alkyl group having 1 to 6 carbon atoms, an alkoxy group having 1 to 8 carbon atoms, a halogen atom, a carboxy, carboxyester, cyano, dialkylamino or nitro group;
Ar represents an aryl group, preferably a mono- or di-cyclic aryl group such as a phenyl or naphtyl group or a mono- or di-cyclic aryl group substituted by an alkyl group having 1 to 6 carbon atoms such as a methyl or ethyl group, an alkoxy group having 1 to 6 carbon atoms such as a methoxy or ethoxy group, a halogen atom such as a chlorine or bromine atom, a nitro, carboxyl, hydroxy, carboxyester, carbonate, cyano or dialkylamino group; and n is an integer of 0 to 4.

Examples of acid decomposable groups represented by A are as

Examples of acid decomposable groups represented by A are as follows.

$$-CO-O-R^{113} \text{ or } -O-CO-O-R^{113} \quad (e)$$

wherein $R^{113}$ represents

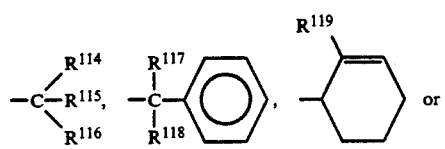

$$\begin{array}{c} R^{120} \\ | \\ -CH-CH=CH_2 \end{array} \quad \text{preferably}$$

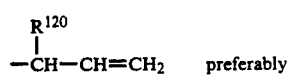

wherein
- $R^{114}$ to $R^{118}$ may be same or different and represent alkyl or aryl groups, preferably linear or branched alkyl groups having 1 to 4 carbon atoms or mono- or poly-cyclic aryl groups having 6 to 10 carbon atoms, or linear or branched alkyl groups having 1 to 4 carbon atoms substituted by a halogen atom such as a chlorine or bromine atom; and
- $R^{117}$ to $R^{120}$ may be same or different and represent hydrogen atoms or alkyl groups, preferably linear or branched alkyl groups having 1 to 4 carbon atoms.

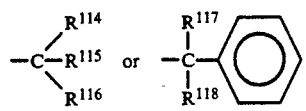

wherein
- $R^{413}$ to $R^{418}$ may be same or different and represent alkyl, aryl, aralkyl or $-O-R^{419}$ groups, preferably linear, branched or cyclic alkyl groups having 1 to 10 carbon atoms, mono- or poly-cyclic aryl groups having 6 to 15 carbon atoms or aralkyl groups having 7 to 15 carbon atoms, or these groups substituted by a halogen atom, a cyano, nitro or alkoxy group; and
- $R^{419}$ represents an alkyl or aryl group, preferably a linear, branched or cyclic alkyl group having 1 to 8 carbon atoms or a mono- or poly-cyclic aryl group having 6 to 10 carbon atoms.

A also represent the following group (g).

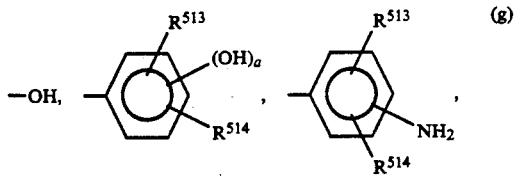

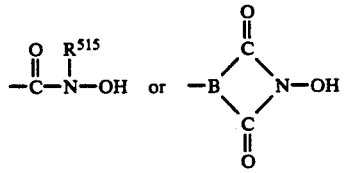

wherein
- $R^{513}$ and $R^{514}$ may be same or different and represent hydrogen or halogen atoms, cyano, nitro, alkyl, aryl, alkoxy, $-CO-R^{515}$, $-COO-R^{515}$, $-O-CO-R^{515}$, $-NHCO-R^{515}$, $-CONH-R^{515}$, $-NHCONH-R^{515}$, $-NHCOO-R^{515}$ or $-OCONH-R^{515}$, preferably hydrogen or chlorine atoms, nitro, linear, branched or cyclic alkyl groups having 1 to 8 carbon atoms, alkoxy groups having 1 to 6 carbon atoms, $-CO-R^{515}$, $-COO-R^{515}$, $-O-CO-R^{515}$, $-NHCO-R^{515}$, $-CONH-R^{515}$, $-NHCONH-R^{515}$, $-NHCOO-R^{515}$ or $-OCONH-R^{515}$, more preferably hydrogen or chlorine atoms, linear or branched alkyl groups having 1 to 4 carbon atoms, alkoxy groups having 1 to 4 carbon atoms, $-CO-R^{515}$, $-COO-R^{515}$, $-NHCO-R^{515}$, $-CONH-R^{515}$, $-NHCONH-R^{515}$ or $-OCONH-R^{515}$;
- $R^{515}$ represents an alkyl or aryl group, preferably linear, branched or cyclic alkyl groups having 1 to 10 carbon atoms, or mono- or poly-cyclic aryl groups having 6 to 15 carbon atoms, the aryl groups may be substituted by an alkyl group having 1 to 6 carbon atoms, an alkoxy group having 1 to 8 carbon atoms, a halogen atom, a carboxy, carboxyester, cyano or nitro group;
- B represents a divalent alkylene or arylene group, preferably a linear, branched or cyclic alkylene group having 1 to 12 carbon atoms or a mono- or poly-cyclic arylene group having 6 to 15 carbon atoms; and a represents an integer of 1 to 3.
- $X^1$, $X^2$ and $X^3$ may be same or different and represent halogen atoms, hydroxy, carboxy, oxime, amide, ureido, amino, alkyl, aryl, aralkyl, alkoxy, aryloxy, $-Y-A$,

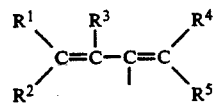

or

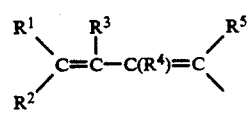

preferably chlorine atoms, linear, branched or cyclic alkyl groups having 1 to 10 carbon atoms, mono- or poly-cyclic aryl groups having 6 to 15 carbon atoms, aralkyl groups having 7 to 15 carbon atoms, alkoxy groups having 1 to 8 carbon atoms or aryloxy groups having 6 to 10 carbon atoms, provided that at least two of $X^1$, $X^2$ and $X^3$ are halogen atoms, hydroxy, carboxy, oxime, amide, ureido, amino, alkoxy or aryloxy groups.

The siloxane polymer of the present invention having a functional group may be prepared by a process which comprises the steps of:

(i) subjecting at least one compound of formula (I) or (II) and at least one compound of formula (III), (Iv) or (v) to a cyclic heat addition reaction;

(ii) hydrolyzing the reaction product of step (i); and (iii) subjecting the hydrolyzed product of step (ii) to a condensation reaction, whereby a siloxane polymer is produced: or a process which comprises the steps of:

(i) hydrolyzing at least one compound of formula (I) or (II);

(ii) subjecting the hydrolyzed product of step (i) to a condensation reaction; and (iii) subjecting the condensate of step (ii) to a cyclic heat addition reaction with at least one compound of formula (III), (IV) or (V), whereby a siloxane polymer is produced:

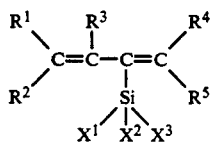
(I)

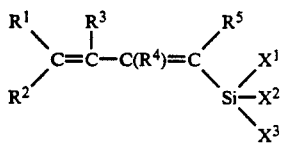
(II)

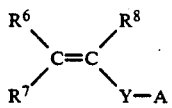
(III)

(IV)

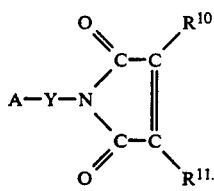
(V)

wherein
$R^1$ to $R^5$ may be same or different and represent hydrogen atoms, alkyl, aryl or alkoxy groups;

$R^6$ to $R^9$ may be same or different and represent hydrogen or halogen atoms, cyano, alkyl, aryl, alkoxy, $-SO_2-R^{12}$, $-SO_3-R^{12}$, $-CO-R^{12}$, $-CO-NH-R^{12}$, $-COO-R^{12}$, or $-Y-A$, wherein $R^{12}$ represents an alkyl or aryl group;

$R^{10}$ and $R^{11}$ represent hydrogen atoms, alkyl or aryl groups;

Y represents a single bond, a divalent aromatic or aliphatic hydrocarbon group;

A represents a functional group;

$X^1$, $X^2$ and $X^3$ may be same or different and represent alkyl, aryl, aralkyl, $-Y-A$,

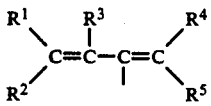

or

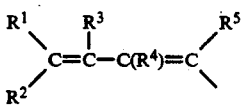

provided that at least two of $X^1$, $X^2$ and $X^3$ are hydrolyzable groups and two of $R^6$ to $R^8$ and Y or $R^{10}$ to $R^{11}$ may combine to form a ring.

Specific examples of the functional group include a group having pKa of not more than 12, an acid decomposable group and a photoreactive or photoresponsible group.

In the process of the present invention, at least one compound of formula (XII), (XIII), (XIV), (XV) or (XVI) described later in detail may coexist and cocondense in the steps of hydrolysis and condensation.

 (XII)

 (XIII)

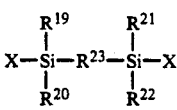 (XIV)

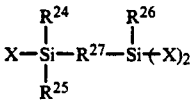 (XV)

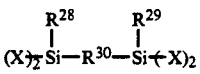 (XVI)

Wherein
$R^{16}$ to $R^{22}$, $R^{24}$ to $R^{26}$, and $R^{28}$ to $R^{29}$ may be same or different and each represents a hydrogen atom or an alkyl, substituted alkyl, aryl, substituted aryl, alkenyl, substituted alkenyl, allyl, silyl, substituted silyl, siloxy or substituted siloxy group, $R^{23}$, $R^{27}$ and $R^{30}$ may be same or different and each represents a single bond, a bivalent alkylene group, a substituted alkylene group, an arylene group or a substituted arylene group, and X represents a hydrolyzable group.

Further, in the process of the present invention, at least one olefin or acetylene compound of formula (III'), (IV') or (V') may coexist in the step of cyclic heat addition reaction to be introduced into the structure of the siloxane polymer:

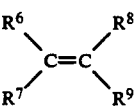 (III')

-continued

(IV')

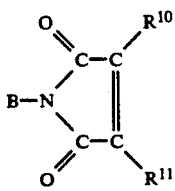
(V')

wherein
R$^6$ to R$^9$ may be same or different and represent hydrogen or halogen atoms, cyano, alkyl, aryl, alkoxy, —SO$_2$—R$^{12}$, —SO$_3$—R$^{12}$, —CO—R$^{12}$, —CO—NH—R$^{12}$, —COO—R$^{12}$, or —Y—A, wherein R$^{12}$ represents an alkyl or aryl group;

R$^{10}$ and R$^{11}$ represent hydrogen atoms, alkyl or aryl groups;

Y represents a single bond, a divalent aromatic or aliphatic hydrocarbon group;

A represents a functional group;

B represents a hydrogen atom, an alkyl or aryl group; provided that two of R$^6$ to R$^8$ and Y or R$^{10}$ to R$^{11}$ may combine to form a ring.

The cyclic heat addition reaction is carried out at a temperature ranging preferably from 50° C. to 200° C., more preferably from 70° C. to 140° C.

Siloxane polymers of the present invention will be explained in detail.

Siloxane Polymer (a)

Siloxane polymer (a) of the present invention contains N-oxyamidesulfonate group

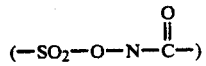

or N-oxyimidesulfonate group

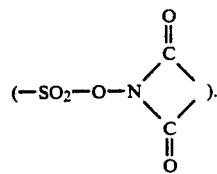

The siloxane polymer per se does not show good alkali solubility but when irradiated with actinic rays or radiant rays, the N-oxyamidesulfonate or N-oxyimidesulfonate group decomposes to form N-hydroxyamide, N-hydroxyimide or sulfonic acid group which makes the siloxane polymer alkali soluble.

Siloxane polymer (a) of the present invention may be produced by the two steps: a heat addition reaction between a compound represented by formula (I) or (II) and a compound represented by formula (III), (IV) or (V) and a condensation reaction to form a siloxane skeleton. In the course of the synthesis, it is unnecessary to use a metal catalyst (e.g., sodium, potassium or magnesium compounds) which would have a bad effect to resist properties.

Siloxane polymer (a) of the present invention is a siloxane polymer having a structure derived from cyclic heat addition products between a silyl substituted diene-compound represented by formula (I) or (II) and an olefin or acetylene compound having N-oxyamidesulfonate or N-oxyimidesulfonate group represented by formula (III), (IV) or (V'), that is, so-called Diels-Alder reaction products (VI), (VII), (VIII), (IX), (X') or (XI').

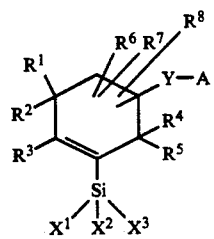
(VI)

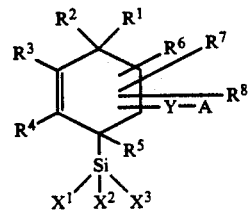
(VII)

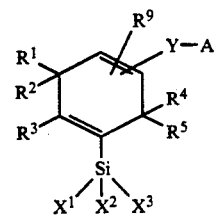
(VIII)

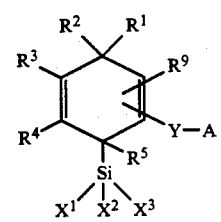
(IX)

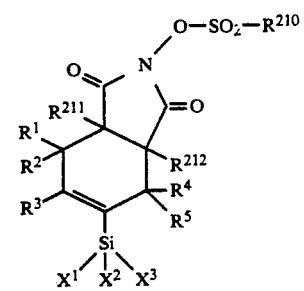
(X')

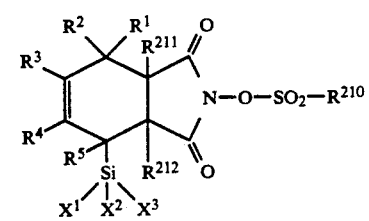
(XI')

wherein R$^1$ to R$^9$, R$^{210}$ to R$^{212}$, X$^1$ to X$^3$, Y and A are same as defined above.

The siloxane polymer of the present invention may be prepared by a method wherein one or more of the compound of formula (I) or (II) is hydrolyzed or alkoxylated and then condensed, to which the compound of formula (III), (IV) or (V) is heat-added, or a method wherein heat addition between the compound of formula (I) or (II) and the compound of formula (III), (IV) or (V) is carried out to form the compound of formula (VI), (VII), (VIII), (IX), (X') or (XI'), one or more of which product is hydrolyzed or alkoxylated and then condensed.

An olefin or acetylene compound not having N-oxyamidesulfonate or N-oxyimidesulfonate group may coexist with the compound of formula (III), (IV) or (V) so that it is incorporated into the structure of the siloxane polymer of the present invention.

One or more of compound of formula (XII), (XIII), (XIV), (XV) and/or (XVI) may be present in the reaction system and co-condensed to improve the properties of the siloxane polymer.

The siloxane polymer contains at least one mol %, preferably 5 to 95 mol %, more preferably 10 to 80 mol % of the structural unit derived from the compound of formula (VI), (VII), (VIII), (IX), (X'), or (XI').

  (XII)

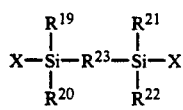  (XIII)

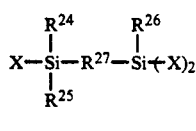  (XIV)

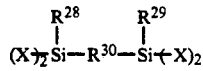  (XV)

(XVI)

In the foregoing formulas, $R^{16}$ to $R^{22}$, $R^{24}$ to $R^{26}$, and $R^{28}$ to $R^{29}$ may be same or different and each represents a hydrogen atom or an alkyl, substituted alkyl, aryl, substituted aryl, alkenyl, substituted alkenyl, allyl, silyl, substituted silyl, siloxy or substituted siloxy group.

More specifically, the alkyl group may be a linear, branched or cyclic one preferably having about 1 to about 10 carbon atoms and specific examples thereof include methyl, ethyl, propyl, butyl, hexyl, octyl, decyl, iso-propyl, iso-butyl, tert-butyl, 2-ethylhexyl and cyclohexyl groups. The substituted alkyl group may be those listed above which are substituted with a halogen atom such as chlorine atom, an alkoxy group having 1 to 6 carbon atoms such as methoxy group, an aryl group such as phenyl group and/or an aryloxy group such as phenoxy group and specific examples thereof are monochloromethyl, dichloromethyl, trichloromethyl, bromomethyl, 2-chloroethyl, 2-bromoethyl, 2-methoxyethyl, 2-ethoxyethyl, phenylmethyl, naphthylmethyl and phenoxymethyl groups.

The aryl group may preferably be monocyclic or bicyclic ones such as phenyl, α-naphthyl and β-naphthyl groups. The substituted aryl groups may be those listed above which are substituted with alkyl group having 1 to 6 carbon atoms such as methyl and ethyl groups; alkoxy groups having 1 to 6 carbon atoms such as methoxy and ethoxy groups; halogen atoms such as chlorine atom; and/or nitro, phenyl, carboxy, hydroxy, amido, imido and/or cyano groups. Specific examples thereof are 4-chlorophenyl, 2-chlorophenyl, 4-bromophenyl, 4-nitrophenyl, 4-hydroxyphenyl, 4-phenylphenyl, 4-methylphenyl, 2-methylphenyl, 4-ethylphenyl, 4-methoxyphenyl, 2-methoxyphenyl, 4-ethoxyphenyl, 2-carboxyphenyl, 4-cyanophenyl, 4-methyl-1-naphtyl, 4-chloro-1-naphthyl, 5-nitro-1-naphthyl, 5-hydroxy-1-naphthyl, 6-chloro-2-naphthyl, 4-bromo-2-naphthyl and 5-hydroxy-2-naphthyl groups.

The alkenyl group is, for instance, a vinyl group and the substituted alkenyl group may be a vinyl group which is substituted with alkyl groups such as methyl group and/or aryl groups such as phenyl group. Specific examples of the substituted alkenyl groups are 1-methylvinyl, 2-methylvinyl, 1,2-dimethylvinyl, 2-phenylvinyl, 2-(p-methylphenyl)vinyl, 2-(p-methoxyphenyl)vinyl, 2-(p-chlorophenyl) vinyl and 2-(o-chlorophenyl)vinyl.

Examples of the silyl, substituted silyl groups are alkyl and/or aryl-substituted silyl groups such as trialkylsilyl and triarylsilyl groups. Such alkyl and aryl groups may be those listed above.

If these substituents each represents a siloxy or substituted siloxy group, these groups may be those bonded with siloxy or substituted siloxy groups of the adjacent structural units or those having a two-dimensional or three-dimensional structure such as those formed by bonding the siloxy or substituted siloxy group to that of other molecule as will be described below:

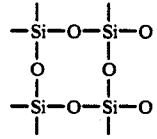

$R^{23}$, $R^{27}$ and $R^{30}$ may be same or different and each represents a single bond, a bivalent alkylene group, a substituted alkylene group, an arylene group or a substituted arylene group. More specifically, the alkylene group may be linear, branched or cyclic ones, particularly a linear alkylene group and preferably those having 1 to 10 carbon atoms such as methylene, ethylene, butylene and octylene groups. Examples of the substituted alkylene group are the foregoing alkylene groups which are substituted with halogen atoms such as chlorine atom, alkoxy groups having 1 to 6 carbon atoms and/or aryloxy groups having 6 to 10 carbon atoms.

The arylene group may preferably be monocyclic and bicyclic ones such as phenylene and naphthylene groups. Moreover, examples of the substituted arylene group are arylene groups which are substituted with alkyl groups having 1 to 6 carbon atoms such as methyl and ethyl groups, alkoxy groups having 1 to 6 carbon atoms such as methoxy and ethoxy groups and/or halogen atoms such as chlorine atom. Specific examples thereof are chlorophenylene, bromophenylene, nitrophenylene, phenylphenylene, methylphenylene, ethylphenylene, methoxyphenylene, ethoxyphenylene, cyanophenylene, methylnaphthylene, chloronaphthylene, bromonaphthylene and nitronaphthylene groups.

X represents a hydrolyzable group and specific examples thereof include halogen atoms such as chlorine and bromine atoms; alkoxy groups having 1 to 10 carbon atoms such as methoxy, ethoxy and propoxy groups; aryloxy groups having 6 to 10 carbon atoms such as phenoxy group; acyloxy groups having 1 to 10 carbon atoms such as acetoxy group; oxime groups having 1 to 6 carbon atoms such as methylaldoxime; amido, ureido and amino groups.

Specific examples of siloxane polymer (a) of the present invention are illustrated below.

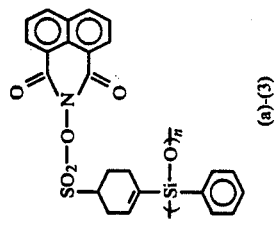
(a)-(3)
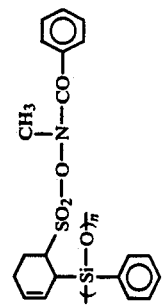
(a)-(6)
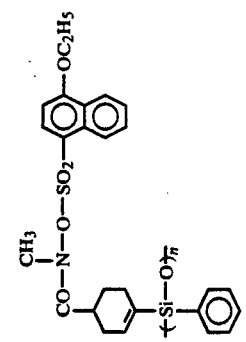
(a)-(9)
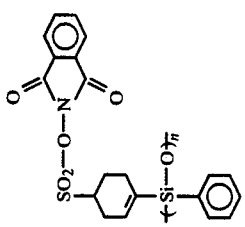
(a)-(2)
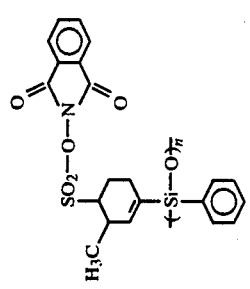
(a)-(5)
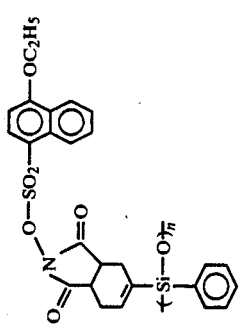
(a)-(8)
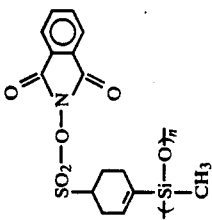
(a)-(1)
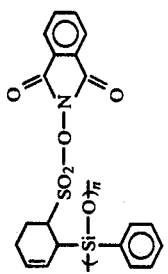
(a)-(4)
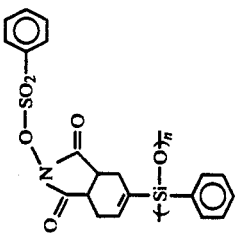
(a)-(7)

-continued
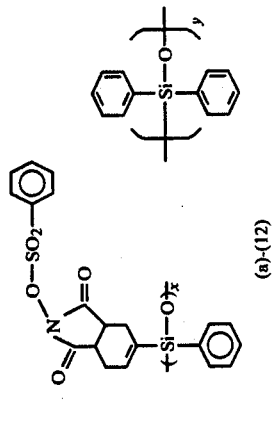
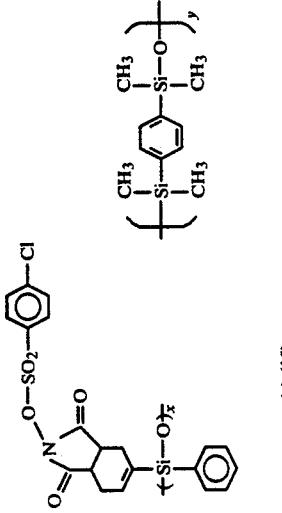
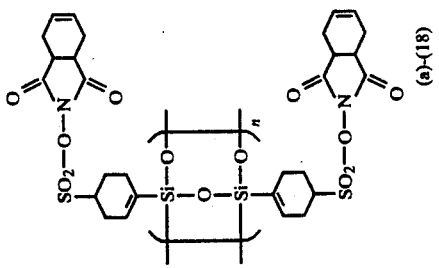
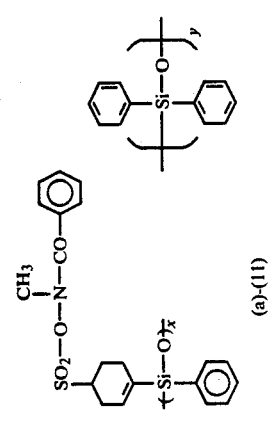
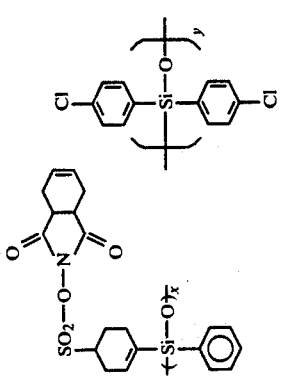
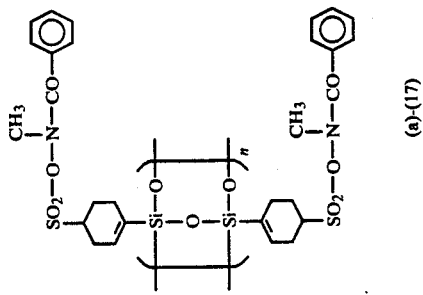
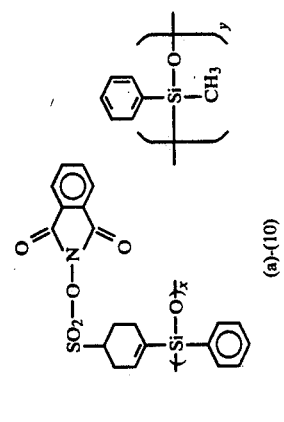
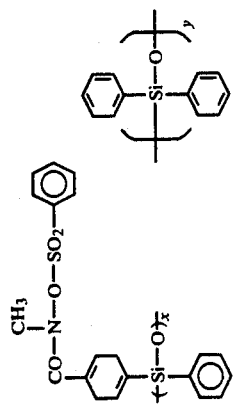
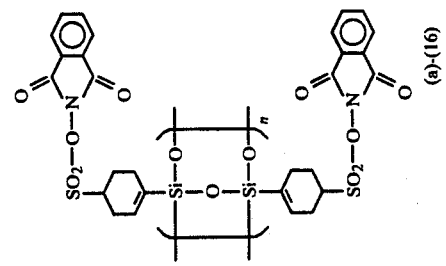

-continued
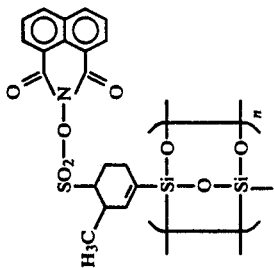 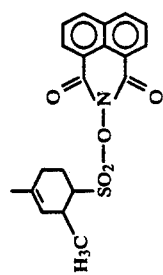 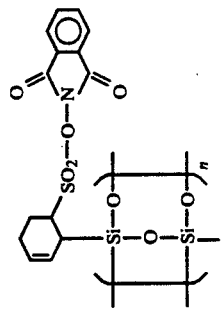
(a)-(21)
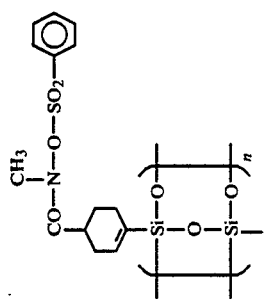  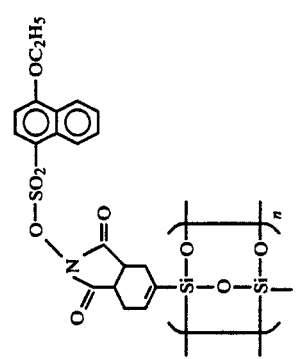
(a)-(20)
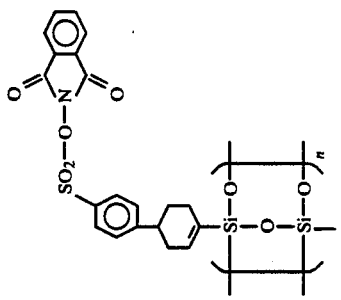 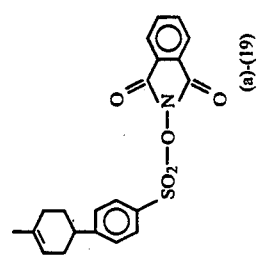 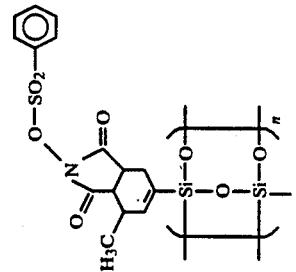
(a)-(19)

-continued
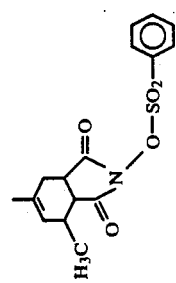 (a)-(22)
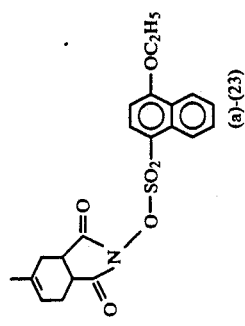 (a)-(23)
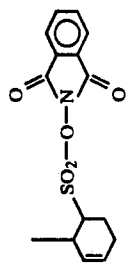 (a)-(24)
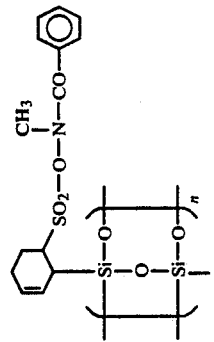 (a)-(25)
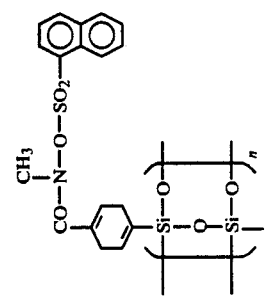 (a)-(26)
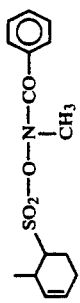 
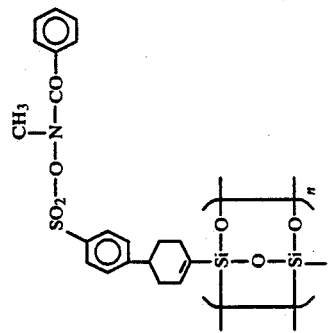 (a)-(27)
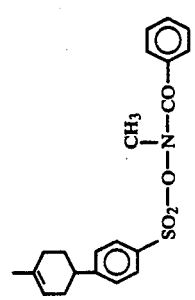
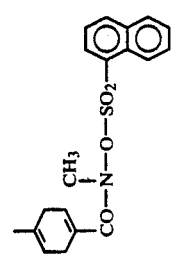

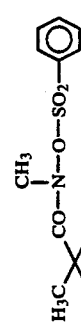
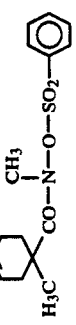
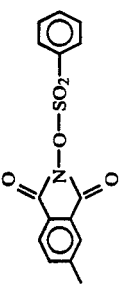
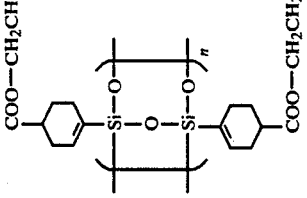
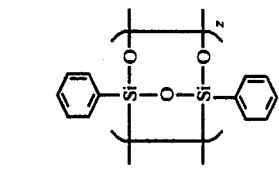
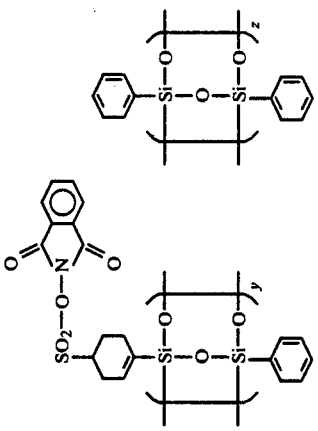
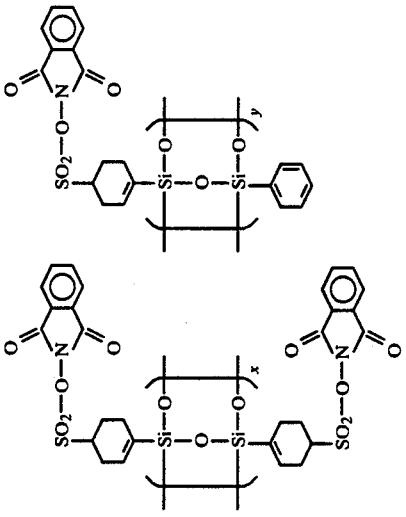

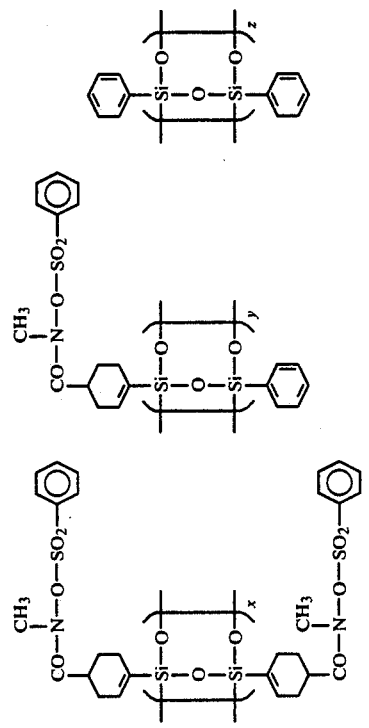
(a)-(32)
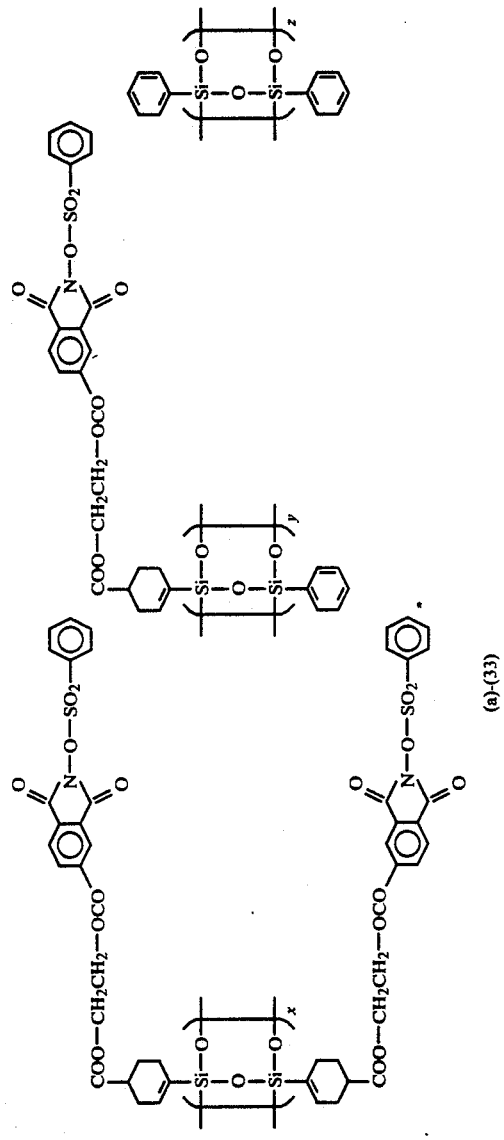
(a)-(33)

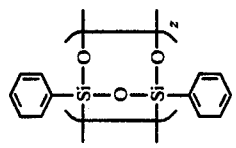
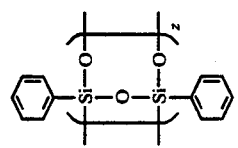
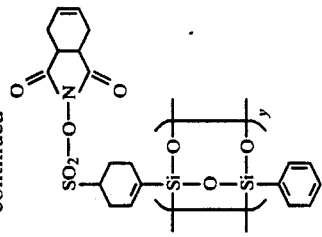
(a)-(34)
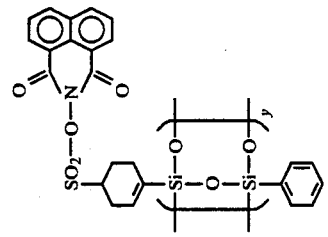
(a)-(35)
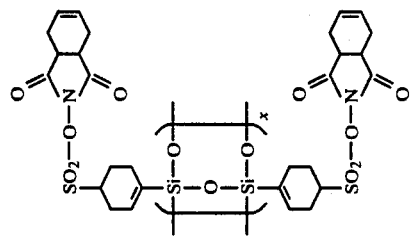
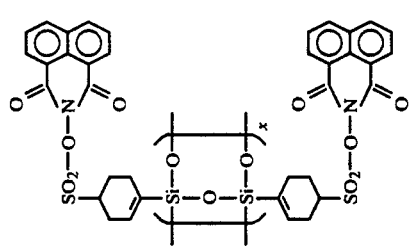

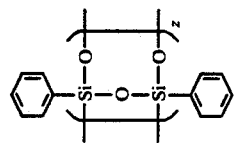
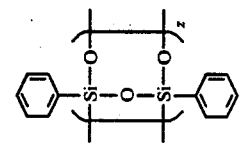
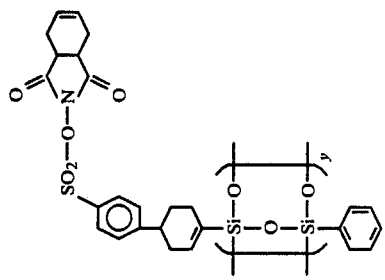
(a)-(36)
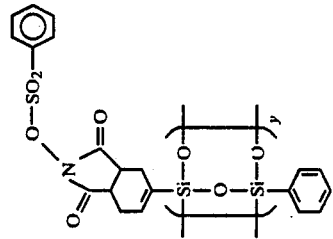
(a)-(37)
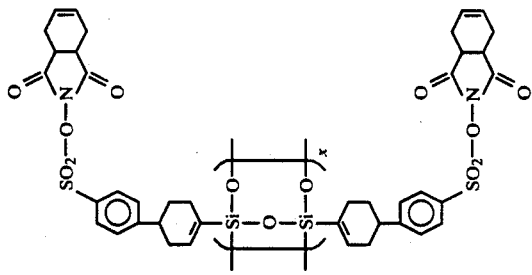
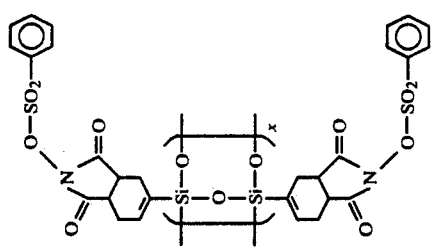

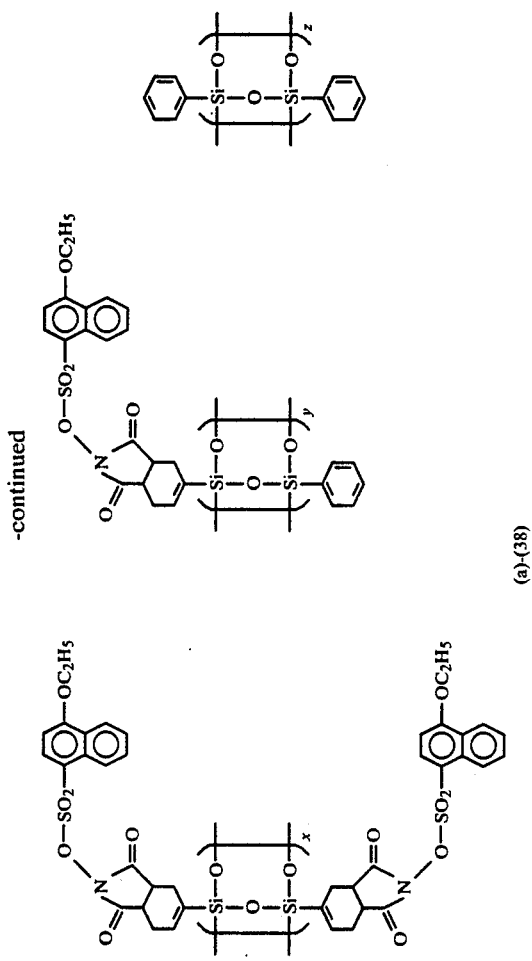
(a)-(38)

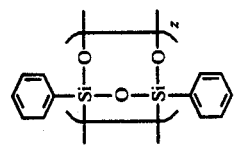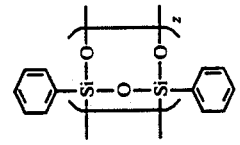
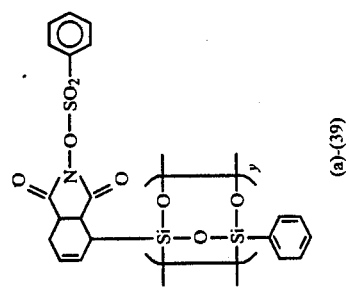
(a)-(39)
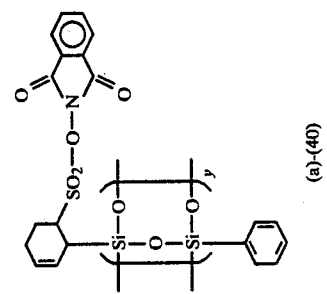
(a)-(40)
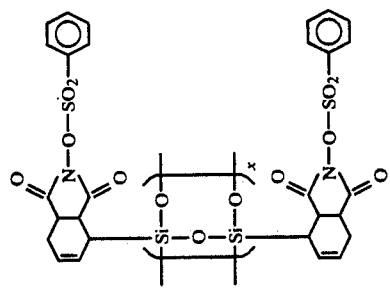

-continued
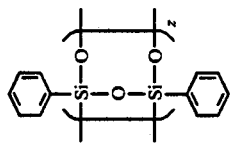 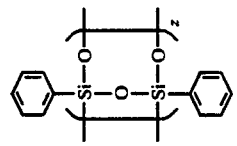
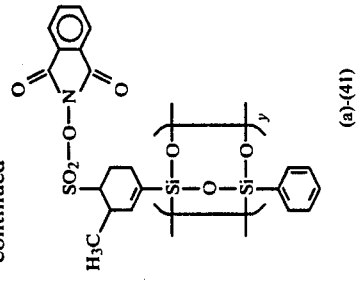
(a)-(41)
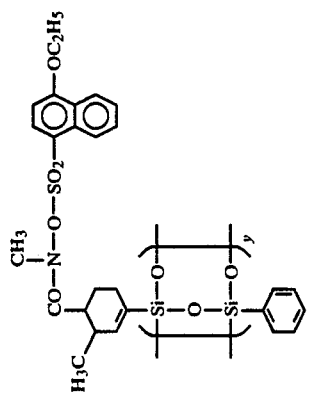
(a)-(42)
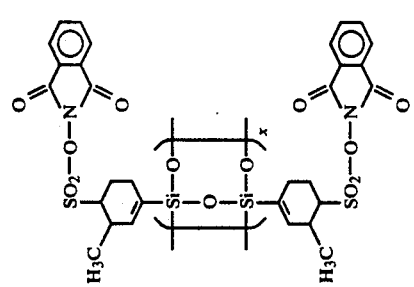
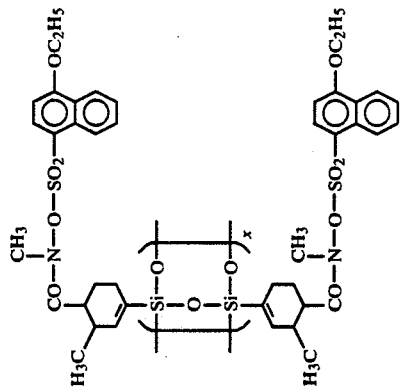

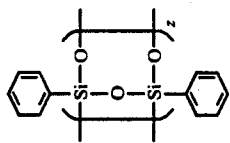 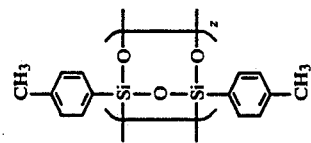 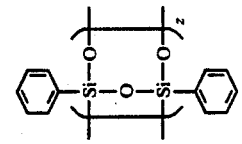
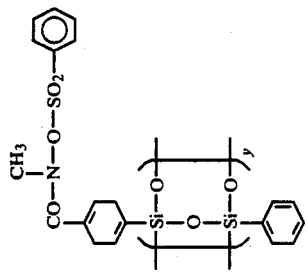
(a)-(43)
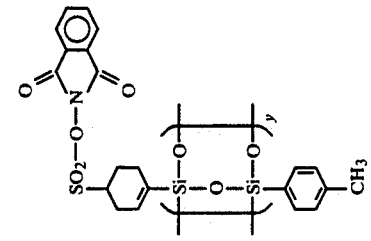
(a)-(44)
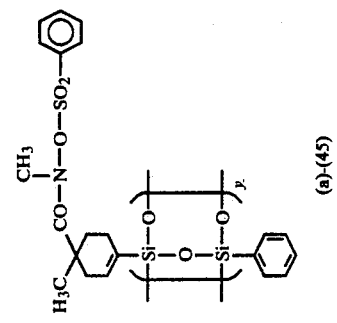
(a)-(45)
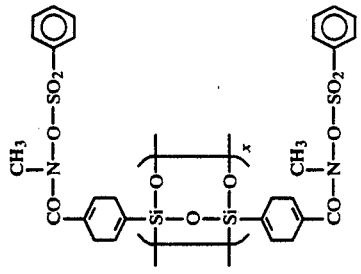 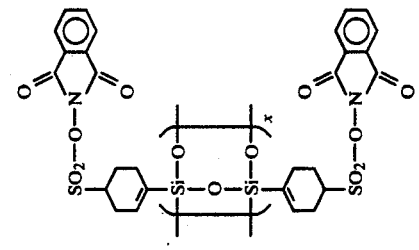 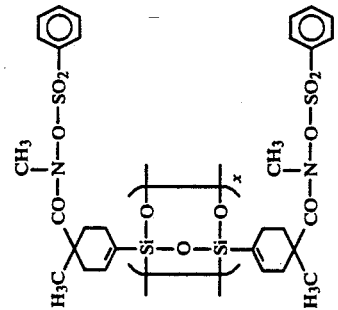

-continued
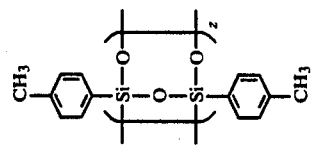
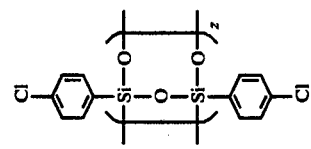
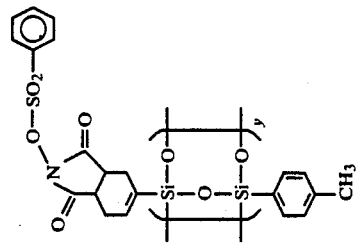
(a)-(46)
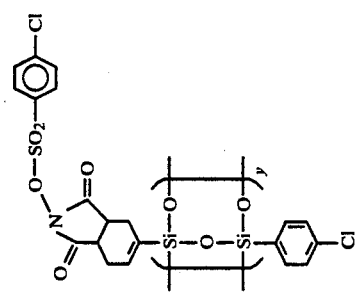
(a)-(47)
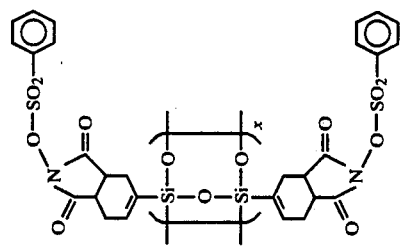
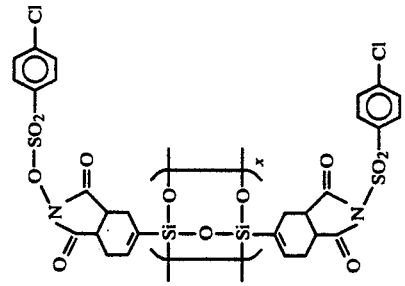

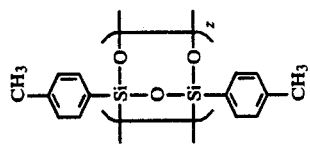
-continued
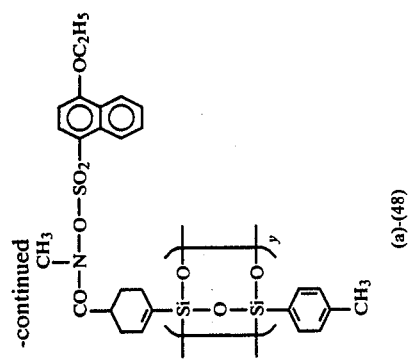
(a)-(48)
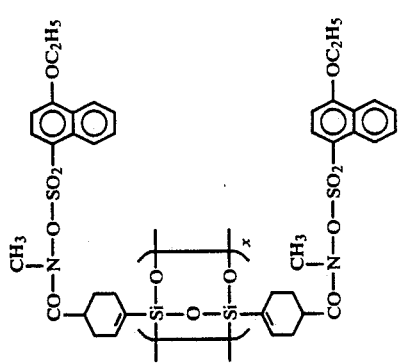

In the foregoing examples of the compound, n is an integer of not less than 1 and x, y and z each is an integer of not less than 0.

The molecular weight of the siloxane polymer (a) of the invention can freely be controlled by changing the condensation conditions, but preferred value thereof is not less than 500, more preferably 1,000 to 500,000 expressed in the weight averaged molecular weight.

An amount of the siloxane polymer to be contained in the positive working light-sensitive composition is generally 5 to 100% by weight, preferably 20 to 95%, more preferably 30 to 90% by weight based on the solid content of the light-sensitive composition.

Siloxane Polymer (b)

Siloxane polymer (b) of the present invention contains nitrobenzyl ester or nitrobenzyl sulfonate group. The siloxane polymer per se does not show good alkali solubility but when irradiated with actinic rays or radiant rays, the nitrobenzyl ester or nitrobenzyl sulfonate group decomposes according to known mechanism to form carboxylic acid or sulfonic acid group which makes the siloxane polymer alkali soluble.

Siloxane polymer (b) of the present invention may be produced by the two steps: a heat addition reaction between a compound represented by formula (I) or (II) and a compound represented by formula (III), (IV) or (V) and a condensation reaction to form a siloxane skeleton. In the course of the synthesis, it is unnecessary to use a metal catalyst (e.g., sodium, potassium or magnesium compounds) which would have a bad effect to resist properties.

Siloxane polymer (b) of the present invention is a siloxane polymer having a structure derived from cyclic heat addition products between a silyl substituted diene compound represented by formula (I) or (II) and an olefin or acetylene compound having nitrobenzyl ester or nitrobenzyl sulfonate group represented by formula (III), (IV) or (V), that is, so-called Diels-Alder reaction products (VI), (VII), (VIII), (IX), (X) or (XI).

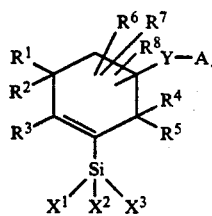

(VI)

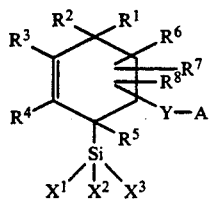

(VII)

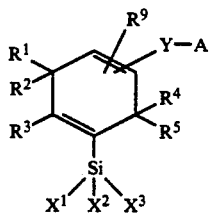

(VIII)

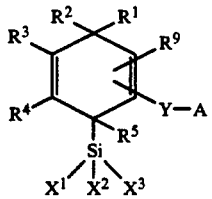

(IX)

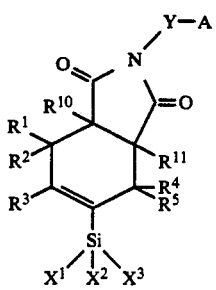

(X)

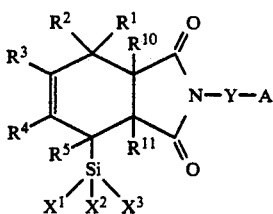

(XI)

wherein $R^1$ to $R^{11}$, $X^1$ to $X^3$, Y and A are same as defined above.

The siloxane polymer of the present invention may be prepared by a method wherein one or more of the compound of formula (I) or (II) is hydrolyzed or alkoxylated and then condensed, to which the compound of formula (III), (IV) or (V) is heat-added, or a method wherein heat addition between the compound of formula (I) or (II) and the compound of formula (III), (IV) or (V) is carried out to form the compound of formula (VI), (VII), (VIII), (IX), (X) or (XI), one or more of which product is hydrolyzed or alkoxylated and then condensed.

An olefin or acetylene compound not having nitrobenzyl ester or nitrobenzyl sulfonate group may coexist with the compound of formula (III), (IV) or (V) so that it is incorporated into the structure of the siloxane polymer of the present invention.

One or more of the compound of formula (XII), (XIII), (XIV), (XV) and/or (XVI) explained earlier may be present in the reaction system and co-condensed to improve the properties of the siloxane polymer.

The siloxane polymer contains at least one mol %, preferably 5 to 95 mol %, more preferably 10 to 80 mol % of the structural unit derived from the compound of formula (VI), (VII), (VIII), (IX), (X) or (XI).

Specific examples of siloxane polymer (b) of the present invention are illustrated below.

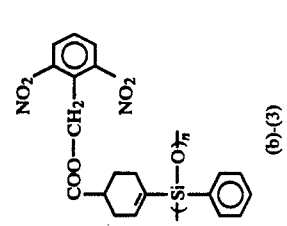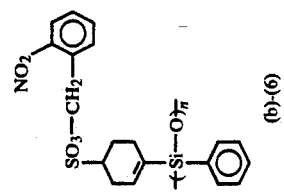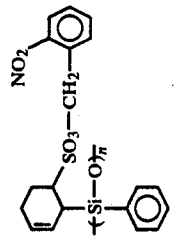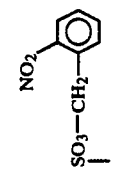
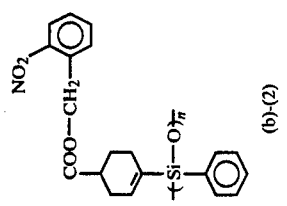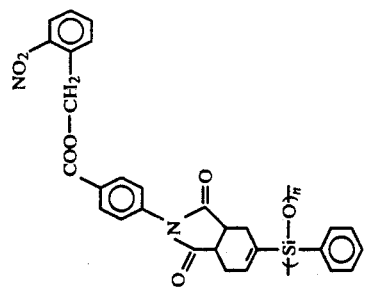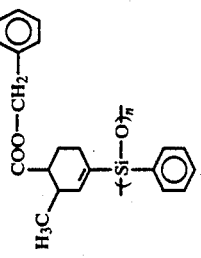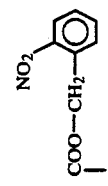
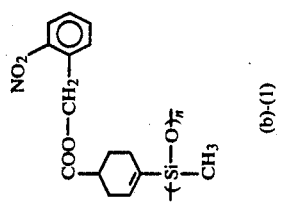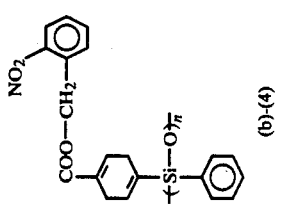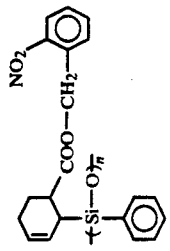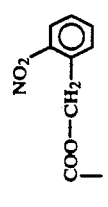

-continued
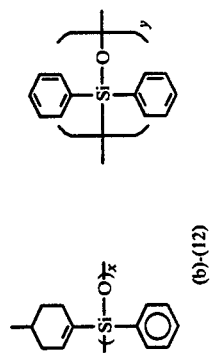 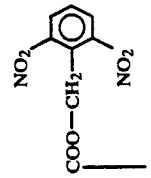 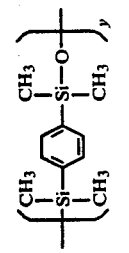 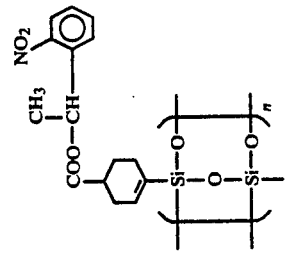
(b)-(12) (b)-(15)
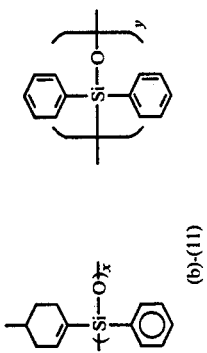 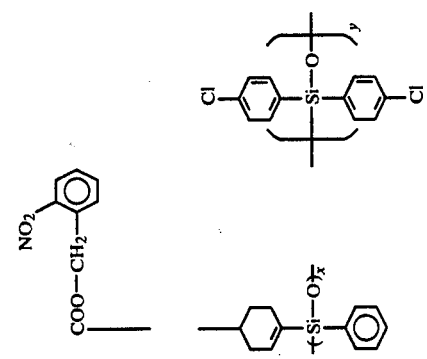 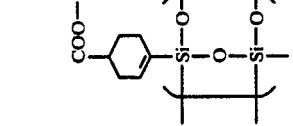
(b)-(11) (b)-(14)
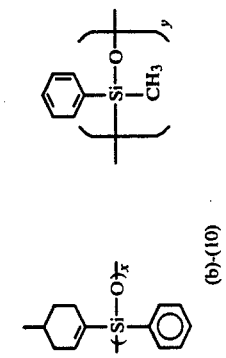 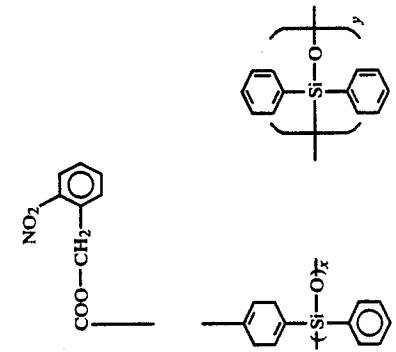 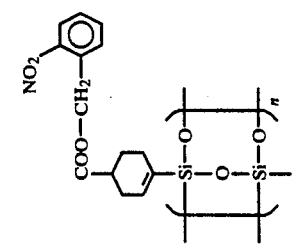
(b)-(10) (b)-(13)

-continued
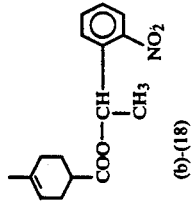
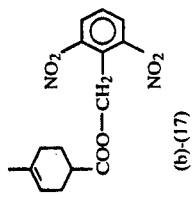
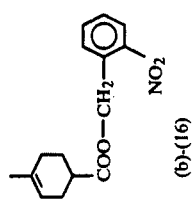
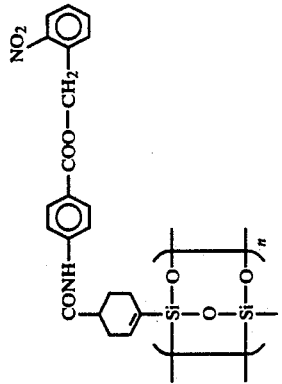
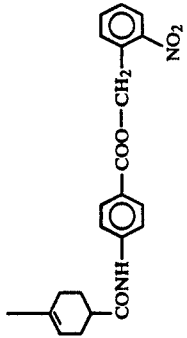
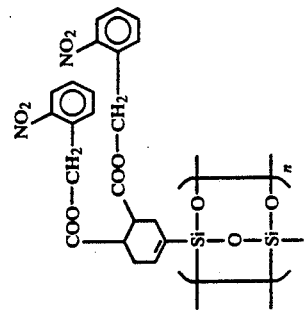
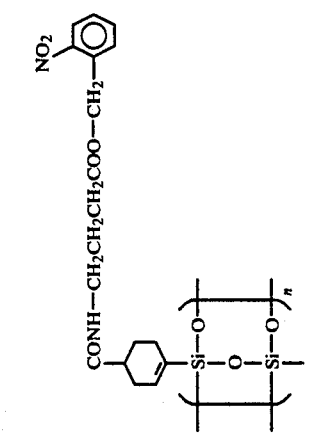

-continued
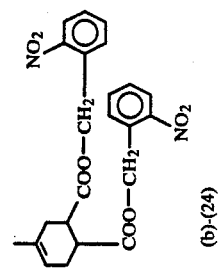
(b)-(22)
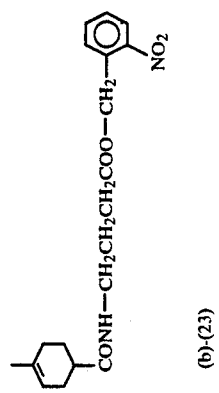
(b)-(23)
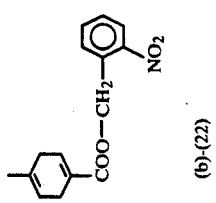
(b)-(24)
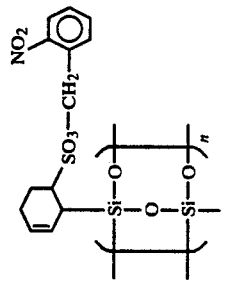
(b)-(25)
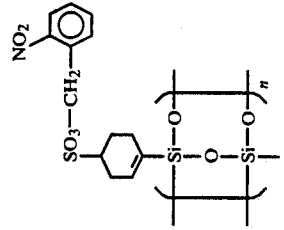
(b)-(26)
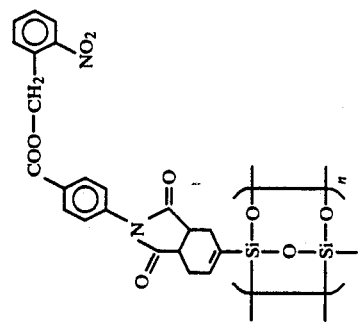
(b)-(27)
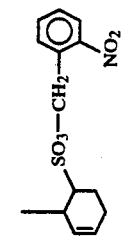
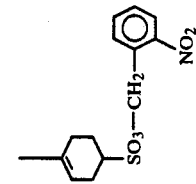
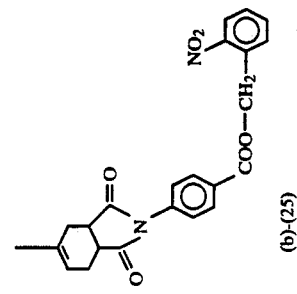

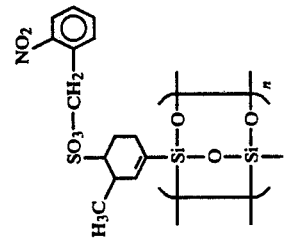 (b)-(30)
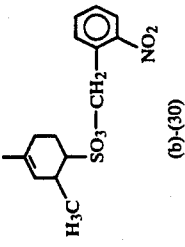 (b)-(29)
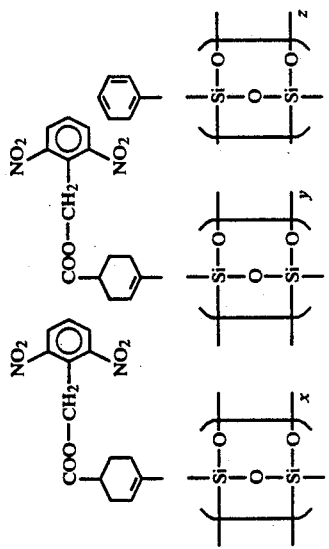 (b)-(33)
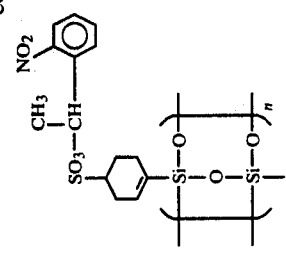 (b)-(28)
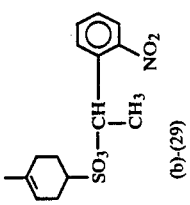 
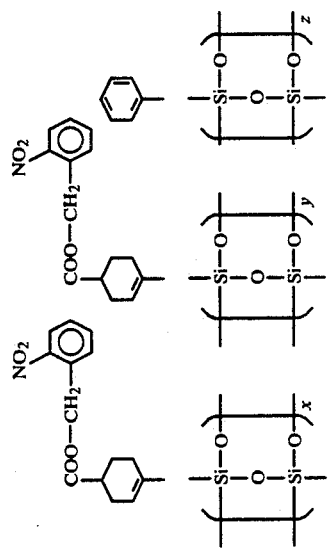 (b)-(32)
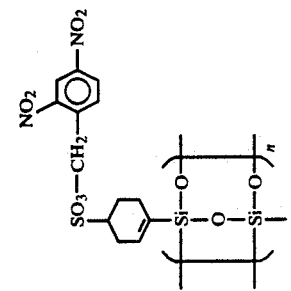 
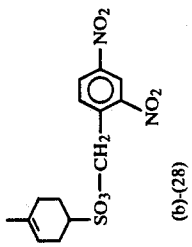
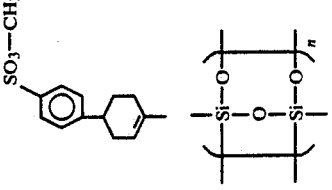 (b)-(31)

-continued
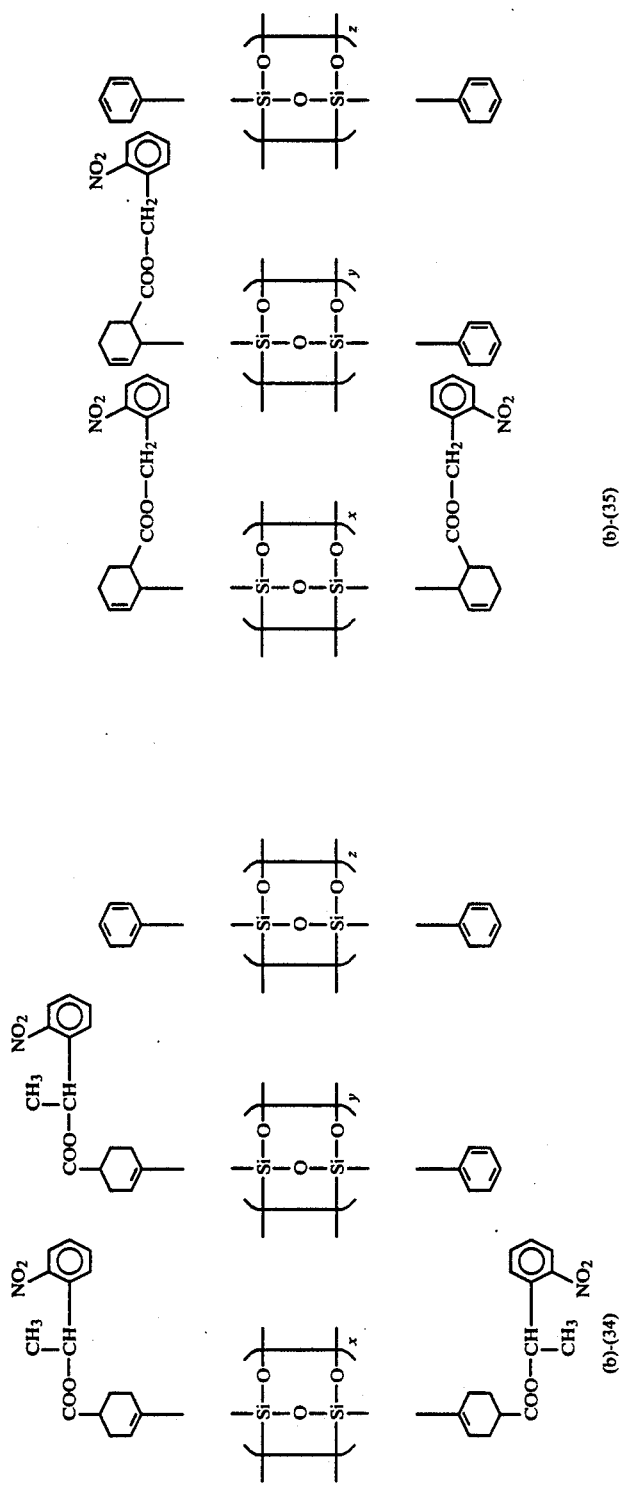
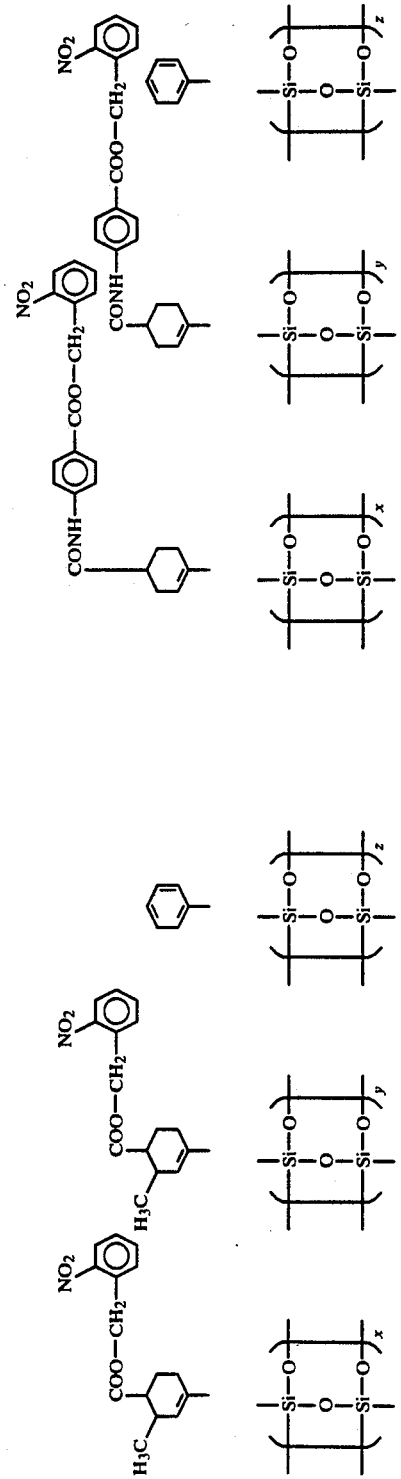

-continued
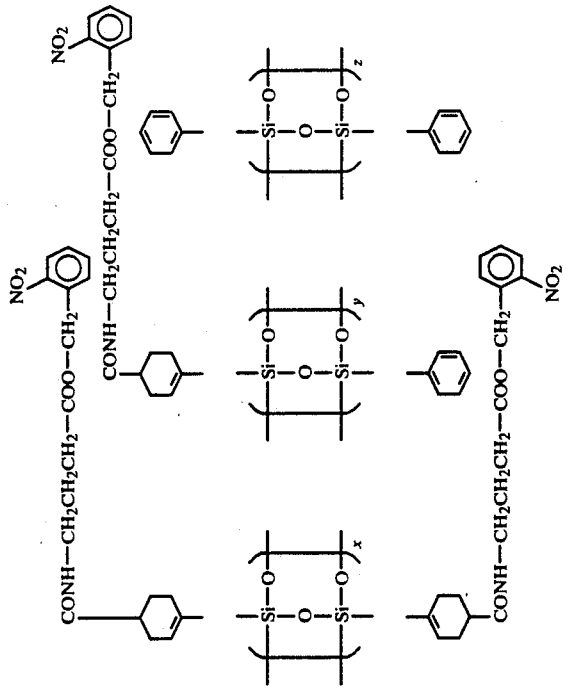
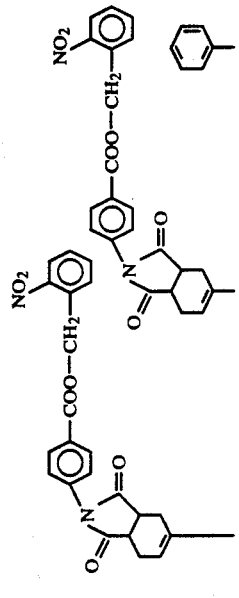

-continued
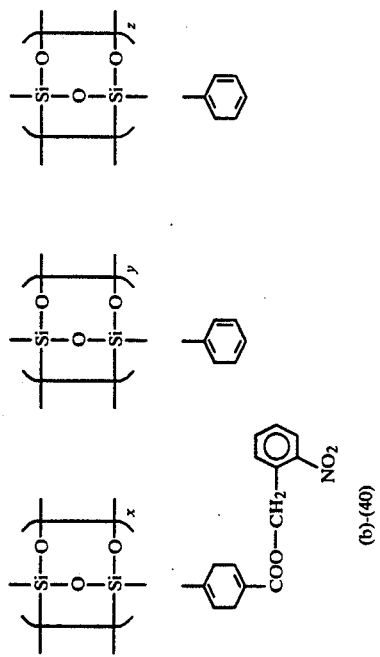
(b)-(40)
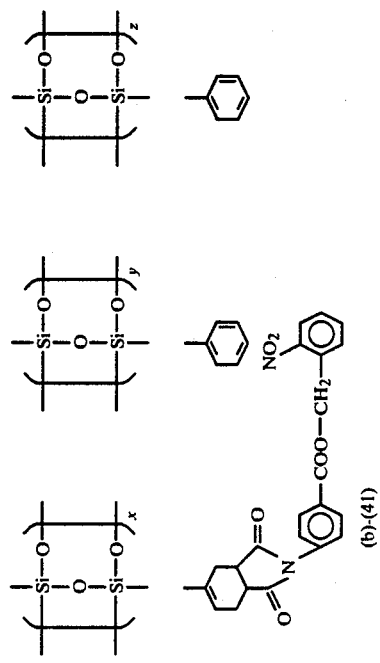
(b)-(41)
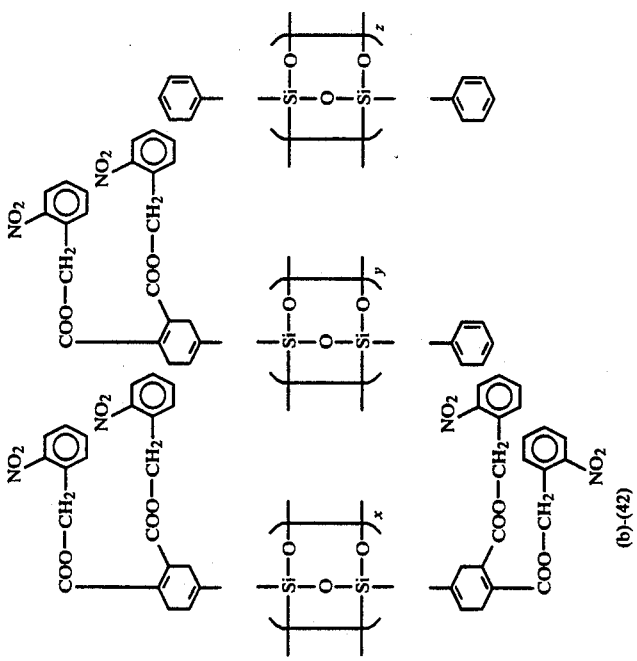
(b)-(42)
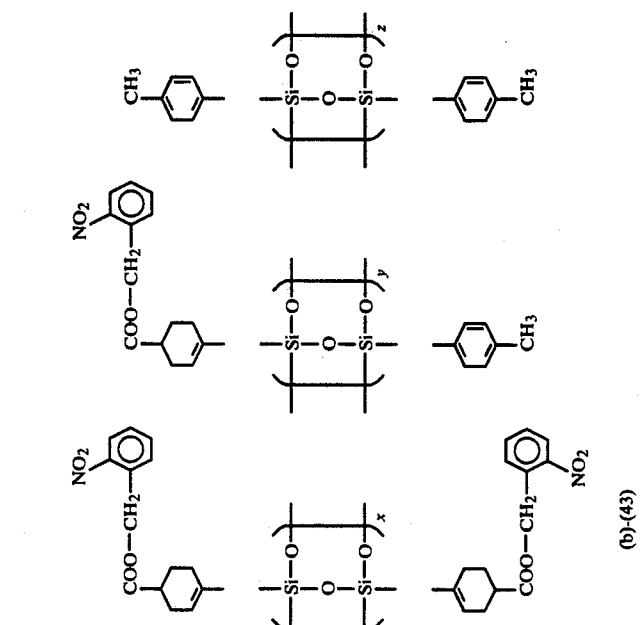
(b)-(43)

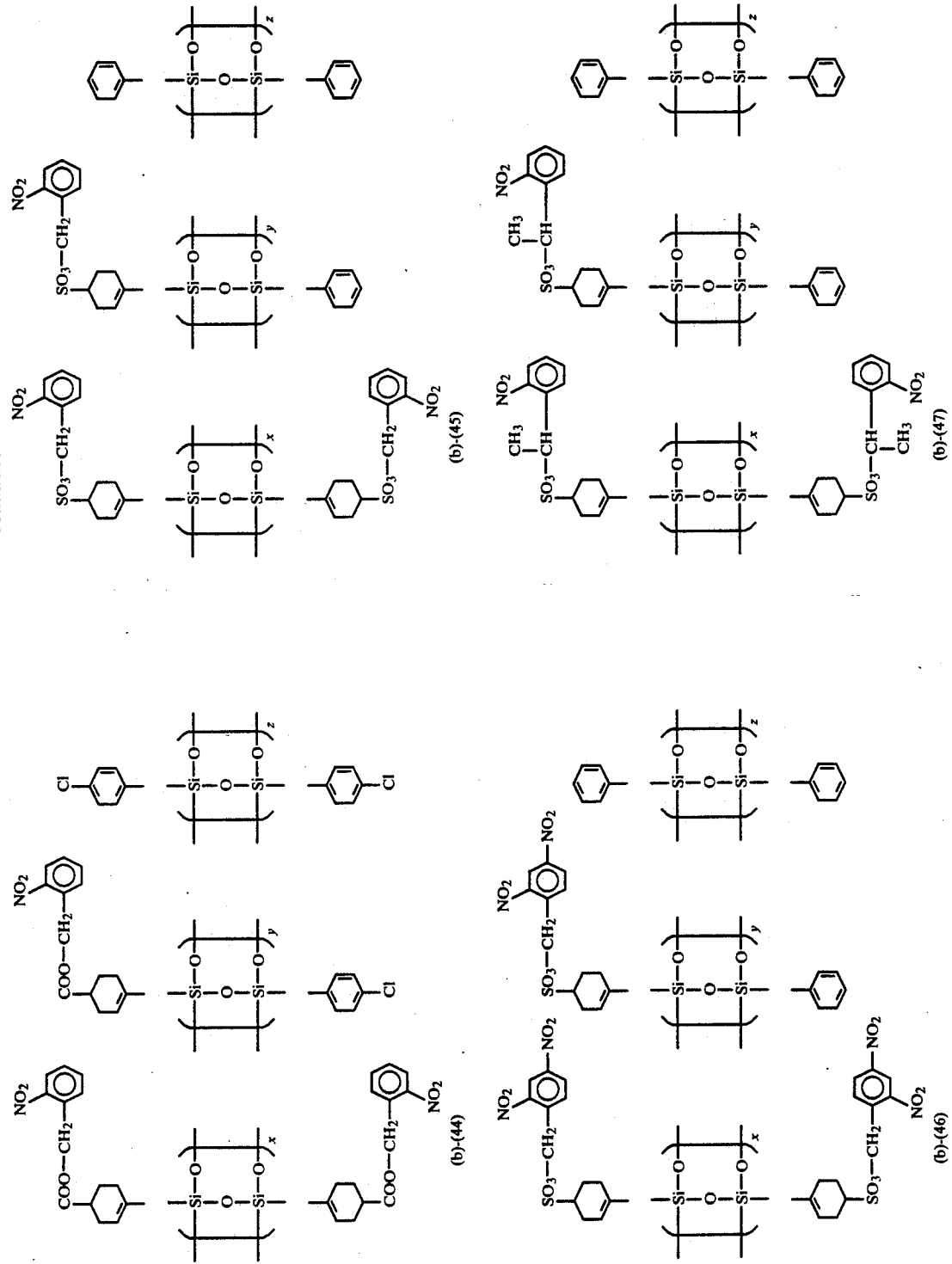

-continued
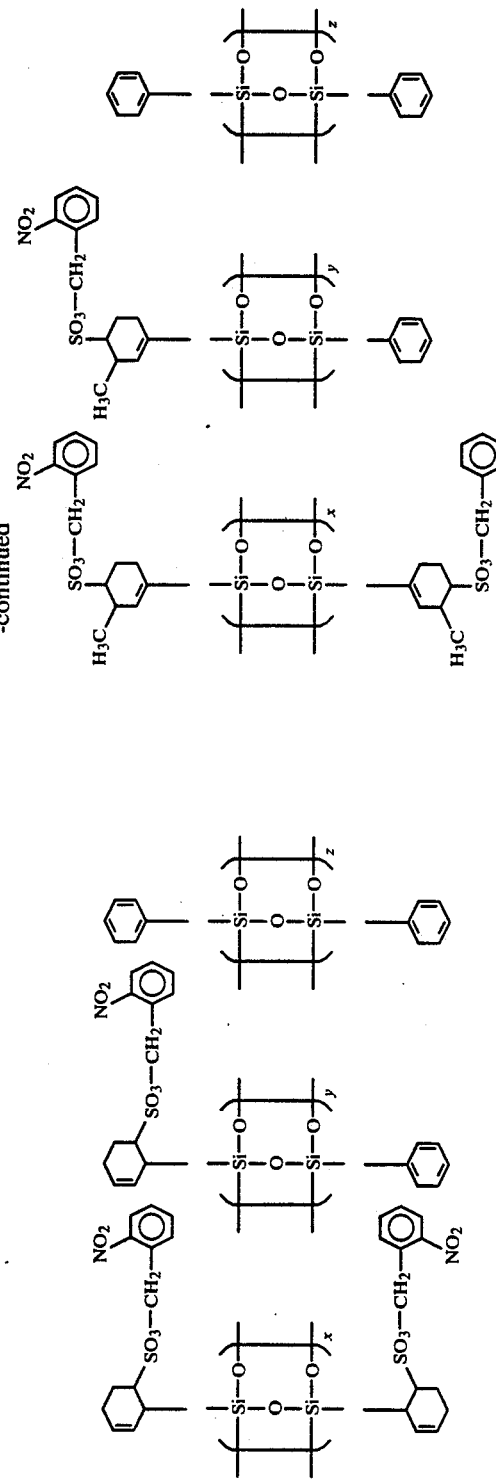
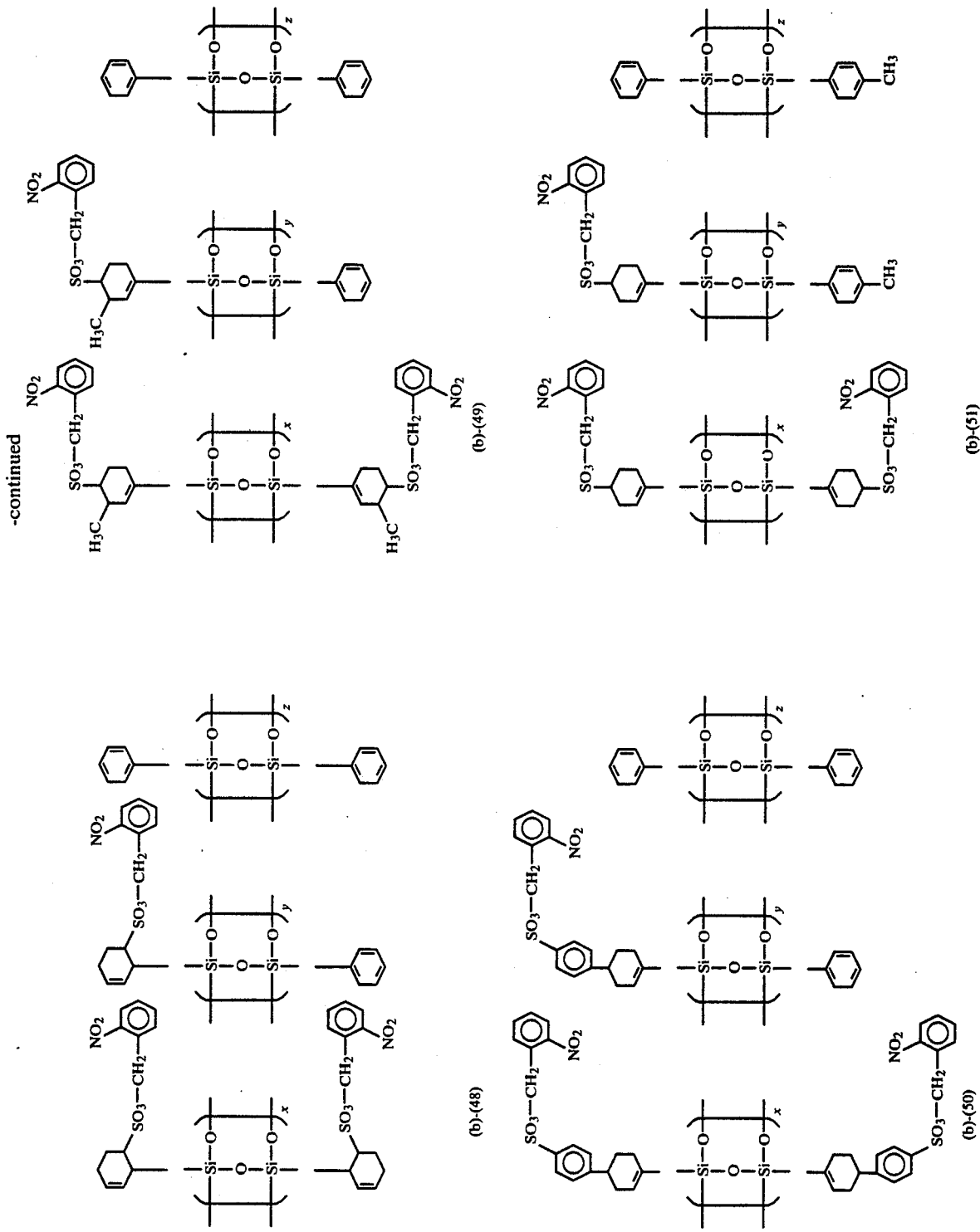

In the foregoing examples of the compound, n is an integer of not less than 1 and x, y and z each is an integer of not less than 0.

The molecular weight of the siloxane polymer (b) of the invention can freely be controlled by changing the condensation conditions, but preferred value thereof is not less than 500, more preferably 1,000 to 500,000 expressed in the weight averaged molecular weight.

An amount of the siloxane polymer to be contained in the positive working light-sensitive composition is generally 5 to 100% by weight, preferably 20 to 95%, more preferably 30 to 90% by weight based on the solid content of the light-sensitive composition.

Siloxane Polymer (c)

Siloxane polymer (c) of the Present invention contains alkoxybenzyl ester or alkoxybenzyl sulfonate group. The siloxane polymer per se does not show good alkali solubility but when irradiated with actinic rays or radiant rays, the alkoxybenzyl ester or alkoxybenzyl sulfonate group decomposes to form carboxylic acid or sulfonic acid group which makes the siloxane polymer alkali soluble.

Siloxane polymer (c) of the present invention may be produced by the two steps: a heat addition reaction between a compound represented by formula (I) or (II) and a compound represented by formula (III), (IV) or (V) and a condensation reaction to form a siloxane skeleton. In the course of the synthesis, it is unnecessary to use a metal catalyst (e.g., sodium, potassium or magnesium compounds) which would have a bad effect to resist properties.

Siloxane polymer (c) of the present invention is a siloxane polymer having a structure derived from cyclic heat addition products between a silyl substituted diene compound represented by formula (I) or (II) and an olefin or acetylene compound having alkoxybenzyl ester or alkoxybenzyl sulfonate group represented by formula (III), (IV) or (V), that is, so-called Diels-Alder reaction products (VI), (VII), (VIII), (IX), (X) or (XI) explained above.

The siloxane polymer of the present invention may be prepared by a method wherein one or more of the compound of formula (I) or (II) is hydrolyzed or alkoxylated and then condensed, to which the compound of formula (III), (IV) or (V) is heat-added, or a method wherein heat addition between the compound of formula (I) or (II) and the compound of formula (III), (IV) or (V) is carried out to form the compound of formula (VI), (VII), (VIII), (IX), (X) or (XI), one or more of which product is hydrolyzed or alkoxylated and then condensed.

An olefin or acetylene compound not having alkoxybenzyl ester or alkoxybenzyl sulfonate group may coexist with the compound of formula (III), (IV) or (V) so that it is incorporated into the structure of the siloxane polymer of the present invention.

One or more of the compound of formula (XII), (XIII), (XIV), (XV) and/or (XVI) explained earlier may be present in the reaction system and co-condensed to improve the properties of the siloxane polymer.

The siloxane polymer contains at least one mol %, preferably 5 to 95 mol %, more preferably 10 to 80 mol % of the structural unit derived from the compound of formula (VI), (VII), (VIII), (IX), (X) or (XI).

Specific examples of siloxane polymer (c) of the present invention are illustrated below.

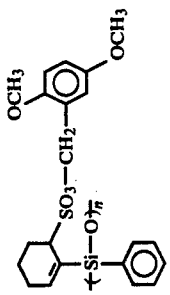
(c)-(6)
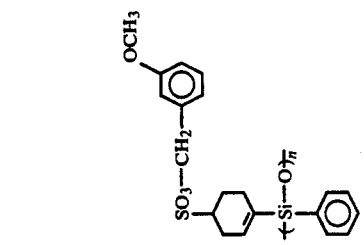
(c)-(3)
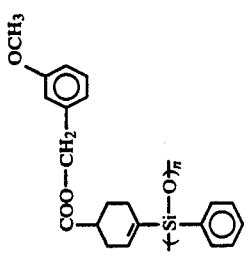
(c)-(2)
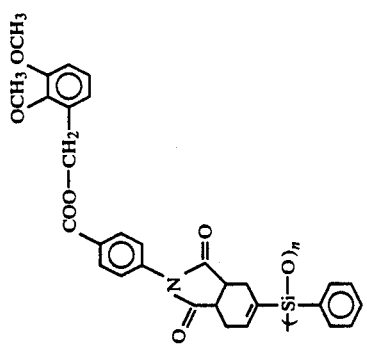
(c)-(5)
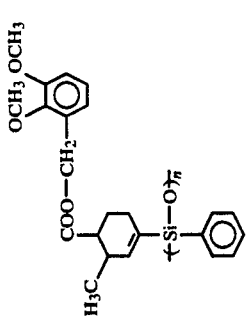
(c)-(8)
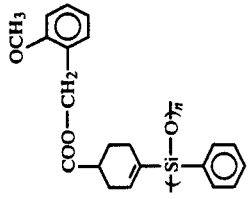
(c)-(1)
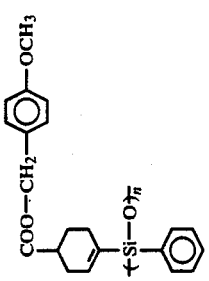
(c)-(4)
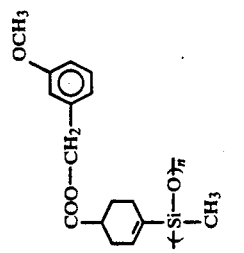
(c)-(7)
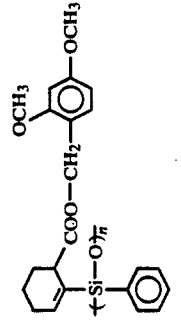
(c)-(9)

-continued
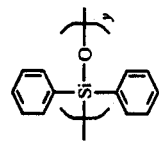
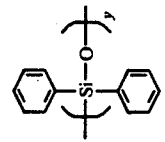
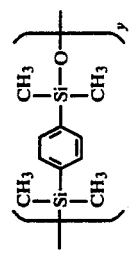
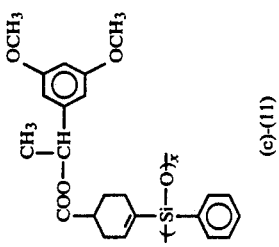 (c)-(11)
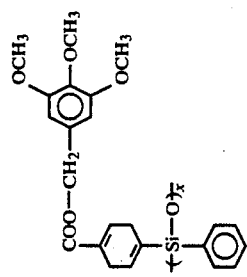 (c)-(13)
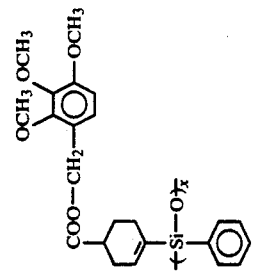 (c)-(15)
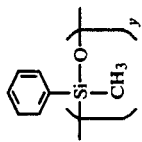
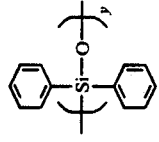
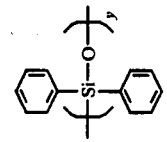
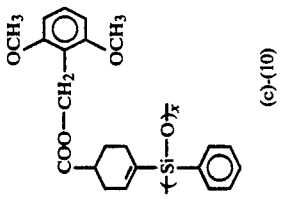 (c)-(10)
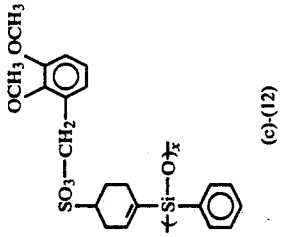 (c)-(12)
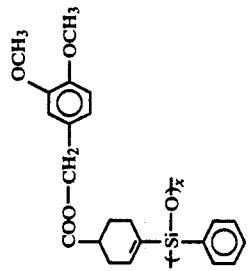 (c)-(14)

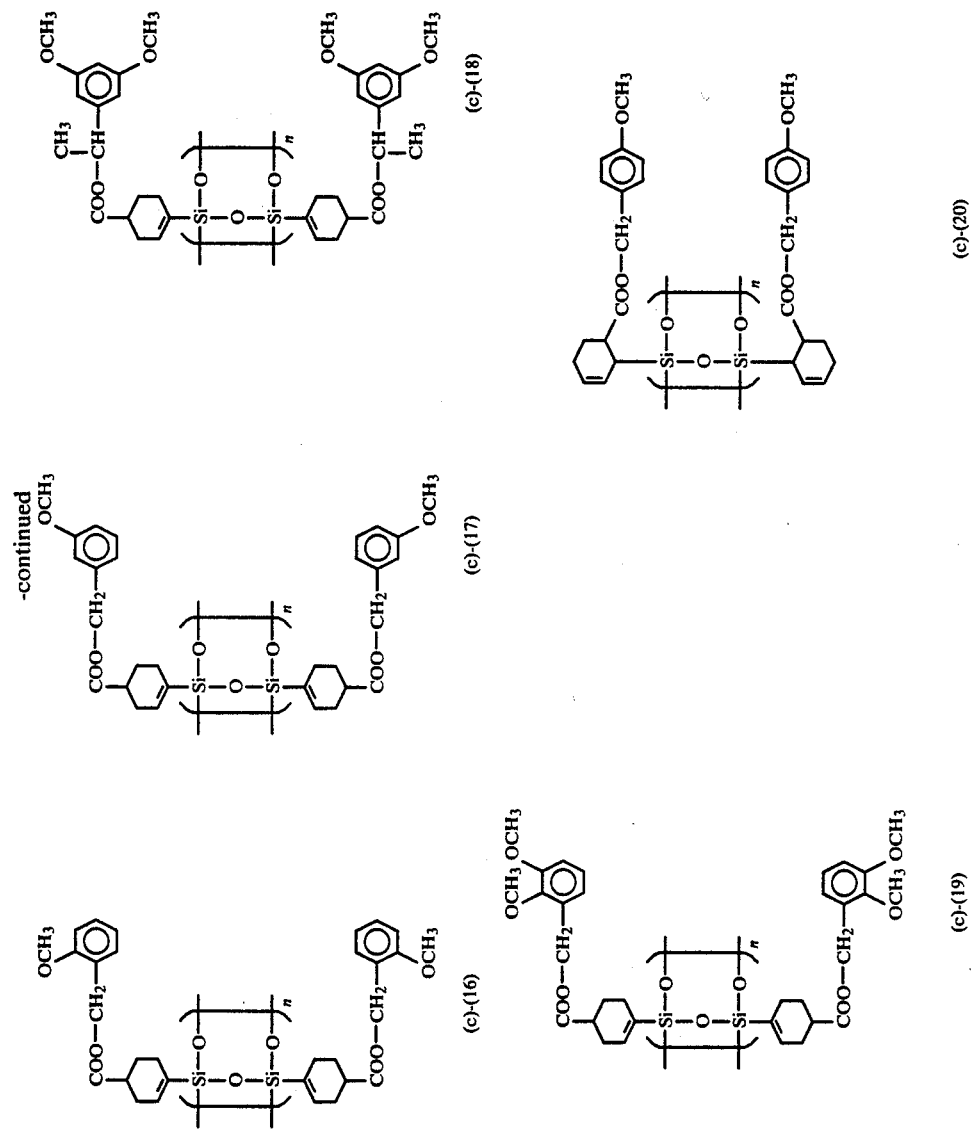

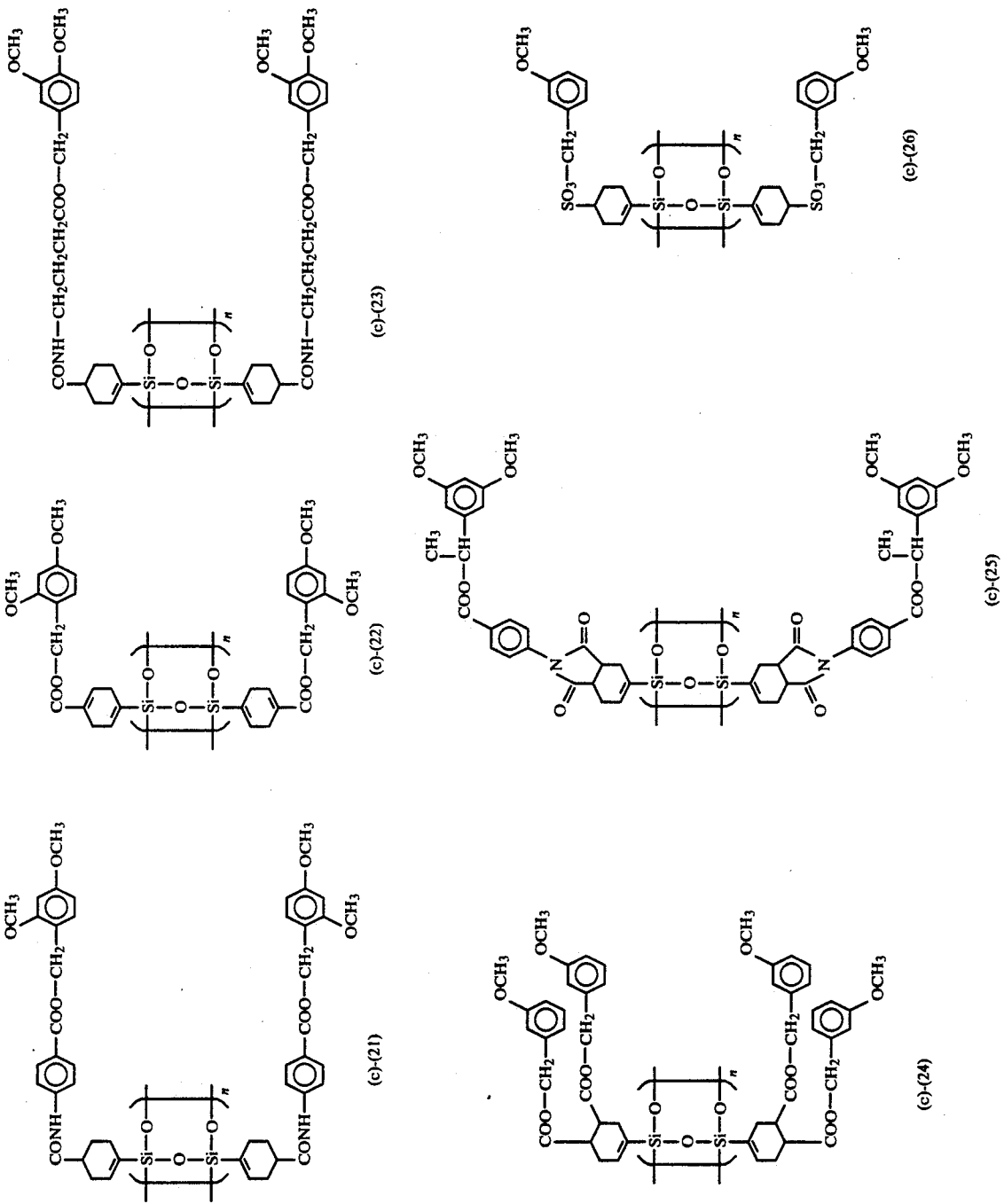

-continued
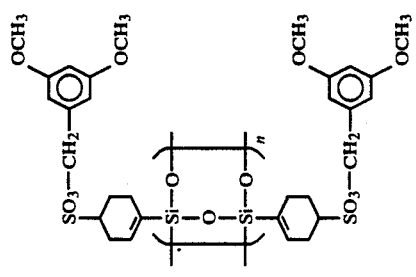
(c)-(28)
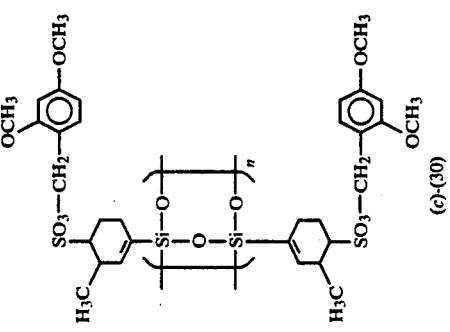
(c)-(30)
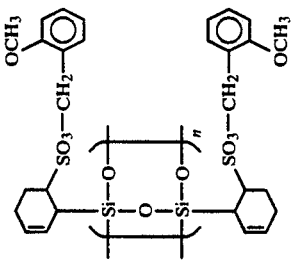
(c)-(27)
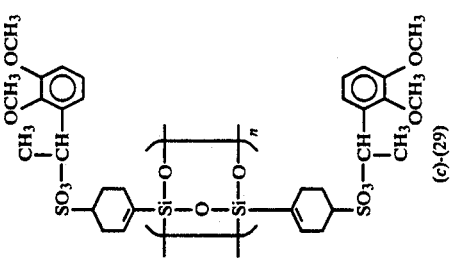
(c)-(29)

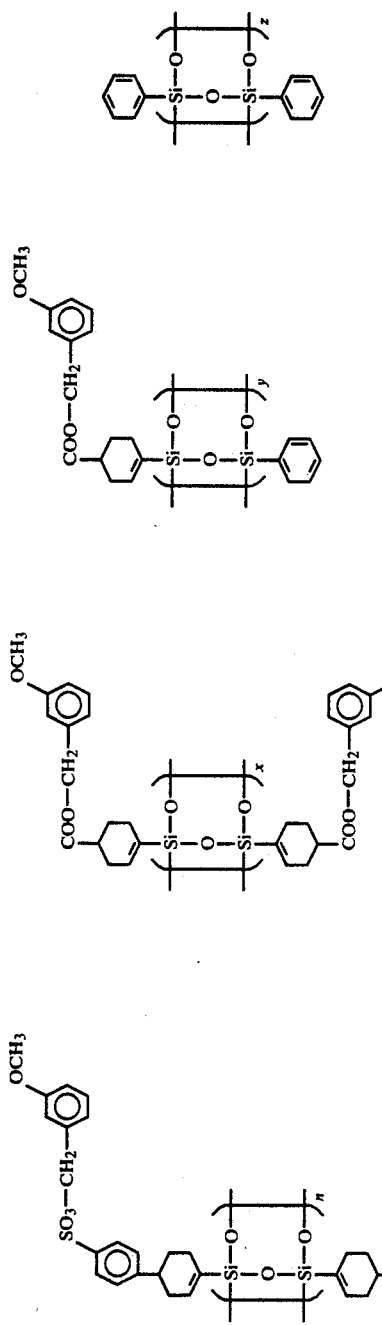

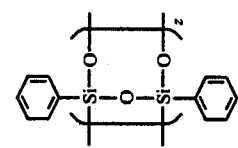
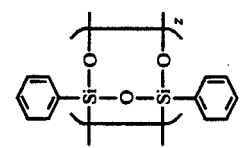
-continued
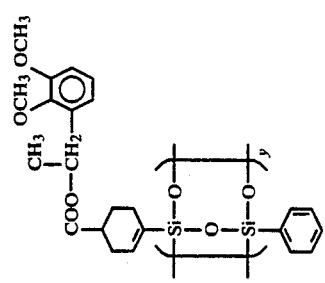
(c)-(34)
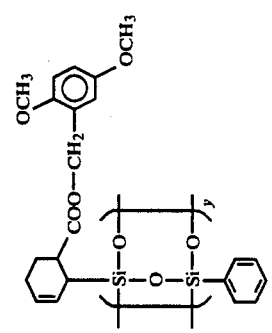
(c)-(35)
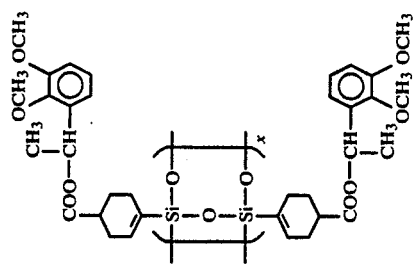
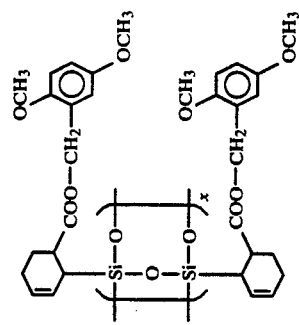

-continued
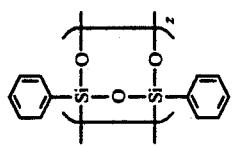
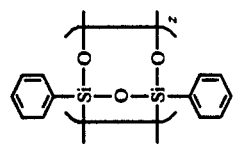
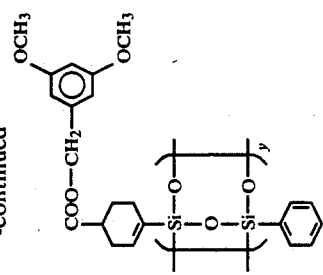
(c)-(36)
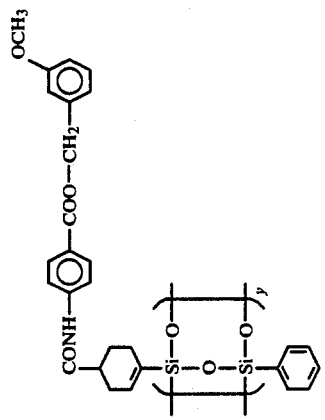
(c)-(37)
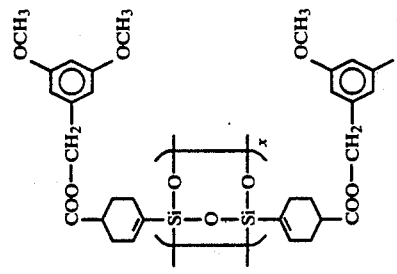
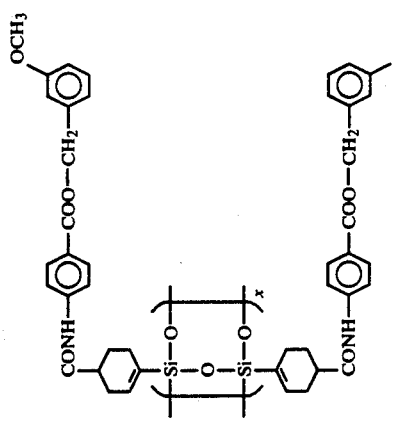

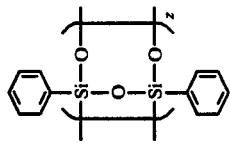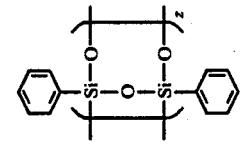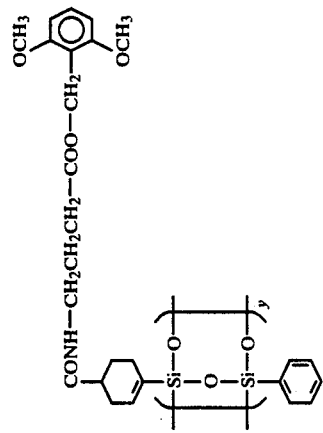
(c)-(38)
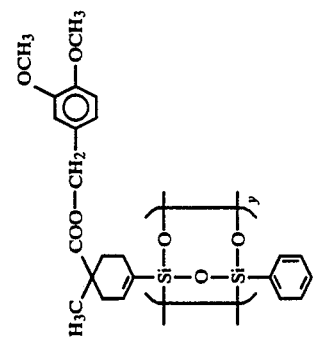
(c)-(39)
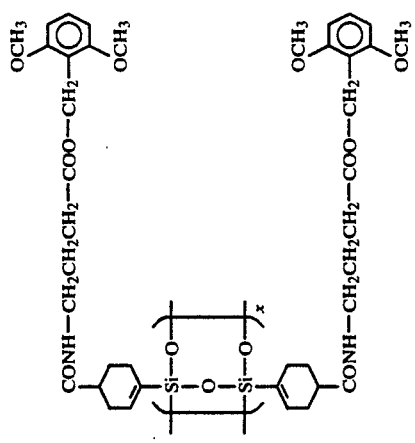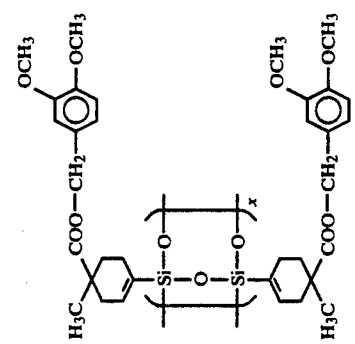

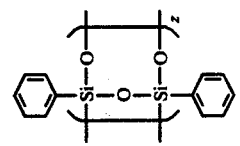
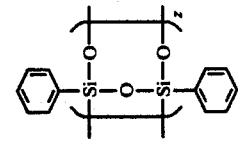
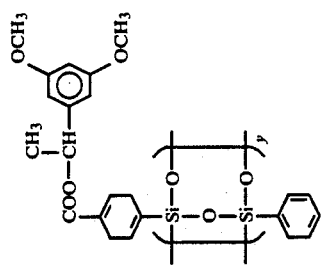
(c)-(40)
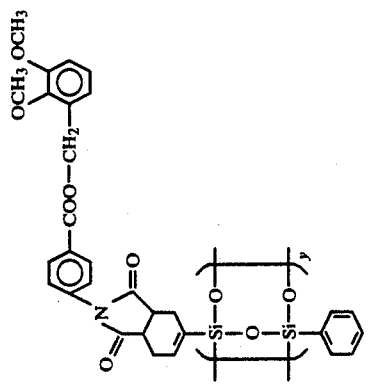
(c)-(41)
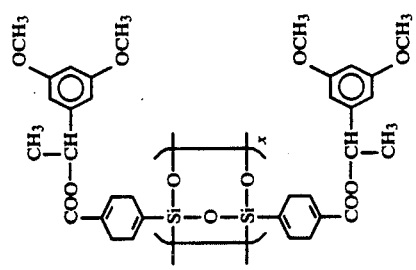
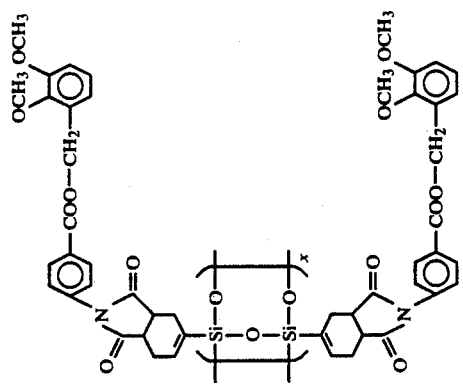

-continued
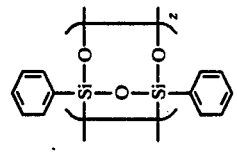
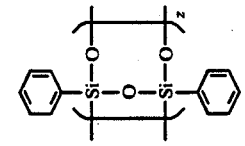
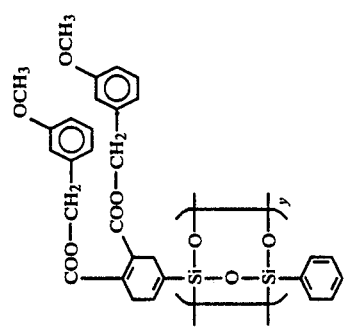
(c)-(42)
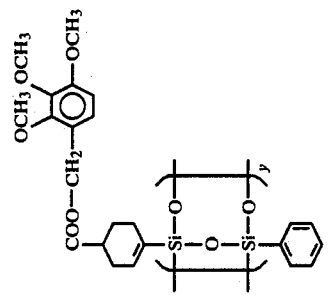
(c)-(43)
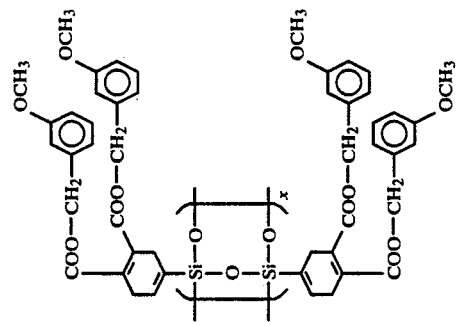
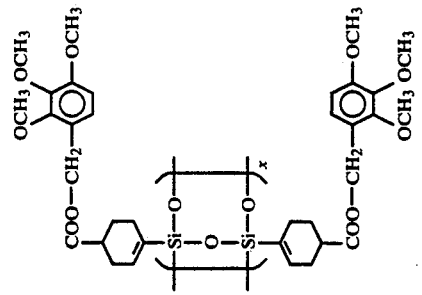

-continued
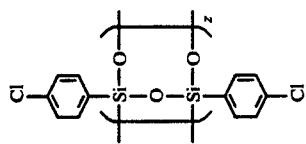 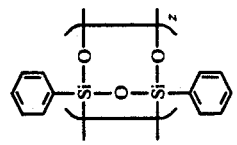
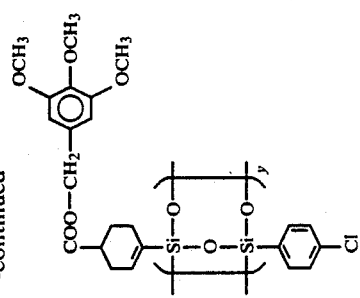 (c)-(44) 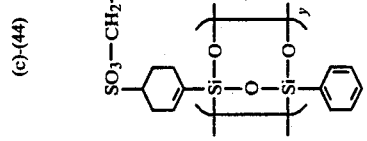 (c)-(45)
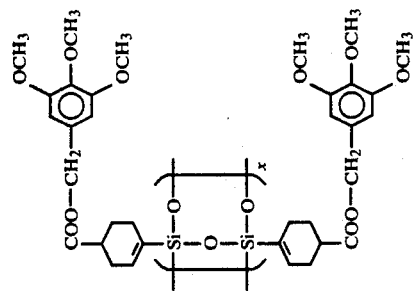 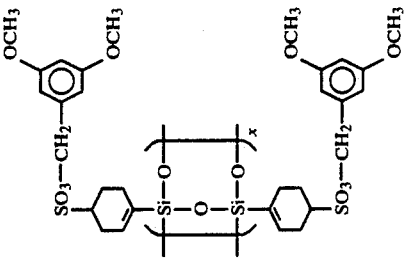

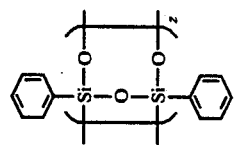
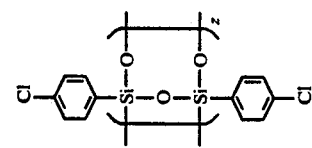
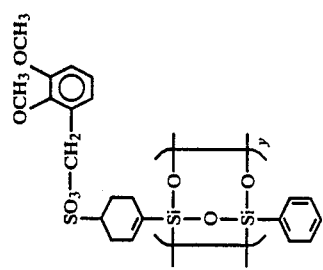
(c)-(46)
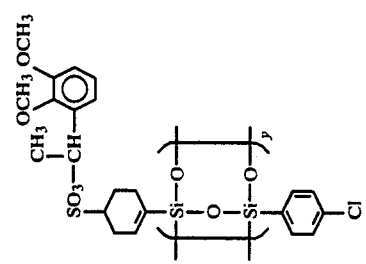
(c)-(47)
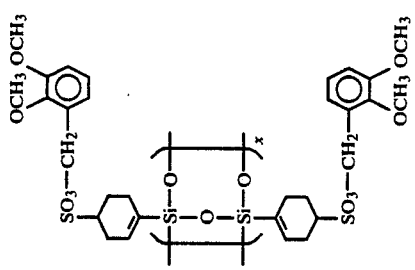
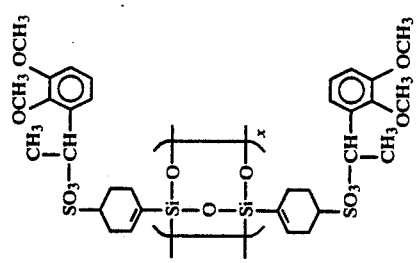

-continued
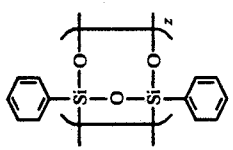
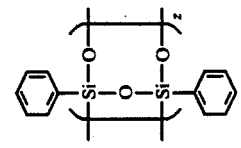
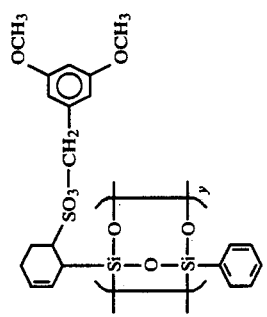
(c)-(48)
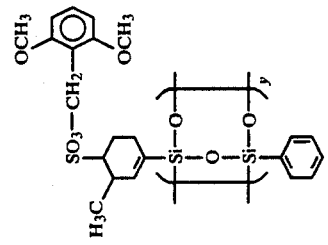
(c)-(49)
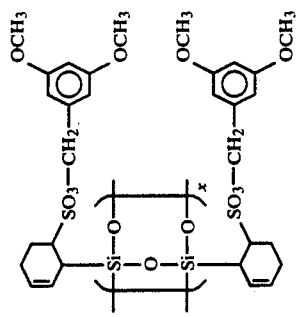
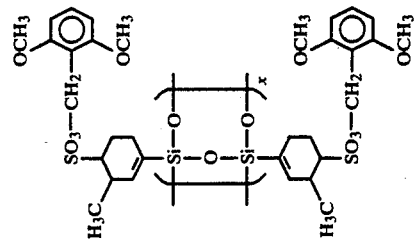

-continued
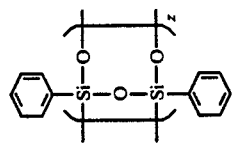
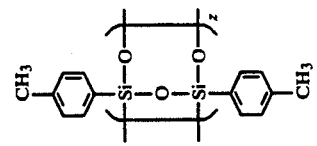
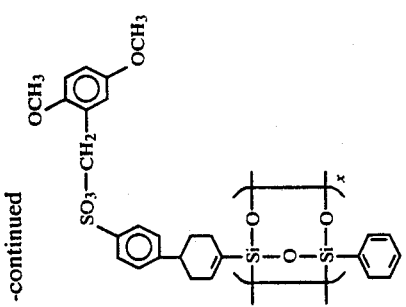
(c)-(50)
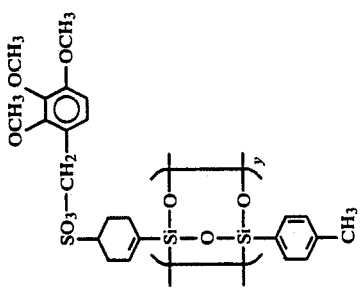
(c)-(51)
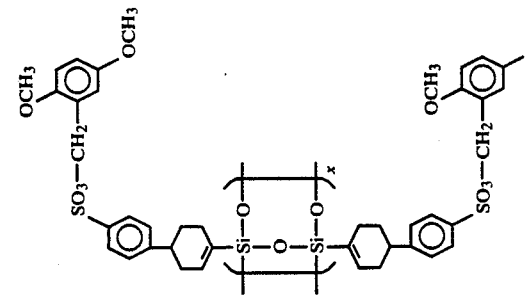
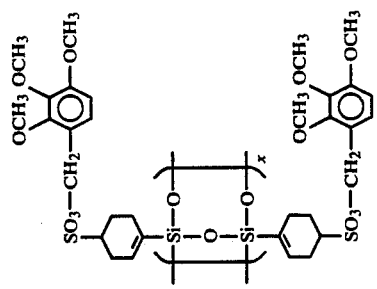

In the foregoing examples of the compound, n is an integer of not less than 1 and x, y and z each is an integer of not less than 0.

The molecular weight of the siloxane polymer (c) of the invention can freely be controlled by changing the condensation conditions, but preferred value thereof is not less than 500, more preferably 1,000 to 500,000 expressed in the weight averaged molecular weight.

An amount of the siloxane polymer to be contained in the positive working light-sensitive composition is generally 5 to 100% by weight, preferably 20 to 95%, more preferably 30 to 90% by weight based on the solid content of the light-sensitive composition.

Siloxane Polymer (d)

Siloxane polymer (d) of the present invention contains a group represented by $-SO_2-SO_2-Ar-$,

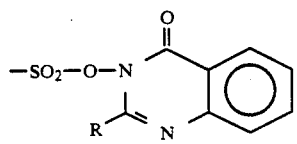

or

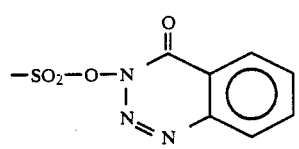

The siloxane polymer per se does not show good alkali solubility but when irradiated with actinic rays or radiant rays, the group mentioned above decomposes to form sulfinic acid or sulfonic acid group which makes the siloxane polymer alkali soluble.

Siloxane polymer (d) of the present invention may be produced by the two steps: a heat addition reaction between a compound represented by formula (I) or (II) and a compound represented by formula (III), (IV) or (V) and a condensation reaction to form a siloxane skeleton. In the course of the synthesis, it is unnecessary to use a metal catalyst (e.g., sodium, potassium or magnesium compounds) which would have a bad effect to resist properties.

Siloxane polymer (d) of the present invention is a siloxane polymer having a structure derived from cyclic heat addition products between a silyl substituted diene compound represented by formula (I) or (II) and an olefin or acetylene compound having a group of $-SO_2-SO_2-Ar-$,

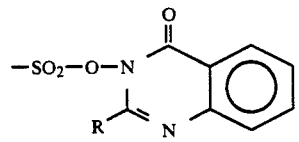

or

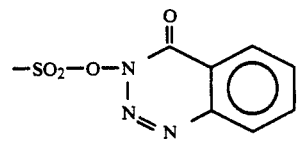

represented by formula (III), (IV) or (V), that is, so-called Diels-Alder reaction products (VI), (VII), (VIII), (IX), (X) or (XI) explained above.

The siloxane polymer of the present invention may be prepared by a method wherein one or more of the compound of formula (I) or (II) is hydrolyzed or alkoxylated and then condensed, to which the compound of formula (III), (IV) or (V) is heat-added, or a method wherein heat addition between the compound of formula (I) or (II) and the compound of formula (III), (IV) or (V) is carried out to form the compound of formula (VI), (VII), (VIII), (IX), (X) or (XI), one or more of which product is hydrolyzed or alkoxylated and then condensed.

An olefin or acetylene compound not having a group of $-SO_2-SO_2-Ar-$,

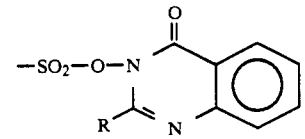

or

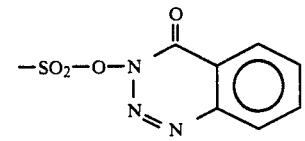

may coexist with the compound of formula (III), (IV) or (V) so that it is incorporated into the structure of the siloxane polymer of the present invention.

One or more of the compound of formula (XII), (XIII), (XIV), (XV) and/or (XVI) explained earlier may be present in the reaction system and co-condensed to improve the properties of the siloxane polymer.

The siloxane polymer contains at least one mol %, preferably 5 to 95 mol %, more preferably 10 to 80 mol % of the structural unit derived from the compound of formula (VI), (VII), (VIII), (IX), (X) or (XI).

Specific examples of siloxane polymer (d) of the present invention are illustrated below.

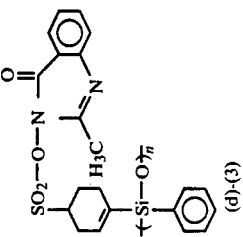
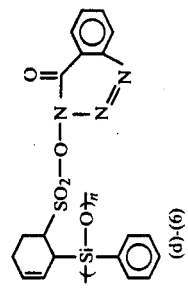
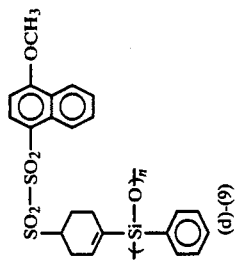
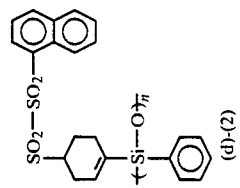
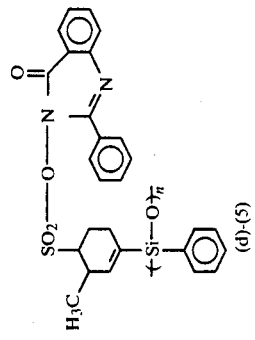
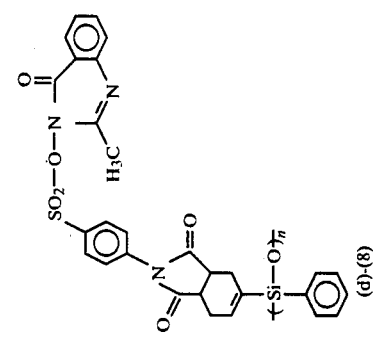
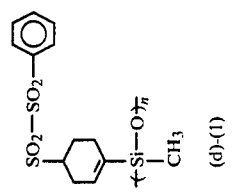
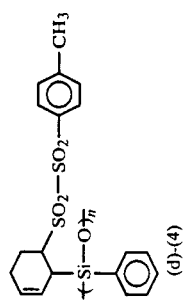
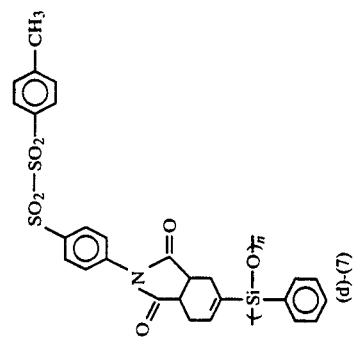

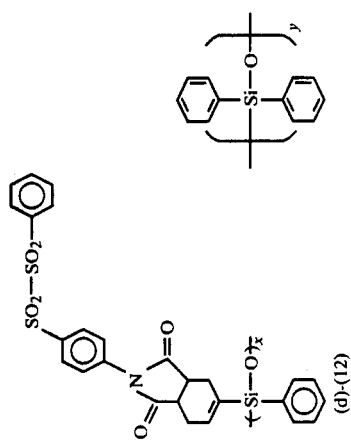
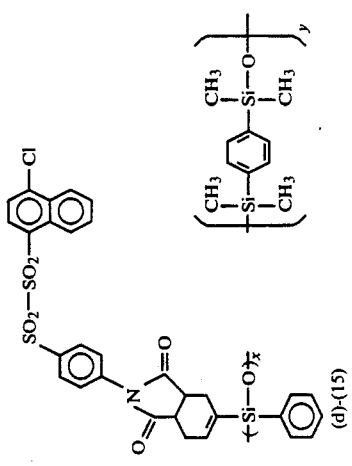
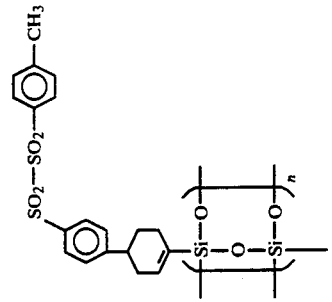
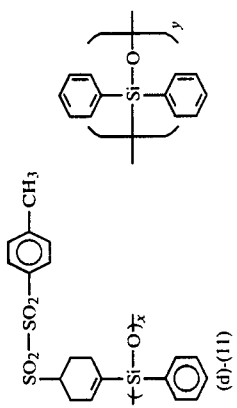
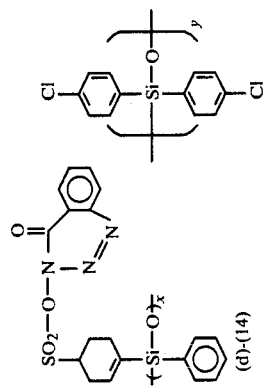
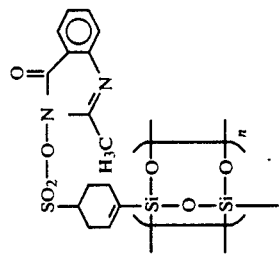
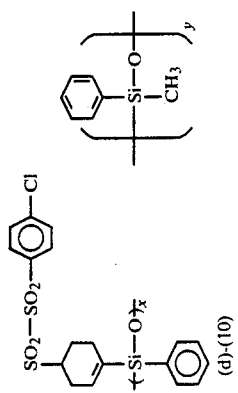
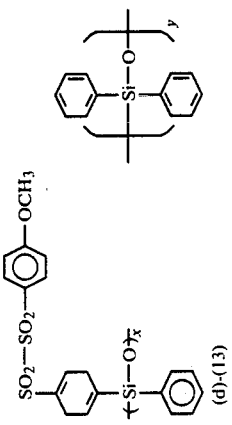
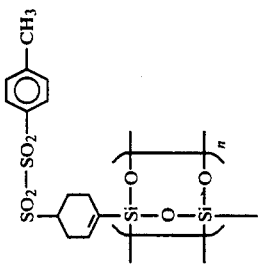

-continued
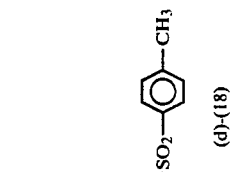
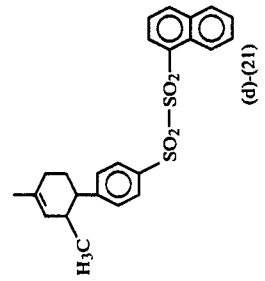
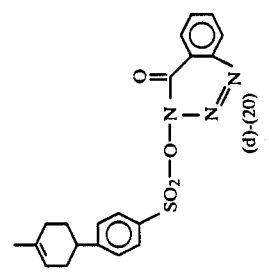
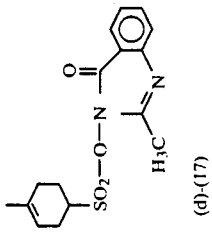
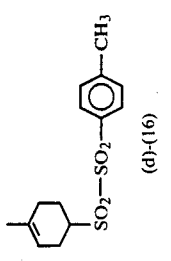

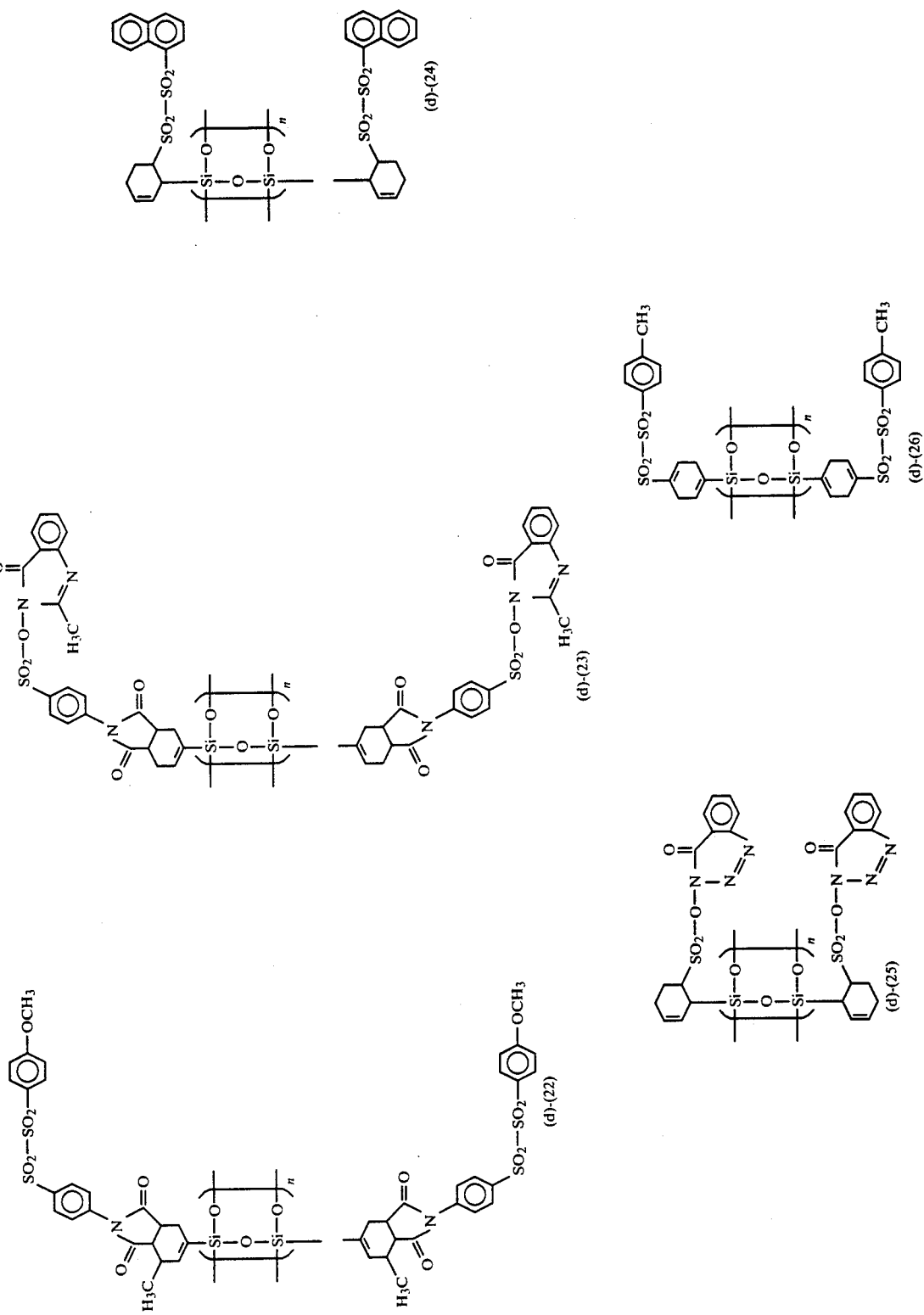

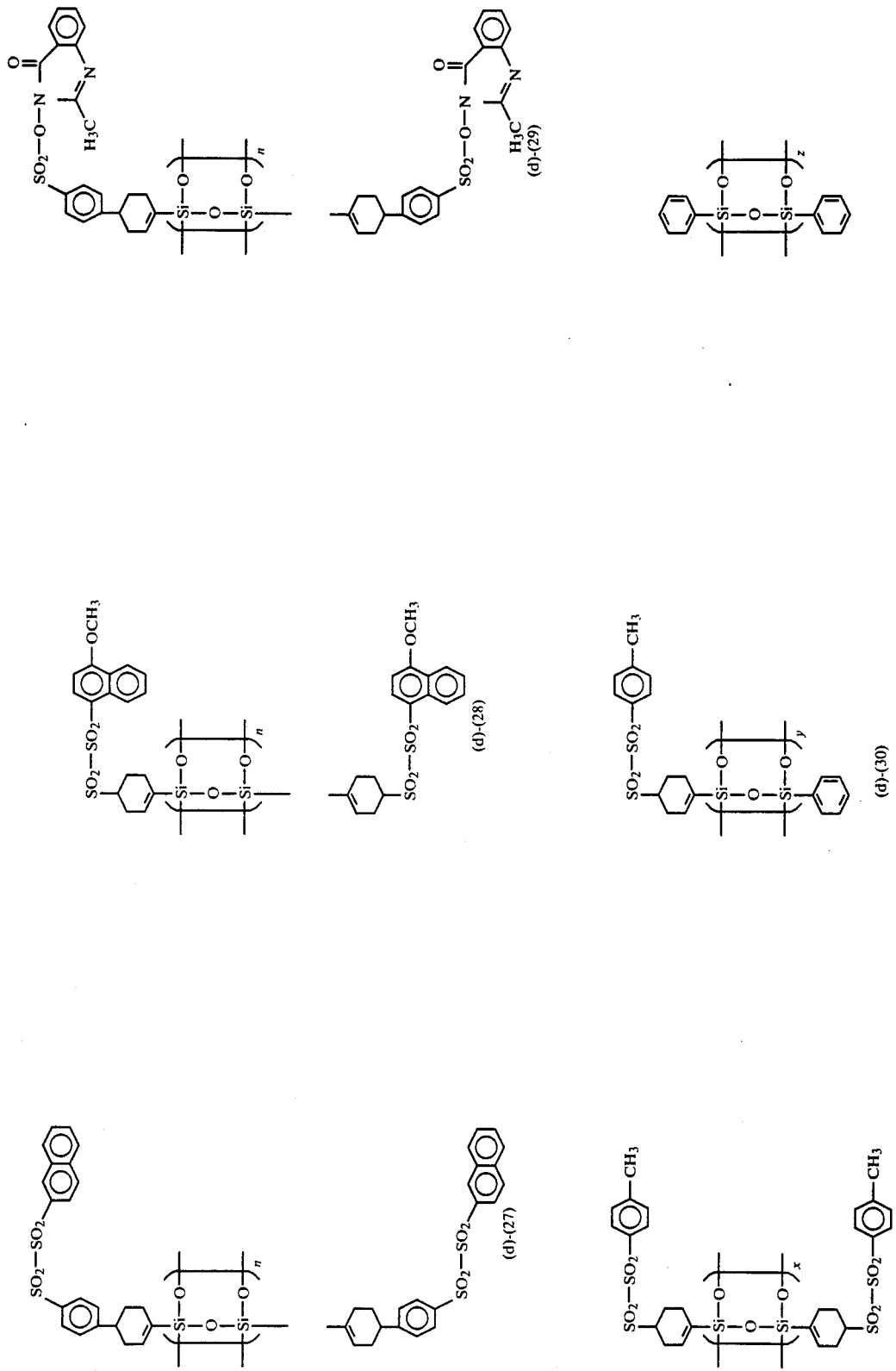

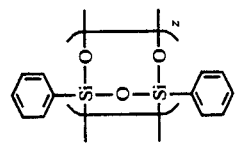
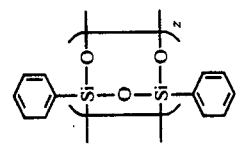
-continued
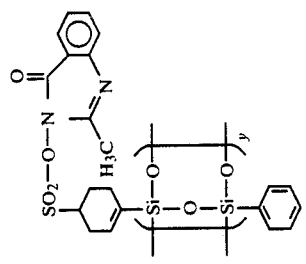
(d)-(31)
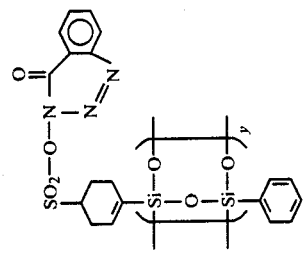
(d)-(32)
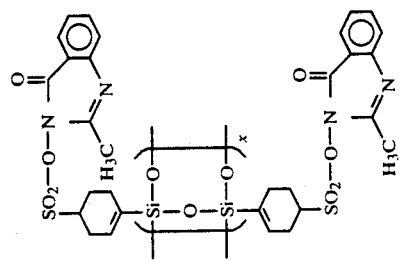
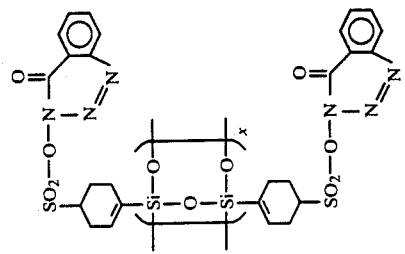

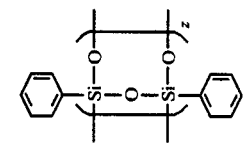
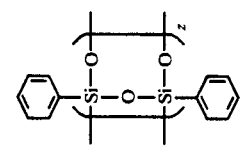
-continued
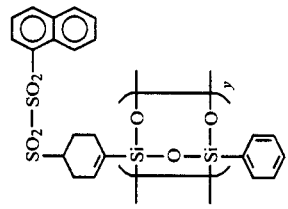
(d)-(33)
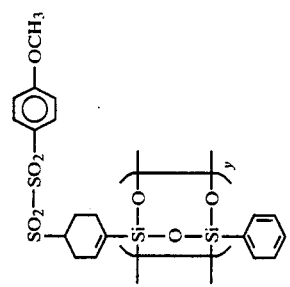
(d)-(34)
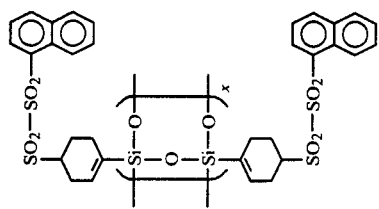
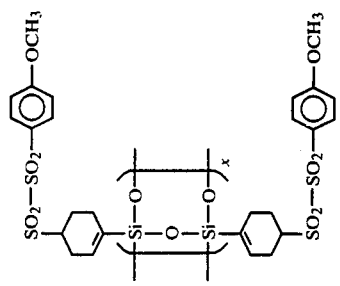

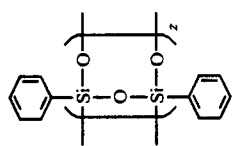
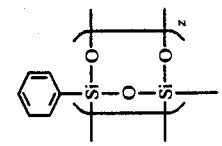
-continued
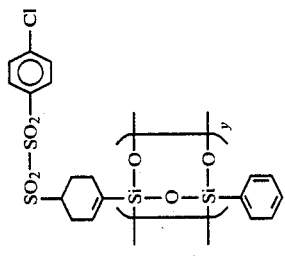
(d)-(35)
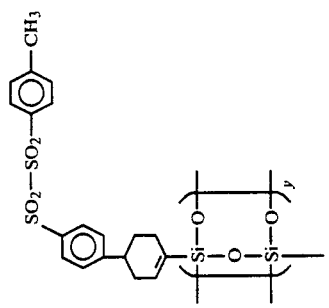
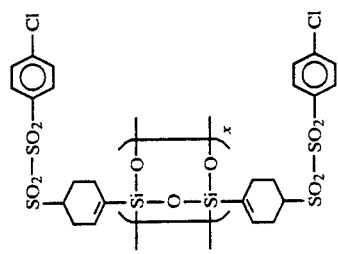
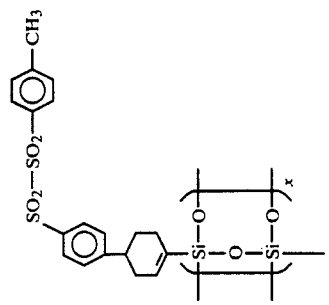

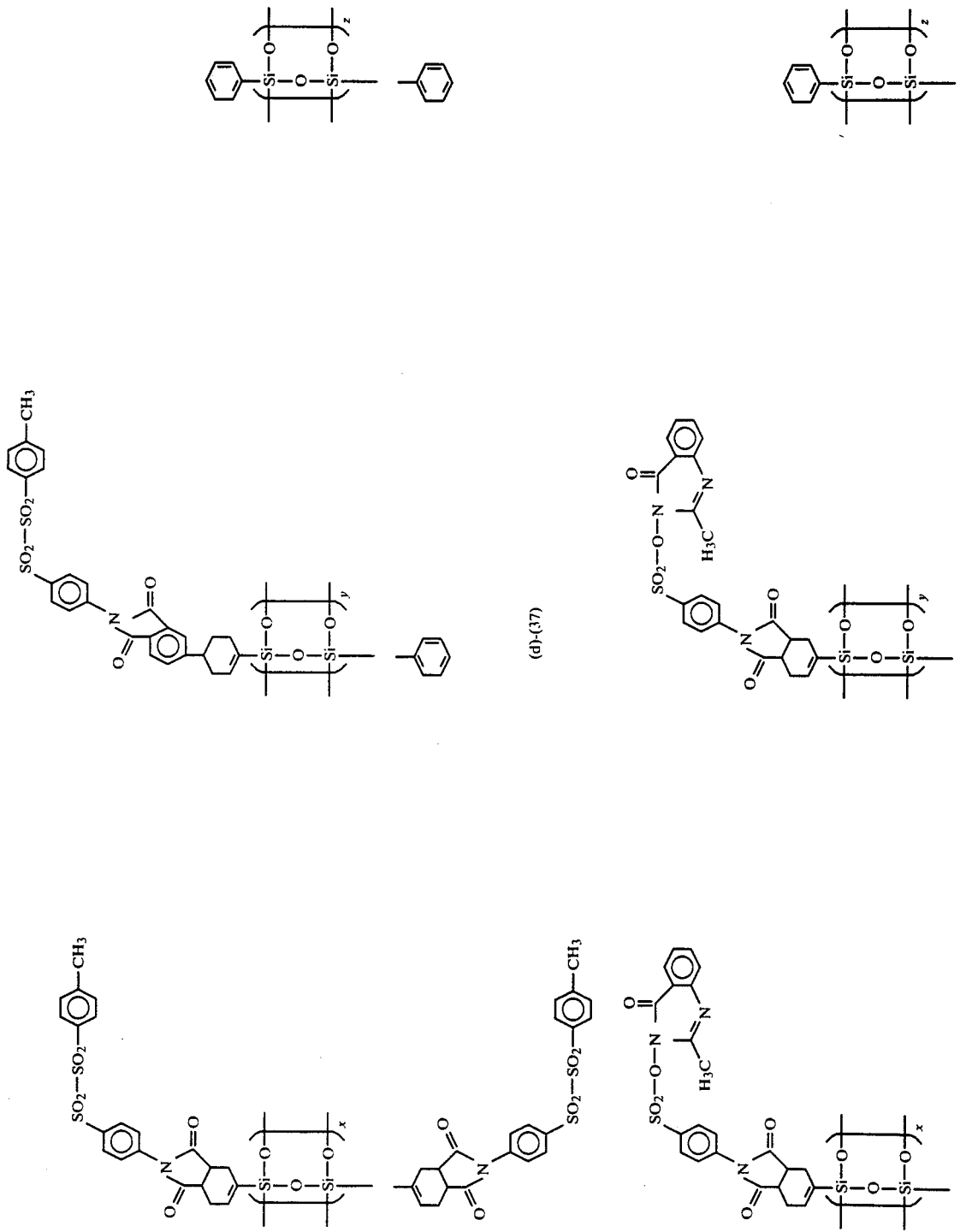

-continued
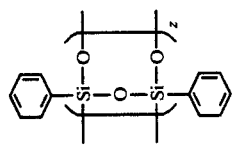
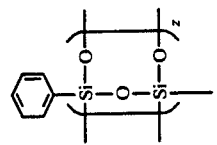
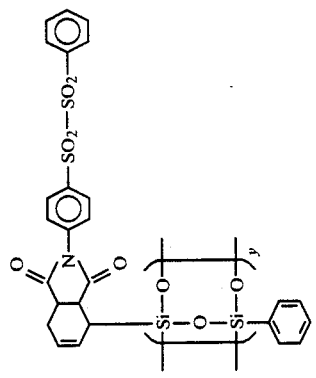
(d)-(38)
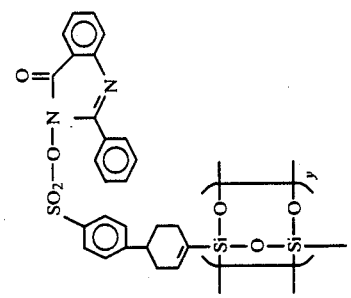
(d)-(39)
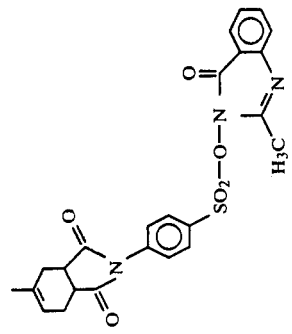
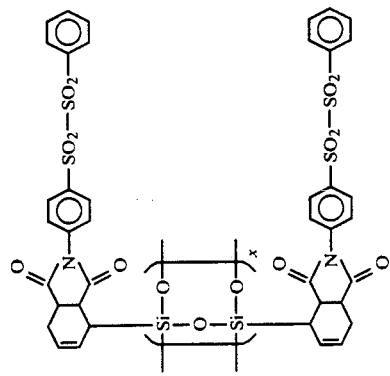
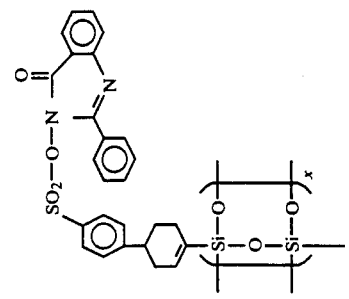

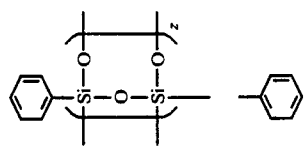
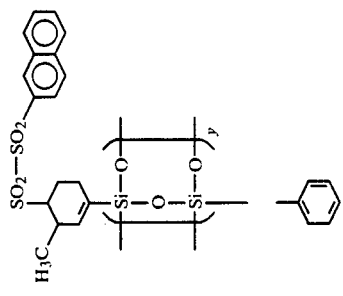
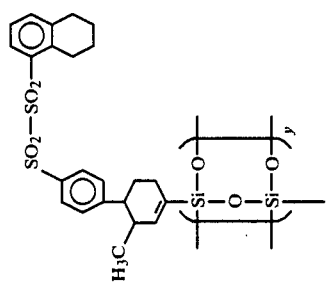
-continued
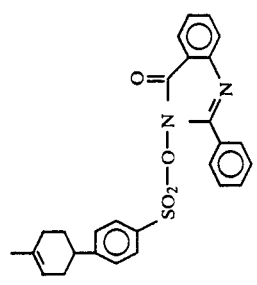
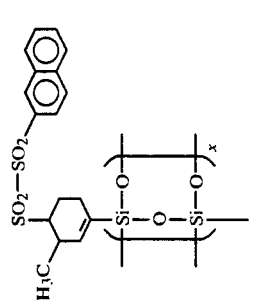
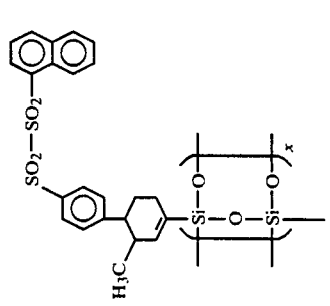

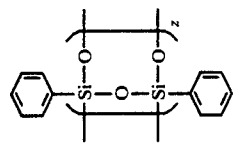
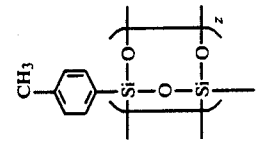
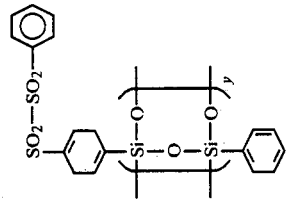 (d)-(42)
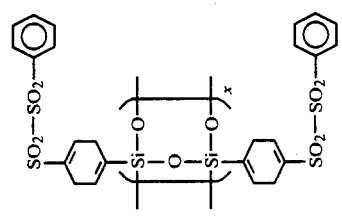 (d)-(43)
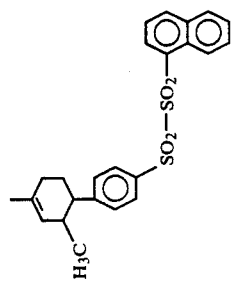
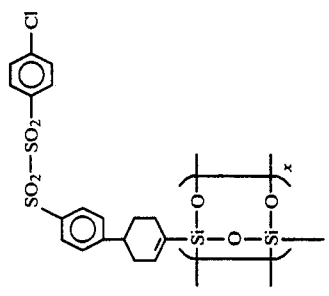

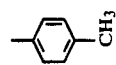
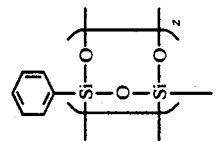
-continued
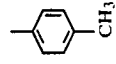 (d)-(44)
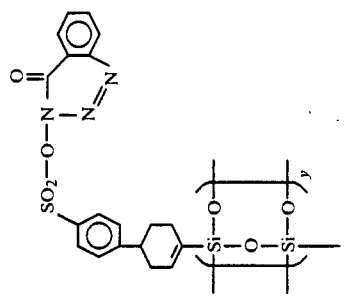
 (d)-(45)
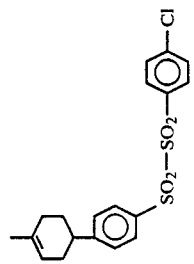
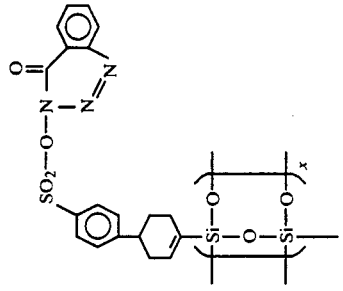
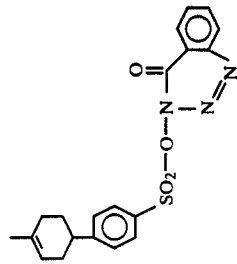

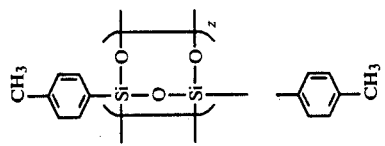
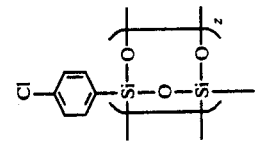
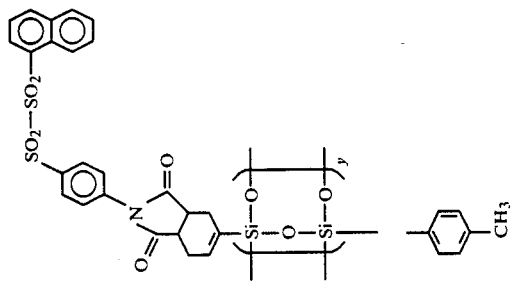
(d)-(46)
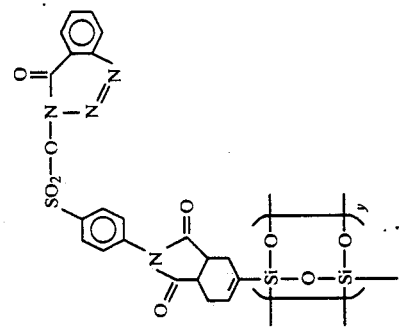
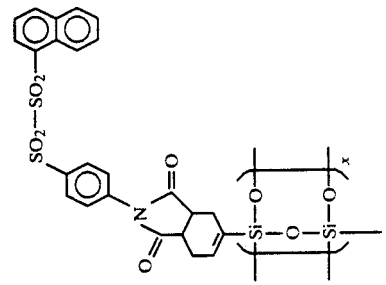 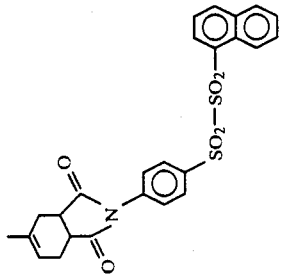
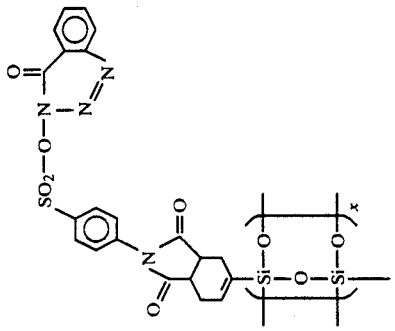

-continued
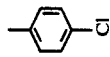
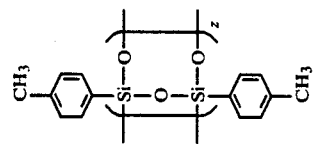
(d)-(47)
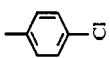
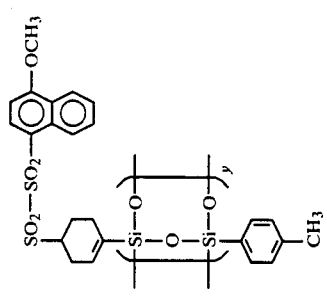
(d)-(48)
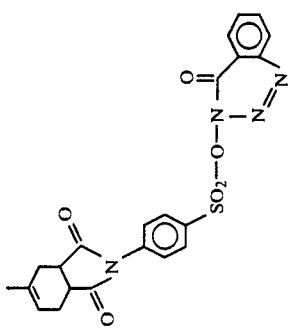
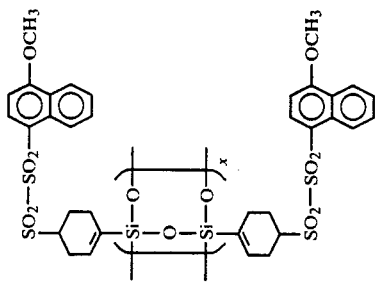

In the foregoing examples of the compound, n is an integer of not less than 1 and x, y and z each is an integer of not less than 0.

The molecular weight of the siloxane polymer (d) of the invention can freely be controlled by changing the condensation conditions, but preferred value thereof is not less than 500, more preferably 1,000 to 500,000 expressed in the weight averaged molecular weight.

An amount of the siloxane polymer to be contained in the positive working light-sensitive composition is generally 5 to 100% by weight, preferably 20 to 95%, more preferably 30 to 90% by weight based on the solid content of the light-sensitive composition.

Siloxane Polymer (e)

Siloxane polymer (e) of the present invention contains tertiary or secondary carbon ester or carbonic acid ester group. The siloxane polymer per se does not show good alkali solubility but when it is combined with a compound capable of generating an acid through irradiation of actinic rays or radiant rays, the tertiary or secondary carbon ester or carbonic acid ester group decomposes to form carboxylic acid, phenol or imide group which makes the siloxane polymer alkali soluble.

Siloxane polymer (e) of the present invention may be produced by the two steps: a heat addition reaction between a compound represented by formula (I) or (II) and a compound represented by formula (III), (IV) or (V) and a condensation reaction to form a siloxane skeleton. In the course of the synthesis, it is unnecessary to use a metal catalyst (e.g., sodium, potassium or magnesium compounds) which would have a bad effect to resist properties.

Siloxane polymer (e) of the present invention is a siloxane polymer having a structure derived from cyclic heat addition products between a silyl substituted diene compound represented by formula (I) or (II) and an olefin or acetylene compound having tertiary or secondary carbon ester or carbonic acid ester group represented by formula (III), (IV) or (V), that is, so-called Diels-Alder reaction products (VI), (VII), (VIII), (IX), (X) or (XI) explained above.

The siloxane polymer of the present invention may be prepared by a method wherein one or more of the compound of formula (I) or (II) is hydrolyzed or alkoxylated and then condensed, to which the compound of formula (III), (IV) or (V) is heat-added, or a method wherein heat addition between the compound of formula (I) or (II) and the compound of formula (III), (IV) or (V) is carried out to form the compound of formula (VI), (VII), (VIII), (IX), (X) or (XI), one or more of which product is hydrolyzed or alkoxylated and then condensed.

An olefin or acetylene compound not having tertiary or secondary carbon ester or carbonic acid ester group may coexist with the compound of formula (III), (IV) or (V) so that it is incorporated into the structure of the siloxane polymer of the present invention.

One or more of the compound of formula (XII), (XIII), (XIV), (XV) and/or (XVI) explained earlier may be present in the reaction system and co-condensed to improve the properties of the siloxane polymer.

The siloxane polymer contains at least one mol %, preferably 5 to 95 mol %, more preferably 10 to 80 mol % of the structural unit derived from the compound of formula (VI), (VII), (VIII), (IX), (X) or (XI).

Specific examples of siloxane polymer (e) of the present invention are illustrated below.

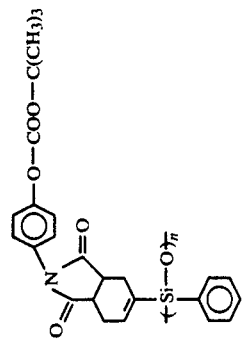
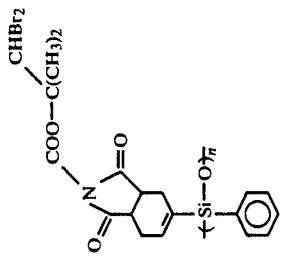
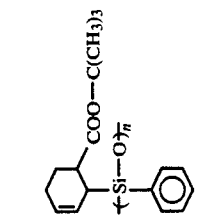
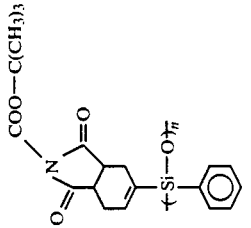
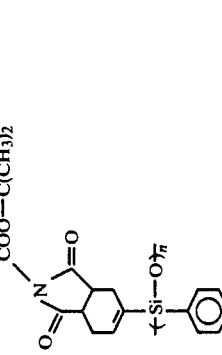
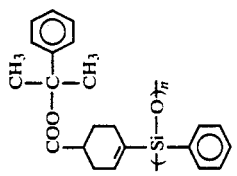
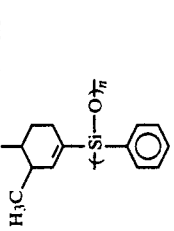
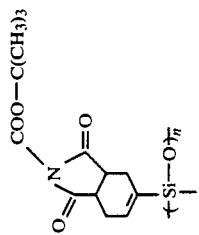
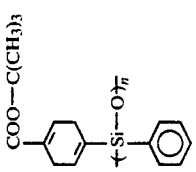
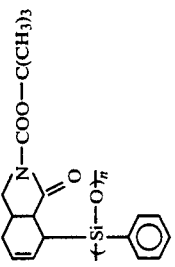

-continued
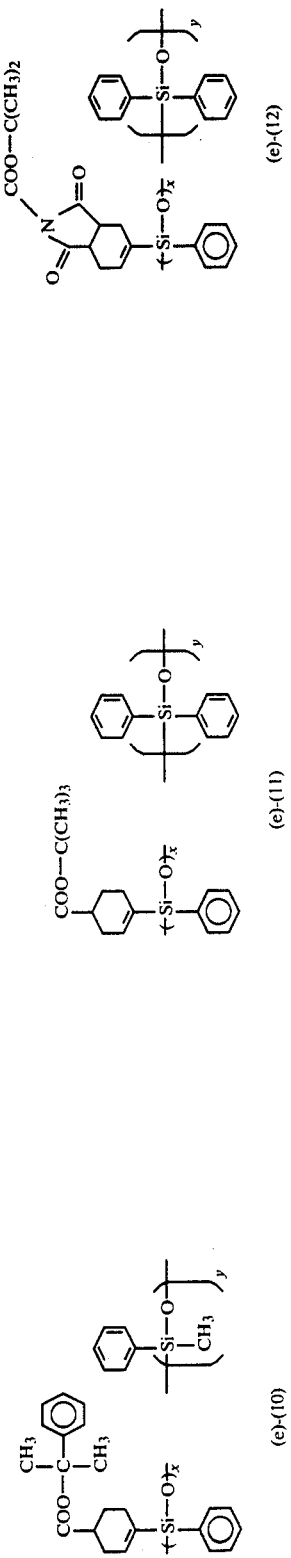
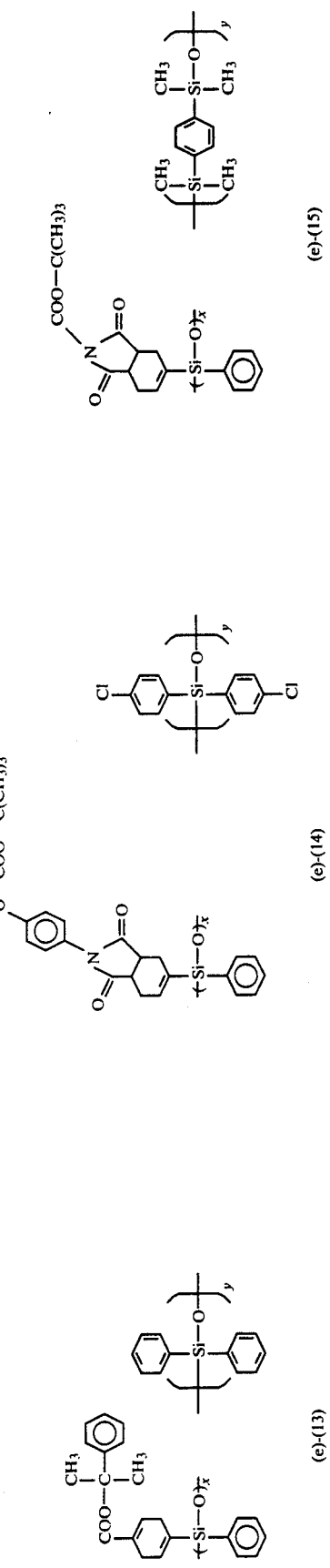

-continued
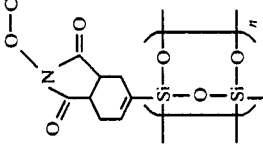
(e)-(18)
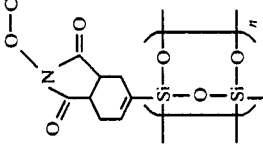
(e)-(21)
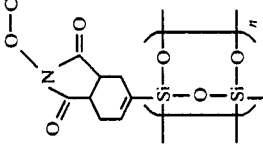
(e)-(17)
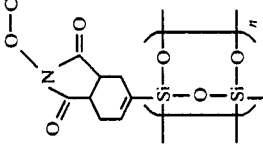
(e)-(20)
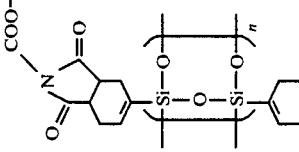
(e)-(16)
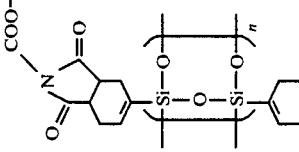
(e)-(19)

-continued
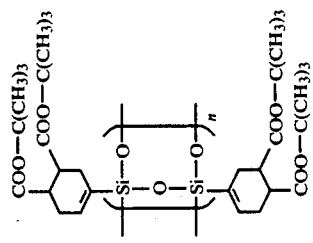
(e)-(23)
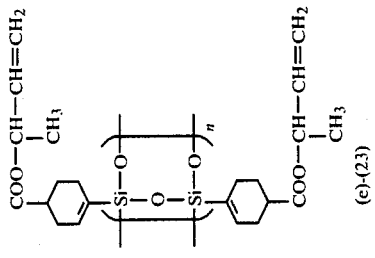
(e)-(24)
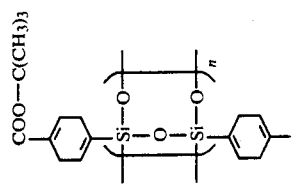
(e)-(22)
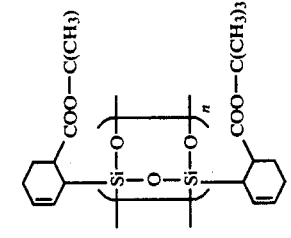
(e)-(27)
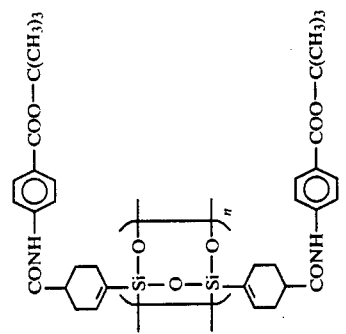
(e)-(26)
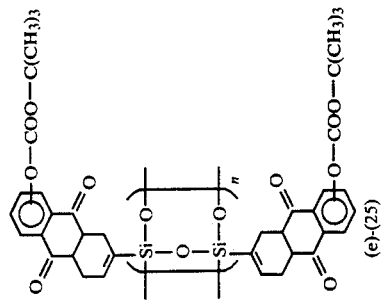
(e)-(25)

-continued
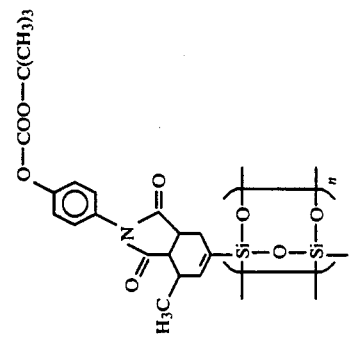
(e)-(30)
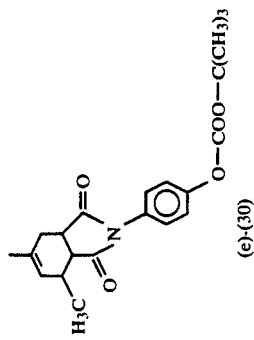
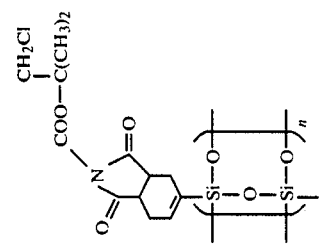
(e)-(29)
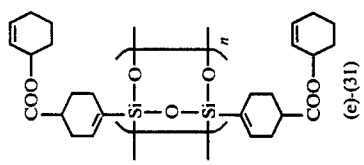
(e)-(31)
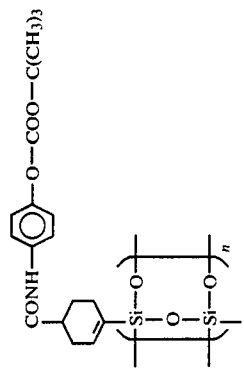
(e)-(28)

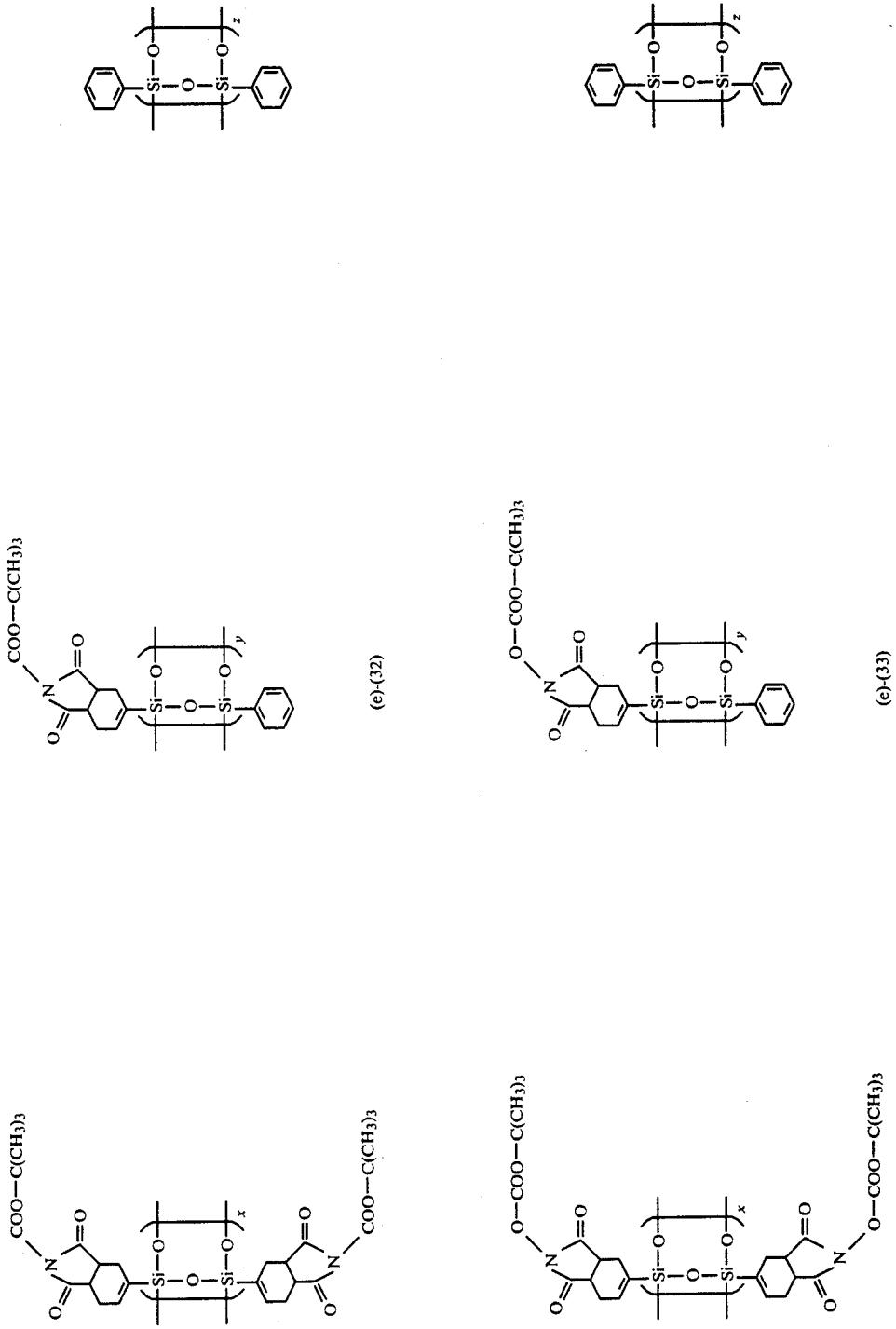

-continued
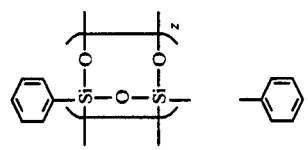 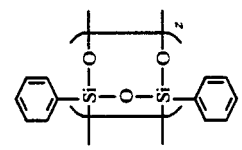
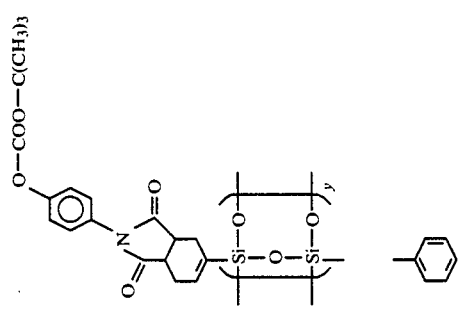 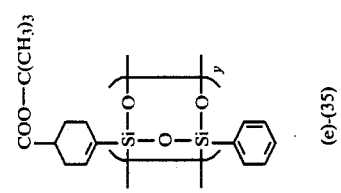
(e)-(34)  (e)-(35)
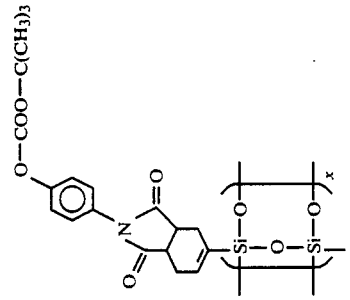 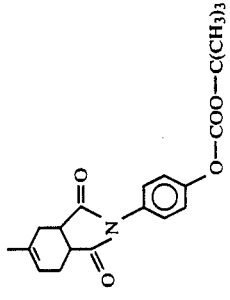 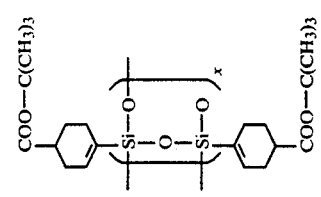

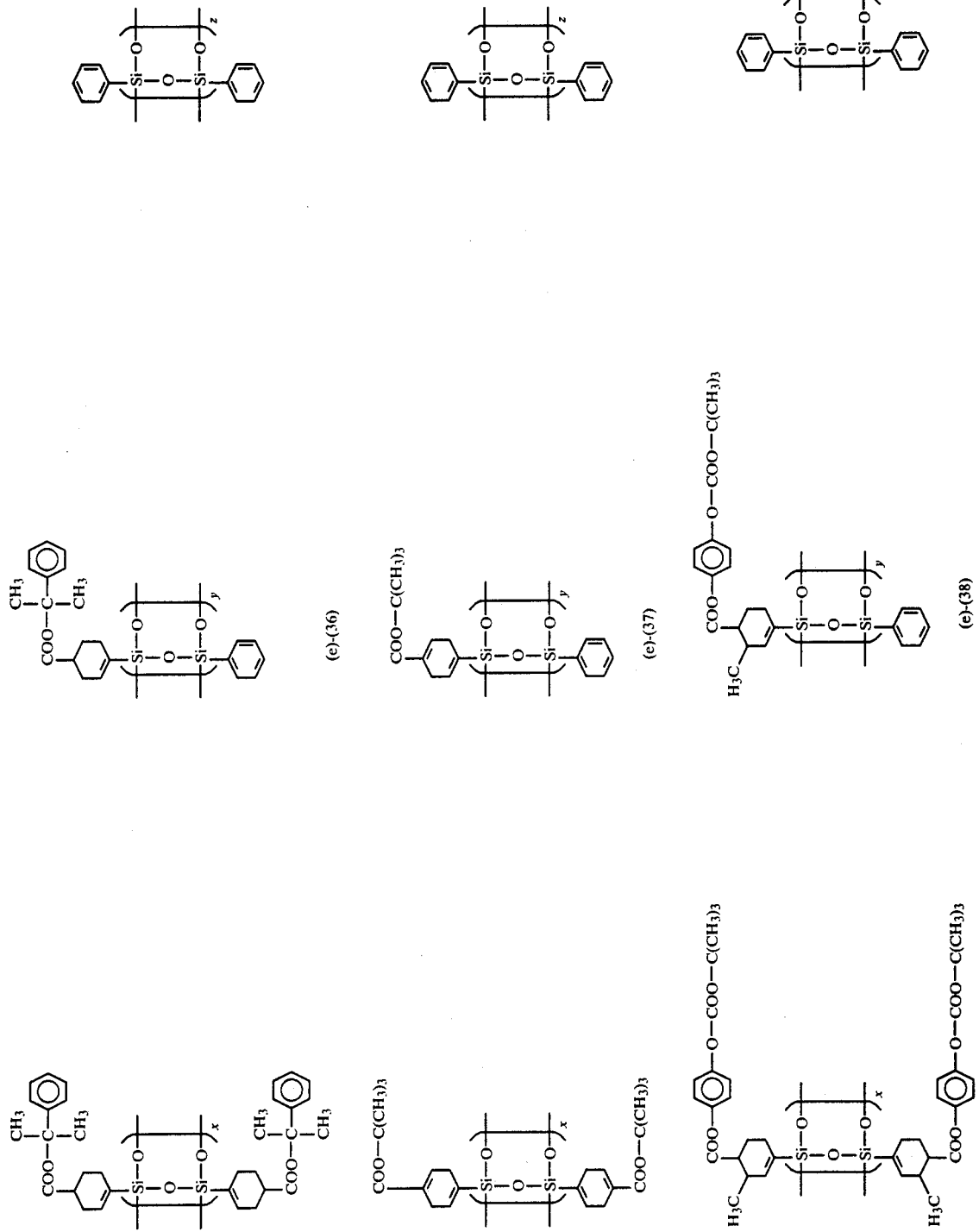

-continued
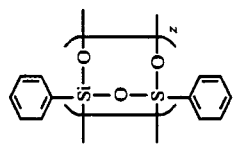 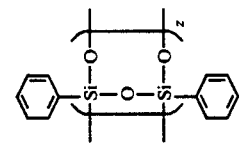
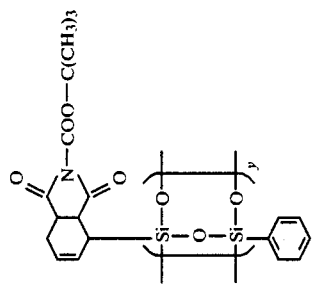 (e)-(39)　　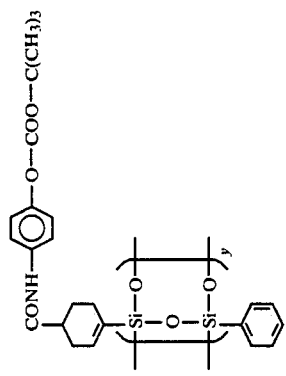 (e)-(40)
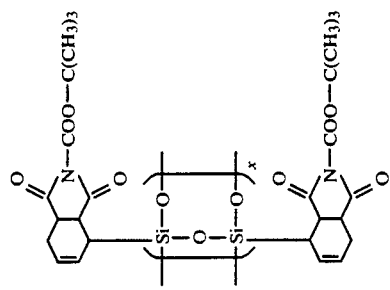 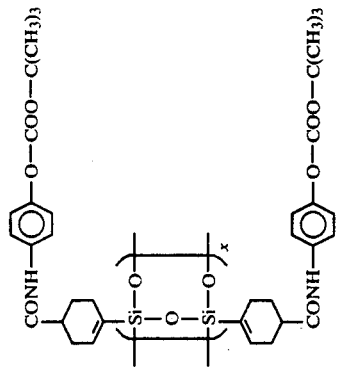

-continued
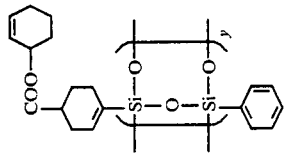
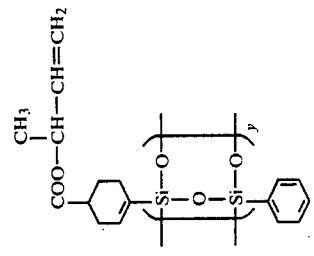 (e)-(41)
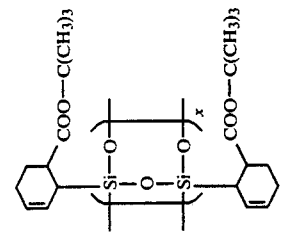 (e)-(42)
(e)-(43)
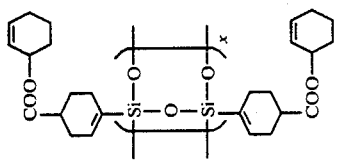
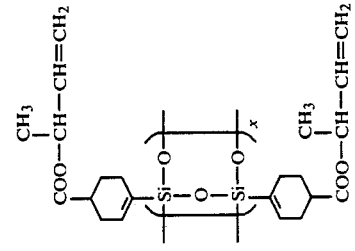

-continued
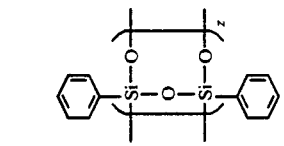
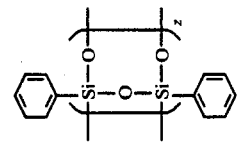
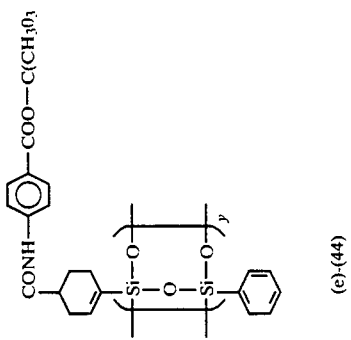
(e)-(44)
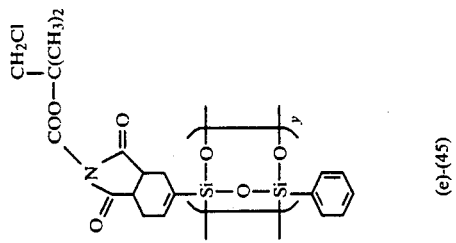
(e)-(45)
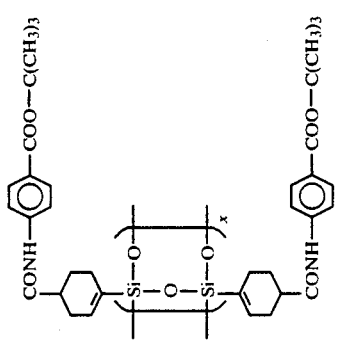
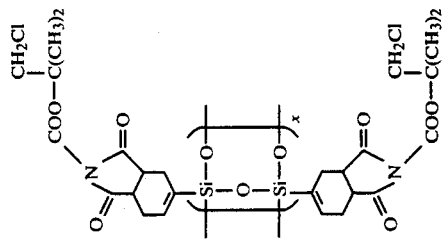

-continued
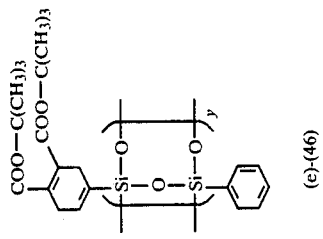
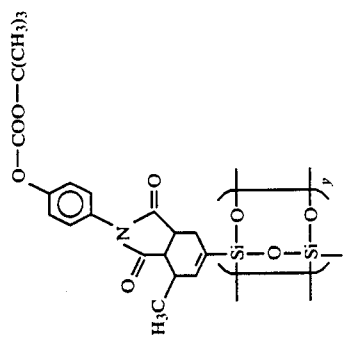 
(e)-(47)
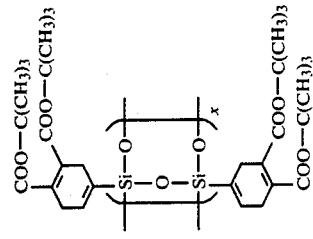
(e)-(46)
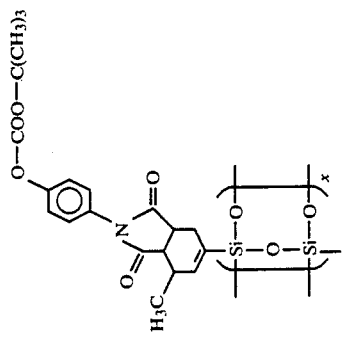 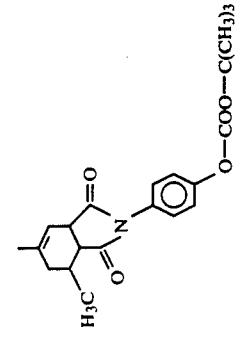

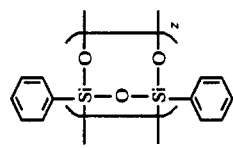
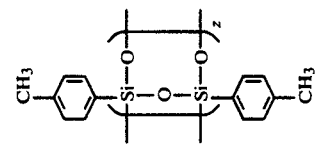
-continued
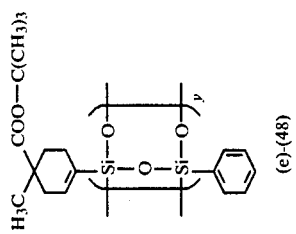
(e)-(48)
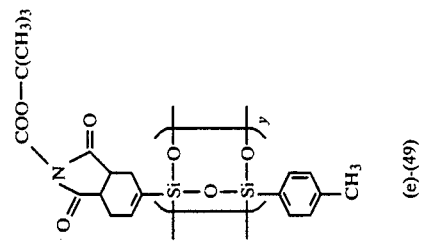
(e)-(49)
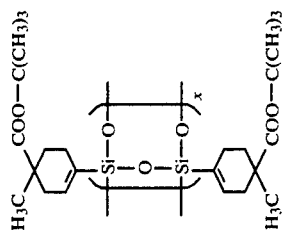
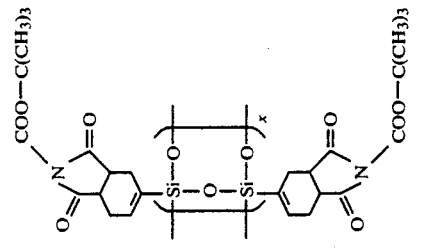

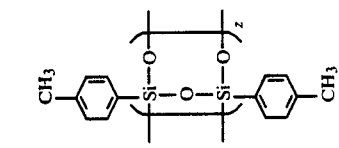 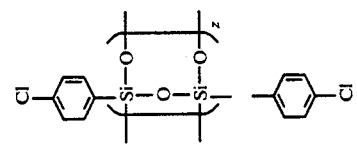
-continued
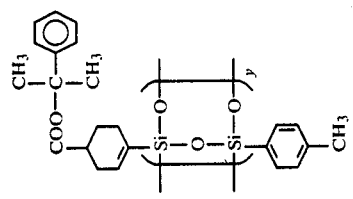 (e)-(50)  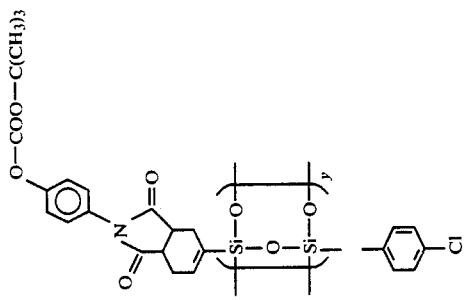 (e)-(51)
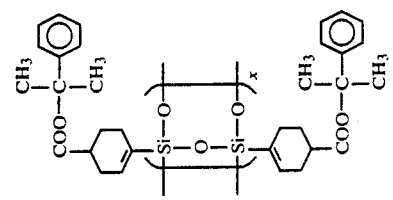 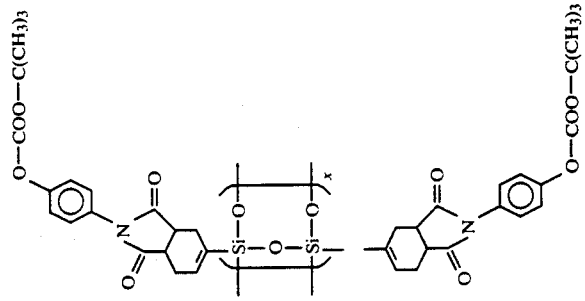

In the foregoing examples of the compound, n is an integer of not less than 1 and x, y and z each is an integer of not less than 0.

The molecular weight of the siloxane polymer (e) of the invention can freely be controlled by changing the condensation conditions, but preferred value thereof is not less than 500, more preferably 1,000 to 500,000 expressed in the weight averaged molecular weight.

An amount of the siloxane polymer to be contained in the positive working light-sensitive composition is generally 5 to 99% by weight, preferably 20 to 95%, more preferably 30 to 90% by weight based on the solid content of the light-sensitive composition.

Siloxane Polymer (f)

Siloxane polymer (f) of the present invention contains silyl ether or silyl ester group. The siloxane polymer per se does not show good alkali solubility but when it is combined with a compound capable of generating an acid through irradiation of actinic rays or radiant rays, the silyl ether or silyl ester group decomposes to form carboxylic acid or phenol group which makes the siloxane polymer alkali soluble.

Siloxane polymer (f) of the present invention may be produced by the two steps: a heat addition reaction between a compound represented by formula (I) or (II) and a compound represented by formula (III), (IV) or (V) and a condensation reaction to form a siloxane skeleton. In the course of the synthesis, it is unnecessary to use a metal catalyst (e.g., sodium, potassium or magnesium compounds) which would have a bad effect to resist properties.

Siloxane polymer (f) of the present invention is a siloxane polymer having a structure derived from cyclic heat addition products between a silyl substituted diene compound represented by formula (I) or (II) and an olefin or acetylene compound having silyl ether or silyl ester group represented by formula (III), (IV) or (V), that is, so-called Diels-Alder reaction products (VI), (VII), (VIII), (IX), (X) or (XI) explained above.

The siloxane polymer of the present invention may be prepared by a method wherein one or more of the compound of formula (I) or (II) is hydrolyzed or alkoxylated and then condensed, to which the compound of formula (III), (IV) or (V) is heat-added, or a method wherein heat addition between the compound of formula (I) or (II) and the compound of formula (III), (IV) or (V) is carried out to form the compound of formula (VI), (VII), (VIII), (IX), (X) or (XI), one or more of which product is hydrolyzed or alkoxylated and then condensed.

An olefin or acetylene compound not having silyl ether or silyl ester group may coexist with the compound of formula (III), (IV) or (V) so that it is incorporated into the structure of the siloxane polymer of the present invention.

One or more of the compound of formula (XII), (XIII), (XIV), (XV) and/or (XVI) explained earlier may be present in the reaction system and co-condensed to improve the properties of the siloxane polymer.

The siloxane polymer contains at least one mol %, preferably 5 to 95 mol %, more preferably 10 to 80 mol % of the structural unit derived from the compound of formula (VI), (VII), (VIII), (IX), (X) or (XI).

Specific examples of siloxane polymer (f) of the present invention are illustrated below.

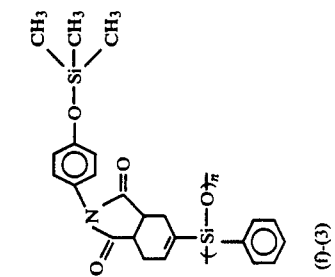
(f)-(3)
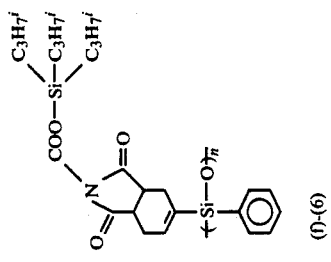
(f)-(6)
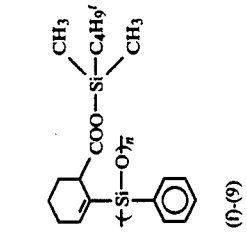
(f)-(9)
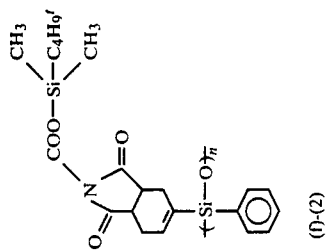
(f)-(2)
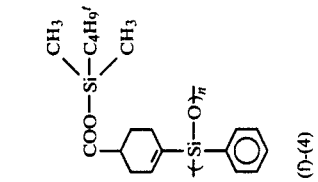
(f)-(4)
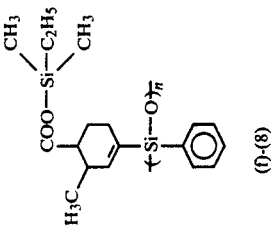
(f)-(8)
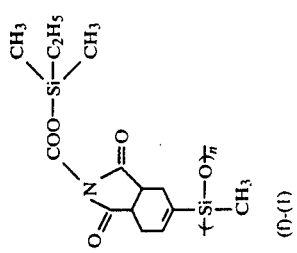
(f)-(1)
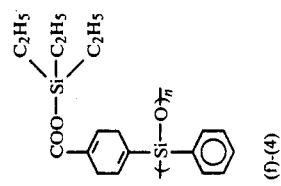
(f)-(4)
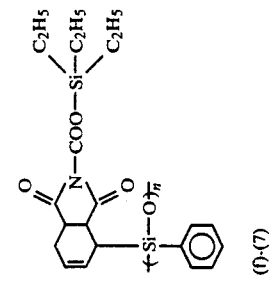
(f)-(7)

-continued
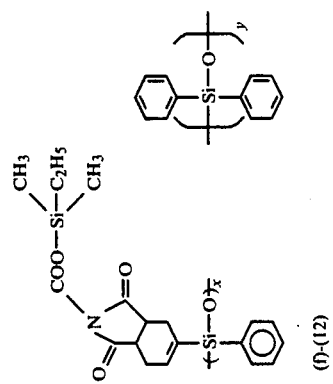
(I)-(12)
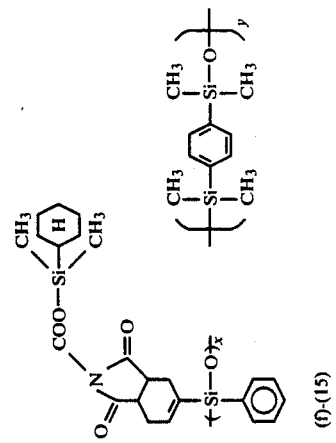
(I)-(15)
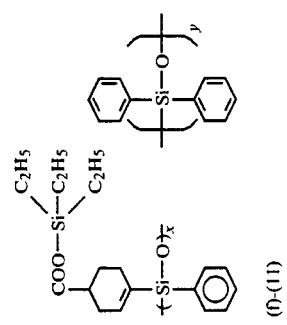
(I)-(11)
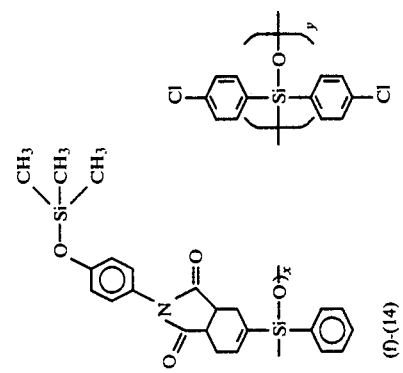
(I)-(14)
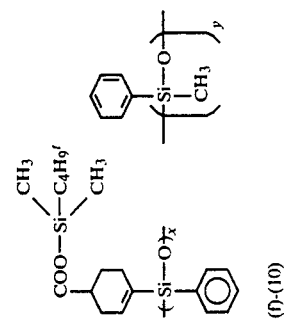
(I)-(10)
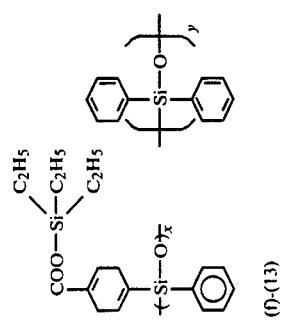
(I)-(13)

-continued
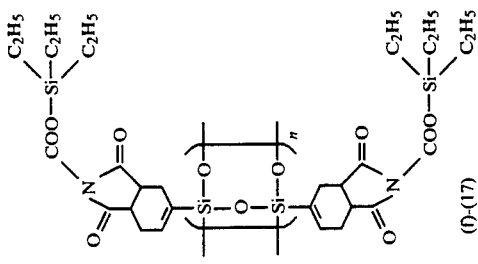
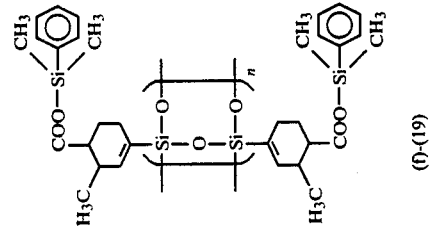
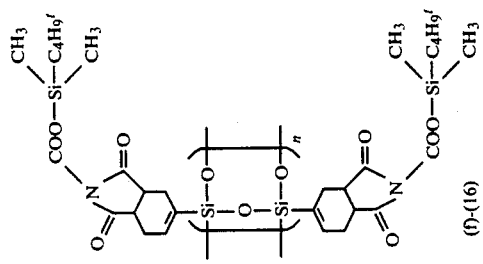
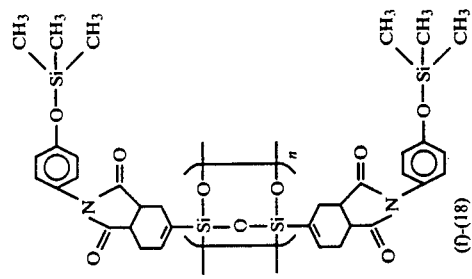

-continued
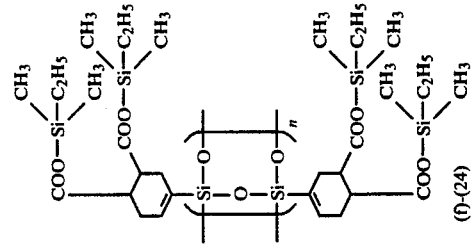
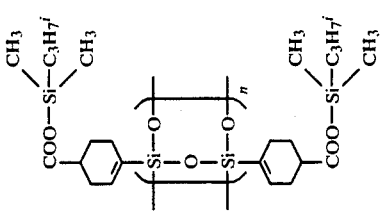
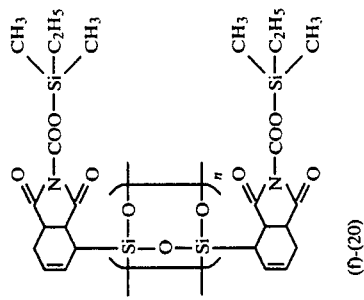
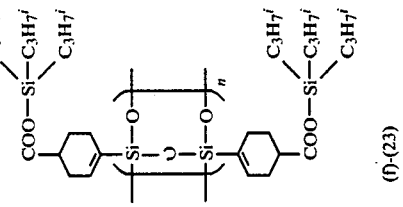
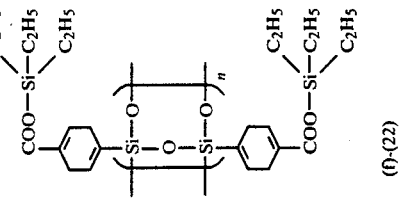

-continued
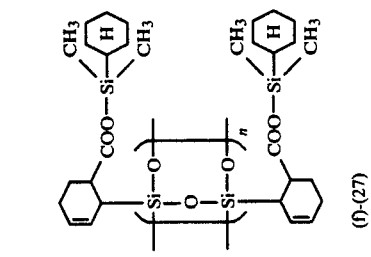
(f)-(27)
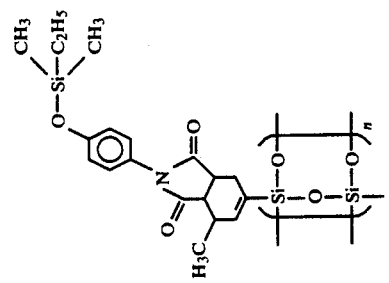
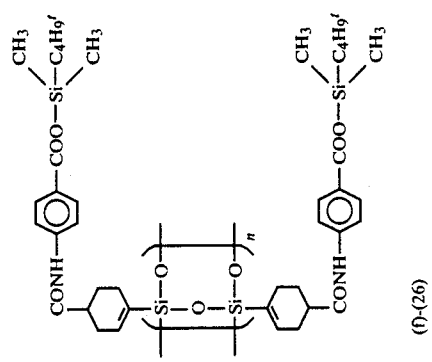
(f)-(26)
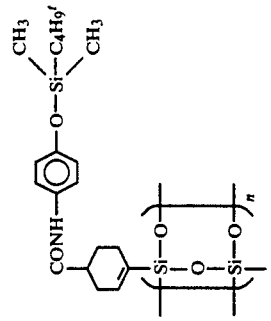
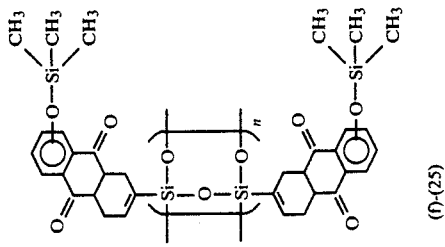
(f)-(25)

-continued
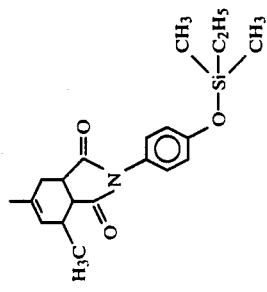
(f)-(30)
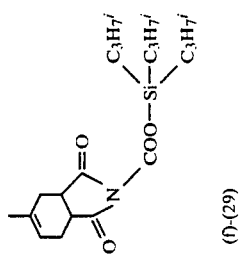
(f)-(29)
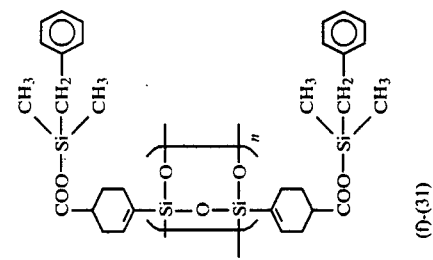
(f)-(31)
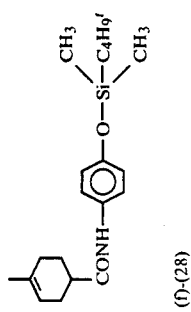
(f)-(28)

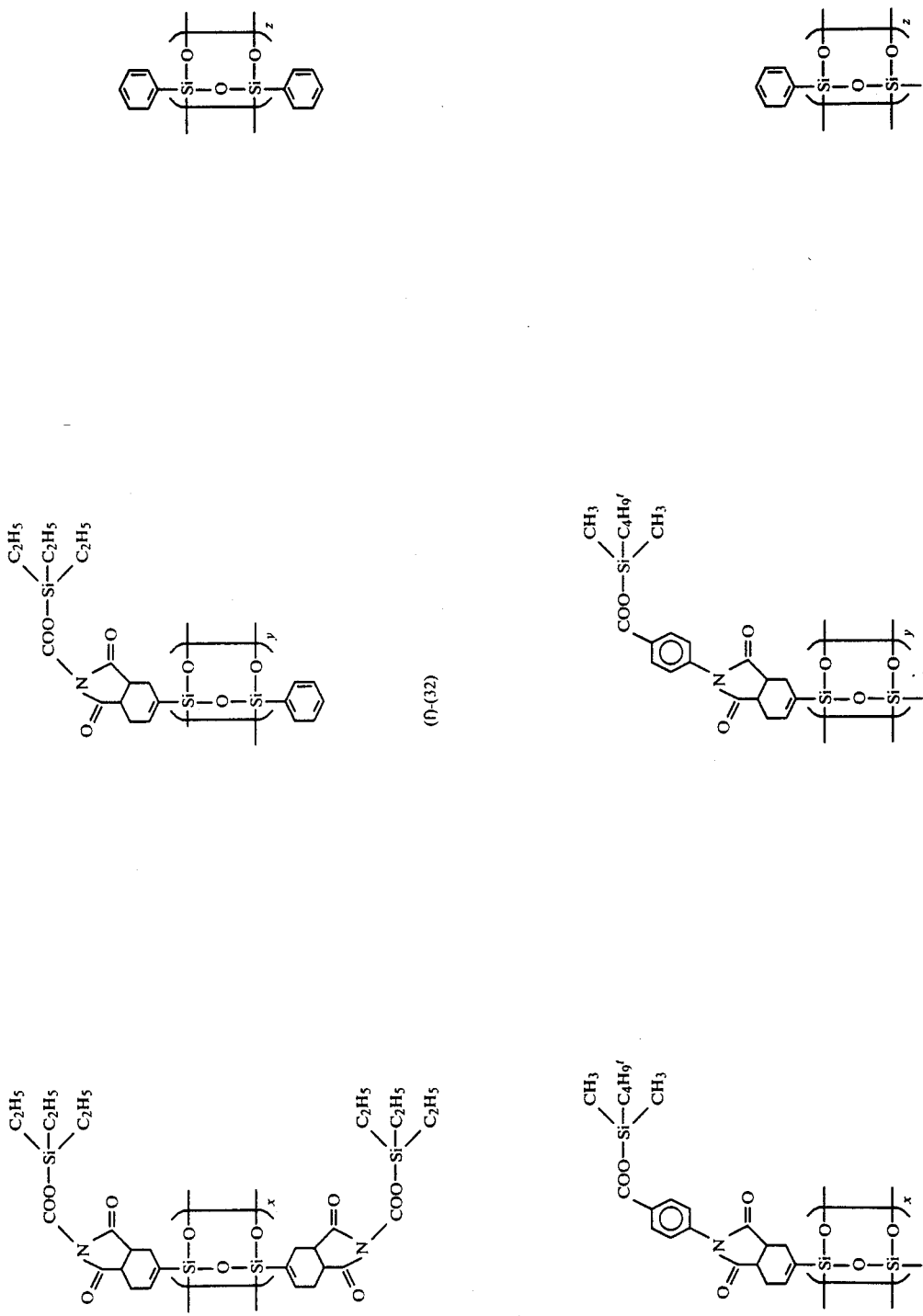

-continued
 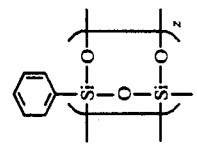 
(I)-(33)
 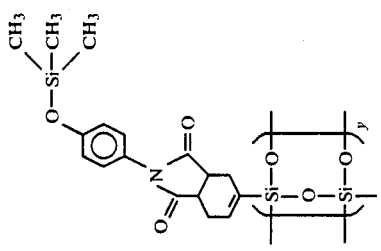 
(I)-(34)
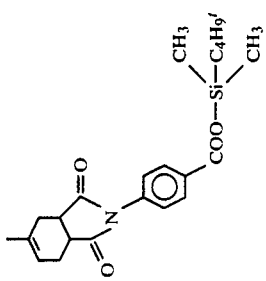 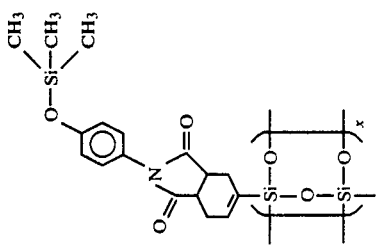 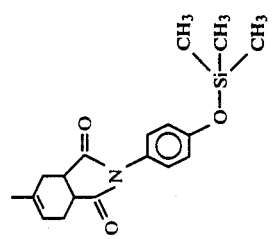

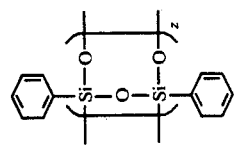
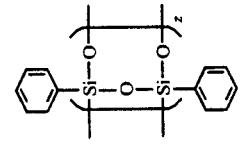
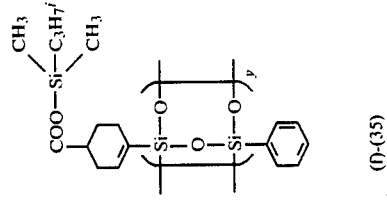
(I)-(35)
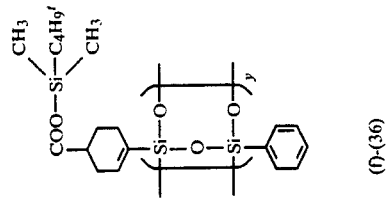
(I)-(36)
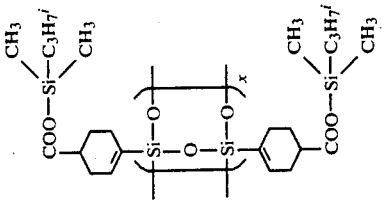
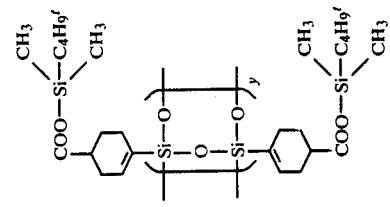

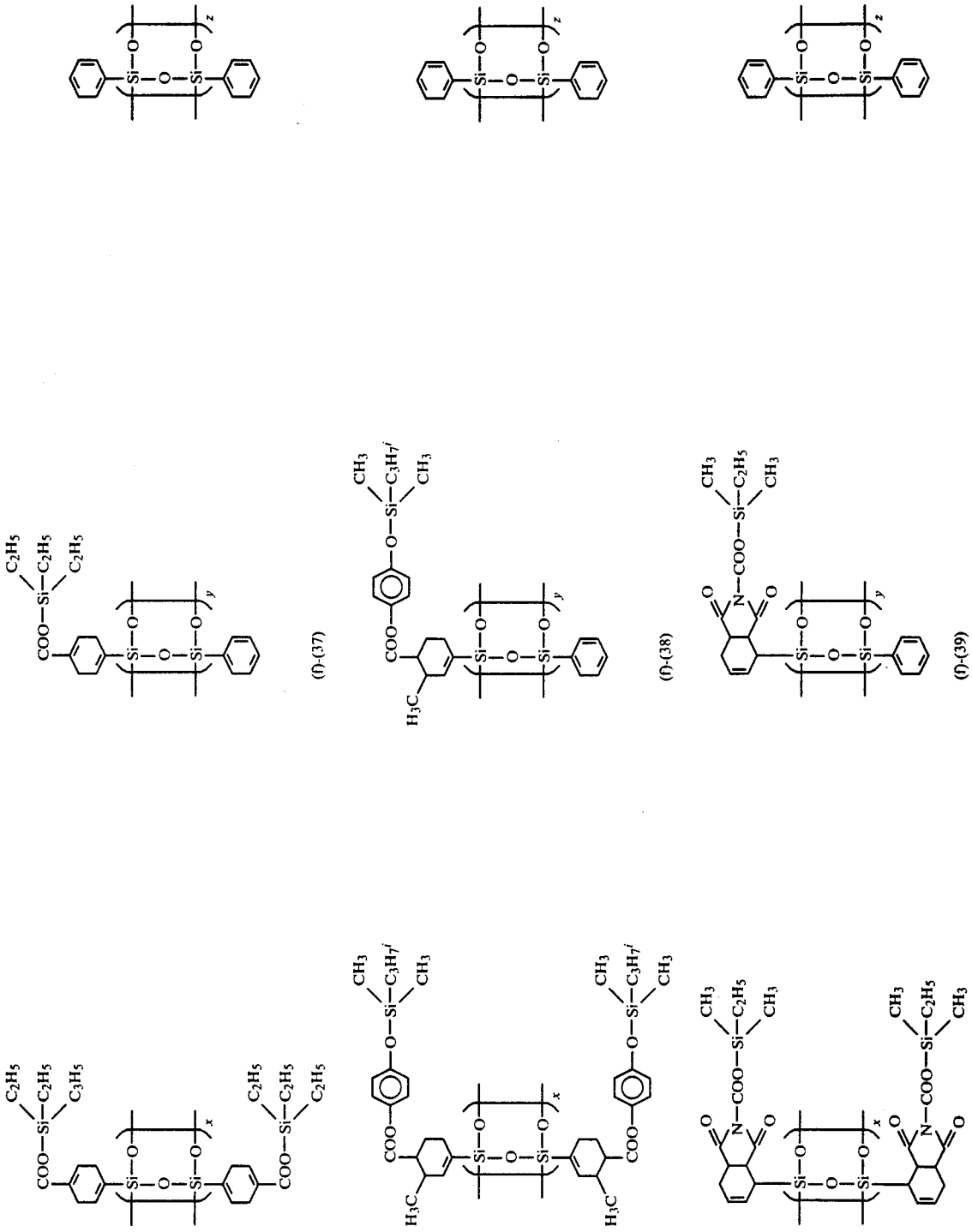

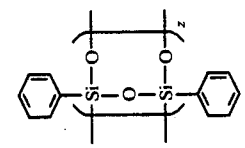
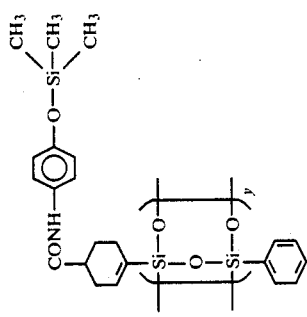 (f)-(40)
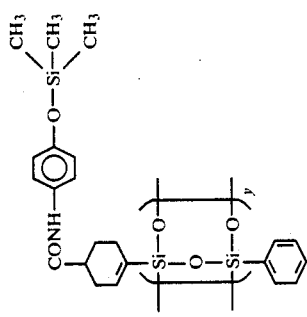 (f)-(41)
-continued
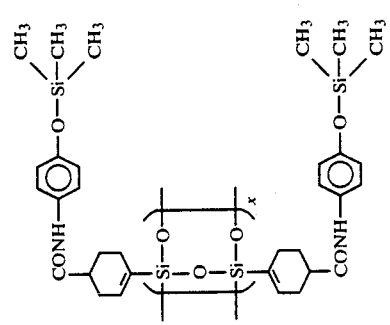
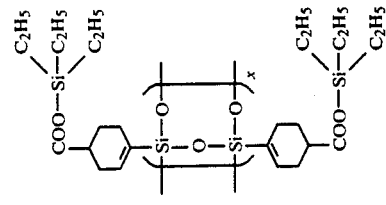

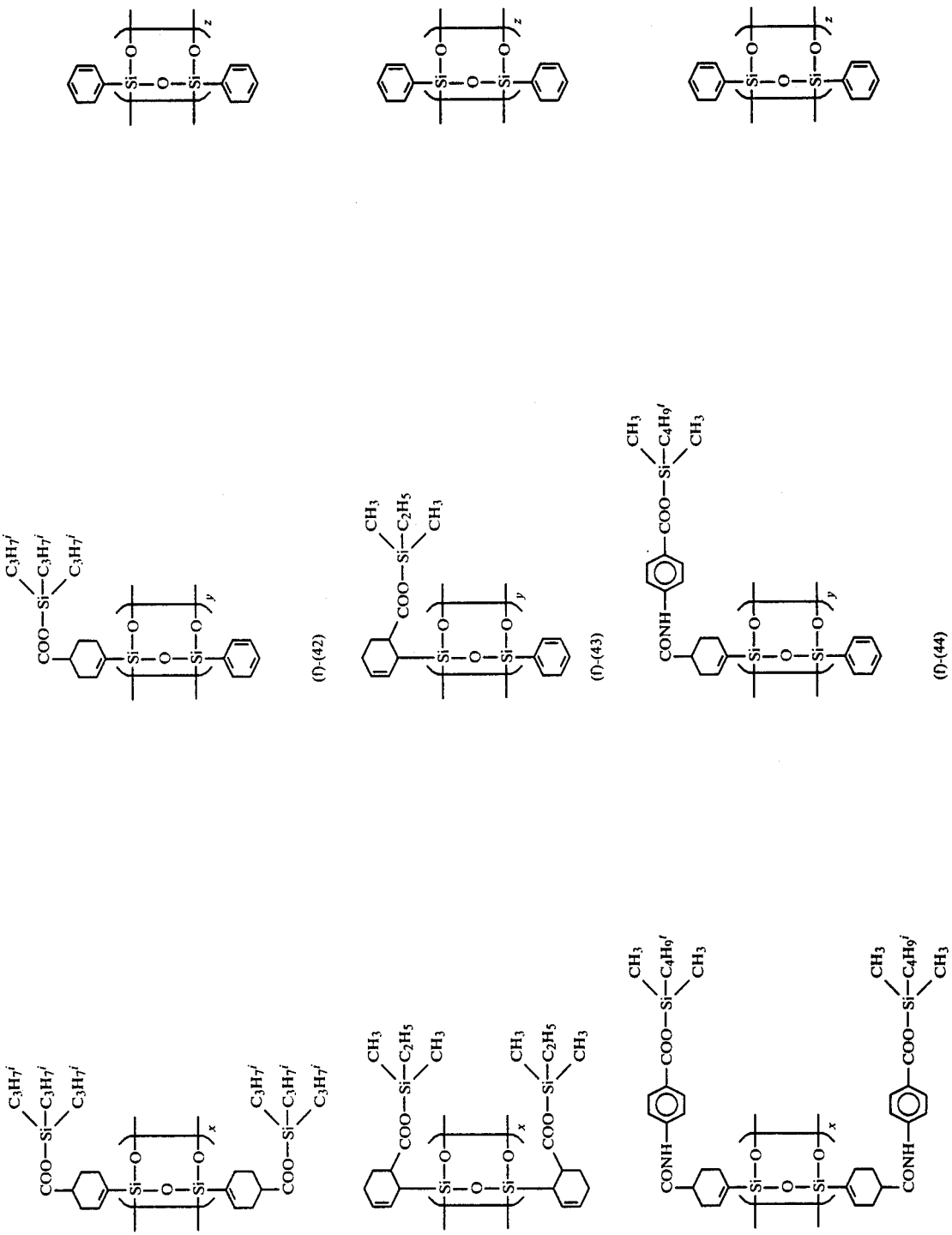

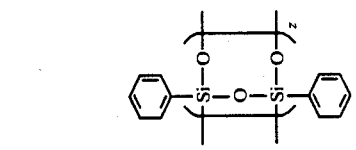
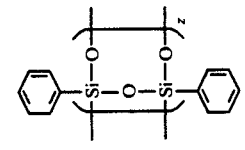
-continued
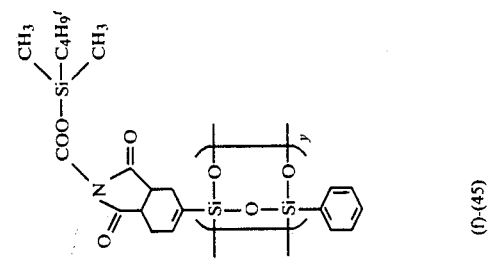
(I)-(45)
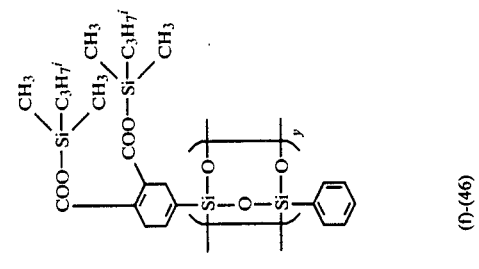
(I)-(46)
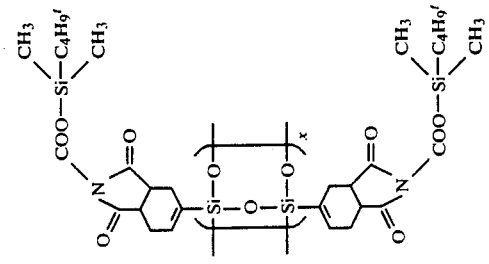
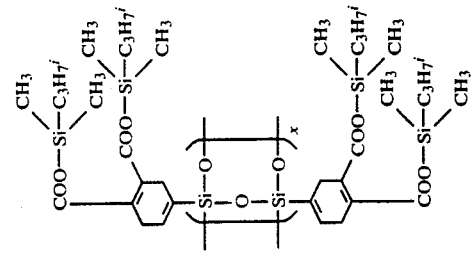

191
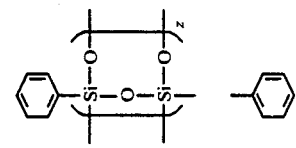
-continued
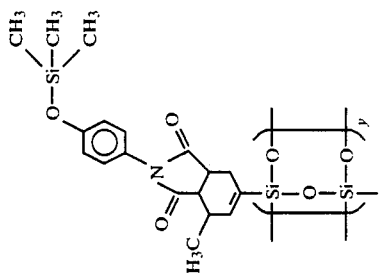
(f)-(47)
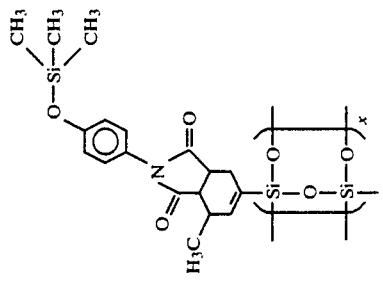
192
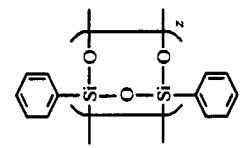
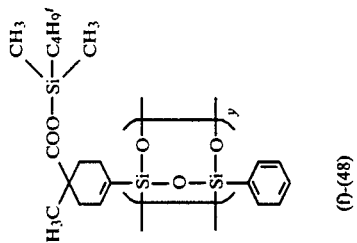
(f)-(48)
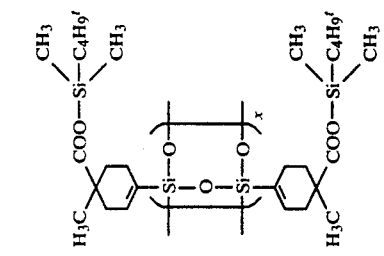

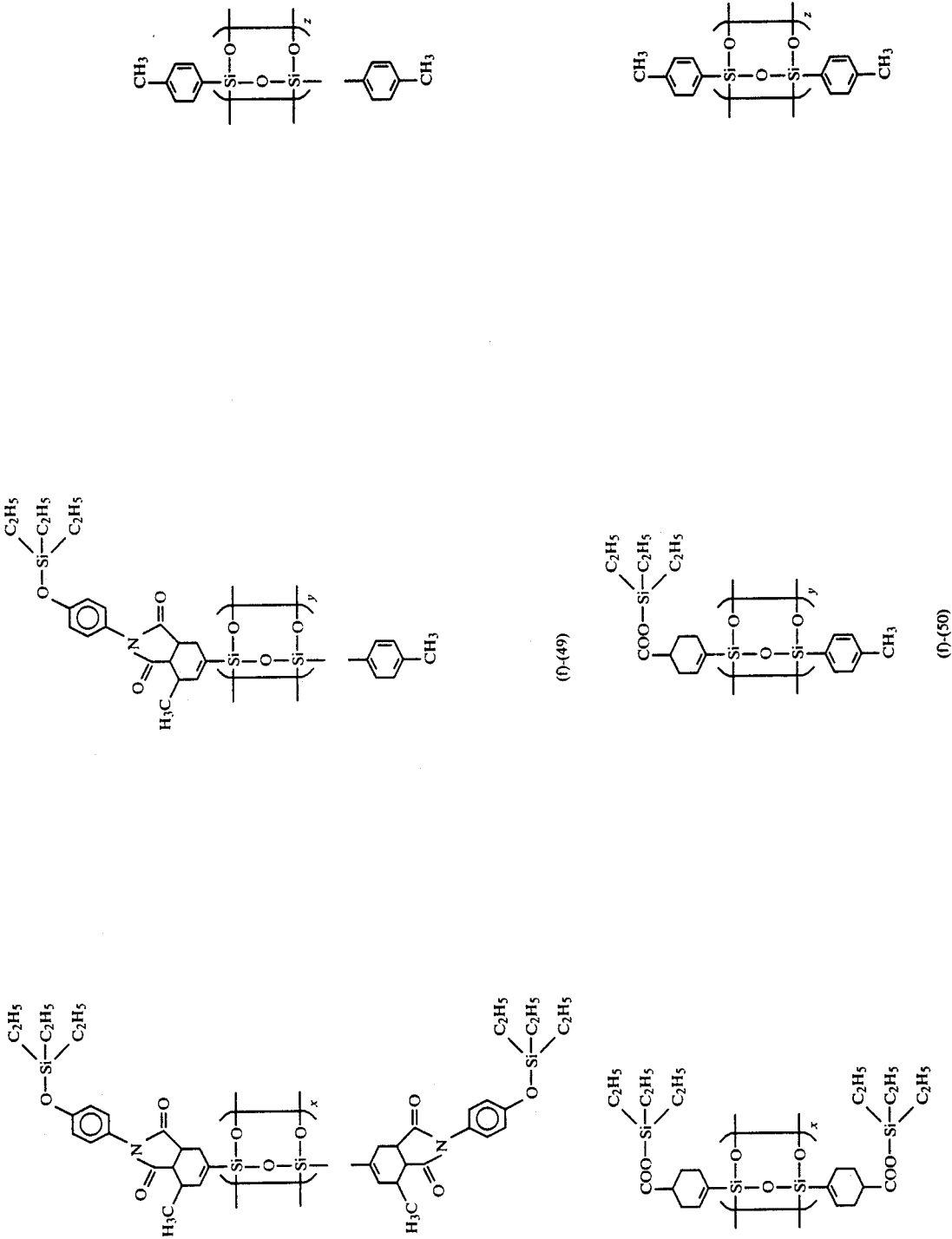

-continued
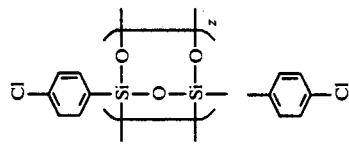
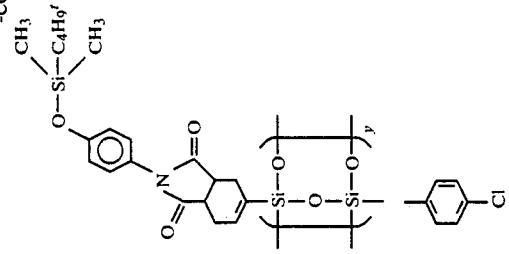
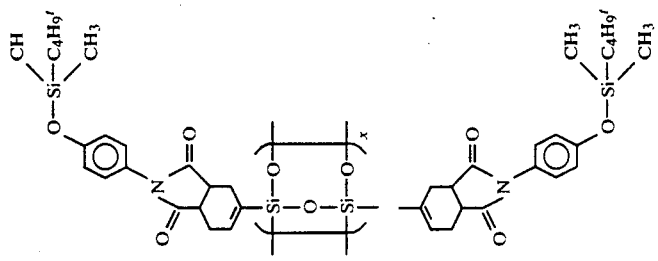
(I)-(51)

In the foregoing examples of the compound, n is an integer of not less than 1 and x, y and z each is an integer of not less than 0.

The molecular weight of the siloxane polymer (f) of the invention can freely be controlled by changing the condensation conditions, but preferred value thereof is not less than 500, more preferably 1,000 to 500,000 expressed in the weight averaged molecular weight.

An amount of the siloxane polymer to be contained in the positive working light-sensitive composition is generally 5 to 99% by weight, preferably 20 to 95%, more preferably 30 to 90% by weight based on the solid content of the light-sensitive composition.

Siloxane Polymer (g)

Siloxane polymer (g) of the present invention contains orthoquinonediazide group. The siloxane polymer when irradiated with actinic rays or radiant rays, the orthoquinonediazide group decomposes to form carboxyl group which makes the siloxane polymer alkali soluble.

Siloxane polymer (g) of the present invention may be produced by the three steps: (i) a heat addition reaction between a compound represented by formula (I) or (II) and a compound represented by formula (III), (IV) or (V), (ii) a condensation reaction to form a siloxane skeleton and (iii) a reaction for introduction of orthoquinonediazide group. In the course of the synthesis, it is unnecessary to use a metal catalyst (e.g., sodium, potassium or magnesium compounds) which would have a bad effect to resist properties.

Siloxane polymer (g) of the present invention is a siloxane polymer having a structure derived from cyclic heat addition products between a silyl substituted diene compound represented by formula (I) or (II) and an olefin or acetylene compound having phenolic OH, N-hydroxyamide, N-hydroxyimide or anilino group represented by formula (III), (IV) or (V), that is, so-called Diels-Alder reaction products (VI), (VII), (VIII), (IX), (X) or (XI) explained above, to which structure orthoquninonediazide groups have been introduced.

The siloxane polymer of the present invention may be prepared by a method wherein one or more of the compound of formula (I) or (II) is hydrolyzed or alkoxylated and then condensed, to which the compound of formula (III), (IV) or (V) is heat-added and then 1, 2-naphthoquinone-2-diazide-4- or 5-sulfonylhalide is reacted, or a method wherein heat addition between the compound of formula (I) or (II) and the compound of formula (III), (IV) or (V) is carried out to form the compound of formula (VI), (VII), (VIII), (IX), (X) or (XI), one or more of which product is hydrolyzed or alkoxylated and then condensed, after which 1, 2-naphthoquinone-2-diazide-4- or 5-sulfonylhalide is reacted.

An olefin or acetylene compound not having phenolic OH, N-hydroxyamide, N-hydroxyimide or anilino group may coexist with the compound of formula (III), (IV) or (V) so that it is incorporated into the structure of the siloxane polymer of the present invention.

One or more of the compound of formula (XII), (XIII), (XIV), (XV) and/or (XVI) explained earlier may be present in the reaction system and co-condensed to improve the properties of the siloxane polymer.

The siloxane polymer contains at least one mol %, preferably 5 to 95 mol %, more preferably 10 to 80 mol % of the structural unit derived from the compound of formula (VI), (VII), (VIII), (IX), (X) or (XI).

Siloxane polymer (g) of the present invention may be prepared by reacting a siloxane polymer having at least one mol % of a structural unit derived from cyclic heat addition products between a silyl substituted diene compound represented by formula (I) or (II) and an olefin or acetylene compound represented by formula (III), (IV) or (V), with 1, 2-naphthoquinone-2-diazide-4- or 5-sulfonylhalide in a reaction medium in the presence of a basic catalyst. An amount of 1, 2-naphthoquinone-2-diazide-4- or 5-sulfonylhalide varies depending on the number of phenolic OH, N-hydroxyamide, N-hydroxyimide or anilino group but usually is 0.1 to 1 mol per one equivalent of the group.

The basic catalyst is an amine such as trimethylamine, triethylamine, tripropylamine, pyridine or tetramethylammonium hydroxide, or inorganic alkali such as sodium hydroxide, potassium hydroxide or sodium carbonate. An amount of the catalyst used is usually 0.8 to 2.0 mol, preferably 1.0 to 2.0 mol per one mol of 1, 2-naphthoquinone-2-diazide-4- or 5-sulfonylhalide.

The reaction medium used in the above reaction is a ketone such as acetone, methyl ethyl ketone or metyl isobutyl ketone, a cyclic ether such as dioxane or tetrahydrofuran, a cyclic ketone such as cyclopentanone or cyclohexanone, an amide such as N,N-dimethylformamide or N,N-dimethylacetamide, an ester such as γ-butyrolactone, ethylene carbonate or propylene carbonate, pyrrolidone, N-methylpyrrolidone or water. An amount of the reaction medium used is usually 100 to 1000 parts by weight per 100 parts by weight of the siloxane polymer. A reaction temperature is usually −30° C. to 60° C., preferably 0° C. to 40° C.

Specific examples of siloxane polymer (g) of the present invention are illustrated below.

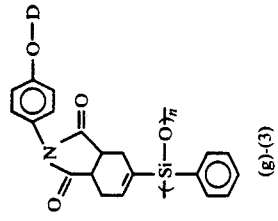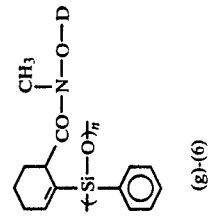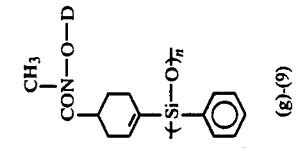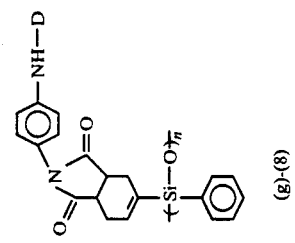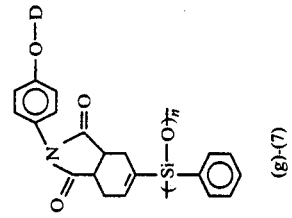

-continued
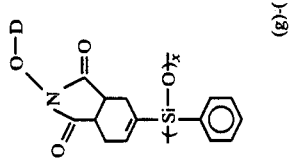
(g)-(11)
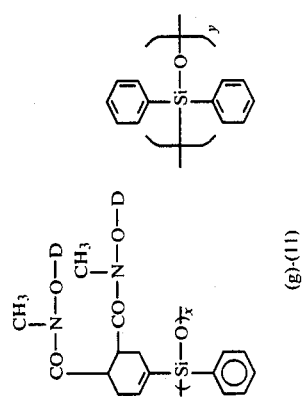
(g)-(12)
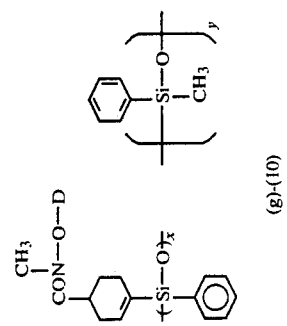
(g)-(10)
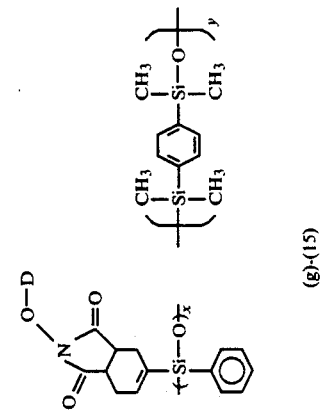
(g)-(15)
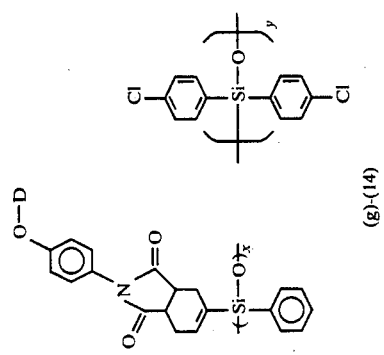
(g)-(14)
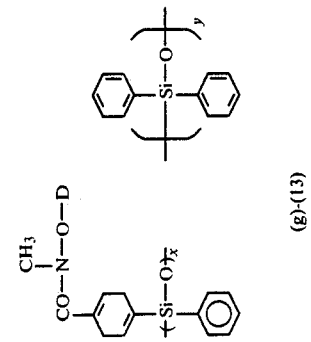
(g)-(13)

-continued
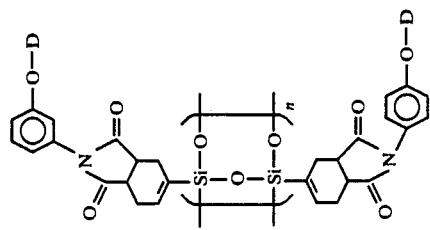
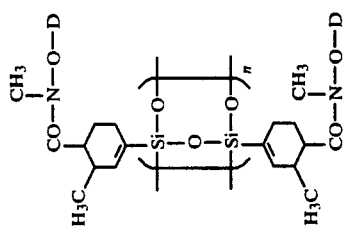
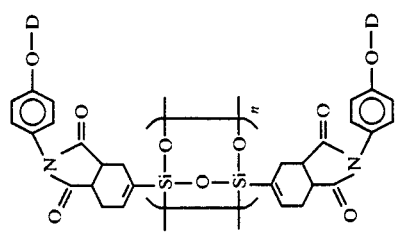
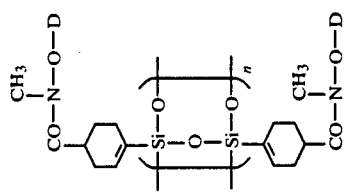
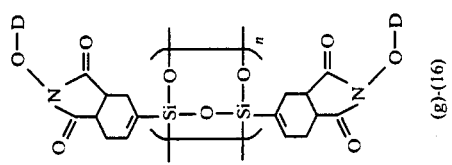
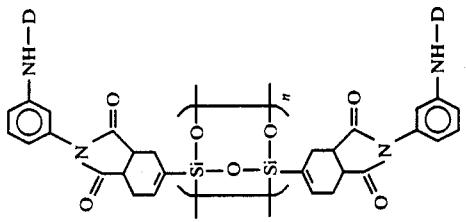

-continued
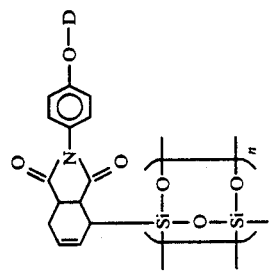
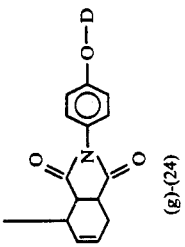
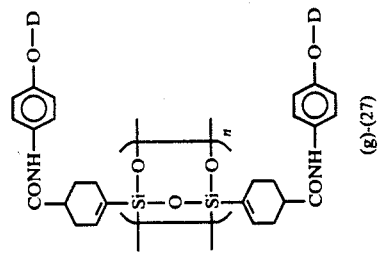
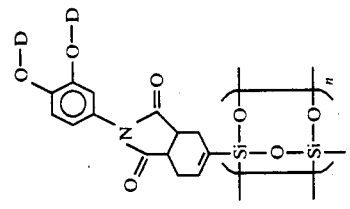
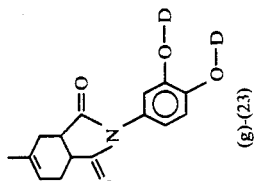
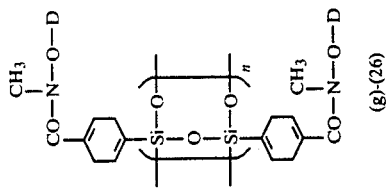
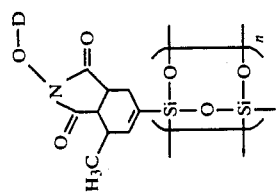
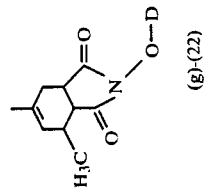
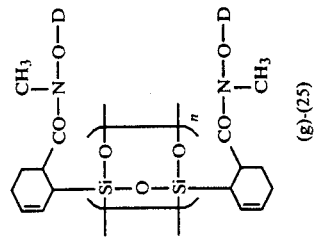

-continued
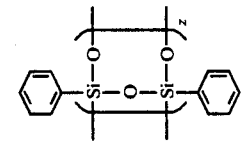
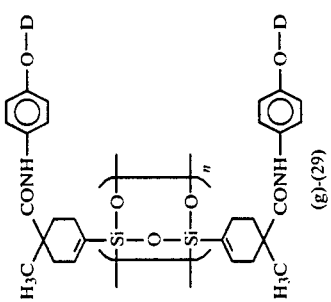
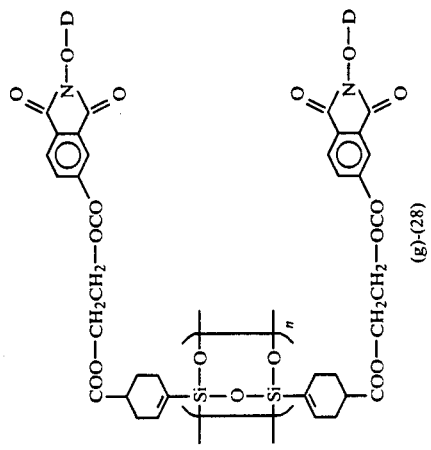
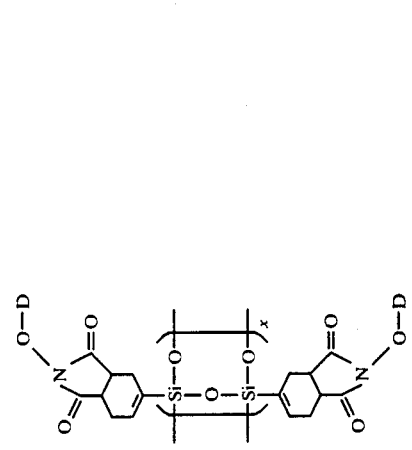

-continued
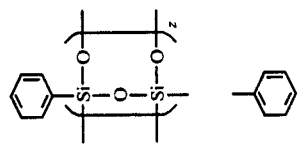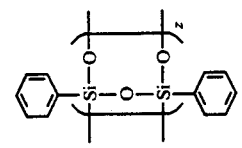
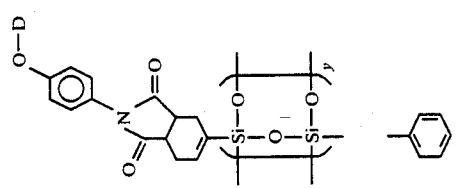(g)-(31)    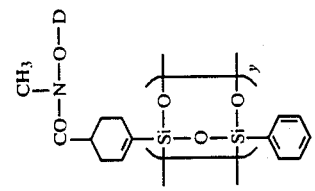(g)-(32)
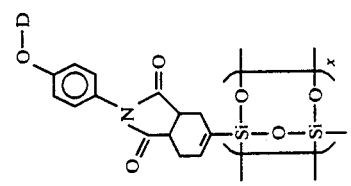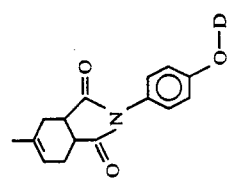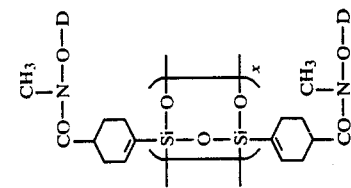

211
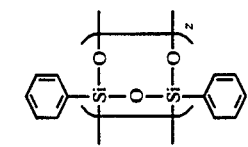
-continued
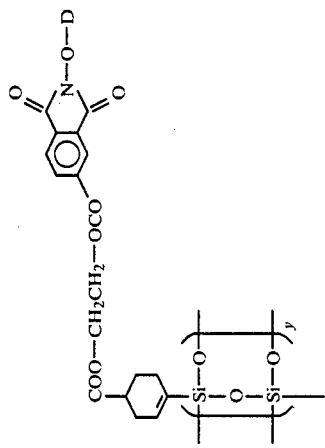
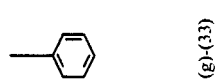
(g)-(33)
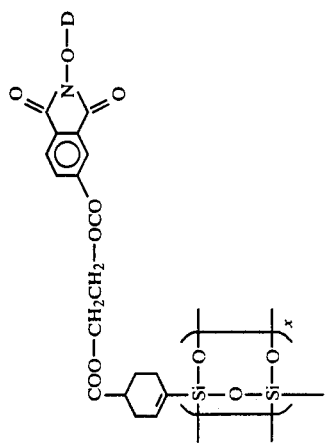
212
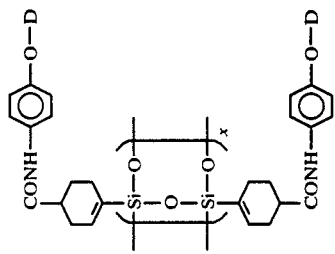
(g)-(34)
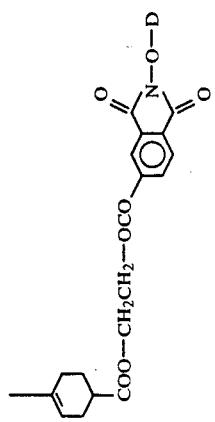

213
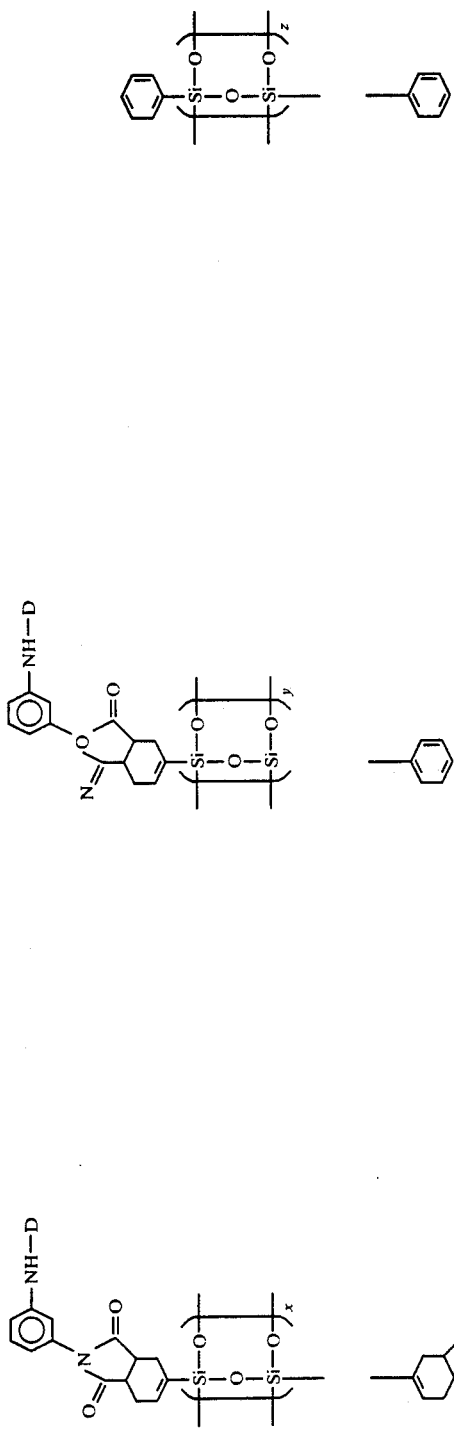
214
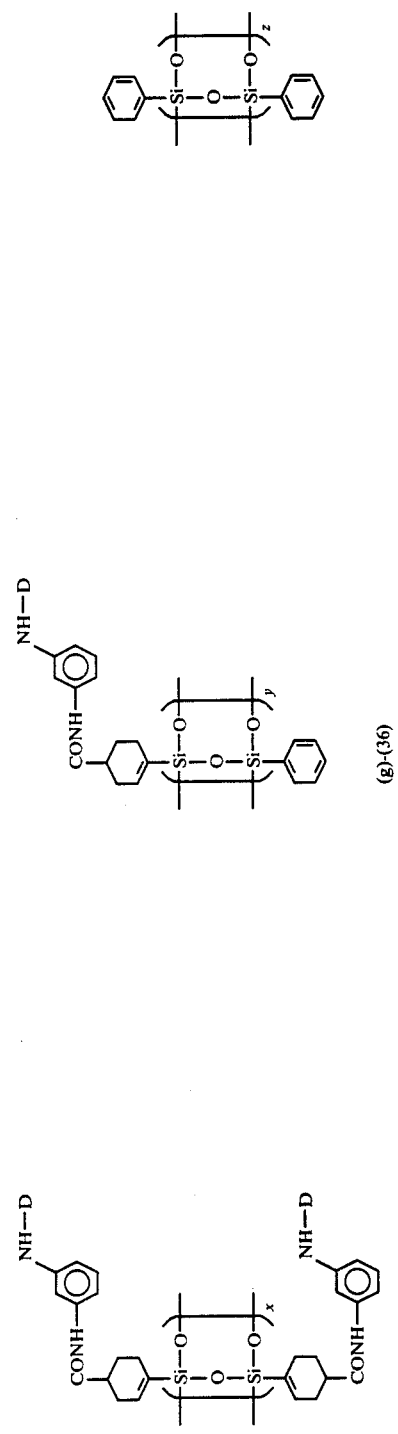
(g)-(36)

215
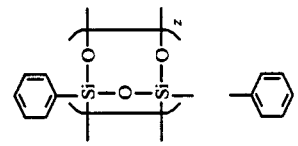
216
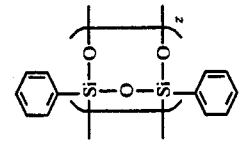
-continued
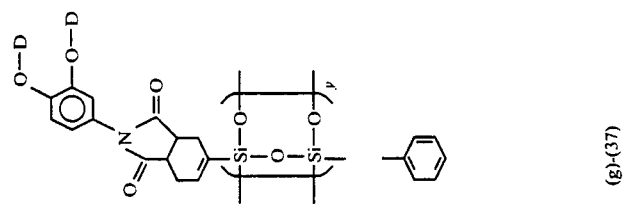
(g)-(37)
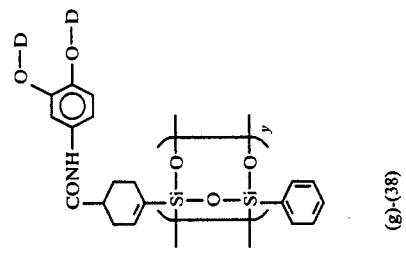
(g)-(38)
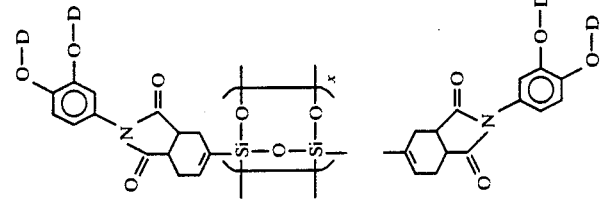
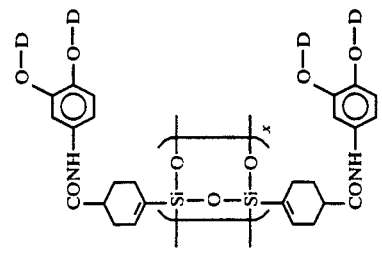

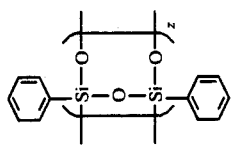
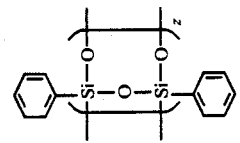
-continued
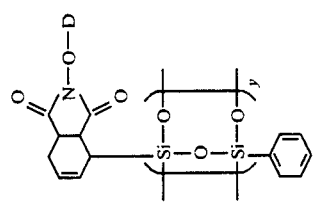
(g)-(39)
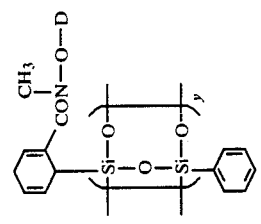
(g)-(40)
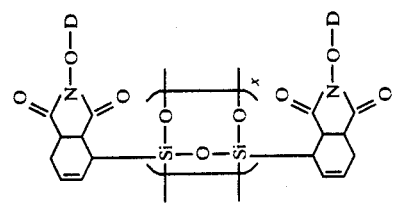
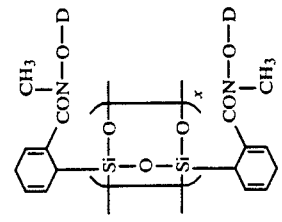

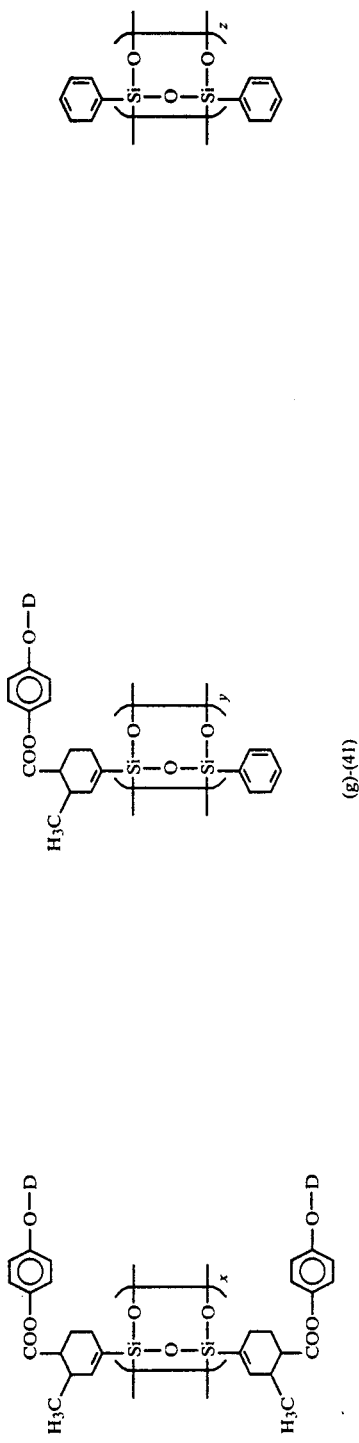

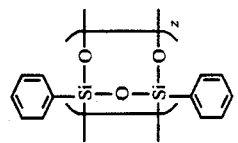
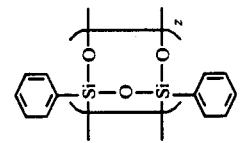
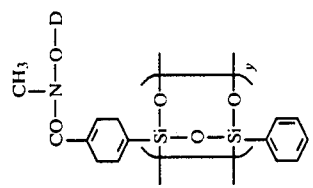
(g)-(43)
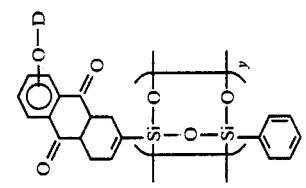
(g)-(44)
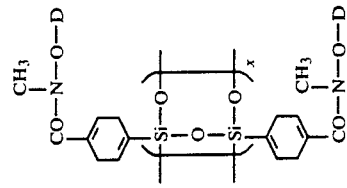
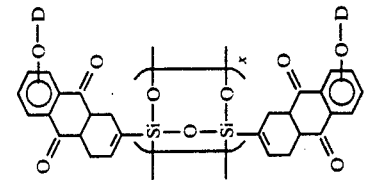

-continued
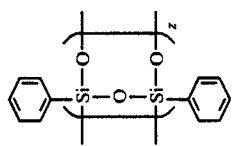
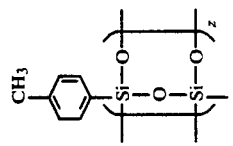 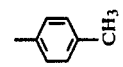
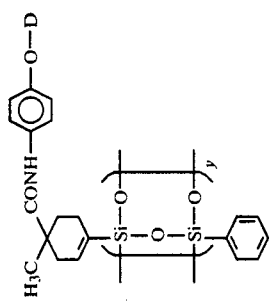
(g)-(45)
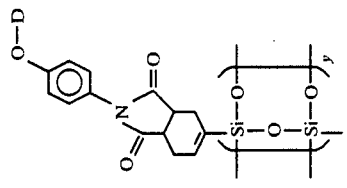 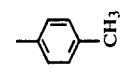
(g)-(46)
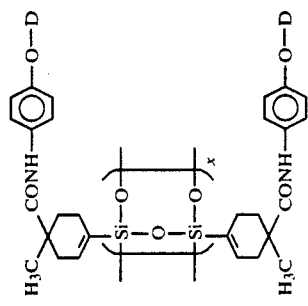
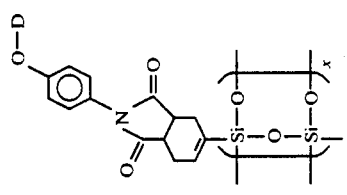 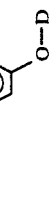

-continued
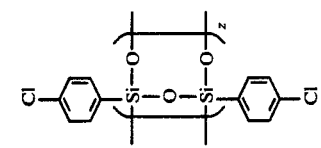
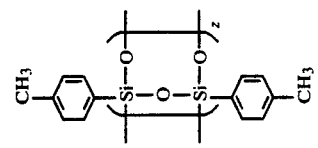
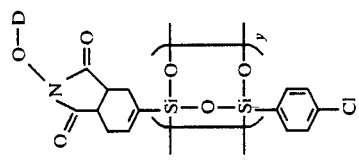
(g)-(47)
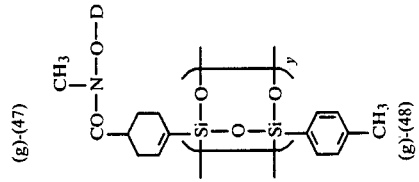
(g)-(48)
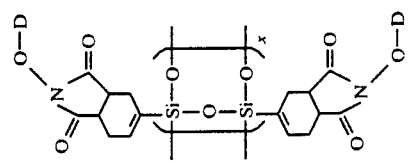
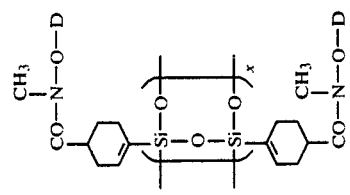

In the foregoing examples of the compound, D is hydrogen atom or 1, 2-naphthoquinone-2-diazide-4- or 5-sulfonyl group. Siloxane polymer (g) of the present invention may contain both hydrogen atom and 1, 2-naphthoquinone-2-diazide-4- or 5-sulfonyl group as D but at least 5 mol % of D-containing structural units contains 1, 2-naphthoquinone-2-diazide-4- or 5-sulfonyl group.

n is an integer of not less than 1 and x, y and z each is an integer of not less than 0.

The molecular weight of the siloxane polymer (g) of the invention can freely be controlled by changing the condensation conditions, but preferred value thereof is not less than 500, more preferably 1,000 to 500,000 expressed in the weight averaged molecular weight.

An amount of the siloxane polymer to be contained in the positive working light-sensitive composition is generally 5 to 100% by weight, preferably 20 to 95%, more preferably 30 to 90% by weight based on the solid content of the light-sensitive composition.

Alkali-soluble Polymers

The positive working light-sensitive composition of the present invention may comprise simply the siloxane polymer (a), (b), (c), (d) or (f), but it may further comprise an alkali-soluble polymer.

The alkali-soluble polymers used in the composition are polymers carrying acidic hydrogen atom having a pKa value of not more than 11 such as phenolic hydroxyl group, carboxyl group, sulfonate residue, imido group, sulfonamido group, N-sulfonylamido group, N-sulfonylurethane group and/or active methylene group. Preferred alkali-soluble polymers are novolak type phenol resins such as phenol-formaldehyde resin, o-cresol-formaldehyde resin, m-cresolformaldehyde resin, p-cresol-formaldehyde resin, xylenol-formaldehyde resin and co-condensates thereof. It is also possible to simultaneously use the aforesaid phenol resin and a condensate of phenol or cresol substituted with an alkyl group having 3 to 8 carbon atoms with formaldehyde such as t-butylphenol/formaldehyde resin as disclosed in J.P. KOKAI No. Sho 50-125806. Examples of other polymers usable in the invention are polymers comprising phenolic hydroxyl group-containing monomer such as N-(4-hydroxyphenyl) methacrylamide as a copolymerization component; homo- or copolymers of monomer(s) such as p-hydroxystyrene, o-hydroxystyrene, m-isopropenylphenol and/or p-isopropenylphenol and partially etherified or esterified products thereof.

Further, polymers comprising a carboxyl group-containing monomer such as acrylic acid and methacrylic acid as a copolymerization component; carboxyl group-containing polyvinyl acetal resins as disclosed in J.P. KOKAI No. Sho 61-267042; and carboxyl group-containing polyurethane resins as disclosed in J.P. KOKAI No Sho 63-124047 can suitably be used.

Polymers comprising repeating units derived from monomers such as N-(4-sulfamoylphenyl) methacrylamide, N-phenylsulfonyl methacrylamide and/or maleimide as copolymerization components: and active methylene group-containing polymers as disclosed in J.P. KOKAI No. Sho 63-127237 are also used in the composition of the invention.

These alkali-soluble polymers may be used alone or in combination. An amount of these alkali-soluble polymers to be incorporated into the light-sensitive composition preferably ranges from 10 to 90% by weight, more preferably 30 to 80% by weight on the basis of the total weight of the solid contents of the composition.

Compounds Capable of Generating Acids Through Irradiation of Actinic Rays

Examples of suitable compounds which are capable of generating acids through irradiation with actinic rays and which can be used in the positive working light-sensitive composition of the present invention in combination with siloxane polymer (e) or (f) are various known compounds and mixtures such as diazonium, phosphonium, sulfonium and iodonium salts of $BF_4^-$, $AsF_6^-$, $PF_6^-$, $SbF_6^-$, $SiF_6^-$ and $ClO_4^-$; organic halogen compounds: and combinations of organometals and organic halogen compounds. It is also suitably used, in the composition of the present invention, compounds capable of generating acids through photolysis as disclosed in U.S. Pat. No. 3,779,778, German Pat. No. 2,610,842 and European Pat. No. 126,712. addition, compounds which are combined with a suitable dye to give a visible contrast between exposed and unexposed areas when they are exposed to light can also be used in the composition of the invention. Examples of such compounds are disclosed in, for instance, J.P. KOKAI Nos. Sho 55-77742 and Sho 57-163234.

Typical examples of the foregoing compounds capable of generating acids through irradiation of actinic rays or radiant rays will hereunder be explained.

(1) Oxadiazole derivatives or s-triazine derivatives represented by formula (XVII) or (XVIII) which is substituted with a trihalomethyl group:

(XVII)

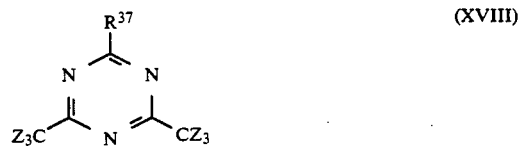

(XVIII)

In the formulas, $R^{36}$ represents a substituted or unsubstituted aryl or alkenyl group; $R^{37}$ represents $R^{36}$, $-CZ_3$ or a substituted or unsubstituted alkyl group; and Z represents a halogen atom, in particular a chlorine or bromine atom.

Specific examples thereof are those listed below:

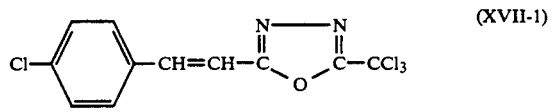

(XVII-1)

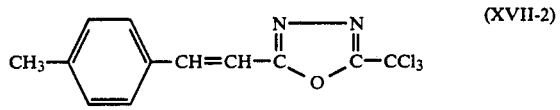

(XVII-2)

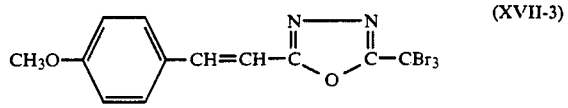

(XVII-3)

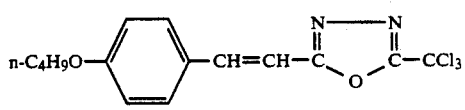 (XVII-4)
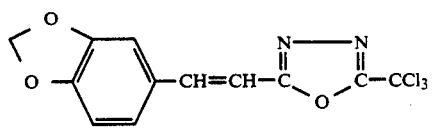 (XVII-5)
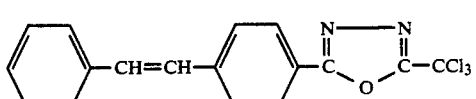 (XVII-6)
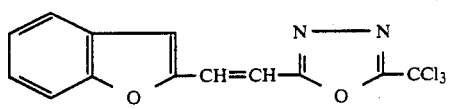 (XVII-7)
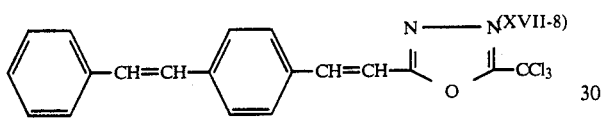 (XVII-8)
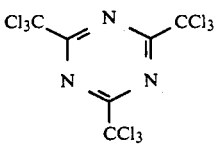 (XVIII-1)
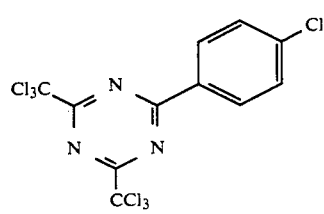 (XVIII-2)
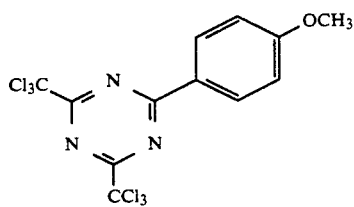 (XVIII-3)
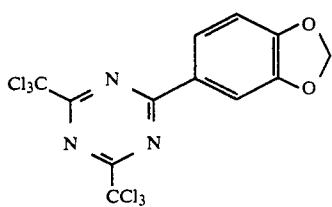 (XVIII-4)
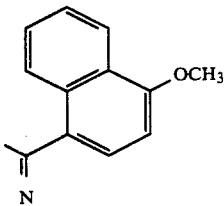 (XVIII-5)
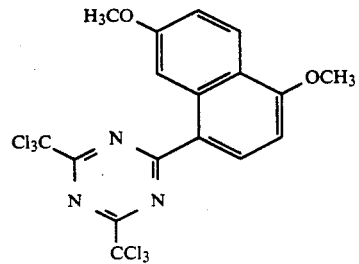 (XVIII-6)
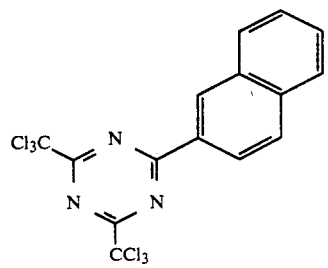 (XVIII-7)
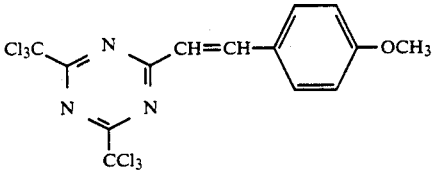 (XVIII-8)
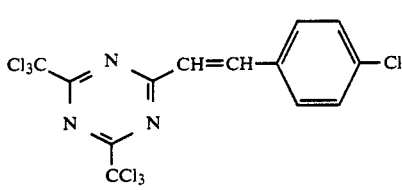 (XVIII-9)
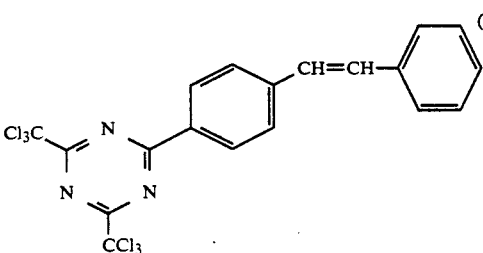 (XVIII-10)
(2) Iodonium salts or sulfonium salts represented by the following general formula (XIX) or (XX) respectively:

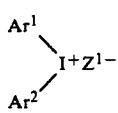 (XIX)

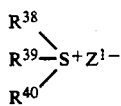 (XX)

In these formulas, $Ar^1$ and $Ar^2$ may be same or different and each represents a substituted or unsubstituted aromatic group. Examples of preferred substituents of the aromatic groups are alkyl, haloalkyl, cycloalkyl, aryl, alkoxy, nitro, carbonyl, alkoxycarbonyl, hydroxy and mercapto groups and halogen atoms, more preferably alkyl groups having 1 to 8 carbon atoms, alkoxy groups having 1 to 8 carbon atoms, nitro group and chlorine atom. $R^{38}$, $R^{39}$ and $R^{40}$ may be same or different and each represents a substituted or unsubstituted alkyl or aromatic group, preferably an aryl group having 6 to 14 carbon atoms, an alkyl group having 1 to 8 carbon atoms or a substituted derivative thereof. Examples of preferred substituents for the aryl groups are alkoxy groups having 1 to 8 carbon atoms, alkyl groups having 1 to 8 carbon atoms, nitro, carbonyl and hydroxyl groups and halogen atoms and those for alkyl groups are alkoxy groups having 1 to 8 carbon atoms, carbonyl group and alkoxycarbonyl groups. $Z^{1-}$ represents $BF_4^-$, $PF_6^-$, $AsF_6^-$, $SbF_6^-$, $ClO_4^-$, $CF_3SO_3^-$. Moreover, two of the groups $R^{38}$, $R^{39}$ and $R^{40}$, and $Ar^1$ and $Ar^2$ each may be bonded through a single bond or a substituent.

Examples of the compounds represented by formula (XIX) are those disclosed in J.P. KOKAI Nos. Sho 50-158680 and Sho 51-100716 and J.P. KOKOKU No. Sho 52-14277. Specific examples thereof are as follows:

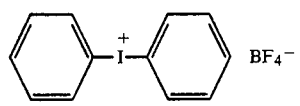 (XIX-1)

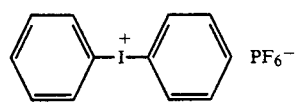 (XIX-2)

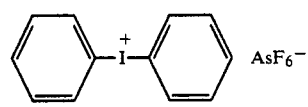 (XIX-3)

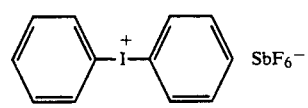 (XIX-4)

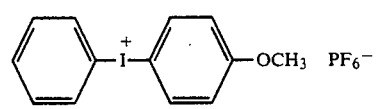 (XIX-5)

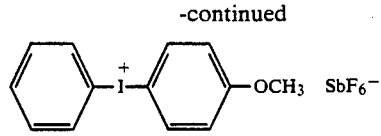 (XIX-6)

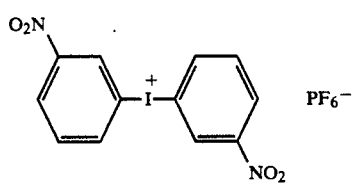 (XIX-7)

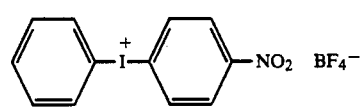 (XIX-8)

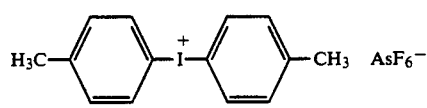 (XIX-9)

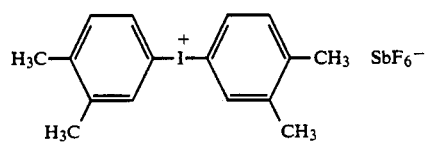 (XIX-10)

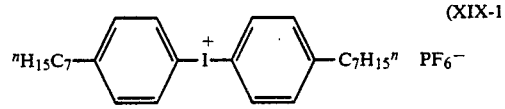 (XIX-11)

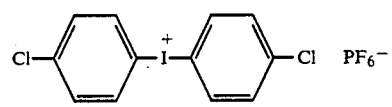 (XIX-12)

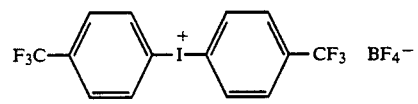 (XIX-13)

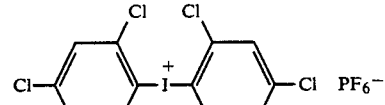 (XIX-14)

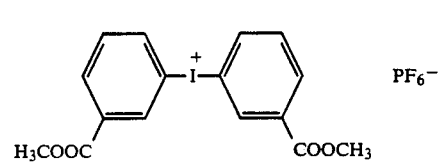 (XIX-15)

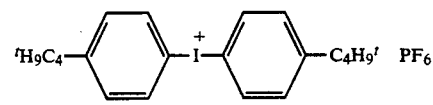 (XIX-16)

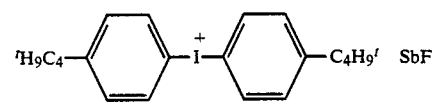 (XIX-17)

(XIX-18)
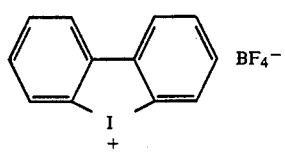
(XIX-19)
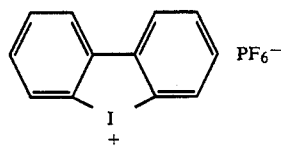
(XIX-20)
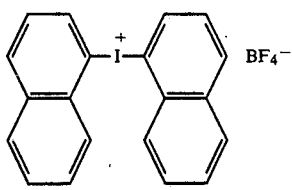
Examples of the compounds represented by formula (XX) are those disclosed in J.P. KOKAI No. Sho 51-56885, J.P. KOKOKU No. Sho 52-14278, U.S. Pat. No. 4,442,197 and German Pat. No. 2,904,626. Specific examples thereof are listed below:
(XX-1)
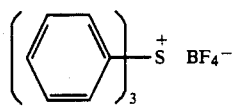
(XX-2)
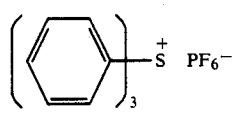
(XX-3)
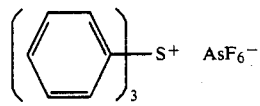
(XX-4)
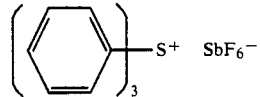
(XX-5)
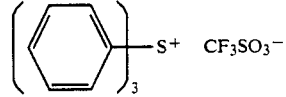
(XX-6)
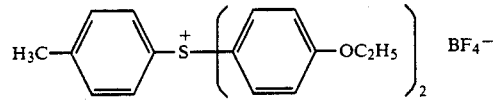
(XX-7)
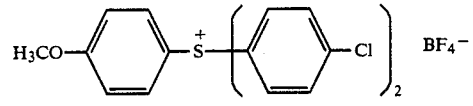
(XX-8)
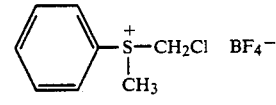
(XX-9)
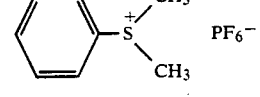
(XX-10)
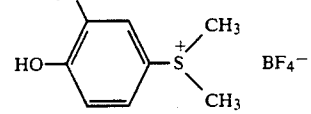

(XX-11)
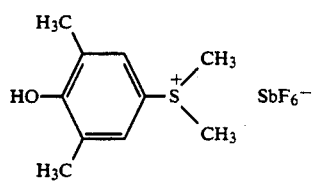
(XX-12)
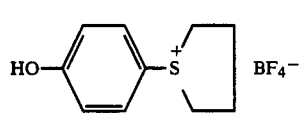
(XX-13)
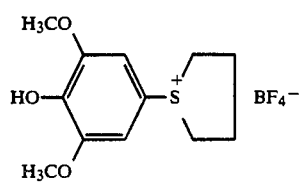
(XX-14)
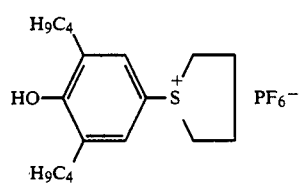
(XX-15)
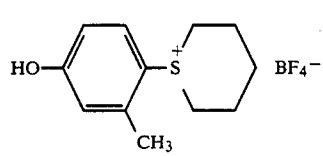
(XX-16)
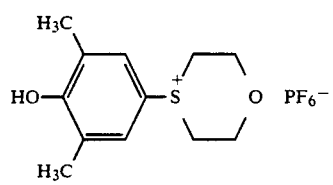
(XX-17)
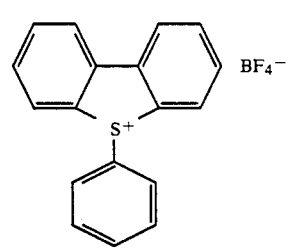
(XX-18)
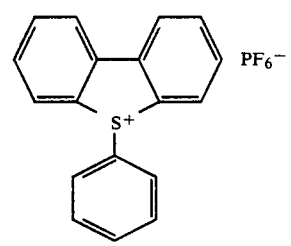
(XX-19)
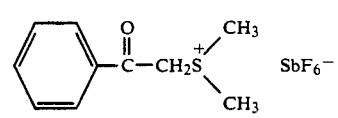

-continued

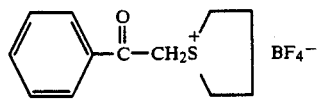 (XX-20)

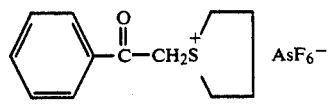 (XX-21)

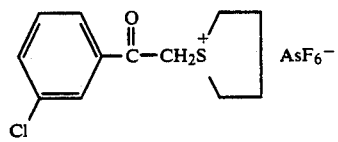 (XX-22)

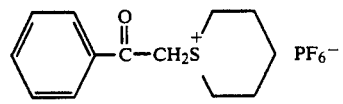 (XX-23)

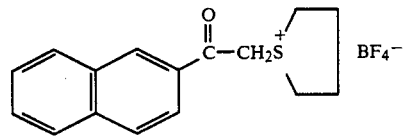 (XX-24)

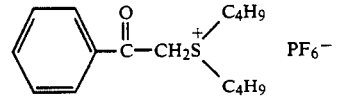 (XX-25)

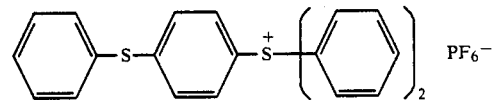 (XX-26)

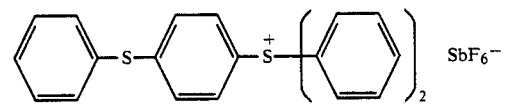 (XX-27)

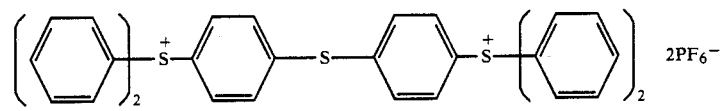 (XX-28)

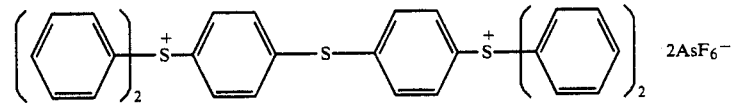 (XX-29)

The compounds represented by formulas (XIX) and (XX) are known and can be prepared, for instance, according to the procedures disclosed in J. W. Knapczyk et al., J. Am. Chem. Soc., 1969, 91, p. 145; A. L. Maycock et al., J. Org. Chem., 1970, 35, p. 2532; E. Goethals et al., Bull. Soc. Chem. Belg., 1964, 73, p. 546; H. M. Leicester, J. Am. Chem. Soc., 1929, 51, p. 3587; J. V. Crivello et al., J. Polym. Sci. Polym. Chem. Ed., 1980, 18, p. 2677; U.S. Pat. Nos. 2,807,648 and 4,247,473; F. M. Beringer et al., J. Am Chem. Soc., 1953, 75, p. 2705; and J.P. KOKAI No. Sho 53-101331.

(3) Disulfone derivatives or imidosulfonate derivatives represented by formula (XXI) or (XXII):

$$Ar^3-SO_2-SO_2-Ar^4 \quad (XXI)$$

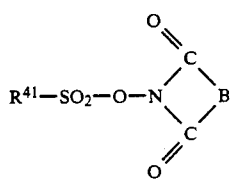 (XXII)

In the formulas, $Ar^3$ and $Ar^4$ may be same or different and each represents a substituted or unsubstituted aryl group; $R^{41}$ represents a substituted or unsubstituted alkyl or aryl group and B represents a substituted or unsubstituted alkylene, alkenylene or arylene group.
Specific examples thereof are as follows:
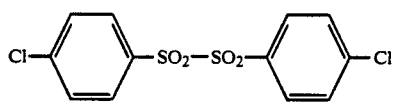 (XXI-1)
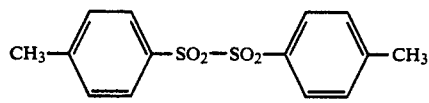 (XXI-2)
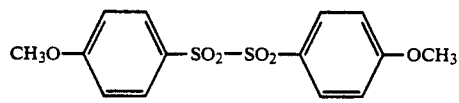 (XXI-3)
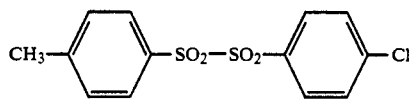 (XXI-4)
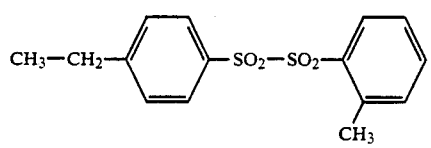 (XXI-5)
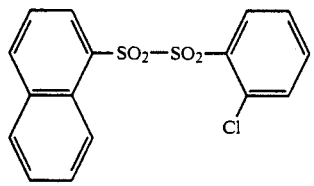 (XXI-6)
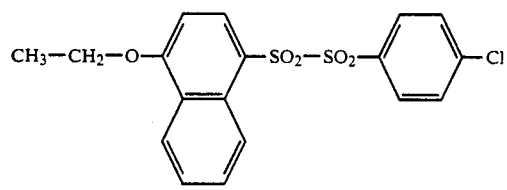 (XXI-7)
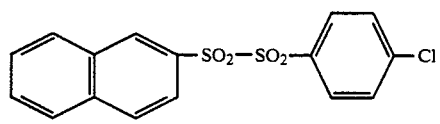 (XXI-8)
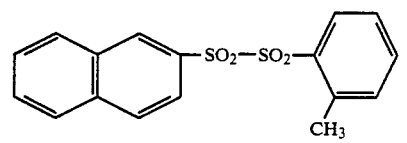 (XXI-9)
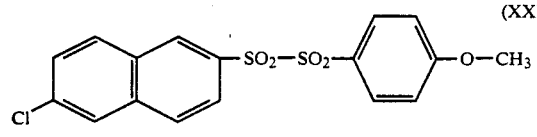 (XXI-10)
-continued
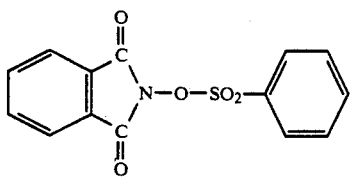 (XXII-1)
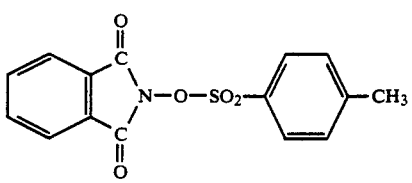 (XXII-2)
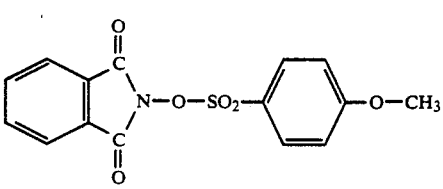 (XXII-3)
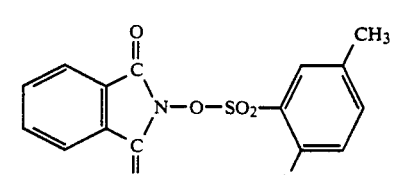 (XXII-4)
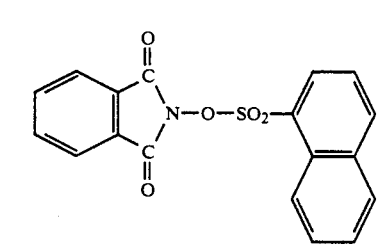 (XXII-5)
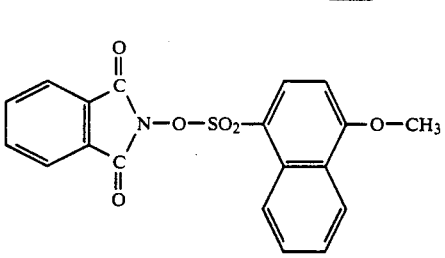 (XXII-6)
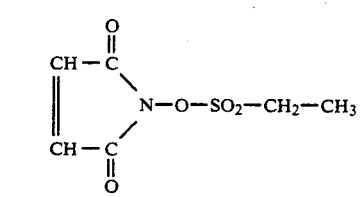 (XXII-7)
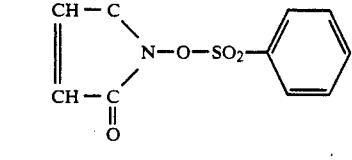 (XXII-8)

-continued

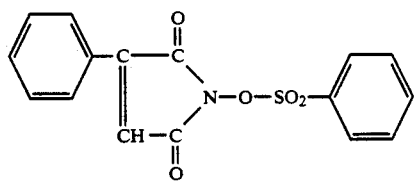 (XXII-9)

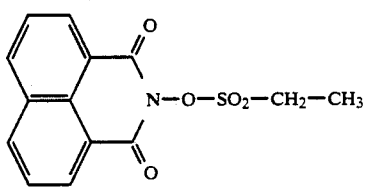 (XXII-10)

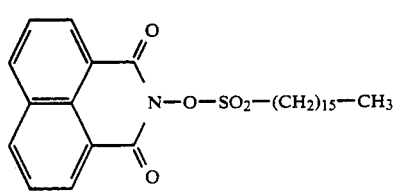 (XXII-11)

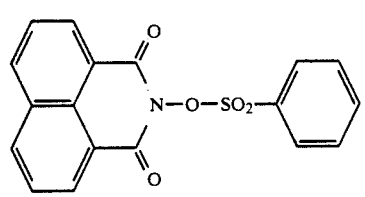 (XXII-12)

(4) Diazonium salts represented by formula (XXIII):

$$Ar^5-N_2^+Z^{2-} \quad (XXIII)$$

wherein $Ar^5$ represents a substituted or unsubstituted aromatic group; $Z^{2-}$ represents an organic sulfonate anion, an organic sulfate anion, an organic carboxylate anion, $BF_4^-$, $PF_6^-$, $AsF_6^-$, $SbF_6^-$ or $ClO_4^-$.

Specific examples thereof are as follows:

 (XXIII-1)

 (XXIII-2)

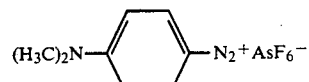 (XXIII-3)

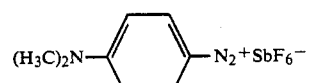 (XXIII-4)

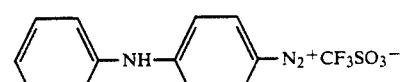 (XXIII-5)

-continued

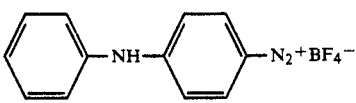 (XXIII-6)

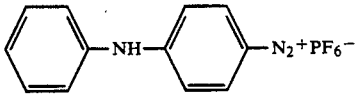 (XXIII-7)

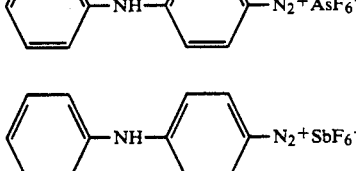 (XXIII-8)

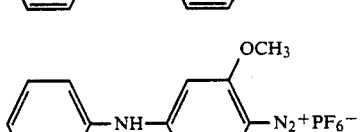 (XXIII-9)

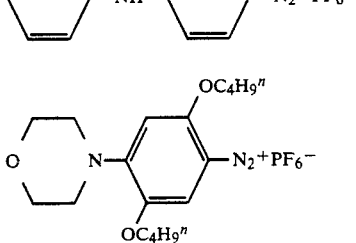 (XXIII-10)

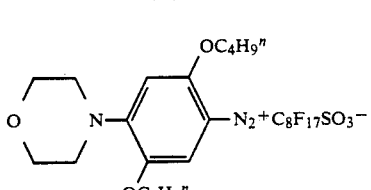 (XXIII-11)

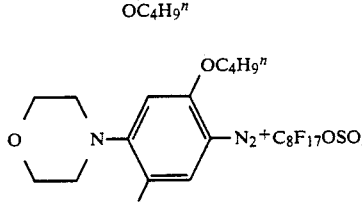 (XXIII-12)

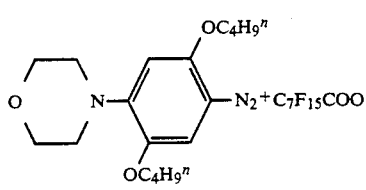 (XXIII-13)

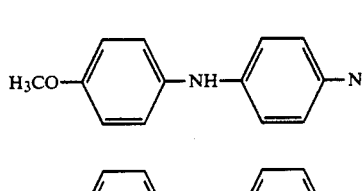 (XXIII-14)

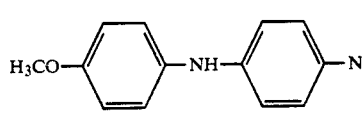 (XXIII-15)

(XXIII-16)

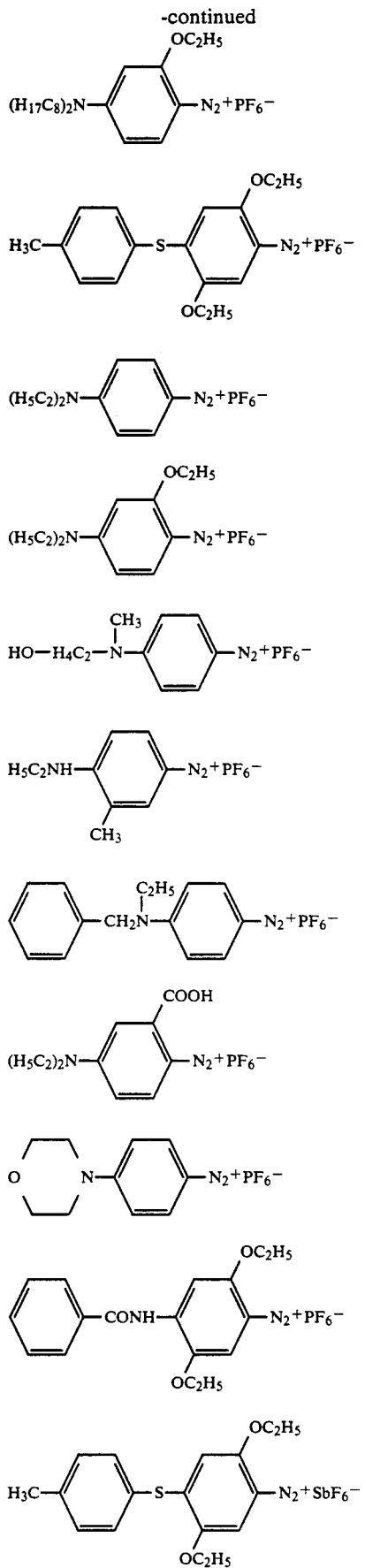
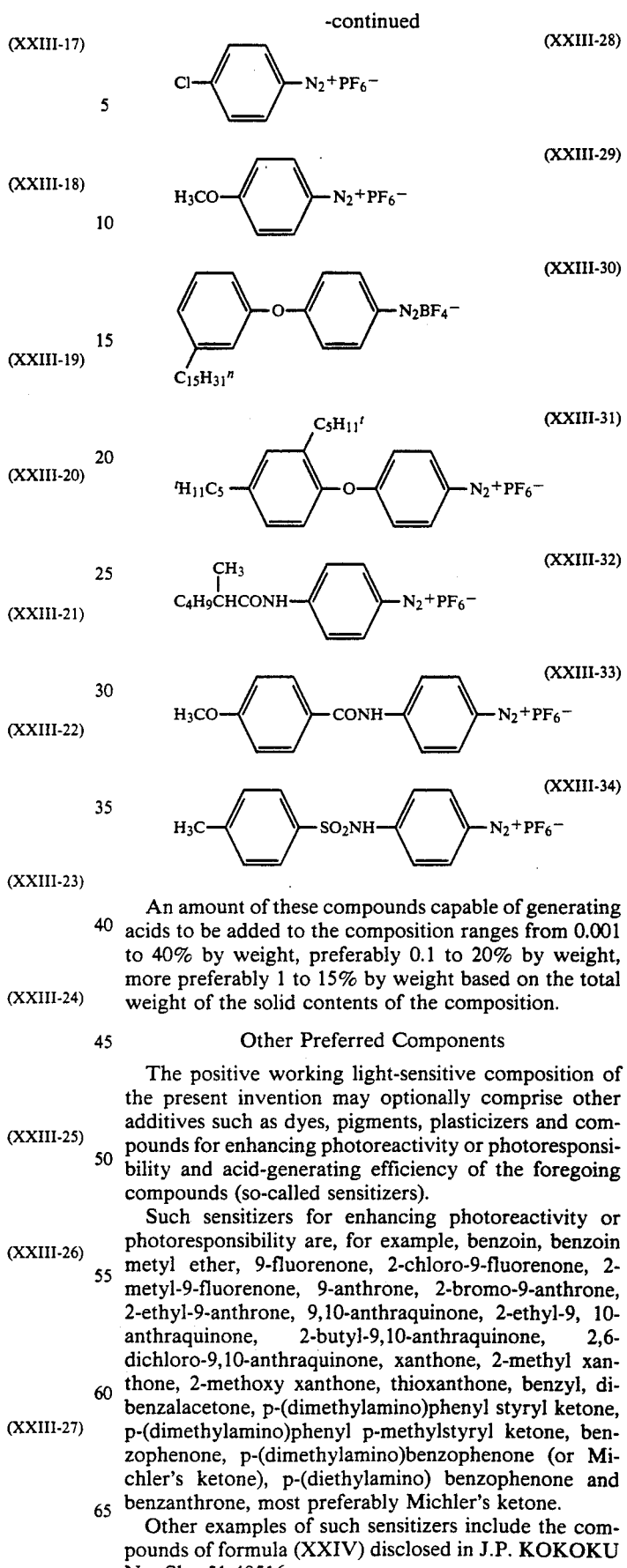

An amount of these compounds capable of generating acids to be added to the composition ranges from 0.001 to 40% by weight, preferably 0.1 to 20% by weight, more preferably 1 to 15% by weight based on the total weight of the solid contents of the composition.

Other Preferred Components

The positive working light-sensitive composition of the present invention may optionally comprise other additives such as dyes, pigments, plasticizers and compounds for enhancing photoreactivity or photoresponsibility and acid-generating efficiency of the foregoing compounds (so-called sensitizers).

Such sensitizers for enhancing photoreactivity or photoresponsibility are, for example, benzoin, benzoin metyl ether, 9-fluorenone, 2-chloro-9-fluorenone, 2-metyl-9-fluorenone, 9-anthrone, 2-bromo-9-anthrone, 2-ethyl-9-anthrone, 9,10-anthraquinone, 2-ethyl-9, 10-anthraquinone, 2-butyl-9,10-anthraquinone, 2,6-dichloro-9,10-anthraquinone, xanthone, 2-methyl xanthone, 2-methoxy xanthone, thioxanthone, benzyl, dibenzalacetone, p-(dimethylamino)phenyl styryl ketone, p-(dimethylamino)phenyl p-methylstyryl ketone, benzophenone, p-(dimethylamino)benzophenone (or Michler's ketone), p-(diethylamino) benzophenone and benzanthrone, most preferably Michler's ketone.

Other examples of such sensitizers include the compounds of formula (XXIV) disclosed in J.P. KOKOKU No. Sho 51-48516.

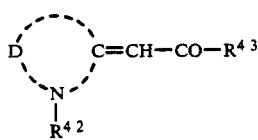

(XXIV)

wherein $R^{42}$ represents an alkyl group (e.g. methyl, ethyl, propyl) or a substituted alkyl group (e.g. 2-hydroxyethyl, 2-methoxyethyl, carboxymethyl, 2-carboxyethyl), $R^{43}$ represents an alkyl group (e.g. methyl, ethyl) or an aryl group (e.g. phenyl, p-hydroxyphenyl, naphtyl, thienyl), and D represents a nonmetallic atom group necessary for forming a hetero nucleus containing nitrogen generally used in a cyanine dye, for instance, benzothiazoles (e.g. benzothiazole, 5-chlorobenzothiazole, 6-chlorobenzothiazole), napthothiazoles (e.g. α-naphthothiazole, β-naphthothiazole), benzoselenazoles (e.g. benzoselenazole, 5-chlorobenzoselenazole, 6-methoxybenzoselenazole), naphthoselenazoles (e.g. α-naphthoselenazole, β-naphthoselenazole), benzoxazoles (e.g. benzoxazole, 5-methylbenzoxazole, 5-phenylbenzoxazole), naphthoxazoles (e.g. α-naphthoxazole, β-naphthoxazole).

Many specific examples of the compounds of formula (XXIV) are known and can be selected and used in the present invention.

Preferred examples of such sensitizers include those disclosed in U.S. Pat. No.4,062,686, for example, 2-[bis(2-furoyl)methylene]-3-methylbenzothiazoline, 2-[bis(2-thienoyl)methylene]-3-methylbenzothiazoline and 2-[bis(2-furoyl)methylene]-3-methylnaphtho[1,2-d]thiazoline. Molar ratio of the sensitizer to the structural unit derived from the compound of formula (VI), (VII), (VIII), (IX), (X), (XI), (X') or (XI') is 0.01/1 to 5/1, preferably 0.1/1 to 2/1.

Such sensitizers for the acid generator represented by formulas (XIX) and (XX) are, for instance, compounds disclosed in U.S. Pat. Nos. 4,250,053 and 4,442,197 Specific examples thereof are anthracene, phenanthrene, perylene, pyrene, chrysene, 1,2-benzanthracene, coronene, 1,6-diphenyl-1,3,5-hexatriene, 1,1,4,4-tetraphenyl-1,3-butadiene, 2,3,4,5-tetraphenyl furan, 2,5-diphenylthiophene, thioxanthone, 2-chlorothioxanthone, phenothiazine, 1,3-diphenyl pyrazoline, 1,3-diphenyl isobenzofuran, xanthone, benzophenone, 4-hydroxybenzophenone, anthrone, ninhydrin, 9-fluorenone, 2,4,7-trinitrofluorenone, indanone, phenanthraquinone, tetralone, 7-methoxy-4-methylcoumalin, 3-keto-bis(7-diethylaminocoumalin), Michler's ketone and ethyl Michler's ketone.

Molar ratio of these sensitizers to the compound capable of generating an acid by photolysis ranges from 0.01/1 to 20/1 and preferably 0.1/1 to 5/1.

In addition, dyes may be used as a coloring agent and preferred dyes include, for instance, oil-soluble dyes and basic dyes. Specific examples thereof are Oil Yellow #101, Oil Yellow #130, Oil Pink #312, Oil Green BG, Oil Blue BOS, Oil Blue #603, Oil Black BY, Oil Black BS, Oil Black T-505 (these dyes being available from ORIENT CHEMICAL INDUSTRIES, LTD.), Crystal Violet (CI 42555), Methyl Violet (CI 42535), Rhodamine B (CI 45170 B), Malachite Green (CI 42000) and Methylene Blue (CI 52015).

The light-sensitive composition of the present invention may further comprise cyclic acid anhydrides, printing out agents for obtaining a visible image immediately after imagewise exposure and other fillers for further enhancing the sensitivity thereof. Examples of cyclic acid anhydrides are, as disclosed in U.S. Pat. No. 4,115,128, phthalic anhydride, tetrahydrophthalic anhydride, hexahydrophthalic anhydride, 3,6-endoxy-Δ$^4$-tetrahydrophthalic anhydride, tetrachlorophthalic anhydride, maleic anhydride, chloromaleic anhydride, α-phenylmaleic anhydride, succinic anhydride and pyromellitic acid. The sensitivity can be increased as high as about 3 times at maximum by incorporating these cyclic acid anhydride into the composition in an amount of 1 to 15% by weight based on the total weight of the composition. Examples of printing out agents for obtaining a visible image immediately after imagewise exposure include a combination of a light-sensitive compound releasing an acid upon exposure to light and a salt forming organic dye. Specific examples are a combination of o-naphthoquinonediazide-4-sulfonyl halide and a salt forming organic dye disclosed in J.P.KOKAI Nos. Sho 50-36209 and 53-8128 and a combination of a trihalomethyl compound and a salt forming organic dye disclosed in J.P.KOKAI Nos. Sho 53-36223 and 54-74728.

Solvent

The positive working light-sensitive composition of the present invention is dissolved in a solvent capable of dissolving the components of the composition and then applied onto the surface of a substrate if it is used as a material for PS plates. In addition, if it is used as a resist for processing semiconductors or the like, it is dissolved in a solvent and the solution is used as such. Examples of such solvents herein used are ethylene dichloride, cyclohexanone, methyl ethyl ketone, methanol, ethanol, propanol, ethylene glycol monomethyl ether, 1-methoxy-2-propanol, ethylene glycol monoethyl ether, 2-methoxyethyl acetate, 2-ethoxyethyl acetate, 1-methoxy-2-propyl acetate, dimethoxyethane, methyl lactate, ethyl lactate, N,N-dimethylacetamide, N,N-dimethylformamide, tetramethyl urea, N-methylpyrrolidone, dimethylsulfoxide, sulforane, γ-butyrolactone, toluene and ethyl acetate and these solvents can be used alone or in combination.

The concentration of the foregoing components (the total solid contents inclusive of additives) ranges from 2 to 50% by weight. When the solution is applied onto a substrate, the amount thereof coated varies depending on the applications and, for instance, as a rule it preferably ranges from 0.5 to 3.0 g/m$^2$ based on the solid contents for PS plates. As the amount thereof coated decreases, the light-sensitivity correspondingly increases, but, on the contrary, physical properties of the resultant film are impaired.

Preparation of PS Plates or the Like

When a PS plate is prepared from the positive working light-sensitive composition of this invention, a substrate is in general used and examples thereof include paper, paper laminated with a plastic film such as polyethylene, polypropylene or polystyrene film; a metal plate such as an aluminum (inclusive of aluminum alloys), zinc or copper plate; a plastic film such as a cellulose diacetate, cellulose triacetate, cellulose propionate, cellulose butyrate, cellulose acetate butyrate, cellulose nitrate, polyethylene terephthalate, polyethylene, polystyrene, polypropylene, polycarbonate or polyvinyl acetal film; and paper or a plastic film listed above which is laminated with a metal foil or on which a layer or on which a layer of the foregoing metal is deposited. Particularly preferred is an aluminum plate because of its high dimensional stability and low cost. Further, it is also preferred to use a composite sheet comprising a polyethylene terephthalate film on which an aluminum sheet is bonded as disclosed in J.P. KOKOKU No. Sho 48-18327. The surface of the aluminum plate is preferably grained by, for instance, mechanical methods such as wire brush graining, brush graining which comprises graining with a nylon brush with pouring a slurry of abrasive particles, ball graining, graining through liquid honing and buff graining; chemical graining methods such as those in which HF, $AlCl_3$ or HCl is used as an etchant; electrolytic graining in which nitric acid or hydrochloric acid is used as an electrolyte; or combined graining comprising combinations thereof, then optionally etched with an acid or alkali and anodized in an electrolyte such as sulfuric acid, phosphoric acid, oxalic acid, boric acid, chromic acid, sulfamic acid or a mixture thereof using a DC or AC current to form a strong passivation film on the surface of the aluminum plate. Such a passivation film per se makes the aluminum plate surface hydrophilic, but it is particularly preferred that the aluminum plate is optionally hydrophilized by subjecting it to a silicate (sodium silicate, potassium silicate) treatment as disclosed in U.S. Pat. Nos. 2,714,066 and 3,181,461; a potassium fluorozirconate treatment as disclosed in U.S. Pat. No. 2,946,638; a phosphomolybdate treatment as disclosed in U.S. Pat. No. 3,201,247; an alkyl titanate treatment as disclosed in U.K. Pat. No. 1, 108,559; a polyacrylic acid treatment as disclosed in German Pat. No. 1,091,433; a polyvinyl phosphonic acid treatment as disclosed in German Pat. No. 1,134,093 and U.K. Pat. No. 1,230,447; a phosphonic acid treatment as disclosed in J.P. KOKOKU No Sho 44-6409; a phytic acid treatment as disclosed in U.S. Pat. No. 3,307,951; a combined treatment with a hydrophilic organic polymeric compound and a bivalent metal as disclosed in J.P. KOKAI Nos. Sho 58-16893 and Sho 58-18291; a treatment by means of an underlying coating of an water-soluble polymer having sulfonate groups as disclosed in J.P. KOKAI No. Sho 59-101651. Examples of other hydrophilization treatments are silicate electrodeposition treatments as disclosed in U.S. Patent No. 3,658,662.

It is also preferred to use an aluminum plate which is subjected to a sealing treatment after graining and anodization treatments. Such a sealing treatment can be performed by immersing the aluminum plate in hot water or a hot aqueous solution containing an inorganic or organic salt or by means of a steam bath.

Actinic Rays or Radiant Rays

Light sources for actinic rays or radiant rays used in the present invention are, for instance, a mercury lamp, a metal halide lamp, a xenon lamp, a chemical lamp and a carbon arc lamp for actinic rays and electron rays, X-rays, ion beam and far ultraviolet rays for radiant rays. Preferred examples of light sources are g-rays, i-rays and Deep-UV rays for photoresists. In addition, a scanning exposure technique with a high energy density beam such as laser beam or electron rays can be employed in the invention. Examples of such laser beam sources are a He·Ne laser, an Ar laser, a Kr ion laser, a He·Cd laser and KrF excimer laser.

Developer

Examples of developers for the positive working light-sensitive composition of the present invention preferably include an aqueous solution of an inorganic alkali agent such as sodium silicate, potassium silicate, sodium hydroxide, potassium hydroxide, lithium hydroxide, tertiary sodium phosphate, secondary sodium phosphate, tertiary ammonium phosphate, secondary ammonium phosphate, sodium metasilicate, sodium bicarbonate or ammonia or an organic alkali agent such as tetraalkyl ammonium hydroxide. These alkaline agents may be used alone or in combination. The concentration thereof ranges from 0.1 to 10% by weight and preferably 0.5 to 5% by weight.

These aqueous alkali solutions may optionally comprise a surfactant or an organic solvent such as an alcohol.

The present invention will hereunder be explained in more detail with reference to the following non-limitative working Examples and the effects practically achieved by the present invention will also be discussed in detail.

PREPARATION EXAMPLE 1

Preparation of N-Hydroxyphthalimide

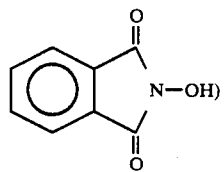

To a solution of 42 g (1.05 mole) of sodium hydroxide in 500 ml of water, there was added 73.0 g (1.05 mole) of hydroxylamine hydrochloride. Subsequently, 148 g (1.0 mole) of phthalic anhydride was added to the solution and the resulting mixture was stirred at 90° C. for one hour. A solution of 30 g of sulfuric acid in 100 ml of water was added to the reaction mixture from which pale yellow solids had been precipitated out and the mixture was stirred for additional 30 minutes. The pale yellow solids were filtered off and recrystallized from a benzene/ethanol mixed solvent to give 132 g of the title compound: N-hydroxyphthalimide.

PREPARATION EXAMPLE 2

Preparation of N-Hydroxymaleimide

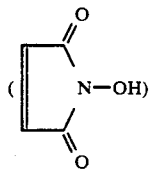

In the Preparation Example 1, 98 g of maleic anhydride was substituted for phthalic anhydride, the resulting mixture was likewise stirred at 90° C. for one hour and then 70° C. for 3 hours. The reaction mixture was allowed to stand at room temperature and the pale brown crystals were filtered off to give 75 g of the title compound: N-hydroxymaleimide.

PREPARATION EXAMPLE 3

Preparation of N-Benzoyl-N-methylhydroxylamine

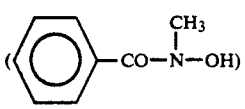

10.0 g of N-methylhydroxylamine hydrochloride was added to 100 ml of tetrahydrofuran and 19.8 g of pyridine was added to the mixture. To the resulting mixture, there was dropwise added a solution of 16.8 g of benzoyl chloride in 100 ml of tetrahydrofuran at room temperature over one hour with stirring. The stirring was continued for additional 8 hours to proceed the reaction. After addition of 50 ml of dilute hydrochloric acid, the tetrahydrofuran was removed in vacuo and the remaining solution was extracted with ethyl acetate. The resultant extract was dried over anhydrous magnesium sulfate and then the ethyl acetate was removed under reduced pressure. The crude product obtained was purified by column chromatography (packed material: silica gel; eluent: ethyl acetate/hexane) to give 8.5 g of N-benzoyl-N-methylhydroxylamine as an oil having a melting point of not more than 20° C.

PREPARATION EXAMPLE 4

Preparation of N-hydroxyphthalimido-vinyl sulfonate

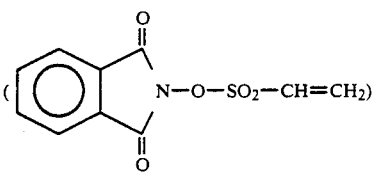

To a mixture of 3.3 g of N-hydroxyphthalimide and 2.6 g of vinylsulfonyl chloride, there was added 50 ml of acetone. 2.0 g of triethylamine was dropwise added to the mixture over 10 minutes at room temperature (about 20° C.) with stirring, then the mixture was stirred at room temperature for additional one hour, poured into 200 g of ice-water and the resulting precipitates were recrystallized from a benzene/ethanol mixed solvent to thus obtain 4.0 g of N-hydroxyphthalimido-vinyl sulfonate.

PREPARATION EXAMPLE 5

Preparation of N-hydroxymaleimido-1-(4-ethoxynaphthalene)sulfonate

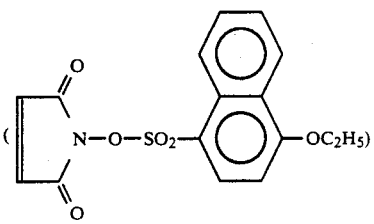

120 ml of acetone was added to a mixture of 5.7 g of N-hydroxymaleimide and 13.5 g of 1-(4-ethoxy-naphthalene)sulfonyl chloride and then the same procedures used in Preparation Example 4 were repeated to obtain 12.4 g of N-hydroxymaleimido-1-(4-ethoxynaphthalene)sulfonate.

PREPARATION EXAMPLE 6

Preparation of o-vinylsulfonyl-N-benzoyl-N-methylhydroxylamine

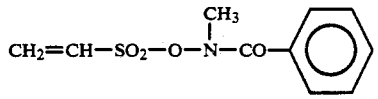

130 ml of tetrahydrofuran was added to a mixture of 7.6 g of N-benzoyl-N-methylhydroxylamine and 6.3 g of vinylsulfonyl chloride and a solution of 5.1 g of triethylamine in 20 ml of tetrahydrofuran was dropwise added to the mixture over 2 hours with stirring while cooling the mixture so that the temperature was maintained at 25° C. or less. The reaction was continued for additional 2 hours at a temperature ranging from 15° to 25° C. and then the same procedures used in Preparation Example 4 were repeated to give 9.2 g of o-vinylsulfonyl-N-benzoyl-N-methylhydroxylamine.

PREPARATION EXAMPLE 7

Preparation of Exemplified Compound (a)-(30)

8.7 g (0.05 mole) of 2-(trimethoxysilyl)-1,3-butadiene and 12.7 g (0.05 mole) of N-hydroxyphthalimido-vinyl-sulfonate were dissolved in 100 ml of dioxane and stirred at 100° C. for one hour under heating. After cooling to room temperature, 9.9 g (0.05 mole) of trimethoxyphenyl silane was added to the mixture. Further, 10 ml of distilled water and 0.1 g of concentrated hydrochloric acid were added thereto and the mixture was stirred for 30 minutes. Then the mixture was heated to remove the solvent (dioxane) and to thus concentrate the mixture. The resulting concentrate was added to 1 l of water with stirring and the solid precipitated out was filtered off and dried in vacuo. Thus, 24 g of a brownish white resin was obtained. It was confirmed that the resin was exemplified compound (a)-(30) in terms of NMR spectroscopy. In addition, the molecular weight thereof was determined by gel permeation chromatography (GPC) and the weight average molecular weight thereof (polystyrene standard) was found to be 3,500.

PREPARATION EXAMPLE 8

Preparation of Exemplified Compound (a)-(38)

8.7 g of 2-(trimethoxysilyl)-1,3-butadiene and 17.4 g of N-hydroxymaleimido-1-(4-ethoxy-naphthalene)sulfonate were dissolved in 100 ml of dioxane and stirred at 100° C. for one hour under heating Thereafter, 9.9 g of trimethoxyphenyl silane was added to the mixture at room temperature and then the same procedures used in Preparation Example 7 were repeated to perform the reaction and the post-treatments. Thus, 28 g of a brownish white resin was obtained. The weight average molecular weight thereof (GPC; polystyrene standard) was found to be 4,200.

EXAMPLES 1 to 6

A 2S aluminum plate having a thickness of 0.24 mm was immersed in 10% aqueous solution of tertiary sodium phosphate maintained at 80° C. for 3 minutes to degrease the same, grained with a nylon brush, etched with a sodium aluminate solution for about 10 minutes and then desmutted with a 3% aqueous solution of sodium hydrogen sulfate. The aluminum plate was then anodized at a Current density of 2 A/dm² for 2 minutes in a 20% sulfuric acid solution to thus obtain an aluminum substrate.

Six kinds of solutions, (A)-1 to (A)-6, of light-sensitive composition (hereunder referred to as "light-sensitive solutions") were prepared by changing the kinds of siloxane polymers of the present invention used in a light-sensitive solution (A) having the following composition. Each of these light-sensitive solutions was applied onto the aluminum plate, which had been anodized, and dried at 100° C. for 2 minutes to obtain the corresponding PS plates (A)-1 to (A)-6. The coated amount of the light-sensitive solution was 1.5 g/m² (weighed after drying) in all the PS plates.

The siloxane polymers used in the light-sensitive solutions (A)-1 to (A)-6 are listed in Table I given below.

| Light-sensitive Solution (A) | |
|---|---|
| Component | Amount (g) |
| Siloxane polymer of the invention | 0.50 |
| Cresol/formaldehyde/novolak resin (m/p-cresol ratio = 6/4) | 1.0 |
| Oil Blue #603 (available from ORIENT CHEMICAL INDUSTRIES CO., LTD.) | 0.02 |
| Methyl ethyl ketone | 5 |
| Methyl cellosolve | 15 |

A gray scale having a density difference of 0.15 was brought in close contact with the light-sensitive layer of each PS plate (A)-1 to (A)-6 and the layer was exposed to light from a 2 KW high pressure mercury lamp at a distance of 50 cm for 2 minutes. The exposed PS plates (A)-1 to (A)-6 were immersed in and developed with DP-4 (trade name; available from Fuji Photo Film Co., Ltd.) diluted 8 times with water for 60 seconds at 25° C. to thus obtain positive images dyed clear blue.

Each of the organopolysiloxane compounds of the present invention used had a weight average molecular weight (GPC; polystyrene standard) ranging from 2,000 to 8,000.

Moreover, among the siloxane polymers used, exemplified compounds (a)-(30), (a)-(35), (a)-(38) and (a)-(43), the content of the N-oxyamidosulfonate group- or N-oxyimidosulfonate group-containing siloxane unit was 50 mole % in each compounds listed above.

TABLE I

| Ex. No. | PS plate | siloxane polymer of the invention used |
|---|---|---|
| 1 | (A)-1 | Exemplified Compound (a)-(16) |
| 2 | (A)-2 | Exemplified Compound (a)-(20) |
| 3 | (A)-3 | Exemplified Compound (a)-(30) |
| 4 | (A)-4 | Exemplified Compound (a)-(35) |
| 5 | (A)-5 | Exemplified Compound (a)-(38) |
| 6 | (A)-6 | Exemplified Compound (a)-(43) |

EXAMPLES 7 TO 12

The same procedures used in Examples 1 to 6 were repeated to form PS plates (B)-1 to (B)-6 except that the following light-sensitive solutions (B)-1 to (B)-6 were used. These solutions were prepared by adding 0.05 g each of ethyl Michler's ketone (4,4'-bis(diethylamino)-benzophenone) to the light-sensitive solutions (A)-1 to (A)-6 used in Examples 1 to 6. The coated amount of the light-sensitive solution was 1.5 g/m² (weighed after drying) in all the PS plates.

| Light-sensitive Solution (B) | |
|---|---|
| Component | Amount (g) |
| Siloxane polymer of the invention | 0.50 |
| Cresol/formaldehyde/novolak resin (m/p-cresol ratio = 6/4) | 1.1 |
| Ethyl Michler's ketone | 0.05 |
| Oil Blue #603 (available from ORIENT CHEMICAL INDUSTRIES CO., LTD.) | 0.01 |
| Methyl ethyl ketone | 5 |
| Methyl cellosolve | 15 |

The resultant PS plates (B)-1 to (B)-6 were exposed to light and developed in the same manner used in Examples 1 to 6. Thus, positive images dyed clear blue were obtained in all the cases. The relative ratio of the sensitibity of the PS plate (A)-1 to (A)-6 to that of the PS plate (B)-1 to (B)-6 was calculated from the step number of the gray scales which were clear. The results obtained are listed in the following Table II.

TABLE II

| Ex. No. | PS plate | siloxane polymer of the invention used | Relative Sensitivity ratio (B)/(A) |
|---|---|---|---|
| 7 | (A)-1 (B)-1 | Exemplified Compound (a)-(16) | 3.0 |
| 8 | (A)-2 (B)-2 | Exemplified Compound (a)-(20) | 1.5 |
| 9 | (A)-3 (B)-3 | Exemplified Compound (a)-(30) | 2.5 |
| 10 | (A)-4 (B)-4 | Exemplified Compound (a)-(35) | 3.5 |
| 11 | (A)-5 (B)-5 | Exemplified Compound (a)-(38) | 3.0 |
| 12 | (A)-6 (B)-6 | Exemplified Compound (a)-(43) | 2.0 |

As seen from Table II, the addition of Michler's ketone to the light-sensitive layer leads to the increase in the sensitivity in all the cases examined.

EXAMPLES 13 TO 18

A comparative PS plate (C) was prepared in the same manner used in Examples 1 to 6 except that a light-sensitive solution (C) was used. The light-sensitive solution (C) was prepared by using 0.40 g of 1,2-naphthoquinonediazido-5-sulfonate of m-cresol/formaldehyde/novolak resin in place of the siloxane polymer of the invention employed in the light-sensitive solution (A). The coated amount of the light-sensitive solution was 1.5 g/m² (weighed after drying).

The PS plates (A)-1 to (A)-6 and the PS plate (C) were allowed to stand under irradiation with light rays from a white fluorescent tube for 10 minutes. These PS plates were exposed to light and developed in the same manner used in Examples 1 to 6 and the change in the sensitivity thereof observed before and after irradiation with the light rays from the white fluorescent tube was determined. As a result, the sensitivity change was observed on the PS plate (C), but the PS plates (A)-1 to (A)-6 of the present invention did not show any change in the sensitivity. In other words, it is confirmed that the PS plates of the present invention are substantially improved in the white light rays-stability.

EXAMPLES 19 TO 24

Each of light-sensitive solutions which had the same compositions as those of the light-sensitive solutions (B)-1 to (B)-6 used in Examples 7 to 12 except that Oil Blue #603 was removed was applied onto a silicon wafer with a spinner and dried on a hot plate maintained at 90° C. for 2 minutes. The thickness of the layer was 1.0 μm.

Then the resultant light-sensitive layer was exposed to light with a scale down projection aligner (stepper) using monochromatic light of 365 nm and subjected to post-heating at 90° C. for one minute. Then it was developed with a 2.4% aqueous solution of tetramethyl ammonium hydroxide for 60 seconds to form a resist pattern. As a result, a good pattern having a line & space of 0.7 μm was obtained.

EXAMPLES 25 TO 26

A commercially available novolak type resist HPR-204 (available from Fuji Hunt Chemical Co., Ltd.) was applied onto a silicon wafer with a spinner and dried at 220° C. for one hour to obtain an underlying coating. The thickness thereof was 2.0 μm.

The following light-sensitive solution (E) was applied onto the underlying layer with a spinner and dried on a hot plate maintained at 90° C. for 2 minutes to form a coated film having a thickness of 0.5 μm.

| Light-sensitive Solution (E) | |
|---|---|
| Component | Amount (g) |
| Siloxane polymer of the invention | 0.90 |
| Cresol/formaldehyde/novolak resin (m/p-cresol ratio = 6/4) | 0.70 |
| Ethyl Michler's ketone | 0.06 |
| Ethyl cellosolve acetate | 8.5 |

The siloxane polymers of the invention used in these Examples were siloxane polymers corresponding to exemplified compounds (a)-(30) and (a)-(37) whose weight average molecular weights (GPC: polystyrene standard) were 3,500 and 5,000 respectively. In these siloxane polymers, the content of the N-oxyamidosulfonate group- or N-oxyimidosulfonate group-containing siloxane unit was 50 mole % in both cases.

The resulting light-sensitive layer was exposed to light and developed in the same manner as used in Examples 19 to 24 and as a result, a good pattern having a line & space of 0.7 μm was obtained. Then the layer wa etched for 20 minutes with a diode parallel plates reactive ion etching apparatus under the conditions of 20 mTorr of $O_2$ gas pressure and 200 mW/cm$^2$ of RF power. Thus, the pattern of the upper layer was completely transferred to the lower HPR-204 layer. The resulting resist pattern was composed of the upper and lower two layers having a high aspect ratio.

More specifically, it was confirmed that the resist of the invention could be used as an upper resist in the two layer resist technique The light-sensitive composition of the present invention is excellent in both white light rays-stability and resistance to oxygen plasma, the sensitivity thereof can be enhanced by use of a sensitizer, it can be developed with an alkaline developer and the production thereof is very easy.

PREPARATION EXAMPLE 9

Preparation of 2-Nitrobenzyl Acrylate 153.2 g (1.0 mole) of 2-nitrobenzyl alcohol, 95.7 g (0.94 mole) of triethylamine and 12.9 g (0.11 mole) of 4-(dimethylamino)pyridine were dissolved in 600 ml of acetone and to the resulting solution, there was dropwise added a solution of 95.0 g (1.05 mole) of acryloyl chloride in 150 ml of acetone at 0° C. over one hour with stirring. Then the stirring was continued for additional one hour. After filtering off the resulting salt, the filtrate was concentrated and purified by column chromatography (packed material: silica gel: eluent: hexane/ethyl acetate=10/1). Thus, 141 g of an oily liquid was recovered.

It was confirmed that the liquid was 2-nitrobenzyl acrylate in terms of NMR spectroscopy.

PREPARATION EXAMPLE 10

Preparation of Exemplified Compound (b)-(32)

87.1 g (0.50 mole) of 2-(trimethoxysilyl)-1,3-butadiene and 103.6 g (0.50 mole) of 2-nitrobenzyl acrylate were dissolved in 1 l of dioxane and stirred at 100° C. for one hour under heating. After cooling to room temperature, 99.1 g (0.50 mole) of trimethoxyphenyl silane was added to the mixture. Further, 70 ml of distilled water and 0.5 g of concentrated hydrochloric acid were added thereto and the mixture was stirred for 30 minutes. Then the solution was heated to remove the solvent (dioxane) and to thus concentrate the solution. The resulting concentrate was added to 10 l of water with stirring and the solid precipitated out was filtered off and dried in vacuo. Thus, 220 g of a brownish white resin was obtained. It was confirmed that the resin was exemplified compound (b)-(32) in terms of NMR spectroscopy. In addition, the molecular weight thereof was determined by gel permeation chromatography (GPC) and the weight average molecular weight thereof (polystyrene standard) was found to be 4,500.

EXAMPLES 27 TO 32

An aluminum substrate was prepared in the same manner used in Examples 1 to 6.

Six kinds of light-sensitive solutions (F)-1 to (F)-6 were prepared by changing the kinds of siloxane polymers of the present invention used in a light-sensitive solution (F) having the following composition. Each of these light-sensitive solutions was applied onto the aluminum plate, which had been anodized, and dried at 100° C. for 2 minutes to obtain the corresponding PS plates (F)-1 to (F)-6. The coated amount of the light-sensitive solution was 1.5 g/m$^2$ (weighed after drying) in all the PS plates.

The siloxane polymers used in the light-sensitive solutions (F)-1 to (F)-6 are listerd in Table III given below.

| Light-sensitive Solution (F) | |
|---|---|
| Component | Amount (g) |
| Siloxane polymer of the invention | 0.50 |
| Cresol/formaldehyde/novolak resin (m/p-cresol ratio = 6/4) | 1.0 |
| Oil Blue #603 (available from ORIENT CHEMICAL INDUSTRIES CO., LTD.) | 0.02 |
| Dichloroethane | 10 |
| Methyl cellosolve | 10 |

A gray scale having a density difference of 0.15 was brought in close contact with the light-sensitive layer of each PS plate (F)-1 to (F)-6 and the layer was exposed to light from a 2 KW high pressure mercury lamp at a distance of 50 cm for 2 minutes. The exposed PS plates (F)-1 to (F)-6 were immersed in and developed with DF-4 (trade name; available from Fuji Photo Film Co., Ltd.) diluted 8 times with water for 60 seconds at 25° C. to thus obtain positive images dyed blue which was clear and free of indistinctness without forming a coupling product dyed brown.

Each of the organopolysiloxane compounds of the present invention used had a weight average molecular weight (GPC; polystyrene standard) ranging from 2,000 to 10,000.

Moreover, among the siloxane polymers used, exemplified compounds (b)-(32), (b)-(40), (b)-(41) and (b)-(45), the content of the nitrobenzyl ester group- or nitrobenzylsulfonate group-containing siloxane unit was 50 mole % in each compounds listed above.

TABLE III

| Ex. No. | PS plate | siloxane polymer of the invention used |
| --- | --- | --- |
| 27 | (F)-1 | Exemplified Compound (b)-(17) |
| 28 | (F)-2 | Exemplified Compound (b)-(26) |
| 29 | (F)-3 | Exemplified Compound (b)-(32) |
| 30 | (F)-4 | Exemplified Compound (b)-(40) |
| 31 | (F)-5 | Exemplified Compound (b)-(41) |
| 32 | (F)-6 | Exemplified Compound (b)-(45) |

EXAMPLES 33 TO 38

Each of light-sensitive solutions (G)-1 to (G)-6 which had the same compositions as those of the light-sensitive solutions (F)-1 to (F)-6 used in Examples 27 to 32 except that Oil Blue #603 was removed was applied onto a silicon wafer with a spinner and dried on a hot plate maintained at 90° C. for 2 minutes. The thickness of the layer was 1.0 μm.

Then the resultant light-sensitive layer was exposed to light with a scale down projection aligner (stepper) using monochromatic light of 365 nm and was developed with a 2.4% aqueous solution of tetramethyl ammonium hydroxide for 60 seconds to form a resist pattern. As a result, a good pattern having a line & space of 0.7 μm was obtained.

EXAMPLES 39 TO 40

A commercially available novolak type resist HPR-204 (available from Fuji Hunt Chemical Co., Ltd.) was applied onto a silicon wafer with a spinner and dried at 220° C. for one hour to obtain an underlying coating. The thickness thereof was 2.0 μm.

The following light-sensitive solution (H) was applied onto the underlying layer with a spinner and dried on a hot plate maintained at 90° C. for 2 minutes to form a coated film having a thickness of 0.5 μm.

| Light-sensitive Solution (H) | |
| --- | --- |
| Component | Amount (g) |
| Siloxane polymer of the invention | 0.90 |
| Cresol/formaldehyde/novolak resin (m/p-cresol ratio = 6/4) | 0.70 |
| Ethyl cellosolve acetate | 8.5 |

The siloxane polymers of the invention used in these Examples were siloxane polymers corresponding to exemplified compounds (b)-(32) and (b)-(45) whose weight average molecular weights (GPC; polystyrene standard) were 4,500 and 6,000 respectively. In these siloxane polymers, the content of the nitrobenzyl ester group- or nitrobenzylsulfonate group-containing siloxane unit was 50 mole % in both cases.

The resulting light-sensitive layer was exposed to light and developed in the same manner as used in Examples 33 to 38 and as a result, a good pattern having a line & space of 0.7 μm was obtained. Then the layer was etched for 20 minutes with a diode parallel plates reactive ion etching apparatus under the conditions of 20 mTorr of $O_2$ gas pressure and 200 mW/cm$^2$ of RF power. Thus, the pattern of the upper layer was completely transferred to the lower HPR-204 layer. The resulting resist pattern was composed of the upper and lower two layers having a high aspect ratio.

More specifically, it was confirmed that the resist of the invention could be used as an upper resist in the two layer resist technique.

The light-sensitive compositions of the present invention do not generate gases during exposure to light and do not undergo any coupling reaction during development. Moreover, they are excellent in resistance to oxygen plasma and can easily be produced.

PREPARATION EXAMPLE 11

Preparation of 3,5-Dimethoxybenzyl Alcohol 7.6 g of lithium aluminum hydride (LiAlH$_4$) was dispersed in 100 ml of dehydrized and dried tetrahydrofuran (THF). To the resulting dispersion, there was dropwise added a solution of 36.4 g of 3,5-dimethoxy benzoate in 200 ml of dehydrized THF over one hour with stirring. Subsequently, the stirring was continued at room temperature for additional one hour. After 20 ml of water was dropwise added to treat the remaining LiAlH$_4$, this reaction added to 1.5 l of water. The reaction mixture was acidified by addition of 20 g of conc. hydrochloric acid and extracted twice with 700 ml of ethyl acetate. The extract was washed with water and then dried over anhydrous magnesium sulfate. The dried ethyl acetate solution was concentrated and purified by column chromatography (packed material: silica gel; eluent: hexane/ethyl acetate=2/1) to give 31 g of colorless needles. It was confirmed that the crystals obtained were 3,5-dimethoxybenzyl alcohol in terms of NMR spectroscopy:

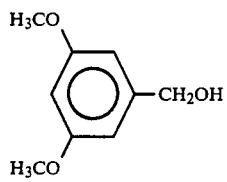

PREPARATION EXAMPLE 12

Preparation of 3,5-Dimethoxybenzyl Acrylate 16.8 g (0.100 mole) of 3,5-dimethoxybenzyl alcohol, 9.5 g (0.094 mole) of triethylamine and 1.3 g (0.011 mole) of 4-(dimethylamino) pyridine were dissolved in 120 ml of acetone. To the resulting solution, there was dropwise added a solution of 9.5 g (0.105 mole) of acryloyl chloride in 30 ml of acetone at room temperature over 30 minutes with stirring. Subsequently, the stirring was continued for additional one hour. The salt formed was filtered off, the filtrate was concentrated and purified by column chromatography (packed material: silica gel; eluent: hexane/ethyl acetate=5/1) to give 15.2 g of an oily liquid.

It was confirmed that the product obtained was 3,5-dimethoxybenzyl acrylate in terms of NMR spectroscopy:

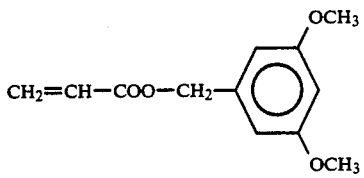

PREPARATION EXAMPLE 13

Preparation of Exemplified Compound (c)-(36)

8.8 g (0.05 mole) of 2-(trimethoxysilyl)-1,3-butadiene and 12.0 g (0.05 mole) of phenyl triethoxysilane were dissolved in 100 ml of dioxane, further 10 ml of distilled water and 0.1 g of conc. hydrochloric acid were added to the solution and the resulting mixture was stirred for 30 minutes. Then the solvents, dioxane and water were distilled off under heating to concentrate the mixture. The concentrate was redissolved in 80 ml of dioxane, 11.1 g (0.05 mole) of 3,5-dimethoxybenzyl acrylate was added to the solution and the mixture was heated at 100° C. for one hour with stirring. The reaction solution was added to 1 l of water with stirring, the precipitates formed was filtered off and dried in vacuo. Thus, 20.5 g of a white resin was obtained. It was confirmed that the resin was compound (c)-(36) in terms of NMR spectroscopy. In addition, the molecular weight thereof was determined by gel permeation chromatography (GPC) and the weight average molecular weight (polystyrene standard) thereof was found to be 3,600.

EXAMPLES 41 TO 46

Six kinds of light-sensitive solutions (I)-1 to (I)-6 were prepared by changing the kinds of siloxane polymers of the present invention used in a light-sensitive solution (I) having the following composition. Each of these light-sensitive solutions was applied onto a silicon wafer with a spinner and dried on a hot plate maintained at 90° C. for 2 minutes. The thickness of the resulting film was 1.0μ.

| Light-sensitive Solution (I) | |
|---|---|
| Component | Amount (g) |
| Siloxane polymer of the invention | 0.50 |
| Cresol/formaldehyde/novolak resin (m/p-cresol ratio = 6/4) | 1.0 |
| Ethyl cellosolve acetate | 8.5 |

The siloxane polymers used in the light-sensitive solutions (I)-1 to (I)-6 are listerd in Table IV given below.

The resulting resist layer was exposed to pulsed light from a KrF excimer laser of 249 nm through a mask and developed with a 2.4% aqueous solution of tetramethyl ammonium hydroxide for 60 seconds to thus form a resist pattern. As a result, a good pattern having a line & space of 0.4 μm.

TABLE IV

| Ex. No. | PS plate | siloxane polymer of the invention used |
|---|---|---|
| 41 | (I)-1 | Exemplified Compound (c)-(16) |
| 42 | (I)-2 | Exemplified Compound (c)-(25) |
| 43 | (I)-3 | Exemplified Compound (c)-(32) |
| 44 | (I)-4 | Exemplified Compound (c)-(36) |
| 45 | (I)-5 | Exemplified Compound (c)-(46) |
| 46 | (I)-6 | Exemplified Compound (c)-(51) |

Each of the siloxane polymers of the present invention used had a weight average molecular weight (GPC; polystyrene standard) ranging from 2,800 to 4,500. Moreover, among the siloxane polymers used, exemplified compounds (c)-(32), (c)-(36), (c)-(46) and (c)-(51), the content of the alkoxybenzyl ester group- or alkoxybenzylsulfonate group-containing siloxane unit was 50 mole % in each compounds listed above.

EXAMPLES 47 TO 48

A commercially available novolak type resist HFR-204 (available from Fuji Hunt Chemical Co., Ltd.) was applied onto a silicon wafer with a spinner and dried at 220° C. for one hour to obtain an underlying coating. The thickness thereof was 2.0 μm.

The following light-sensitive solution (J) was applied onto the underlying layer with a spinner and dried on a hot plate maintained at 90° C. for 2 minutes to form a coated film having a thickness of 0.5 μm.

| Light-sensitive Solution (J) | |
|---|---|
| Component | Amount (g) |
| Siloxane polymer of the invention | 1.0 |
| Cresol/formaldehyde/novolak resin (m/p-cresol ratio = 6/4) | 0.60 |
| Ethyl cellosolve acetate | 8.5 |

The siloxane polymers of the invention used in these Examples were siloxane polymers corresponding to exemplified compounds (c)-(34) and (c)-(45) whose weight average molecular weights (GPC; polystyrene standard) were 3,500 and 3,200 respectively. In these siloxane polymers, the content of the alkoxybenzyl ester group- or alkoxybenzylsulfonate group-containing siloxane unit was 25 mole % in both cases.

The resulting light-sensitive layer was exposed to light and developed in the same manner as used in Examples 41 to 46 and as a result, a good pattern having a line & space of 0.4 μm was obtained. Then the layer was etched for 20 minutes with a diode parallel plates reactive ion etching apparatus under the conditions of 20 mTorr of $O_2$ gas pressure and 200 mW/cm² of RF power. Thus, the pattern of the upper layer was completely transferred to the lower HPR-204 layer. The resulting resist pattern was composed of the upper and lower two layers having a high aspect ratio.

More specifically, it was confirmed that the resist of the invention could be used as an upper resist in the two layer resist technique.

PREPARATION EXAMPLE 14

Preparation of vinyl-1-naphthyl Disulfone

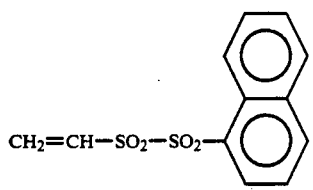

189 g of sodium sulfite was dissolved in 600 ml of water, the solution was warmed at a temperature ranging from 60° to 70° C., 68 g of 1-naphthalenesulfonyl chloride was added and then the mixture was reacted at a temperature ranging from 50° to 60° C. for 5 hours. Insolubles were filtered off, the temperature of the reaction solution was brought back to room temperature and the solution was acidified by addition of conc. hydrochloric acid. The resulting precipitates were collected by filtration to give 55 g of 1-naphthalene sulfinic acid.

15 ml of water was added to 9.6 g of 1-naphthalene sulfinic acid and a solution of 2 g of sodium hydroxide in 5 ml of water was added to the mixture. To the solution there was added a solution of 6.3 g of vinylsulfonyl chloride in 20 ml of acetonitrile at room temperature with stirring and the mixture was stirred at room temperature for additional 24 hours. The reaction solution was poured into 300 ml of water, the resulting precipitates were recovered through filtration and recrystallized from a mixed solvent of benzene and ethanol to give 3.5 g of vinyl-1-naphthyldisulfone.

PREPARATION EXAMPLE 15

Preparation of 4-Tolyl-4-styryldisulfone

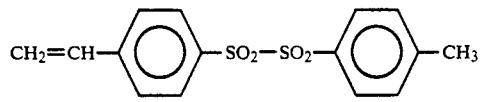

The same procedures used in Preparation Example 14 were repeated to obtain 45 g of p-toluenesulfinic acid except that 57 g of p-toluenesulfonyl chloride was substituted for 1-naphthalenesulfonyl chloride used in Preparation Example 14.

15 ml of water was added to 7.8 g of p-toluenesulfinic acid and a solution of 2 g of sodium hydroxide in 5 ml of water was added to the mixture. To the solution there was added a solution of 10.1 g of p-styrenesulfonyl chloride in 20 ml of acetonitrile at room temperature with stirring and the mixture was stirred at room temperature for additional 24 hours. The reaction solution was poured into 300 ml of water, the resulting precipitates were recovered through filtration and recrystallized from a mixed solvent of benzene and ethanol to give 5.1 g of 4-tolyl-4-styryldisulfone.

PREPARATION EXAMPLE 16

Preparation of 2-Methyl-3-vinylsulfonyloxy-4-(3H)-quinazoline (3H)-quinazoline

-continued

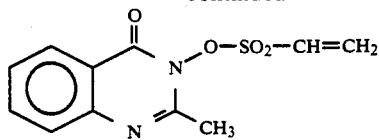

11.8 g of hydroxylamine hydrochloride was dissolved in 20 ml of water and 65 ml of a 20% by weight sodium hydroxide aqueous solution was added to the solution. 50 ml of the resulting solution was added to a solution of 9.7 g of methyl N-acetylanthranilate in 40 ml of methanol and the mixture was stirred at room temperature for 48 hours. After removal of the solvent under reduced pressure, 100 ml of water was added to the residue to dissolve it, 5 ml of conc. hydrochloric acid was added thereto, the crystals precipitated out was recovered by filtration and recrystallized from an ethanol/water mixed solvent to give 7.5 g of 2-methyl-3-hydroxy-4(3H)-quinazoline.

4.4 g of 2-methyl-3-hydroxy-4(3H)-quinazoline and 3.2 g of vinylsulfonyl chloride were added to 50 ml of acetone and 2.8 g of triethylamine was dropwise added to the solution with stirring while maintaining the temperature of the solution at 0° to 20° C. Further, the stirring was continued at 20° to 30° C. for additional 3 hours and then the solvent was removed under reduced pressure. 100 ml of water was added to the residue, the resulting precipitates were collected by filtration and recrystallized from an ethanol/benzene mixed solvent to give 5.3 g of 2-methyl-3-vinylsulfonyloxy TM 4(3H)-quinazoline.

PREPARATION EXAMPLE 17

Preparation of 1,2,3-Triaza-3-(4-styryl)-sulfonyloxy-4-tetralone sulfonyloxy-4-tetralone

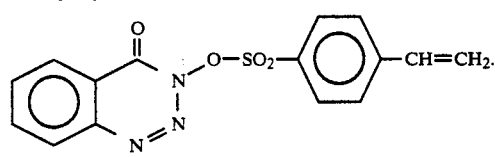

To a solution of 26 g of N-hydroxy-2-aminobenzamide and 45 ml of 35% hydrochloric acid in 800 ml of water, there was added a solution of 12.5 g of sodium nitrite in 120 ml of water at 50° C. and then stirring was continued at room temperature. The resulting precipitates were filtered off and recrystallized from methanol to give 19.7 g of the following product:

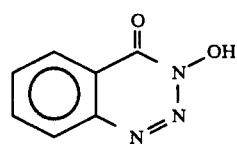

The product was dissolved in 150 ml of tetrahydrofuran (THF) and 12.2 g of triethylamine was added to the solution. To the solution, there was dropwise added, at 10° C., 24.3 g of p-styrenesulfonyl chloride and the mixture was stirred at room temperature for additional one hour. Thereafter, 500 ml of ethyl acetate was added, the mixture was washed with water and the ethyl acetate solution was dried over Na$_2$SO$_4$. The ethyl acetate solution was concentrated to dryness, the resulting white solids were redissolved in acetone and the solution was poured into 4 l of water to give 28.5 g of 1,2,3-triaza-3-(4-styryl)-sulfonyloxy-4-tetralone.

PREPARATION EXAMPLE 18

Preparation of Exemplified Compound (d)-(31)

4.4 g (0.025 mole) of 2-(trimethoxysilyl)-1,3-butadiene and 18.0 g (0.075 mole) of phenyl triethoxysilane were dissolved in 100 ml of dioxane, further 10 ml of distilled water and 0.1 g of conc. hydrochloric acid were added to the solution and the mixture was stirred for 30 minutes. Then the mixture was concentrated by heating it and distilling off the solvent. After redissolving the concentrate by addition of 80 ml of dioxane, 6.6 g (0.025 mole) of 2-methyl-3-vinylsulfonyloxy-4(3H)-quinazolinone was added to the solution and the mixture was heated at 100° C. for one hour with stirring. The reaction solution was poured into 1 l of water with stirring, the resulting precipitates were filtered off and dried in vacuo. Thus, 17 g of a brownish white resin was obtained. It was confirmed that the resin was exemplified compound (d)-(31) by means of NMR spectroscopy. In addition, the molecular weight thereof was determined by gel permeation chromatography (GPC) and the weight average molecular weight (polystyrene standard) thereof was found to be 3,000.

PREPARATION EXAMPLE 19

Preparation of Exemplified Compound (d)-(33)

The same reaction and post-treatments as used in Preparation Example 18 were repeated except that 7.1 g (0.025 mole) of vinyl-1-naphthyldisulfone was substituted for 2-methyl-3-vinylsulfonyloxy-4(3H)-quinazoline used in Preparation Example 18 to obtain 18.5 g of a white resin. It was confirmed that the resin was exemplified compound (d)-(33) by means of NMR spectroscopy. In addition, the weight average molecular weight (GPC; polystyrene standard) thereof was found to be 3,800.

EXAMPLES 49 TO 52

An aluminum substrate was prepared in the same manner as in Examples 1 to 6.

Four kinds of light-sensitive solutions (K)-1 to (K)-4 were prepared by changing the kinds of siloxane polymers of the present invention used in a light-sensitive solution (K) having the following composition. Each of these light-sensitive solutions was applied onto the aluminum plate, which had been anodized, and dried at 100° C. for 2 minutes to obtain the corresponding PS plates (K)-1 to (K)-4. The coated amount of the light-sensitive solution was 1.5 g/m$^2$ (weighed after drying) in all the PS plates.

The siloxane polymers used in the light-sensitive solutions (K)-1 to (K)-4 are listed in Table V given below.

| Light-sensitive Solution (K) | |
|---|---|
| Component | Amount (g) |
| Siloxane polymer of the invention | 0.50 |
| Cresol/formaldehyde/novolak resin (m/p-cresol ratio = 6/4) | 1.0 |
| Ethyl Michler's ketone | 0.05 |
| Oil Blue #603 (available from ORIENT CHEMICAL INDUSTRIES CO., LTD.) | 0.02 |

| -continued | |
|---|---|
| Light-sensitive Solution (K) | |
| Component | Amount (g) |
| Methyl ethyl ketone | 5 |
| Mehtyl cellosolve | 15 |

A gray scale having a density difference of 0.15 was brought in close contact with the light-sensitive layer of each PS plate (K)-1 to (K)-4 and the layer was exposed to light from a 2 KW high pressure mercury lamp at a distance of 50 cm for 2 minutes. The exposed PS plates (K)-1 to (K)-4 were immersed in and developed with DP-4 (trade name; available from Fuji Photo Film Co., Ltd.) diluted 8 times with water for 60 seconds at 25° C. to thus obtain positive images dyed clear blue.

Each of the siloxane polymers of the present invention used had a weight average molecular weight (GPC; polystyrene standard) ranging from 2,500 to 4,000.

Moreover, among the siloxane polymers used, exemplified compounds (d)-(40) and (d)-(46), the content of the disulfone group- or 3-sulfonyloxy-4-quinazoline group-containing siloxane unit was 25 mole % in each compound.

TABLE V

| Ex. No. | PS plate | siloxane polymer of the invention used |
|---|---|---|
| 49 | (K)-1 | Exemplified Compound (d)-(20) |
| 50 | (K)-2 | Exemplified Compound (d)-(27) |
| 51 | (K)-3 | Exemplified Compound (d)-(40) |
| 52 | (K)-4 | Exemplified Compound (d)-(46) |

EXAMPLES 53 TO 56

A comparative PS plate (L) was prepared in the same manner used in Examples 49 to 52 except that a light-sensitive solution (L) was used. The light-sensitive solution (L) was prepared by using 0.40 g of 1,2-naphthoquinonediazido-5-sulfonate of m-cresol/formaldehyde/novola k resin in place of the siloxane polymer of the invention and ethyl Michler's ketone in the light-sensitive solution (K). The coated amount of the light-sensitive solution was 1.5 g/m$^2$ (weighed after drying).

The PS plates (K)-1 to (K)-4 prepared in Examples 49 to 52 and the PS plate (L) were allowed to stand under irradiation with light rays from a white fluorescent tube for 20 minutes. These PS plates were exposed to light and developed in the same manner used in Examples 49 to 52 and the change in sensitivity thereof observed before and after the irradiation with the light rays from the white fluorescent tube was determined. As a result, the sensitivity change was observed on the PS plate (L), but the PS plates (K)-1 to (K)-4 of the present invention did not show any change in the sensitivity. In other words, it is confirmed that the PS plates of the present invention are substantially improved in the white light rays-stability.

EXAMPLES 57 TO 60

Four kinds of light-sensitive solutions (M)-1 to (M)-4 were prepared by changing the kinds of siloxane polymers of the present invention used in a light-sensitive solution (M) having the following composition. Each of these light-sensitive solutions was applied onto a silicon wafer with a spinner and dried on a hot plate maintained at 90° C. for 2 min. The thickness of the resulting film was 1.0μ.

| Light-sensitive Solution (M) | |
|---|---|
| Component | Amount (g) |
| Siloxane polymer of the invention | 0.50 |
| Cresol/formaldehyde/novolak resin (m/p-cresol ratio = 6/4) | 1.0 |
| Ethyl cellosolve acetate | 8.5 |

The siloxane polymers used in the light-sensitive solutions (I)-1 to (I)-6 are listed in Table VI given below.

The resulting resist layer was exposed to pulsed light from a KrF excimer laser of 249 nm through a mask and developed with a 2.4% aqueous solution of tetramethyl ammonium hydroxide for 60 seconds to thus form a resist pattern. As a result, a good pattern having a line & space of 0.4 μm.

Each of the siloxane polymers of the present invention used had a weight average molecular weight (GPC; polystyrene standard) ranging from 3,000 to 5,000. Moreover, among the siloxane polymers used, exemplified compounds d)-(31) and d)-(37), the content of the disulfone group- or 3-sulfonyloxy-4-quinazoline group-containing siloxane unit was 50 mole % in each compound listed above.

TABLE VI

| Ex. No. | PS plate | siloxane polymer of the invention used |
|---|---|---|
| 57 | (M)-1 | Exemplified Compound (d)-(16) |
| 58 | (M)-2 | Exemplified Compound (d)-(20) |
| 59 | (M)-3 | Exemplified Compound (d)-(31) |
| 60 | (M)-4 | Exemplified Compound (d)-(37) |

EXAMPLES 61 TO 62

A commercially available novolak type resist HPR-204 (available from Fuji Hunt Chemical Co., Ltd.) was applied onto a silicon wafer with a spinner and dried at 220° C. for one hour to obtain an underlying coating. The thickness thereof was 2.0 μm.

The following light-sensitive solution (N) was applied onto the underlying layer with a spinner and dried on a hot plate maintained at 90° C. for 2 minutes to form a coated film having a thickness of 0.5 μm.

| Light-sensitive Solution (N) | |
|---|---|
| Component | Amount (g) |
| Siloxane polymer of the invention | 1.00 |
| Cresol/formaldehyde/novolak resin (m/p-cresol ratio = 6/4) | 0.60 |
| Ethyl Michler's ketone | 0.04 |
| Ethyl cellosolve acetate | 8.5 |

The siloxane polymers of the invention used in these Examples were siloxane polymers corresponding to exemplified compounds (d)-(36) and (d)-(38) whose weight average molecular weights (GPC; polystyrene standard) were 3,200 and 3,800 respectively. In these siloxane polymers, the content of the disulfone group- or 3-sulfonyloxy-4-quinazoline group-containing siloxane unit was 25 mole % in both cases.

The resulting light-sensitive layer was exposed to light with a scale down projection aligner (stepper) using monochromatic light of 365 nm and developed in the same manner as used in Examples 57 to 60 and as a result, a good pattern having a line & space of 0.7 μm was obtained. Then the layer was etched for 20 minutes with a diode parallel plates reactive ion etching apparatus under the conditions of 20 mTorr of $O_2$ pressure and 200 mW/cm$^2$ of RF power. Thus, the pattern of the upper layer was completely transferred to the lower HPR-204 layer. The resulting resist pattern was composed of the upper and lower two layers having a high aspect ratio.

More specifically, it was confirmed that the resist of the invention could be used as an upper resist in the two layer resist technique.

PREPARATION EXAMPLE 20

Preparation of N-t-Butoxycarbonylmaleimide

To a suspension of 9.7 g (0.10 mole) of maleimide and 11.2 g 0.10 mole) of potassium t-butoxide in 200 ml of tetrahydrofuran (THF), there was dropwise added, at 0° C., 21.8 g (0.10 mole) of di-t-butyldicarbonate over 30 minutes with stirring. Thereafter, the stirring was continued for additional one hour. The reaction mixture was poured into 500 ml of cold water and extracted with ethyl acetate. The crude product obtained by drying and concentrating the resulting ethyl acetate solution was purified by column chromatography (packed material: silica gel; eluent: hexane/ethyl acetate) to give 15.8 g of N-t-butoxycarbonylmaleimide.

PREPARATION EXAMPLE 21

Preparation of N-(p-t-Butoxycarbonyloxyphenyl) -maleimide

To a suspension of 18.9 g (0.10 mole) of N-(p-hydroxyphenyl) maleimide and 11.2 g (0.10 mole) of potassium t-butoxide in 200 ml of tetrahydrofuran (THF), there was dropwise added, at 0° C., 21.8 g (0.10 mole) of di-t-butyldicarbonate over 30 minutes with stirring. Thereafter, the same reaction and post-treatments as used in Preparation Example 20 were performed to thus give 21.7 g of N-(p-t-butoxycarbonyloxyphenyl)maleimide.

PREPARATION EXAMPLE 22

Preparation of Exemplified Compound (e)-(32)

8.7 g (0.050 mole) of 2-(trimethoxysilyl)-1,3-butadiene and 9.9 g (0.050 mole) of N-t-butoxycarbonyl maleimide were dissolved in 100 m l of dioxane and heated to 100° C. for one hour with stirring. After cooling to room temperature, 9.9 g (0.050 mole) of trimethoxyphenylsilane was added to the solution. Further, 10 ml of distilled water and 0.1 g of conc. hydrochloric acid were added to the solution and the solution was stirred for additional 30 minutes. Then the solution was heated to remove the solvent, dioxane, and to concentrate the solution. The resulting concentrate was added to 1 l of water with stirring, the solids recipitated out were filtered off and dried in vacuo. Thus, 22.1 g of a white resin was obtained. It was confirmed that the resin was exemplified compound (e)-(32) by means of NMR spectroscopy. In addition, the molecular weight of the compound was determined by gel permeation chromatography (GPC) and the weight average molecular weight (polystyrene standard) thereof was found to be 4,000.

PREPARATION EXAMPLE 23

Preparation of Exemplified Compound (e)-(34)

The same reaction and post-treatments as those used in Preparation Example 22 were performed to obtain 25.5 g of a white resin except that 14.5 g (0.050 mole) of N-(p-t-butoxycarbonyloxyphenyl)maleimide was substituted for N-t-butoxycarbonyl maleimide used in Preparation Example 22. It was confirmed that the resulting resin was exemplified compound (e)-(34) by means of NMR spectroscopy. In addition, the weight average molecular weight (GPC: polystyrene standard) thereof was found to be 6,000.

PREPARATION EXAMPLE 24

Preparation of Exemplified Compound (e)-(35)

The same reaction and post-treatments as those used in Preparation Example 22 were performed to obtain 18.2 g of a white resin except that 6.4 g (0.050 mole) of t-butyl acrylate was substituted for N-t-butoxycarbonyl maleimide used in Preparation Example 22. It was confirmed that the resulting resin was exemplified compound (e)-(35) by means of NMR spectroscopy. In addition, the weight average molecular weight (GPC; polystyrene standard) thereof was found to be 3,500.

EXAMPLES 63 TO 68

A 2S aluminum plate having a thickness of 0.24 mm was immersed in a 10% solution of tertiary sodium phosphate maintained at 80° C. for 3 minutes to degrease the same, grained with a nylon brush, etched with a sodium aluminate solution for about 10 minutes and then desmutted with a 3% aqueous solution of sodium hydrogen sulfate. The aluminum plate was then anodized at a current density of 2 A/dm² for 2 minutes in a 20% sulfuric acid solution to thus obtain an aluminum substrate.

Six kinds of light-sensitive solutions (O)-1 to (O)-6 were prepared by changing the kinds of siloxane polymers of the present invention used in a light-sensitive solution (O) having the following composition. Each of these light-sensitive solutions was applied onto the aluminum plate, which had been anodized, and dried at 100° C. for 2 minutes to obtain the corresponding PS plates (O)-1 to (O)-6. The coated amount of the light-sensitive solution was 1.5 g/m² (weighed after drying) in all the PS plates.

The siloxane polymers used in the light-sensitive solution (O)-1 to (O)-6 are listed in the following Table VII.

| Light-sensitive Solution (O) | |
|---|---|
| Component | Amount (g) |
| Siloxane polymer of the invention | 1.1 |
| PF₆ Salt of triphenylsulfonium | 0.10 |
| Anthracene | 0.04 |
| Oil Blue #603 (available from ORIENT CHEMICAL INDUSTRIES CO., LTD.) | 0.02 |
| Methyl ethyl ketone | 5 |
| Methyl cellosolve | 15 |

As a comparative example, a PS plate P was prepared by applying the following light-sensitive solution (P) onto the aluminum plate in the same manner as that described above in connection with the light-sensitive solution (O). The coated amount of the light-sensitive solution was 1.5 g/m² (weghed after drying).

| Light-sensitive Solution (P) | |
|---|---|
| Component | Amount (g) |
| Cresol/formaldehyde/novolak resin (m/p-cresol ratio = 6/4) | 1.1 |
| Condensed product of cresol/formaldehyde/novolak | 0.45 |

| Light-sensitive Solution (P) | |
|---|---|
| Component | Amount (g) |
| resin with 1,2-naphthoquinone-2-diazido-5-sulfonyl chloride | |
| 2-(p-methoxyphenyl)-4,6-bistrichloromethyl-s-triazine | 0.02 |
| Oil Blue #603 (available from ORIENT CHEMICAL INDUSTRIES CO., LTD.) | 0.01 |
| Methyl ethyl ketone | 5 |
| Methyl cellosolve | 15 |

A gray scale having a density difference of 0.15 (step tablet; available from Fuji Photo Film Co., Ltd.) was brought in close contact with the light-sensitive layer of each PS plate (O)-1 to (O)-6 or (P) and the layer was exposed to light from a 2 KW high pressure mercury lamp at a distance of 50 cm. After the exposure to light, the PS plates (O)-1 to (O)-6 were heated to 90° C. for one minute. Thereafter, the exposed PS plates (O)-1 to (O)-6 and (P) were immersed in and developed with DP-4 (trade name; available from Fuji photo Film Co., Ltd.) diluted 8 times with water for 60 seconds at 25° C. and the exposure time required for making the 5th step of the gray scale having a density difference of 0.15 completely clear was determined. The results thus obtained are listed in the following Table VII.

TABLE VII

| Ex. No. | PS plate | Siloxane Polymer Employed | Exposure Time (sec) |
|---|---|---|---|
| 63 | (O)-1 | Exemplified Compound (e)-(21) | 15 |
| 64 | (O)-2 | Exemplified Compound (e)-(26) | 20 |
| 65 | (O)-3 | Exemplified Compound (e)-(32) | 10 |
| 66 | (O)-4 | Exemplified Compound (e)-(34) | 5 |
| 67 | (O)-5 | Exemplified Compound (e)-(35) | 15 |
| 68 | (O)-6 | Exemplified Compound (e)-(40) | 5 |
| 1 | (P) | Comparative Example | 55 |

As seen from the results listed in Table VII, all the PS plates (O)-1 to (O)-6 in which the siloxane polymers of the invention were used require a short exposure time and have high sensitivity compared with those for the comparative PS plate (P).

The weight average molecular weight (GPC; polystyrene standard) of all the siloxane polymers listed in Table VII range from 3,000 to 8,500.

Moreover, among the siloxane polymers corresponding to exemplified compounds (e)-(32), (e)-(34), (e)-(35) and (e)-(40), the content of the tertiary carbon-ester group- or carboxylate group-containing siloxane unit was 50 mole % in all the cases.

EXAMPLES 69 TO 74

To examine the stability, with time, of PS plates, the PS plates (O)-1 to (O)-6 prepared in Examples 63 to 68 and newly prepared PS plates (Q)-1 and (Q)-2 were kept to stand at a temperature of 45° C. and a humidity of 75% for 3 days. The PS plates (Q)-1 and (Q)-2 were prepared in the same manner as in Examples 63 to 68 except that the following light-sensitive solutiuon (Q) was used (the coated amount of the solution was 1.5 g/m² weighed after drying).

| Light-sensitive Solution (Q) | |
|---|---|
| Component | Amount (g) |
| The following silyl ester compound* disclosed in J. P. KOKAI No. Sho 60-10247 | 0.40 |
| Cresol/formaldehyde/novolak resin | 1.1 |

-continued

| Light-sensitive Solution (Q) | |
|---|---|
| Component | Amount (g) |
| (m/p-cresol ratio = 6/4) | |
| 2-(p-Methoxyphenyl)-4,6-bistrichloromethyl-s-triazine | 0.05 |
| Oil Blue #603 (available from ORIENT CHEMICAL INDUSTRIES CO., LTD.) | 0.01 |
| Methyl ethyl ketone | 5 |
| Methyl cellosolve | 15 |

*The compounds used in the light-sensitive solution (Q) and disclosed in J. P. KOKAI No. Sho 60-10247 are as follows:

(Q)-1

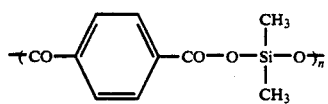

weight average molecular weight = 2,100
(GPC; polystyrene standard)

(Q)-2

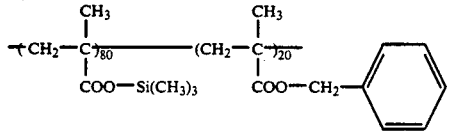

weight average molecular weight = 30,000
(GPC; polystyrene standard)

A gray scale having a density difference of 0.15 was brought in close contact with the light-sensitive layer of each PS plate (O)-1 to (O)-6, (P) or (Q)-1 to (Q)-2 prior to or after allowing to stand under the foregoing conditions and these assembly were exposed to light from a 30 A carbon arc lamp at a distance of 70 cm for 30 seconds. Then these PS plates (O)-1 to (O)-6, (P) and (Q)-1 to (Q)-2 were developed in the same manner as used in Examples 63 to 68 and the difference between the number of steps of the gray scale observed on each PS plate before and after allowing to stand for 3 days under the foregoing conditions (45° C.; 75% humidity) was determined. The results observed are summarized in the following Table VIII.

TABLE VIII

| PS plate | difference between the number of steps of the gray scale before and after allowing to stand for 3 days under the conditions (45° C.; 75% humidity) (number of steps) |
|---|---|
| (O)-1 | 0.5 |
| (O)-2 | 0 |
| (O)-3 | 0.5 |
| (O)-4 | 0 |
| (O)-5 | 0 |
| (O)-6 | 0 |
| (P) (Comp. Ex.) | 1.0 |
| (Q)-1 (Comp. Ex.) | 2.5 |
| (Q)-2 (Comp. Ex.) | 1.5 |

As seen from Table VIII, all of the PS plates (O)-1 to (O)-6 in which the compounds of the present invention were used have the difference in the step number of the gray scale lower than those for the comparative PS plates (F) and (Q)-1 to (Q)-2 and high stability with time and thus they are very excellent.

EXAMPLES 75 TO 80

Each of light-sensitive solutions (R)-1 to (R)-6 which had the same compositions as those of the light-sensitive solutions ((O)-1 to (O)-6 used in Examples 63 to 68 except that Oil Blue #603 was removed was applied onto a silicon wafer with a spinner and dried on a hot plate maintained at 90° C. for 2 minutes. The thickness of the resulting layer was 1.0 $\mu$m.

Then the resulting light-sensitive layer was exposed to light with a scale down projection aligner (stepper) using monochromatic light of 365 nm and subjected to post-heating at 90° C. for one minute. Then it was developed with a 2.4% aqueous solution of tetramethyl ammonium hydroxide for 60 seconds to form a resist pattern. As a result, a good pattern having a line & space of 0.7$\mu$m was obtained.

EXAMPLES 81 TO 82

A commercially available novolak type resist HPR-204 (available from Fuji Hunt Chemical Co., Ltd.) was applied onto a silicon wafer with a spinner and dried at 220° C. for one hour to obtain an underlying coating. The thickness thereof was 2.0 $\mu$m.

The following light-sensitive solution (S) was applied onto the underlying layer with a spinner and dried on a hot plate maintained at 90° C. for 2 minutes to form a coated film having a thickness of 0.5 $\mu$m.

| Light-sensitive Solution (S) | |
|---|---|
| Component | Amount (g) |
| Siloxane polymer of the invention | 1.10 |
| PF$_6$ Salt of diphenyl iodonium | 0.10 |
| Anthracene | 0.04 |
| 2-Ethoxyethyl acetate | 8.5 |

The siloxane polymers of the invention used in these Examples were siloxane polymers corresponding to exemplified compounds (e)-(32) and (e)-(34) whose weight average molecular weights (GPC; polystyrene standard) were 4,000 and 6,500 respectively. In these siloxane polymers, the content of the tertiary carbon-ester group- or carbonate ester group-containing siloxane unit was 50% in both cases.

The resulting light-sensitive layer was exposed to light and developed in the same manner as used in Examples 75 to 80 and as a result, a good pattern having a line & space of 0.7 $\mu$m was obtained. Then the layer was etched for 20 minutes with a diode parallel plates reactive ion etching apparatus under the conditions of 20 mTorr of $O_2$ gas pressure and 200 mW/cm$^2$ of RF power. Thus the pattern of the upper layer was completely or faithfully transferred to the lower HPR-204 layer. The resulting resist pattern was composed of the upper and lower two layers having a high aspect ratio.

More specifically, it was confirmed that the resist of the present invention could be used as an upper resist in the two layer resist technique.

The light-sensitive composition of the present invention is highly sensitive, is excellent in stability with time and resistance to oxygen plasma, can be developed with an alkaline developer and can easily be prepared.

PREPARATION EXAMPLE 25

Preparation of Exemplified Compound (f)-(34)

8.7 g (0.050 mole) of 2-(trimethoxysilyl -1,3-butadiene and 9.5 g (0.050 mole) of N-(p-hydroxyphenyl)maleimide were dissolved in 100 ml of dioxane and the solution was heated to 100° C. for one hour with stirring. After cooling to room temperature, 9.9 g (0.050 mole) of trimethoxyphenylsilane was added to the solution. Further, 10 ml of distilled water and 0.1 g of conc. hydrochloric acid were added to the solution and it was stirred for 30 minutes. Thereafter, the solution was heated to remove the solvent and to thus concentrate the solution. The concentrate was added to 1 l of water with stirring, the resulting precipitates were filtered off and dried in vacuo. Thus, 22.4 g of a white resin was obtained.

The resin was redissolved in 100 ml of dioxane, then 3.4 g (0.050 mole) of imidazole was added to the solution and a solution of 5.5 g (0.050 mole) of trimethyl chlorosilane in 20 ml of dioxane was dropwise added to the solution over 30 minutes. Then the solution was continuously stirred at room temperature for 24 hours. The resulting imidazole hydrochloride was filtered off and the reaction solution was added to 2 l of water with stirring. The precipitates formed were filtered off and dried in vacuo to give 24.5 g of a white resin.

It was confirmed that the resin was exemplified compound (f)-(34) by means of NMR spectroscopy. In addition, the molecular weight of the resin was also determined by gel permeation chromatography (GPC) and the weight average molecular weight (polystyrene standard) thereof was found to be 5,300.

PREPARATION EXAMPLE 26

Preparation of Exemplified Compound (f)-(36)

8.7 g (0.050 mole) of 2-(trimethoxysilyl)-1,3-butadiene and 9.9 g (0.050 mole) of trimethoxyphenylsilane were dissolved in 100 ml of dioxane, further 10 ml of distilled water and 0.1 g of conc. hydrochloric acid were added to the solution and it was stirred for 30 minutes. Thereafter, the solution was heated to remove the solvent and to thus concentrate the solution. The concentrate was added to 1 l of water with stirring, the resulting solids were filtered off and dried in vacuo. Thus, 13.4 g of a white resin was obtained. The resin was redissolved in 100 ml of dioxane, then 9.3 g (0.050 mole) of t-butyldimethylsilyl acrylate was added to the solution and it was heated to 100° C. for one hour with stirring. The reaction solution was concentrated and the resulting concentrate was added to 2 l of water with stirring. The precipitates formed were filtered off and dried in vacuo to give 22.0 g of a white resin. It was confirmed that the resin was exemplified compound (f)-(36) by means of NMR spectroscopy. In addition, the molecular weight of the resin was also determined by GPC and the weight average molecular weight polystyrene standard) thereof was found to be 4,500.

PREPARATION EXAMPLE 27

Preparation of Exemplified Compound (f)-(33)

The same reaction and post-treatments as those used in Preparation Example 26 except that 16.6 g (0.050 mole) of N-(p-t-butyldimethylsiloxycarbonylphenyl)-maleimide was substituted for t-butyldimethylsilyl acrylate used in Preparation Example 26 to thus give 29.2 g of a white resin. It was confirmed that the resin was exemplified compound (f)-(33) by means of NMR spectroscopy. In addition, the molecular weight of the resin was also determined by GPC and the weight average molecular weight polystyrene standard) thereof was found to be 5,000.

EXAMPLES 83 TO 88

A 2S aluminum plate having a thickness of 0.24 mm was immersed in a 10% solution of tertiary sodium phosphate maintained at 80° C. for 3 minutes to degrease the same, grained with a nylon brush, etched with a sodium aluminate solution for about 10 minutes and then desmutted wit a 3% aqueous solution of sodium hydrogen sulfate. The aluminum plate was then anodized at a current density of 2 A/dm² for 2 minutes in a 20% sulfuric acid solution to thus obtain an aluminum substrate.

Six kinds of light-sensitive solutions (T)-1 to (T)-6 were prepared by changing the kinds of siloxane polymers of the present invention used in a light-sensitive solution (T) having the following composition. Each of these light-sensitive solutions was applied onto the aluminum plate, which had been anodized, and dried at 100° C. for 2 minutes to obtain the corresponding PS plates (T)-1 to (T)-6. The coated amount of the light-sensitive solution was 1.5 g/m² (weighed after drying) in all the PS plates.

The siloxane polymers used in the light-sensitive solution (T)-1 to (T)-6 are listed in the following Table IX.

| Light-sensitive Solution (T) | |
|---|---|
| Component | Amount (g) |
| Siloxane polymer of the invention | 0.50 |
| Cresol/formaldehyde/novolak resin (m/p-cresol ratio = 6/4) | 1.0 |
| PF$_6$ Salt of triphenylsulfonium | 0.05 |
| Anthracene | 0.02 |
| Oil Blue #603 (available from ORIENT CHEMICAL INDUSTRIES CO., LTD.) | 0.02 |
| Methyl ethyl ketone | 5 |
| Methyl cellosolve | 15 |

As a comparative example, a PS plate U was prepared by applying the following light-sensitive solution (U) onto the aluminum plate in the same manner as that described above in connection with the light-sensitive solution (T). The coated amount of the light-sensitive solution was 1.5 g/m² (weighed after drying).

| Light-sensitive Solution (U) | |
|---|---|
| Component | Amount (g) |
| Cresol/formaldehyde/novolak resin (m/p-cresol ratio = 6/4) | 1.1 |
| Condensed product of cresol/formaldehyde/novolak resin with 1,2-naphthoquinone-2-diazido-5-sulfonyl chloride | 0.45 |
| 2-(p-methoxyphenyl)-4,6-bistrichloromethyl-s-triazine | 0.02 |
| Oil Blue #603 (available from ORIENT CHEMICAL INDUSTRIES CO., LTD.) | 0.01 |
| Methyl ethyl ketone | 5 |
| Methyl cellosolve | 15 |

A gray scale having a density difference of 0.15 (step tablet; available from Fuji Photo Film Co., Ltd. was brought in close contact with the light sensitive layer of each PS plate (T)-1 to (T)-6 or (U) and the layer was exposed to light from a 2 KW high pressure mercury lamp at a distance of 50 cm. Thereafter, the exposed PS plates (T)-1 to (T)-6 and (U) were immersed in and developed with DP-4 (trade name; available from Fuji Photo Film Co., Ltd.) diluted 8 times with water for 60 seconds at 25° C. and the exposure time required for making the 5th step of the gray scale having a density difference of 0.15 completely clear was determined. The results thus obtained are listed in the following Table IX.

TABLE IX

| Ex. No. | PS plate | Siloxane Polymer Employed | Exposure Time (sec) |
|---|---|---|---|
| 83 | (T)-1 | Exemplified Compound (f)-(25) | 20 |
| 84 | (T)-2 | Exemplified Compound (f)-(26) | 35 |
| 85 | (T)-3 | Exemplified Compound (f)-(34) | 15 |
| 86 | (T)-4 | Exemplified Compound (f)-(35) | 25 |
| 87 | (T)-5 | Exemplified Compound (f)-(37) | 30 |
| 88 | (T)-6 | Exemplified Compound (f)-(40) | 20 |
| 2 | (U) | Coompartive Example | 55 |

As seen from the results listed in Table IX, all the PS plates (T)-1 to (T)-6 in which the siloxane polymers of the invention were used require a short exposure time and have high sensitivity compared with those for the comparative PS plate (U).

The weight average molecular weight (GPC; polystyrene standard) of all the siloxane polymers listed in Table IX range from 4,000 to 7,500.

Moreover, in the siloxane polymers corresponding to exemplified compounds (f)-(34), (f)-(35), (f)-(37) and (f)-(40), the content of the silyl ether group- or silyl ester group-containing siloxane unit was 50 mole % in all the cases.

EXAMPLES 89 TO 94

Each of light-sensitive solutions which had the same compositions as those of the light-sensitive solutions (T)-1 to (T)-6 used in Examples 83 to 88 except that Oil Blue #603 was removed was applied onto a silicon wafer with a spinner and dried on a hot plate maintained at 90° C. for 2 minutes. The thickness of the resulting layer was 1.0 μm.

Then the resulting light-sensitive layer was exposed to light with a scale down projection aligner (stepper) using monochromatic light of 365 nm and then it was developed with a 2.4% aqueous solution of tetramethyl ammonium hydroxide for 60 seconds to form a resist pattern. As a result, a good pattern having a line & space of 0.7 μm was obtained.

EXAMPLES 95 TO 96

A commercially available novolak type resist HPR-204 (available from Fuji Hunt Chemical Co., Ltd.) was applied onto a silicon wafer with a spinner and dried at 220° C. for one hour to obtain an underlying coating. The thickness thereof was 2.0 μm.

The following light-sensitive solution (X) was applied onto the underlying layer with a spinner and dried on a hot plate maintained at 90° C. for 2 minutes to form a coated film having a thickness of 0.5 μm.

| Light-sensitive Solution (X) | |
|---|---|
| Component | Amount (g) |
| Siloxane polymer of the invention | 0.90 |
| Cresol/formaldehyde/novolak resin (m/p-cresol ratio = 6/4) | 0.70 |
| PF$_6$ Salt of diphenyl iodonium | 0.10 |
| Anthracene | 0.04 |
| Ethyl cellosolve acetate | 8.5 |

The siloxane polymers of the invention used in these Examples were siloxane polymers corresponding to exemplified compounds (f)-(34) and f)-(37) whose weight average molecular weights (GPC; polystyrene standard) were 5,300 and 4,500 respectively. In these siloxane polymers, the content of the silyl ether group- or silyl ester group-containing siloxane unit was 50% in both cases.

The resulting light-sensitive layer was exposed to light and developed in the same manner as used in Examples 89 to 94 and as a result, a good pattern having a line & space of 0.7 μm was obtained. Then the layer was etched for 20 minutes with a diode parallel plates reactive ion etching apparatus under the conditions of 20 mTorr of O$_2$ gas pressure and 200 mW/cm$^2$ of RF power. Thus the pattern of the upper layer was completely or faithfully transferred to the lower HPR-204 layer. The resulting resist pattern was composed of the upper and lower two layers having a high aspect ratio.

More specifically, it was confirmed that the resist of the present invention could be used as an upper resist in the two layer resist technique.

The light-sensitive composition of the present invention is highly sensitive, is excellent in resistance to oxygen plasma, can be developed with an alkaline developer and can easily be prepared.

PREPARATION EXAMPLE 28

Preparation of Exemplified Compound (g)-(30)

8.7 g (0.05 mole) of 2-(trimethoxysilyl)-1,3-butadiene and 5.7 g (0.05 mole) of N-hydroxymaleimide were dissolved in 100 m of dioxane and the resulting solution was stirred at 100° C. for one hour. After cooling to room temperature, 9.9 g (0.05 mole) of trimethoxyphenyl-silane was added to the solution. Further, 10 ml of distilled water and 0.1 g of conc. hydrochloric acid were added thereto and the solution was stirred for 30 minutes. Thereafter, the solution was heated to remove the solvent, dioxane, and to thus concentrate the solution. The concentrate was added to 1 l of water with stirring, the solids precipitated out were filtered off and dried in vacuo. Thus, 18.2 g of a brownish white resin was recovered. It was confirmed that the resin was exemplified compound (g)-(30) (D=H) by means of NMR spectroscopy.

The resin was redissolved in 100 ml of γ-butyrolactone and 13.4 g (0.050 mole) of 1,2-naphthoquinone-2-diazido-5-sulfonyl chloride was added to the resulting solution. To the solution, there was dropwise added 5.1 g 0.050 mole) of triethylamine over 20 minutes. Then 15 ml of water was added and the pH value of the solution was adjusted to about 6.5 by dropwise addition of additional triethylamine. The reaction mixture was added to 3 l of water with stirring. The resin precipitated out was filtered off and dried in vacuo to give 26.5 g of a yellow resin (exemplified compound (g)-(30); D=1,2-naphthoquinone-2-diazido-5-sulfonyl group).

The molecular weight of the resin was determined by gel permeation chromatography (GPC) and the weight average molecular weight (polystyrene standard) thereof was found to be 4,800.

PREPARATION EXAMPLE 29

Preparation of Exemplified Compound (g)-(32)

The same reaction and post-treatments as used in Preparation Example 28 were performed except that 5.1 g (0.050 mole) of N-hydroxy-N-methylacrylamide was substituted for N-hydroxymaleimide used in Preparation Example 28 to thus obtain 24.8 g of a yellow resin. The molecular weight of the resulting resin was determined by GPC and the weight average molecular weight polystyrene standard) thereof was found to be 3,800.

PREPARATION EXAMPLE 30

Preparation of Exemplified Compound (g)-(34)

The same reaction and post-treatments as used in Preparation Example 28 were performed except that 8.2 g (0.050 mole) of N-(p-hydroxyphenyl)acrylamide was substituted for N-hydroxymaleimide used in Preparation Example 28 to thus obtain 29.2 g of a yellow resin. The molecular weight of the resulting resin was determined by GPC and the weight average molecular weight (polystyrene standard) thereof was found to be 5,500.

EXAMPLES 96 TO 102

A 2S aluminum plate having a thickness of 0.24 mm was immersed in a 10% aqueous solution of tertiary sodium phosphate maintained at 80° C. for 3 minutes to degrease the same, grained with a nylon brush, etched with a sodium aluminate solution for about 10 minutes and then desmutted with a 3% aqueous solution of sodium hydrogen sulfate. The aluminum plate was then anodized at a current density of 2 A/dm$^2$ for 2 minutes in a 20% sulfuric acid solution to thus obtain an aluminum substrate.

Six kinds of light-sensitive solutions (Y)-1 to (Y)-6 were prepared by changing the kinds of siloxane polymers of the present invention used in a light-sensitive solution (Y) having the following composition. Each of these light-sensitive solutions was applied onto the aluminum plate, which had been anodized, and dried at 100° C. for 2 minutes to obtain the corresponding PS plates (Y)-1 to (Y)-6. The coated amount of the light-sensitive solution was 1.5 g/m$^2$ (weighed after drying) in all the PS plates.

The siloxane polymers used in the light-sensitive solution (Y)-1 to (Y)-6 are listed in the following Table X.

| Light-sensitive Solution (Y) | |
|---|---|
| Component | Amount (g) |
| Siloxane polymer of the invention | 0.70 |
| Cresol/formaldehyde/novolak resin (m/p-cresol ratio = 6/4) | 1.0 |
| Oil Blue #603 (available from ORIENT CHEMICAL INDUSTRIES CO., LTD.) | 0.02 |
| Methyl ethyl ketone | 5 |
| Methyl cellosolve | 15 |

A gray scale having a density difference of 0.15 was brought in close contact with the light-sensitive layer of each PS plate (Y)-1 to (Y)-6 and the layer was exposed to light from a 2 KW high pressure mercury lamp for one minute at a distance of 50 cm. Thereafter, the exposed PS plates (Y)-1 to Y)-6 were immersed in and developed with DP-4 (trade name; available from Fuji Photo Film Co., Ltd.) diluted 8 times with water for 60 seconds at 25° C. Thus, there was obtained an image dyed clear blue.

The weight average molecular weight (GPC; polystyrene standard) of all the siloxane polymers used in these Examples range from 3,000 to 7,000.

Moreover, in the siloxane polymers corresponding to exemplified compounds (g)-(30), (g)-(32), (g)-(34) and (g)-(44), the content of the structural unit derived from phenolic OH group-, N-hydroxylamido group- or N-hydroxylimino group-containing siloxane was 50 mole % on the basis of the total amount of the charge stock in all the cases.

TABLE X

| Ex. No. | PS plate | Siloxane Polymer Employed |
|---|---|---|
| 97 | (Y)-1 | Exemplified Compound (g)-(17) |
| 98 | (Y)-2 | Exemplified Compound (g)-(19) |
| 99 | (Y)-3 | Exemplified Compound (g)-(30) |
| 100 | (Y)-4 | Exemplified Compound (g)-(32) |
| 101 | (Y)-5 | Exemplified Compound (g)-(34) |
| 102 | (Y)-6 | Exemplified Compound (g)-(44) |

EXAMPLES 103 TO 108

Each of light-sensitive solutions (Y')-1 to (Y')-6 which had the same compositions as those of the light-sensitive solutions (Y)-1 to (Y)-6 used in Examples 97 to 102 except that Oil Blue #603 was removed was applied onto a silicon wafer with a spinner and dried on a hot plate maintained at 90° C. for 2 minutes. The thickness of the resulting layer was 1.0 μm.

Then the resulting light-sensitive layer was exposed to light with a scale down projection aligner (stepper) using monochromatic light of 436 nm and then it was developed with a 2.4% aqueous solution of tetramethyl ammonium hydroxide for 60 seconds to form a resist pattern. As a result, a good pattern having a line & space of 0.8 μm was obtained.

EXAMPLES 109 TO 110

A commercially available novolak type resist HPR-204 (available from Fuji Hunt Chemical Co., Ltd.) was applied onto a silicon wafer with a spinner and dried at 220° C. for one hour to obtain an underlying coating. The thickness thereof was 2.0 μm.

The following light-sensitive solution (C') was applied onto the underlying layer with a spinner and dried on a hot plate maintained at 90° C. for 2 minutes to form a coated film having a thickness of 0.5 μm.

| Light-sensitive Solution (C') | |
|---|---|
| Component | Amount (g) |
| Siloxane polymer of the invention | 1.00 |
| Cresol/formaldehyde/novolak resin (m/p-cresol ratio = 6/4) | 0.60 |
| Ethyl cellosolve acetate | 8.5 |

The siloxane polymers of the invention used in these Examples were siloxane polymers corresponding to exemplified compounds (g)-(30) and (g)-(34) whose weight average molecular weights (GPC; polystyrene standard) were 4,800 and 5,500 respectively. In these siloxane polymers, the content of the structural unit derived from the N-hydroxylimido group- or phenolic OH group-containing siloxane unit was 50% in both cases.

The resulting light-sensitive layer was exposed to light and developed in the same manner as used in Examples 103 to 108 and as a result, a good pattern having a line & space of 0.8 μm was obtained. Then the layer was etched for 20 minutes with a diode parallel plates reactive ion etching apparatus under the conditions of 20 mTorr of O$_2$ gas pressure and 200 mW/cm$^2$ of RF power. Thus, the pattern of the upper layer was completely or faithfully transferred to the lower HPR-204 layer. The resulting resist pattern was composed of the upper and lower two layers having a high aspect ratio.

More specifically, it was confirmed that the resist of the present invention could be used as an upper resist in the two layer resist technique.

The light-sensitive composition of the present invention is excellent in film-forming ability, solubility in solvents and resistance to oxygen plasma, can be developed with an alkaline developer and can easily be prepared.

What is claimed is:

1. A siloxane polymer having at least 1 mol % of a repeating unit obtained by hydrolysis or alkoxylation followed by condensation of a cyclic heat addition product between a diene compound of formula (I) or (II) and an olefin or acetylene compound having a phenolic OH, N-hydroxyamide, N-hydroxyimide or anilino group of formula (III), (IV) or (V):

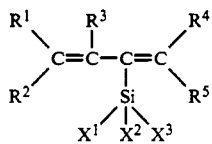  (I)

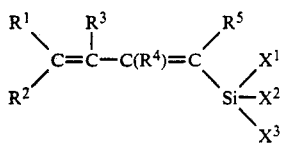  (II)

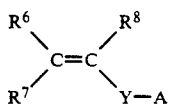  (III)

$R^9-C\equiv C-Y-A$  (IV)

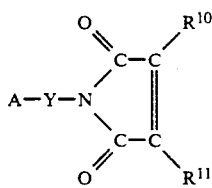  (V)

wherein
R$^1$ to R$^5$ may be the same or different and represent hydrogen atoms, alkyl, aryl or alkoxy groups;
R$^6$ to R$^9$ may be the same or different and represent hydrogen or halogen atoms, cyano, alkyl, aryl, alkoxy, —SO$_2$R$^{12}$, —SO$_3$R$^{12}$, —CO—R$^{12}$, —CO—NH—R$^{12}$, —COO—R$^{12}$, or —Y—A, wherein R$^{12}$ represents an alkyl or aryl group;
R$^{10}$ and R$^{11}$ represent hydrogen atoms, alkyl or aryl groups;
Y represents a single bond, a divalent aromatic or aliphatic hydrocarbon group;
A represents —OH,

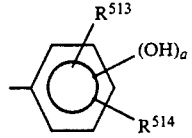 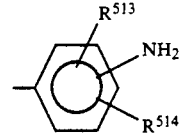

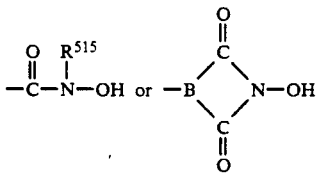

wherein
R$^{513}$ and R$^{514}$ may be the same or different and represent hydrogen or halogen atoms, cyano, nitro, alkyl, aryl, alkoxy, —CO—R$^{515}$, —COO—R$^{515}$, —O—CO—R$^{515}$, —NH-CO—R$^{515}$, —CONH—R$^{515}$, —NH—CONH—R$^{515}$, —NHCOO—R$^{515}$ or —OCONH—R$^{515}$, wherein R$^{515}$ represents an alkyl or aryl group; B represents a divalent alkylene or arylene group; a represents an integer of 1 to 3; X$^1$, X$^2$ and X$^3$ may be the same or different and represent halogen atoms, hydroxy, carboxy, oxime, amide, ureido, amino, alkyl, aryl, aralkyl, alkoxy, aryloxy,

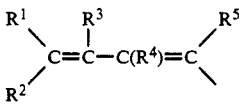

or

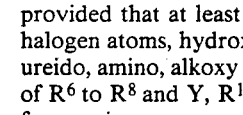

provided that at least two of X$^1$, X$^2$ and X$^3$ are halogen atoms, hydroxy, carboxy, oxime, amide, ureido, amino, alkoxy or aryloxy groups and two of R$^6$ to R$^8$ and Y, R$^{10}$ and R$^{11}$ may combine to form a ring.

2. The siloxane polymer of claim 1, wherein
R$^1$ to R$^5$ may be the same or different and are hydrogen atoms, linear, branched or cyclic alkyl groups having 1 to 10 carbon atoms, mono- or poly-cyclic aryl groups having 6 to 15;
R$^6$ to R$^9$ may be the same or different and are hydrogen or chlorine atoms, cyano, linear, branched or cyclic alkyl groups having 1 to 6 carbon atoms, mono- or poly-cyclic aryl groups having 6 to 10 carbon atoms, alkoxy groups having 1 to 6 carbon atoms, —SO$_2$R$^{12}$, —SO$_3$—R$^{12}$, —CO—R$^{12}$, —CO—NH—R$^{12}$, —COO—R$^{12}$ or
R$^{12}$ is a linear, branched or cyclic alkyl group having 1 to 10 carbon atoms, or a mono- or poly-cyclic aryl group having 6 to 15 carbon atoms; R$^{10}$ and R$^{11}$ are hydrogen atoms, or linear, branched or cyclic alkyl groups having 1 to 4 carbon atoms; two of R$^6$ to R$^8$ and Y, or R$^{10}$ and R$^{11}$ may combine to form a ring;
Y is a single bond, a linear, branched or cyclic alkylene group having 1 to 4 carbon atoms, or a mono- or poly-cyclic arylene group having 6 to 10 carbon atoms; and
X$^1$ to X$^3$ may be the same or different and are chlorine atoms, linear, branched or cyclic alkyl groups having 1 to 10 carbon atoms, mono- or poly-cyclic aryl groups having 6 to 15 carbon atoms, aralkyl groups having 7 to 15 carbon atoms, alkoxy groups having 1 to 8 carbon atoms, or aryloxy groups having 6 to 10 carbon atoms, provided that at least two of $X^1$, $X^2$ and $X^3$ are chlorine atoms, alkoxy groups having 1 to 8 carbon atoms or aryloxy groups having 6 to 10 carbon atoms.

3. The siloxane polymer of claim 1, wherein the cyclic heat addition product is represented by the formula (VI), (VII), (VIII), or (IX):

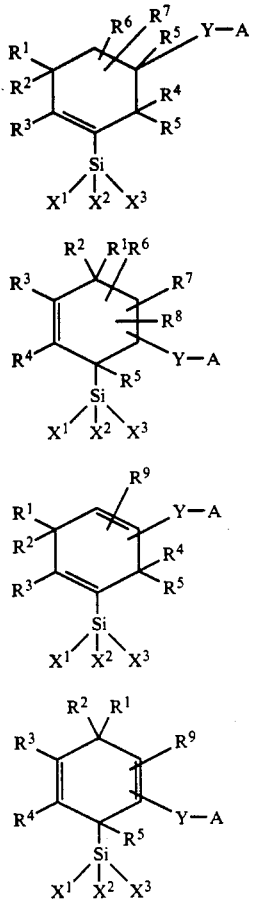

wherein $R^1$ to $R^9$, $X^1$ to $X^3$, Y and A are the same as defined in claim 18.

4. The siloxane polymer of claim 1, wherein the siloxane polymer contains 10 to 80 mol % of the repeating unit obtained by hydrolysis or alkoxylation followed by the condensation of the cyclic heat addition product.

5. The siloxane polymer of claim 1, wherein the condensation is carried out in the presence of one or more compound of formula (XII), (XIII), (XIV), (XV) or (XVI):

$$R^{16}(-Si-X)_3 \quad (XII)$$

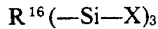

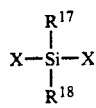

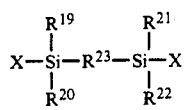

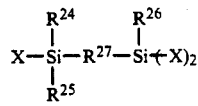

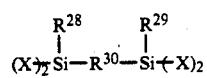

wherein
$R^{16}$ to $R^{22}$, $R^{24}$ to $R^{26}$, $R^{28}$ and $R^{29}$ may be the same or different and each represents a hydrogen atom or an alkyl, substituted alkyl, aryl, substituted aryl, alkenyl, substituted alkenyl, silyl, substituted silyl, siloxy or substituted siloxy group;
$R^{23}$, $R^{27}$ and $R^{30}$ may be the same or different and each represents a single bond, a bivalent alkylene group, a substituted alkylene group, an arylene group or a substituted arylene group; and
X represents a hydrolyzable group.

6. The siloxane polymer of claim 5, wherein the alkyl group is a linear, branched or cyclic alkyl group having 1 to 10 carbon atoms;
the substituted alkyl group is a linear, branched or cyclic alkyl group having 1 to 10 carbon atoms which is substituted with at least one of a halogen atom, an alkoxy group having 1 to 6 carbon atoms, an aryl group or an aryloxy group;
the aryl group is selected from the group consisting of monocyclic and bicyclic aryl groups;
the substituted aryl group is selected from the group consisting of monocyclic and bicyclic aryl groups which are substituted with at least one group selected from among alkyl groups having 1 to 6 carbon atoms, alkoxy groups having 1 to 6 carbon atoms, halogen atoms, or nitro, phenyl, carboxy, hydroxy, amido, imido or cyano groups;
the alkenyl group is a vinyl group; and
the substituted alkenyl group is a vinyl group which is substituted with alkyl groups or aryl groups.

7. The siloxane polymer of claim 5, wherein the alkyl group is selected from the group consisting of methyl, ethyl, propyl, butyl, hexyl, octyl, decyl, iso-propyl, iso-butyl, tert-butyl, 2-ethylhexyl and cyclohexyl groups;
the substituted alkyl group is selected from the group consisting of monochloromethyl, dichloromethyl, trichloromethyl, bromomethyl, 2-chloroethyl, 2-bromoethyl, 2-methoxyethyl, 2-ethoxyethyl, phenylmethyl, naphthylmethyl and phenoxymethyl groups;
the aryl group is selected from the group consisting of phenyl, α-naphthyl and β-naphthyl groups;
the substituted aryl group is selected from the group consisting of 4-chlorophenyl, 2-chlorophenyl, 4-bromophenyl, 4-nitrophenyl, 4-hydroxyphenyl, 4-phenylphenyl, 4-methylphenyl, 2-methylphenyl, 4-ethylphenyl, 4-methoxyphenyl, 2-methoxyphenyl, 4-ethoxyphenyl, 2-carboxyphenyl, 4-cyanophenyl, 4-methyl-1-naphtyl, 4-chloro-1-naphthyl, 5-nitro-1-naphthyl, 5-hydroxy-1-naphthyl, 6-chloro-2-naphthyl, 4-bromo-2-naphthyl and 5-hydroxy-2-naphthyl groups; and
the substituted alkenyl group is selected from the group consisting of 1-methylvinyl, 2-methylvinyl, 1,2-dimethylvinyl, 2-phenylvinyl, 2-(p-methylphenyl)vinyl, 2-(p-methoxyphenyl)vinyl, 2-(p-chlorophenyl)vinyl and 2-(o-chlorophenyl)vinyl.

8. The siloxane polymer of claim 1, wherein the repeating unit of the siloxane polymer is selected from the group consisting of compounds (g)-(1) to (g)-(48):

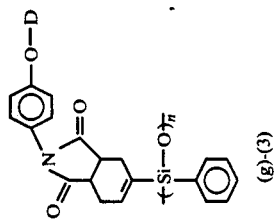 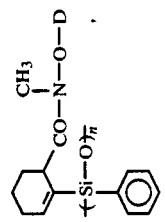 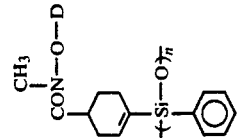 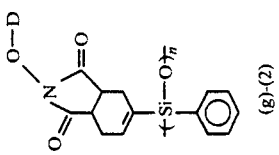 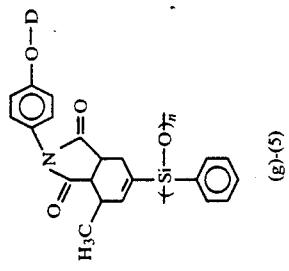 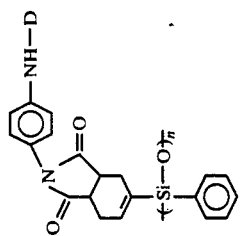 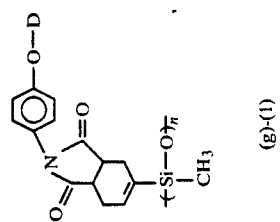 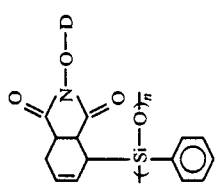 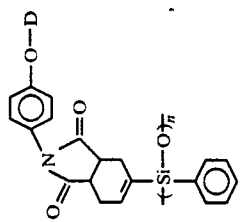

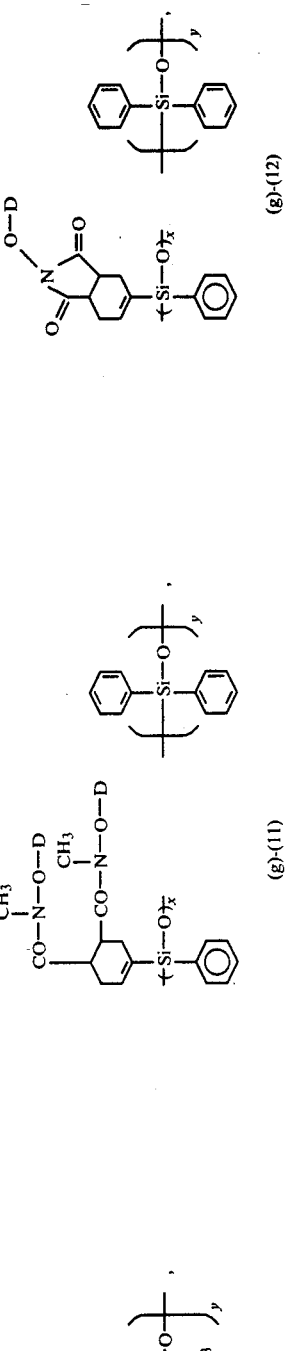
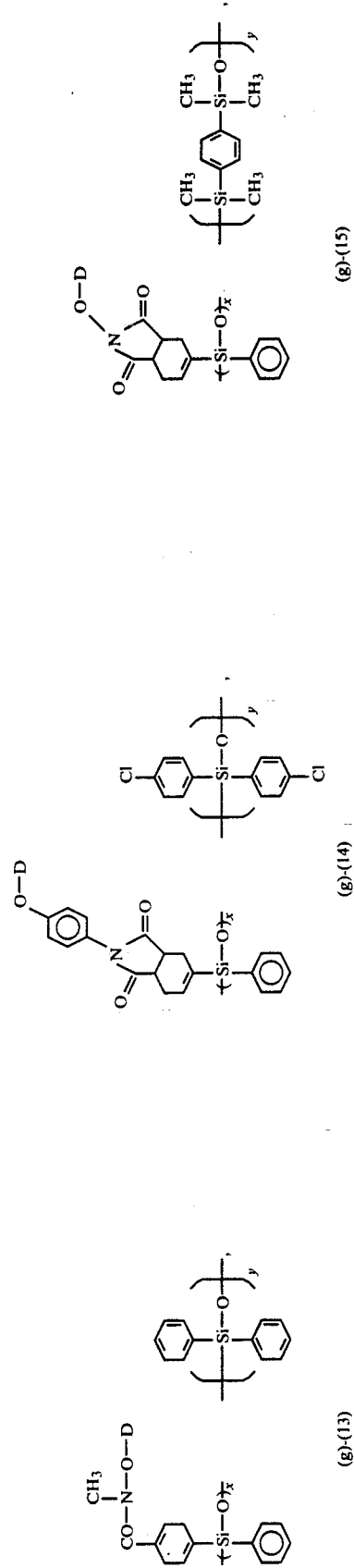

-continued
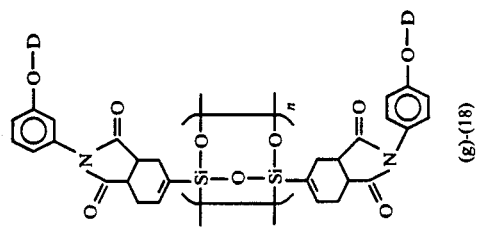
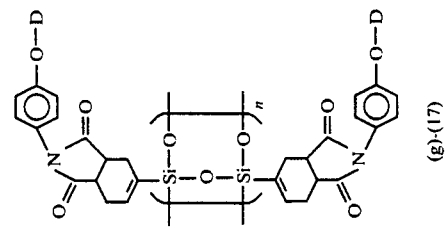
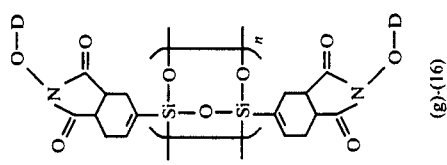
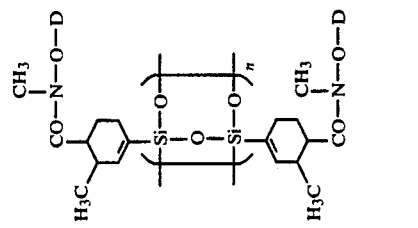
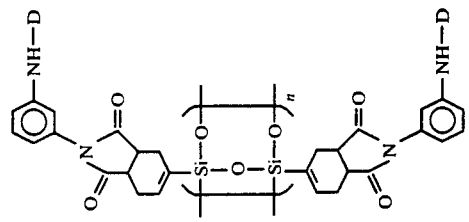

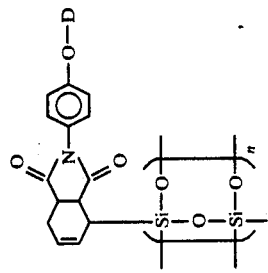
(g)-(24)
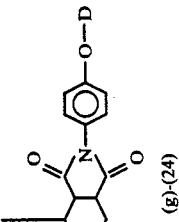
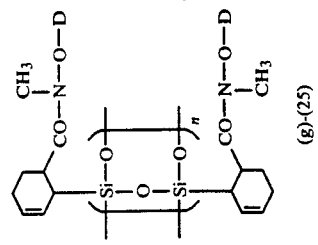
(g)-(27)
-continued
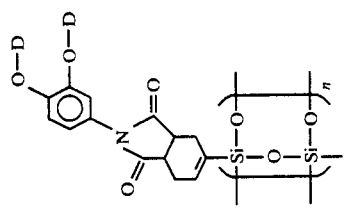
(g)-(23)
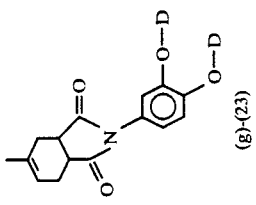
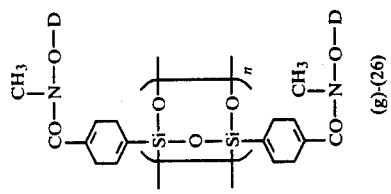
(g)-(26)
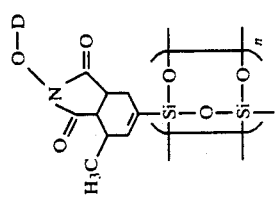
(g)-(22)
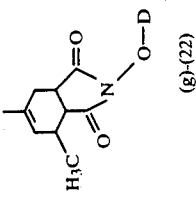
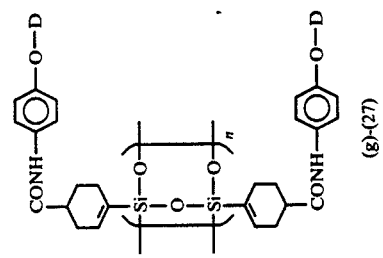
(g)-(25)

-continued
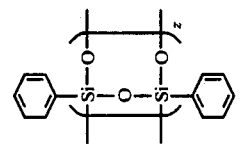
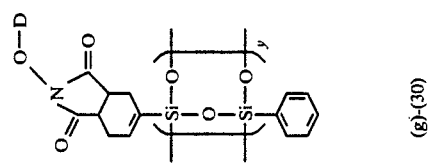
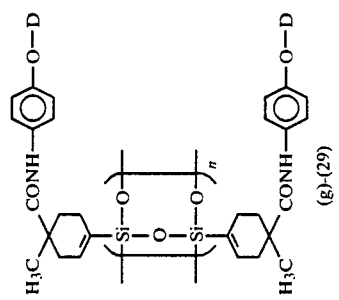
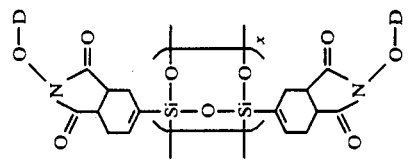
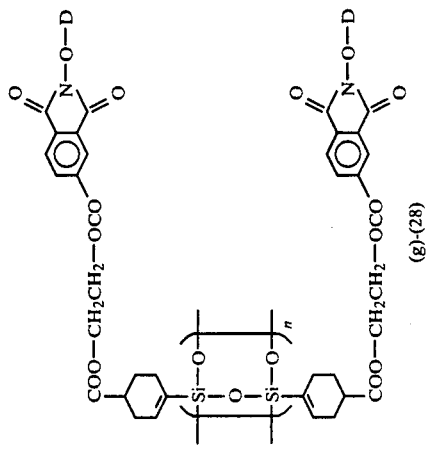

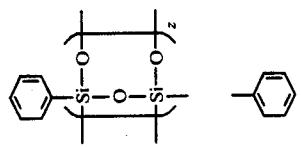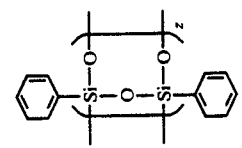
-continued
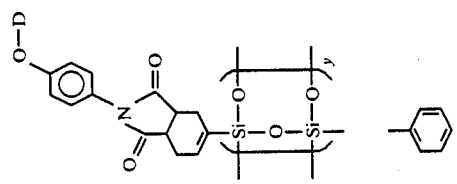 (g)-(31)
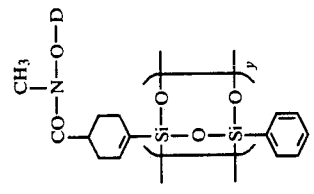 (g)-(32)
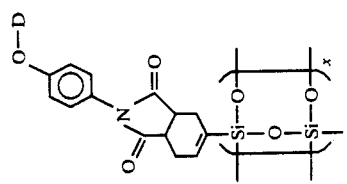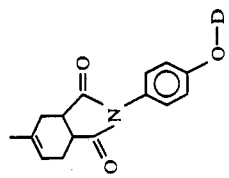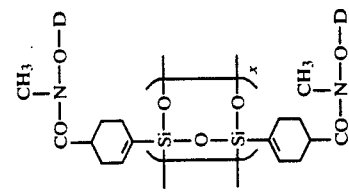

291
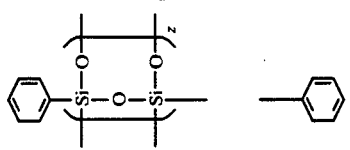
292
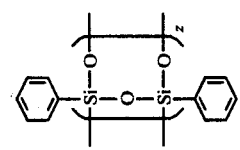
-continued
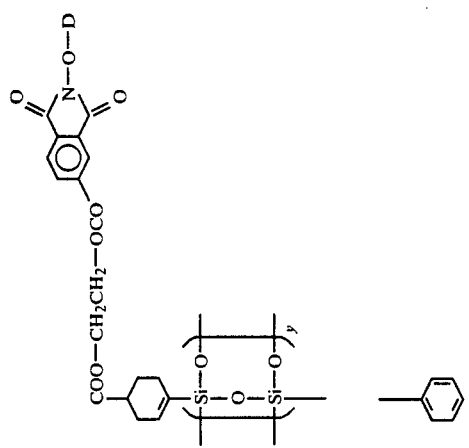
(g)-(33)
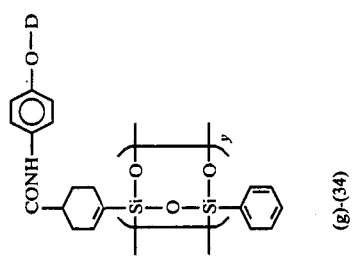
(g)-(34)
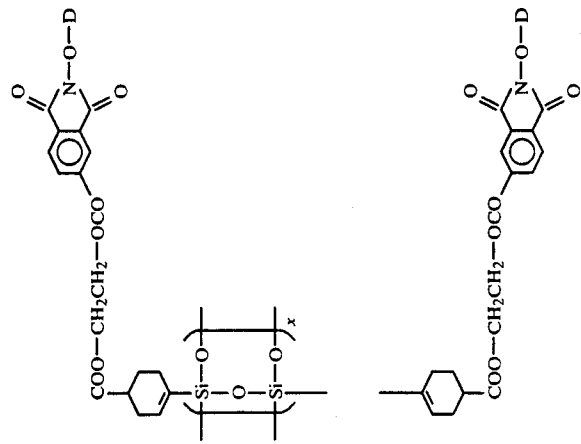

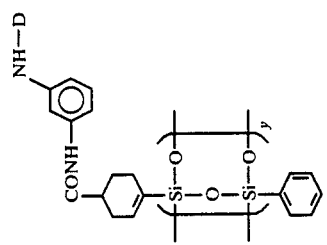
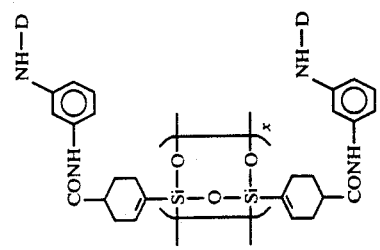
-continued
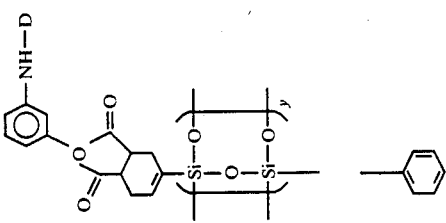
(g)-(35)
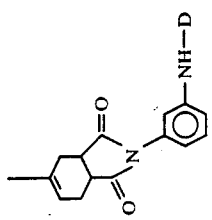
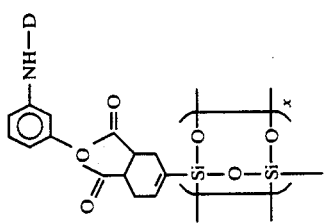
(g)-(36)

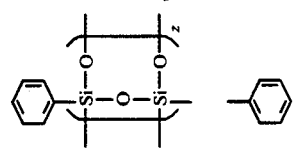
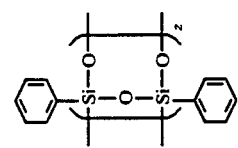
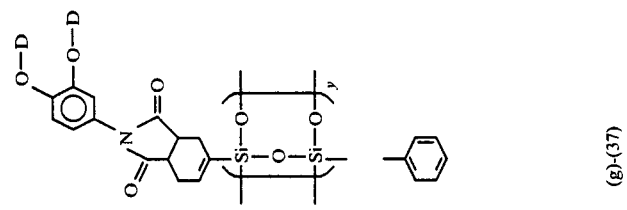
(g)-(37)
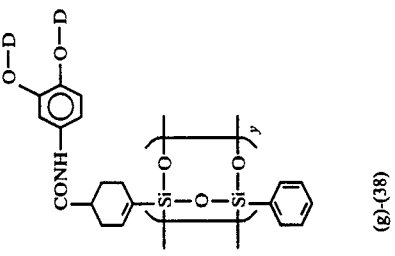
(g)-(38)
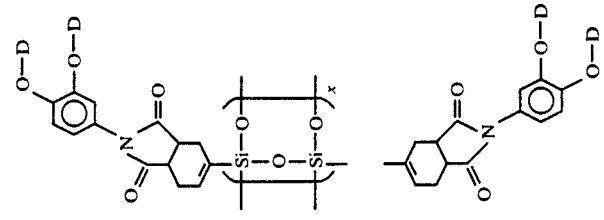
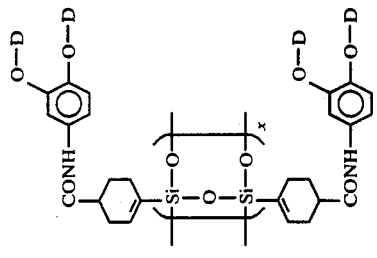

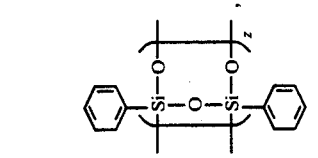
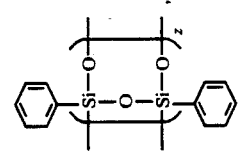
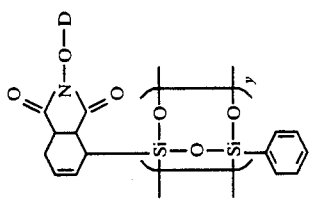
(g)-(39)
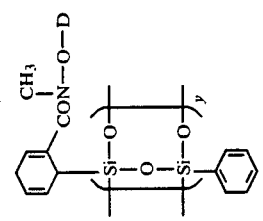
(g)-(40)
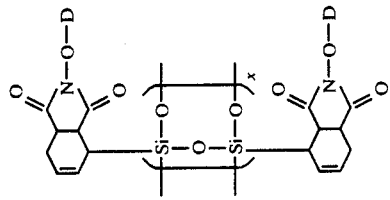
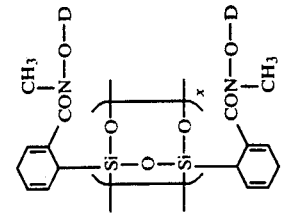

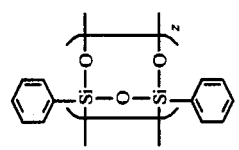
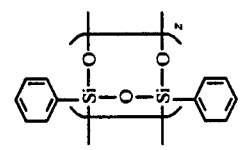
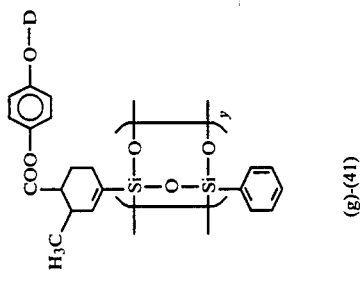
(g)-(41)
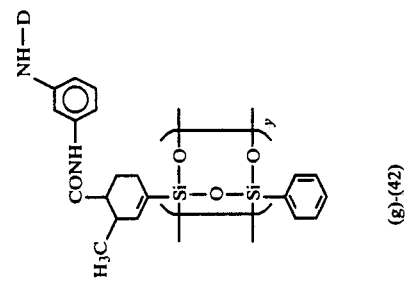
(g)-(42)
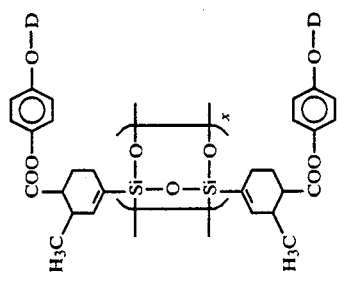
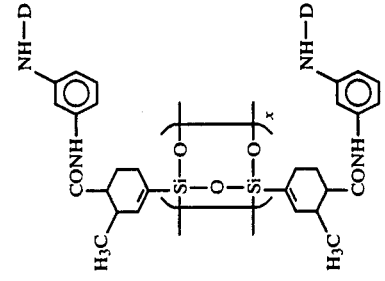

-continued
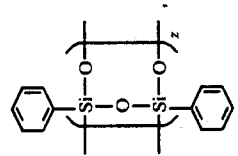 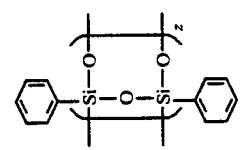
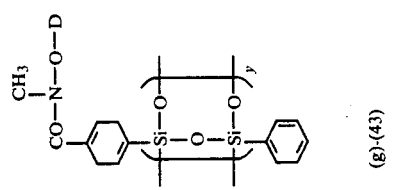
(g)-(43)
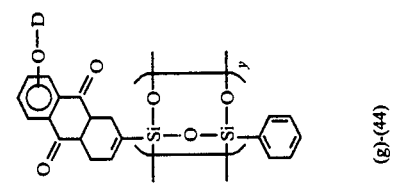
(g)-(44)
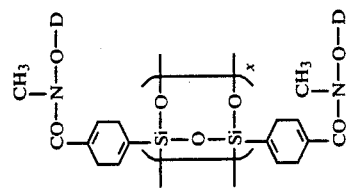 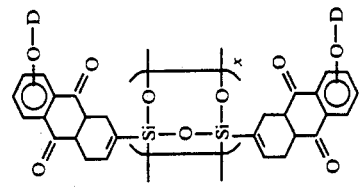

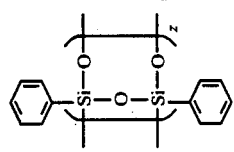
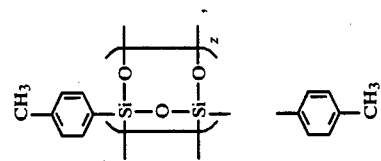
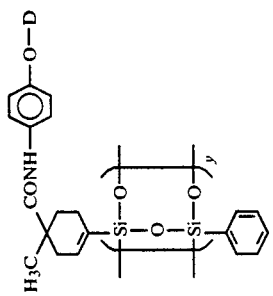
(g)-(45)
(g)-(46)
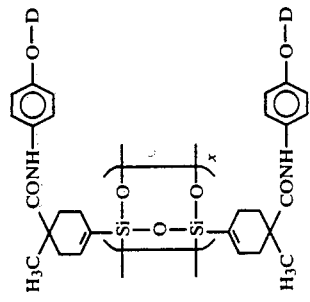

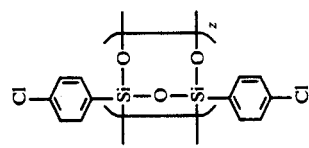
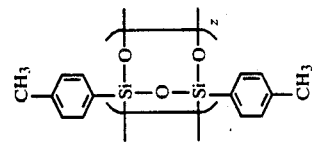
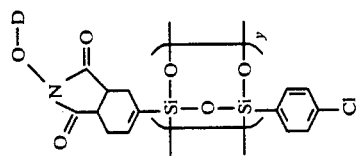
(g)-(47)
and
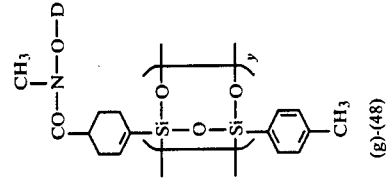
(g)-(48)
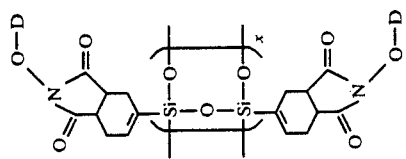
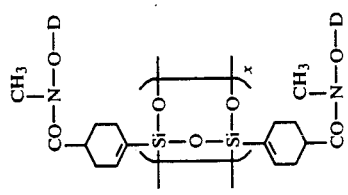
wherein D is hydrogen atom, $n$ is an integer not less than 1 and $x$, $y$ and $z$ are each an integer not less than 0.—
* * * * *